(12) United States Patent
Kato et al.

(10) Patent No.: US 11,910,697 B2
(45) Date of Patent: Feb. 20, 2024

(54) COPOLYMER, ELECTROLUMINESCENCE DEVICE MATERIAL INCLUDING COPOLYMER, AND ELECTROLUMINESCENCE DEVICE

(71) Applicant: SAMSUNG ELECTRONICS CO., LTD., Suwon-si (KR)

(72) Inventors: Fumiaki Kato, Yokohama (JP); Masashi Tsuji, Hwaseong-si (KR); Takao Motoyama, Hwaseong-si (KR); Yusaku Konishi, Yokohama (JP); Keigo Furuta, Yokohama (JP); Takahiro Fujiyama, Yokohama (JP); Tae Ho Kim, Seongnam-si (KR); Won Sik Yoon, Seoul (KR); Ha Il Kwon, Suwon-si (KR); Dae Young Chung, Suwon-si (KR); Eun Joo Jang, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 152 days.

(21) Appl. No.: 17/470,884

(22) Filed: Sep. 9, 2021

(65) Prior Publication Data

US 2022/0077394 A1    Mar. 10, 2022

(30) Foreign Application Priority Data

Sep. 9, 2020 (JP) .................. 2020-151518

(51) Int. Cl.
*H10K 85/10* (2023.01)
*C08G 61/10* (2006.01)
(Continued)

(52) U.S. Cl.
CPC ............ *H10K 85/111* (2023.02); *C08G 61/10* (2013.01); *C08L 65/02* (2013.01);
(Continued)

(58) Field of Classification Search
CPC ...... H10K 85/111; H10K 50/17; H10K 50/15; C08G 61/10; C08G 61/02;
(Continued)

(56) References Cited

U.S. PATENT DOCUMENTS 6,605,373 B2   8/2003   Woo et al.
6,900,285 B2   5/2005   Woo et al.
(Continued)

FOREIGN PATENT DOCUMENTS

JP   2009043896 A   2/2009
JP   2009256679 A   11/2009
(Continued)

*Primary Examiner* — Shane Fang
(74) *Attorney, Agent, or Firm* — CANTOR COLBURN LLP

(57) ABSTRACT

A copolymer having a structural unit represented by Chemical Formula 1 is provided. The copolymer may improve performance, e.g., luminous efficiency, of an electroluminescence device.

[Chemical Formula 1]

(Continued)

In Chemical Formula 1, the definition of each substituent is as described in the detailed description.

17 Claims, 2 Drawing Sheets

(51) Int. Cl.
*C08L 65/02* (2006.01)
*H10K 50/15* (2023.01)
*H10K 50/17* (2023.01)

(52) U.S. Cl.
CPC .... *C08G 2261/11* (2013.01); *C08G 2261/148* (2013.01); *C08G 2261/149* (2013.01); *C08G 2261/1434* (2013.01); *C08G 2261/312* (2013.01); *C08G 2261/3142* (2013.01); *C08G 2261/95* (2013.01); *H10K 50/15* (2023.02); *H10K 50/17* (2023.02)

(58) Field of Classification Search
CPC ........ C08G 2261/3162; C08G 2261/11; C08G 2261/1434; C08G 2261/148; C08G 2261/149; C08G 2261/312; C08G 2261/143; C08G 2261/411; C08G 2261/18; C08G 2261/95; C08G 2261/3142; C08G 2261/512; C08G 2261/91; H01L 51/0039
See application file for complete search history.

(56) References Cited

U.S. PATENT DOCUMENTS

| 9,882,134 | B2 | 1/2018 | Fujiyama et al. |
| 10,040,887 | B2 | 8/2018 | Korai et al. |
| 2009/0153021 | A1 | 6/2009 | Jen et al. |
| 2016/0002392 | A1* | 1/2016 | Liaw ........................ B01J 41/13 528/7 |
| 2018/0090687 | A1 | 3/2018 | Matsuo et al. |
| 2018/0166632 | A1 | 6/2018 | Kawakami et al. |
| 2020/0028082 | A1 | 1/2020 | Lee et al. |
| 2020/0227641 | A1 | 7/2020 | Kang et al. |

FOREIGN PATENT DOCUMENTS

| JP | 2010155985 A | 7/2010 |
| JP | 2017-0119793 A | 7/2017 |
| KR | 2016-0009562 A | 1/2016 |
| KR | 2017-0134163 A | 7/2018 |
| KR | 2019-0103992 A | 9/2019 |
| KR | 2019-0103994 A | 9/2019 |
| WO | 2016159292 A1 | 10/2016 |
| WO | 16194714 A1 | 12/2016 |

* cited by examiner

COPOLYMER, ELECTROLUMINESCENCE DEVICE MATERIAL INCLUDING COPOLYMER, AND ELECTROLUMINESCENCE DEVICE

CROSS-REFERENCE TO RELATED APPLICATION

This application claims priority to Japanese Patent Application No. 2020-151518 filed in the Japan Patent Office on Sep. 9, 2020, and all the benefits accruing therefrom under 35 U.S.C. § 119, the entire content of which is herein incorporated by reference.

BACKGROUND

1. Field

A copolymer, an electroluminescence device material including the copolymer, and an electroluminescence device are disclosed.

2. Description of the Related Art

Research and development of electroluminescence devices (EL devices) are actively progressing. In particular, EL devices are expected to be used as solid-light emitting type, and provide relatively inexpensive and large area full color display devices or recording light source arrays. An EL device is a light emitting device including a thin film of several nanometers to several hundred nanometers between an anode and a cathode. In addition, the EL devices usually further include a hole transport layer, a light emitting layer, an electron transport layer, or the like.

A material of the light emitting layer includes a fluorescent light emitting material and a phosphorescent light emitting material. The phosphorescent light emitting material is a material which is expected to have luminous efficiency compared with that of the fluorescent light emitting material. In addition, in order to cover a wide color gamut, a RGB light source requires an emission spectrum having a narrow half value width. For blue emission, deep blue is particularly required, and there is current interest to develop EL devices with greater life-span, and which also satisfy the necessary color purity.

As a method of solving such a problem, there is a light emitting device using "quantum dot" which is an inorganic light emitting material as a light emitting material (See, Patent Document 1, Japanese Patent Laid-Open Publication No. 2010-199067). Quantum dots (QD) are semiconductor materials having crystal structures of several nanometers in size. Because quantum dots are very small in size, a surface area per unit volume is large. For this reason, the majority of atoms are present on the surface of the nanocrystals, and exhibit quantum confinement effects.

Due to the quantum confinement effect, a quantum dot is able to adjust the emission wavelength by adjusting its size, and much attention has been given to improve light emission characteristics such as improved color purity and high photoluminescence (PL) luminous efficiency. A quantum dot light emitting diode (QD LED) is a three-layered device including a quantum dot light emitting layer positioned between a hole transport layer (HTL) and an electron transport layer (ETL).

SUMMARY

In an electroluminescence device, and in particular, a quantum dot electroluminescence device, the hole transport material described in Patent Document 1, does not provide the necessary emission performance, e.g., luminous efficiency, for such a device.

Accordingly, an embodiment provides a technology that improves the performance, e.g., luminous efficiency, of an electroluminescence device, and in particular, a quantum dot electroluminescence device.

An embodiment uses a polymer having a specific structure.

An embodiment provides a copolymer having a structural unit represented by Chemical Formula 1.

Chemical Formula 1

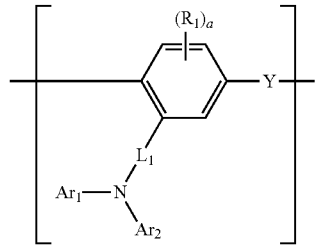

(1)

In Chemical Formula 1, $Ar_1$ and $Ar_2$ are independently a substituted or unsubstituted aromatic hydrocarbon group having 6 to 30 carbon atoms, or a substituted or unsubstituted aromatic heterocyclic group having 3 to 30 ring-member atoms, $L_1$ is a substituted or unsubstituted aromatic hydrocarbon group having 6 to 30 carbon atoms, each $R_1$ is independently a hydrogen, a substituted or unsubstituted alkyl group having 1 to 20 carbon atoms, a substituted or unsubstituted alkoxy group having 1 to 20 carbon atoms, a substituted or unsubstituted aromatic hydrocarbon group having 6 to 30 carbon atoms, or a substituted or unsubstituted aromatic heterocyclic group having 3 to 30 ring-member atoms, wherein each $R_1$ may be the same or different from each other, or two $R_1$'s may be linked to provide a ring structure, a is an integer of 0, 1, 2, or 3, and Y is a substituted or unsubstituted aromatic hydrocarbon group having 6 to 60 carbon atoms or a substituted or unsubstituted aromatic heterocyclic group having 3 to 60 ring-member atoms.

A polymer composition including copolymer and a polymeric material having a HOMO level of greater than about −5.6 eV and less than or equal to about −5.3 eV, wherein the copolymer includes a structural unit represented by Chemical Formula 1.

In an embodiment, the polymeric material is represented by Chemical Formula 35:

Chemical Formula 35

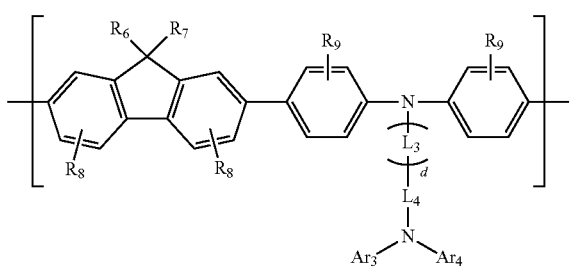

(35)

wherein, in Chemical Formula 35, $R_6$ to $R_9$ are independently a hydrogen, or a hydrocarbon group having 1 to 16 carbon atoms, $L_3$ is a substituted or unsubstituted aromatic hydrocarbon group having 6 to 25 carbon atoms, or a substituted or unsubstituted aromatic heterocyclic group, d is 0, 1, or 2, and if d is 0, $L_3$ is a single bond, and if d is 2, each $L_3$ is the same or different, $L_4$ is a substituted or unsubstituted aromatic hydrocarbon group having 6 to 25 carbon atoms, or a substituted or unsubstituted aromatic heterocyclic group having 3 to 24 ring-member atoms, wherein $L_4$ optionally forms a ring with $Ar_3$, $Ar_3$ is a substituted or unsubstituted aromatic hydrocarbon group having 6 to 25 carbon atoms, or a substituted or unsubstituted aromatic heterocyclic group having 3 to 24 ring-member atoms, wherein $Ar_3$ optionally forms a ring with $Ar_4$ or $L_4$, and $Ar_4$ is an aromatic hydrocarbon group having 6 to 25 carbon atoms which is substituted with a linear hydrocarbon group having 1 to 12 carbon atoms, a branched hydrocarbon group having 3 to 12 carbon atoms, or an aromatic heterocyclic group having 3 to 24 ring-member atoms, which is substituted with a linear hydrocarbon group having 1 to 12 carbon atoms, or a branched hydrocarbon group having 3 to 12 carbon atoms, wherein $Ar_4$ optionally forms a ring with $Ar_3$.

An electroluminescence device, and in particular, a quantum dot electroluminescence device having excellent performance, e.g., excellent luminous efficiency, may be provided.

DETAILED DESCRIPTION

Figure 1:
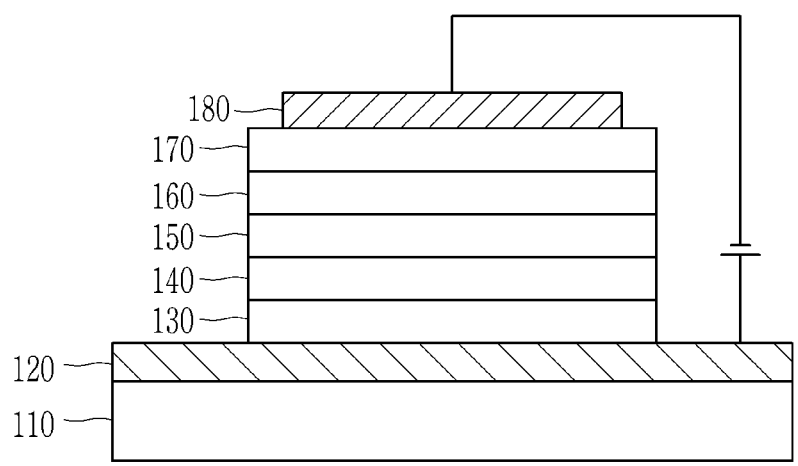
FIG. 1 is a schematic view illustrating an electroluminescence device according to an embodiment.

According to an embodiment, a copolymer having a structural unit represented by Chemical Formula 1 is provided:

Chemical Formula 1

(1)

In Chemical Formula 1, $Ar_1$ and $Ar_2$ are each independently a substituted or unsubstituted aromatic hydrocarbon group having 6 to 30 carbon atoms, or a substituted or unsubstituted monovalent aromatic heterocyclic group having 3 to 30 ring-member atoms, $L_1$ is a substituted or unsubstituted aromatic hydrocarbon group having 6 to 30 carbon atoms, each $R_1$ is independently a hydrogen, a substituted or unsubstituted alkyl group having 1 to 20 carbon atoms, a substituted or unsubstituted alkoxy group having 1 to 20 carbon atoms, a substituted or unsubstituted aromatic hydrocarbon group having 6 to 30 carbon atoms, or a substituted or unsubstituted aromatic heterocyclic group having 3 to 30 ring-member atoms, wherein two $R_1$'s may be optionally linked to provide a ring structure, a is an integer of 0, 1, 2, or 3, and Y is a substituted or unsubstituted divalent aromatic hydrocarbon group having 6 to 60 carbon atoms or a substituted or unsubstituted divalent aromatic heterocyclic ring group having 3 to 60 ring-member atoms.

As used herein, "structural unit represented by Chemical Formula 1" is also referred to as "Structural Unit (1)."

A structural unit having a structure represented by Chemical Formula 1-1 among "structural units represented by Chemical Formula 1" is also referred to as "Structural Unit X."

In addition, the structural unit "—Y—" in the structural unit represented by Chemical Formula 1 is also referred to as "Structural Unit Y."

A copolymer having a structural unit represented by Chemical Formula 1 is also referred to as a "copolymer."

Chemical Formula 1-1

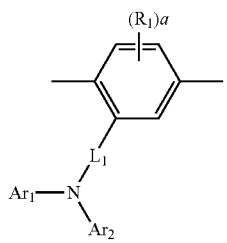

According to another embodiment, a polymer composition includes the copolymer of Chemical Formula 1 and a polymeric material having a HOMO level of greater than about −5.6 electron volts (eV) and less than or equal to about −5.3 eV.

According to another embodiment, an electroluminescence device material includes the copolymer of Chemical Formula 1 or the polymer composition that includes the copolymer of Chemical Formula 1.

According to another embodiment, an electroluminescence device includes a first electrode and a second electrode each having a surface opposite the other, and an organic layer including one or more layers disposed between the first electrode and the second electrode, wherein at least one of the organic layers includes the aforementioned copolymer of Chemical Formula 1 or polymer composition. As used herein, the electroluminescence device is simply referred to as "LED."

Quantum dot electroluminescence devices are also referred to simply as "QLEDs."

An organic electroluminescence device is also simply referred to as "OLED."

A conventional organic electroluminescence device (organic light emitting diode, OLED) includes a hole transport layer (HTL) and a light emitting layer. The HOMO (Highest Occupied Molecular Orbital) level of the material used for the hole transport layer (HTL) may be greater than or equal to about −5.3 eV and less than or equal to about −5.0 eV. In addition, since the HOMO level of the material used in the light emitting layer is between about −5.5 eV and about −5.0 eV, a difference from the HOMO level of the material used for the hole transport layer (HTL) is small, so that efficient hole transport may be possible to provide a device having high luminous efficiency.

On the other hand, the valence band level of a quantum dot used in a quantum dot electroluminescence device (QLED) is, for example, about −5.7 eV for a blue QLED and about −5.55 eV for a red QLED. For this reason, the difference in the band offset from the HOMO level of the hole transport layer material used in the conventional organic electroluminescence device (OLED) is large, and the carrier injection efficiency, the luminous efficiency, the turn-on voltage of the QLED, and the driving voltage are increased.

In order to solve these problems, a method of lowering the band offset with the light emitting layer (quantum dot (QD) layer) using a hole transport layer material having a deeper HOMO level of the hole transport layer (HTL) is being considered.

As a result of repeated studies on materials having a deep HOMO level (especially hole transport layer materials), the present inventors have developed and identified the structure of Chemical Formula 1, in particular, the structural unit "X" of Chemical Formula 1, into a structure represented by Chemical Formula 1-1, and provide a material having deep HOMO levels.

Chemical Formula 1-1

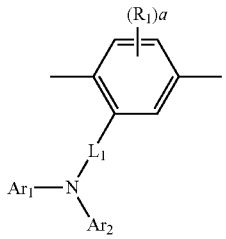

In detail, the structural unit "X" constituting the copolymer of Chemical Formula 1 has a structure in which a monoamine (N(Ar$_1$)(Ar$_2$)) is arranged in a side chain. With such a structure, the length of the conjugate is shortened, and as a result, the HOMO level of the copolymer may be deepened. In addition, the structural unit "X" has a structure in which the benzene ring of the main chain is linked to other structural units at the para position, and the side chain (monoamine) is arranged at the ortho position. With this structure, the conjugate of the monoamine is maintained, and as a result, the HOMO level of the copolymer may be deepened. Thus, the copolymer has a deep HOMO level. For this reason, in a quantum dot electroluminescence device including a hole injection layer or a hole transport layer (especially a hole transport layer) containing the copolymer and a light emitting layer containing quantum dots, a HOMO level difference between a hole injection layer or a hole transport layer (particularly a hole transport layer) and a light emitting layer is small, and hole injection capability from the hole transport layer into the light emitting layer may be improved.

In addition, since the ability to inject holes (holes) into the light emitting layer may be improved, it is also possible to widen the light emitting area. Therefore, by using the copolymer, an electroluminescence device exhibiting high luminous efficiency may be produced.

Accordingly, the copolymer according to the present disclosure has a deep HOMO level. The electroluminescence device produced using the copolymer may exhibit high luminous efficiency. In addition, the copolymer according to the present disclosure may suppress an increase in the driving voltage. Therefore, the electroluminescence device produced using the copolymer may exhibit high luminous efficiency with a low driving voltage. Moreover, since the copolymer has excellent film-forming properties and solvent solubility, film-forming by the wet (coating) method may be possible. Therefore, by using the copolymer, a large area and high productivity of the electroluminescence device are possible. The above effect may be effectively exhibited when the copolymer is applied to an EL device, particularly a hole transport layer or a hole injection layer of a QLED.

Hereinafter, embodiments are described, however the claims are not to be limited to the following embodiments. In addition, each drawing is exaggerated for better understanding and ease of description, and the dimensional ratio of each constituent element in each drawing may differ from reality. In addition, when the embodiment of the present disclosure has been described with reference to the drawings, the same reference numerals are given to the same elements in the description of the drawings, and redundant descriptions are omitted.

It will be understood that when an element is referred to as being "on" another element, it can be directly on the other element or intervening elements may be present therebetween. In contrast, when an element is referred to as being "directly on" another element, there are no intervening elements present. The terminology used herein is for the purpose of describing particular embodiments only and is not intended to be limiting.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. In this specification, unless otherwise specified, operation and physical properties are measured under the conditions of room temperature (20° C. or more and 25° C. or less)/relative humidity 40% RH or more and 50% RH or less.

As used herein, unless otherwise specified, "substituted" refers to substitution with an alkyl group, a cycloalkyl group, a hydroxyalkyl group, an alkoxyalkyl group, an alkoxyl group, a cycloalkoxyl group, an alkenyl group, an alkynyl group, an amino group, an aryl group, an aryloxy group, an alkylthio group, a cycloalkylthio group, an arylthio group, an alkoxycarbonyl group, an aryloxycarbonyl group, a hydroxyl group (—OH), a carboxyl group (—COOH), a thiol group (—SH), or a cyano group (—CN). Moreover, when a group is substituted, the form of substitution in which the substituent is included in the definition before substitution is excluded. For example, when a substituent is an alkyl group, this alkyl group as a substituent is not substituted with a further alkyl group.

Here, the alkyl group as the substituent may be either a linear or branched, for example a linear alkyl group having 1 to 20 carbon atoms or a branched alkyl group having 3 to 20 carbon atoms. Specifically, the alkyl group may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, a nonadecyl group, an icosyl group, and the like.

As the substituent, the cycloalkyl group may include for example, a cyclopropyl group, a cyclobutyl group, a cyclopentyl group, and a cyclohexyl group.

As the hydroxyalkyl group, for example, the alkyl group may be substituted with 1 to 3 (desirably 1 or 2, and particularly desirably substituted with hydroxy groups (for example, hydroxymethyl group, hydroxyethyl group).

As the alkoxyalkyl group, for example, the alkyl group may be substituted with 1 to 3 (desirably 1 or 2 and particularly desirably substituted with alkoxy groups.

The alkoxy group as the substituent may be either linear or a branched, but desirably a linear alkoxy group having 1 to 20 carbon atoms or a branched chain alkoxy group having 3 to 20 carbon atoms. For example, the alkoxy group may be, for example, a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, and the like.

The cycloalkoxy group as a substituent may be, for example, a cyclopropyl oxy group, a cyclobutyl oxy group, a cyclopentyl oxy group, a cyclohexyl oxy group, and the like.

The alkenyl group may include, for example, a vinyl group, an allyl group, a 1-propenyl group, an isopropenyl group, a 1-butenyl group, a 2-butenyl group, a 3-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 5-heptenyl group, a 1-octenyl group, a 3-octenyl group, a 5-octenyl group, and the like.

The alkynyl group as a substituent may include, for example, an acetylenyl group, a 1-propynyl group, a 2-propynyl group, a 1-butynyl group, a 2-butynyl group, a 3-butynyl group, a 1-pentetyl group, a 2-pentetyl group, a 3-pentetyl group, 1-hexynyl group, a 2-hexynyl group, a 3-hexynyl group, a 1-heptinyl group, a 2-heptinyl group, 5-heptinyl group, a 1-octynyl group, a 3-octynyl group, a 5-octynyl group, and the like.

Examples of the aryl group as the substituent may include an aryl group having 6 to 30 carbon atoms.

The aryl group may include, for example, a phenyl group, a naphthyl group, a biphenyl group, a fluorenyl group, an anthryl group, a pyrenyl group, an azulenyl group, an acenaphthylenyl group, a terphenyl group, and a phenanthryl group.

The aryloxy group as the substituent may include, for example, a phenoxy group, and a naphthyloxy group.

The alkylthio group as the substituent may include, for example, a methylthio group, an ethylthio group, a propylthio group, a pentylthio group, a hexylthio group, an octylthio group, a dodecylthio group, and the like.

The cycloalkylthio group as the substituent may include, for example, a cyclopentylthio group and a cyclohexylthio group.

The arylthio group as the substituent may include, for example, a phenylthio group, a naphthylthio group, and the like.

The alkoxycarbonyl group as the substituent may include, for example, a methyloxy carbonyl group, an ethyloxy carbonyl group, a butyloxy carbonyl group, an octyloxy carbonyl group, a dodecyloxycarbonyl group, and the like.

The aryloxycarbonyl group as the substituent may include, for example, a phenyloxycarbonyl group, a naphthyloxycarbonyl group, and the like.

[Copolymer]

The copolymer of the present disclosure may include a structural unit (Structural Unit (1)) represented by Chemical Formula 1. The copolymer having the following structure has a deep HOMO level. For this reason, the electroluminescence device (especially a quantum dot electroluminescence device) which has the copolymer of the present disclosure (particularly in a hole transport layer or a hole injection layer) has improved luminous efficiency. In addition, high durability (long light emission life-span), high current efficiency, and low driving voltage may be achieved. The copolymer of the present disclosure may comprise a plurality of structural unit (Structural Unit (1)) represented by Chemical Formula 1, or may comprises a plurality of two or more different forms of Structural Units (1). The plurality of structural units (1) may exist in a block type or in a random type.

Chemical Formula 1

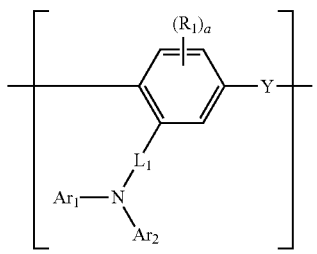

(1)

In Chemical Formula 1, $Ar_1$ and $Ar_2$ are independently a substituted or unsubstituted aromatic hydrocarbon group having 6 to 30 carbon atoms or a substituted or unsubstituted aromatic heterocyclic group having 3 to 30 ring-member atoms. Herein, the aromatic hydrocarbon group having 6 to 30 carbon atoms is not particularly limited, but may be specifically, groups derived from aromatic hydrocarbon compounds of benzene (phenyl group), pentalene, indene, naphthalene, anthracene, azulene, heptalene, acenaphthene, phenalene, fluorene, phenanthrene, biphenyl, terphenyl, quaterphenyl, quinquephenyl, pyrene, 9,9-diphenyl fluorene, 9,9'-spirobi[fluorene], 9,9-dialkyl fluorene, and the like. The monovalent aromatic heterocyclic group having 3 to 30 ring-member atoms is not particularly limited, but may be specifically monovalent groups derived from heterocyclic aromatic compounds of acridine, phenazine, benzoquinoline, benzoisoquinoline, phenanthridine, phenanthroline, anthraquinone, fluorenone, dibenzofuran, dibenzothiophene, carbazole, imidazophenanthridine, benzimidazophenanthridine, azadibenzofuran, 9-phenyl carbazole, azacarbazole, azabenzothiophene, diazadibenzofuran, diazacarbazole, diazabenzothiophene, xanthone, thioxanthone, pyridine, quinolone, and anthraquinoline. In an aspect, the monovalent aromatic heterocyclic group having 3 to 30 ring-member atoms preferably has 4 to 30 ring-member atoms, and even more preferably has 5 to 30 ring-member atoms, which can include carbon atoms. $Ar_1$ and $Ar_2$ (unsubstituted form) may be an aromatic hydrocarbon group as described above; a structure in which two or more aromatic hydrocarbon groups as described above are combined; an aromatic heterocyclic group as described above; a structure in which two or more aromatic heterocyclic groups as described above are combined; or a structure in which one or more aromatic hydrocarbon groups as described above and one or more aromatic heterocyclic groups are combined.

Among them, in view of a deeper HOMO level, at least one of $Ar_1$ or $Ar_2$ may be a group represented by Chemical Formula 1-2.

Chemical Formula 1-2

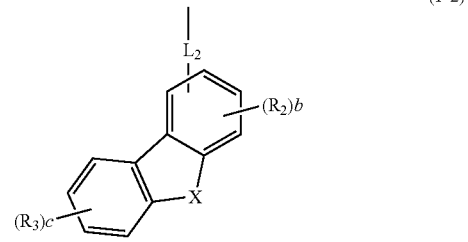

(1-2)

In Chemical Formula 1-2,
$L_2$ is a single bond, a substituted or unsubstituted aromatic hydrocarbon group having 6 to 30 carbon atoms, or a substituted or unsubstituted aromatic heterocyclic group having 3 to 30 ring-member atoms. Herein, the aromatic hydrocarbon group having 6 to 30 carbon atoms and the aromatic heterocyclic group having 3 to 30 ring-member atoms may be exemplified in the same way as the divalent group derived from the aromatic hydrocarbon compound and heterocyclic aromatic compound in $Ar_1$ and $Ar_2$. Among them, from the viewpoint of a deeper HOMO level, $L_2$ may be desirably a single bond, benzene (phenylene group) or fluorene (fluorenyl group), and more desirably a single bond or benzene (phenylene group).

each $R_2$ and each $R_3$ may are independently a hydrogen, a substituted or unsubstituted alkyl group having 1 to 20 carbon atoms, a substituted or unsubstituted alkoxy group having 1 to 20 carbon atoms, a substituted or unsubstituted aromatic hydrocarbon group having 6 to 30 carbon atoms, or a substituted or unsubstituted aromatic heterocyclic group having 3 to 30 ring-member atoms, or optionally, two adjacent $R_2$, or two adjacent $R_3$, join to form a ring structure. Herein, as an alkyl group having 1 to 20 carbon atoms and an alkoxy group having 1 to 20 carbon atoms, groups such as those listed in the "substituent" above may be exemplified. Further, the aromatic hydrocarbon group having 6 to 30 carbon atoms and the aromatic heterocyclic group having 3 to 30 ring-member atoms may be exemplified in the same way as the groups derived from the aromatic hydrocarbon compound and heterocyclic aromatic compound in $Ar_1$ and $Ar_2$. Among these, each $R_2$ and each $R_3$ may be independently a hydrogen, or an alkyl group having 1 to 10 carbon atoms, and desirably hydrogen. X represents a group that is $=CR_4R_5—$, $—O—$, or $—S—$. In an embodiment, X may be $=CR_4R_5—$ or $—O—$. When X is $=CR_4R_5—$, $R_4$ and $R_5$ may be independently a substituted or unsubstituted aryl group having 6 to 30 carbon atoms, a substituted or unsubstituted alkyl group having 1 to 20 carbon atoms, or $R_4$ and $R_5$ may join to form a ring structure. Herein, as the aryl group having 6 to 30 carbon atoms, the same aryl group as listed in the "substituent" above may be exemplified. Further, examples of the alkyl group having 1 to 20 carbon atoms include the same alkyl groups listed in the "substituent" above. Of these, from the viewpoint of a deeper HOMO level, $R_4$ and $R_5$ may each independently form a ring structure in which an alkyl group having 1 to 8 carbon atoms or an aryl group are bonded to each other together with the carbon atom to which each is bonded, and for example a ring structure (spirobi[fluorenyl] group) in which an alkyl group having 1 to 3 carbon atoms or a phenyl group are bonded to each other together with together with the carbon atoms to which each is bonded.

b may be an integer of 0, 1, 2, or 3.

c may be an integer of 0, 1, 2, 3, or 4.

In other words, in an embodiment, the group represented by Chemical Formula 1-2 may be a functional group selected from Chemical Formulas 3 to 18.

Chemical Formulas 3 to 18

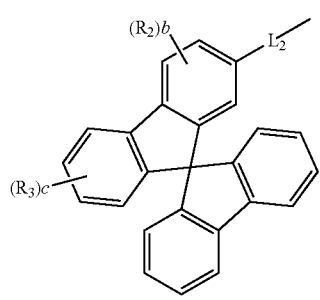
(3)

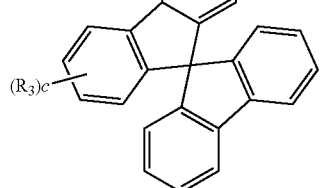
(4)

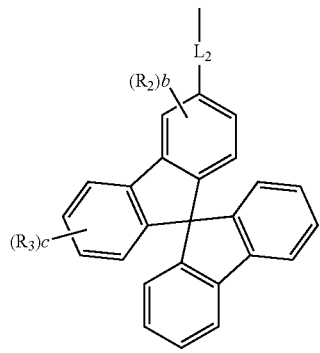
(5)

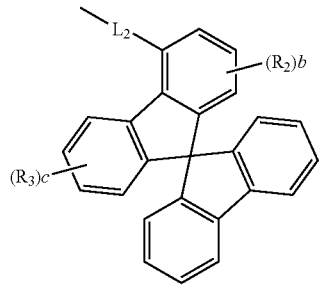
(6)

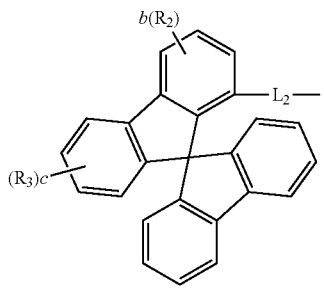

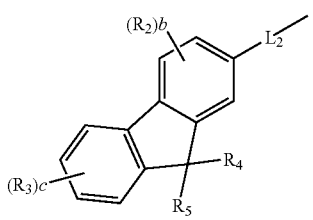
(7)

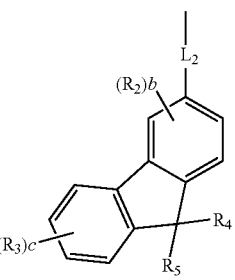
(8)

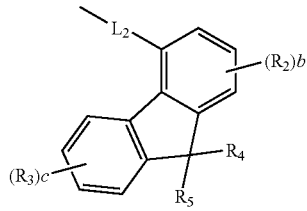
(9)

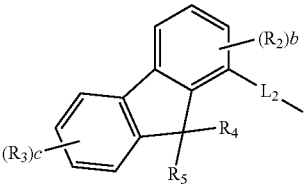
(10)

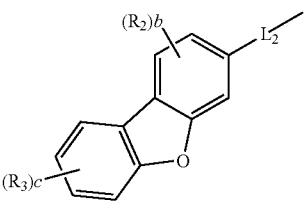
(11)

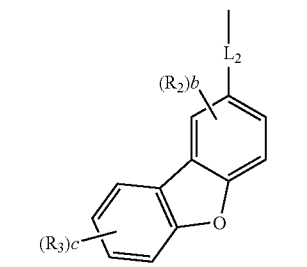
(12)

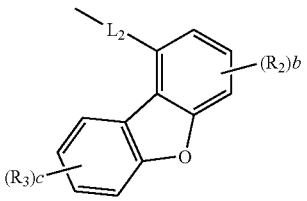
(13)

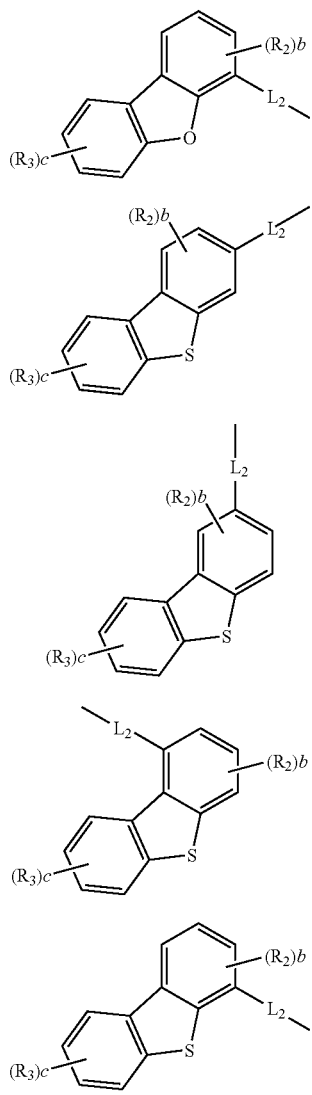

(14)

(15)

(16)

(17)

(18)

In Chemical Formulas 3 to 18,
$L_2$ may be a single bond, a substituted or unsubstituted aromatic hydrocarbon group having 6 to 30 carbon atoms, or a substituted or unsubstituted aromatic heterocyclic group having 3 to 30 ring-member atoms,
each $R_2$ and each $R_3$ may be independently a hydrogen, a substituted or unsubstituted alkyl group having 1 to 20 carbon atoms, a substituted or unsubstituted alkoxy group having 1 to 20 carbon atoms, a substituted or unsubstituted aromatic hydrocarbon group having 6 to 30 carbon atoms, or a substituted or unsubstituted aromatic heterocyclic group having 3 to 30 ring-member atoms,
b may be an integer of 0, 1, 2, or 3, and
c may be an integer of 0, 1, 2, 3, or 4. Meanwhile, detailed descriptions of $L_2$, $R_2$, $R_3$, b, and c in Chemical Formulas 3 to 18 are the same as those in Chemical Formula 1-2, and thus descriptions thereof will be omitted herein.

In Chemical Formula 1, as a combination of $Ar_1$ and $Ar_2$, $Ar_1$ may be a group selected from Chemical Formulas 3 to 6 and Chemical Formulas 11 to 14, and $Ar_2$ may be a group selected from Chemical Formulas 7 to 14, or an aromatic hydrocarbon group having 6 to 25 carbon atoms which is substituted or unsubstituted with a linear alkyl group having 1 to 8 carbon atoms or a branched alkyl group having 3 to 8 carbon atoms. In addition, as a combination of $Ar_1$ and $Ar_2$, $Ar_1$ may be a group selected from Chemical Formulas 3, 5 and 14, and $Ar_2$ may be a group selected from Chemical Formulas 7 and 14 and an aromatic hydrocarbon group having 6 to 25 carbon atoms (especially biphenyl group) substituted or unsubstituted with a linear alkyl group having 3 to 5 carbon atoms. The copolymers having these combinations may have deeper HOMO levels. Herein, the aromatic hydrocarbon group having 6 to 25 carbon atoms may be monovalent groups derived from aromatic hydrocarbons such as benzene (phenyl group), pentalene, indene, naphthalene, anthracene, azulene, heptalene, acenaphthene, phenalene, fluorene, phenanthroline, biphenyl, terphenyl and quaterphenyl, pyrene, 9,9-diphenyl fluorene, 9,9'-spirobi[fluorene], and 9,9-dialkyl fluorene.

In an embodiment, $Ar_1$ may be a group selected from Chemical Formulas 3 to 6 and Chemical Formulas 11 to 14, and $Ar_2$ may be a group selected from substituted or unsubstituted benzene, substituted or unsubstituted fluorene, substituted or unsubstituted biphenyl, substituted or unsubstituted dibenzofuran, dibenzothiophene, or a combination of two or more thereof. In an embodiment, $Ar_1$ may be a 9,9'-spirobi[fluorenyl] group or a combination of benzene and dibenzofuran, and $Ar_2$ may be a group selected from benzene, 9,9-dimethyl fluorene, biphenyl substituted or unsubstituted an alkyl group having 1 to 5 carbon atoms, dibenzofuran, and dibenzothiophene, or a combination of two or more thereof. Particularly, one of $Ar_1$ and $Ar_2$ may be selected from Group A and the other may be selected from Group B. The copolymer including $Ar_1$ and $Ar_2$ as described above has a deeper HOMO level, and thus, it can also improve the luminous efficiency of LEDs (especially QLEDs) including the copolymer.

[Group A]

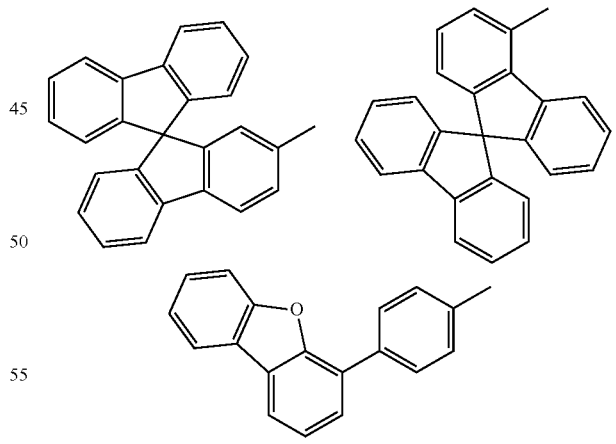

[Group B]

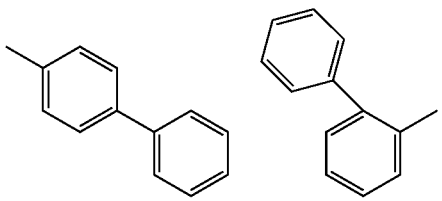

-continued

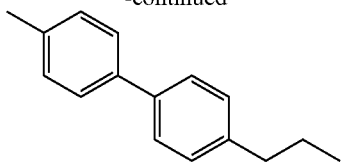

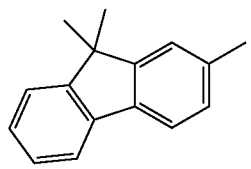

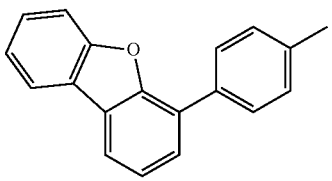

L₁ is a substituted or unsubstituted aromatic hydrocarbon group having 6 to 30 carbon atoms. Herein, the aromatic hydrocarbon group having 6 to 30 carbon atoms may be exemplified in the same manner as the group derived from the aromatic hydrocarbon compound in Ar₁ and Ar₂. Among them, from the viewpoint of a deeper HOMO level, L₁ may be a phenylene group, a fluorenylene group or a naphthylene group, and desirably a phenylene group.

Each R₁ may be independently a hydrogen, a substituted or unsubstituted alkyl group having 1 to 20 carbon atoms, a substituted or unsubstituted alkoxy group having 1 to 20 carbon atoms, a substituted or unsubstituted aromatic hydrocarbon group having 6 to 30 carbon atoms, or a substituted or unsubstituted aromatic heterocyclic group having 3 to 30 ring-member atoms, or optionally, two R₁'s may join to form a ring structure. Herein, examples of the alkyl group having 1 to 20 carbon atoms and the alkoxy group having 1 to 20 carbon atoms are the same groups as those listed in "substituent" above. In addition, the aromatic hydrocarbon group having 6 to 30 carbon atoms and the aromatic heterocyclic group having 3 to 30 ring-member atoms may be exemplified in the same way as the group derived from the aromatic hydrocarbon compound and heterocyclic aromatic compound in Ar₁ and Ar₂. Among them, R₁ may be desirably hydrogen or an alkyl group having 1 to 20 carbon atoms, and more desirably hydrogen.

a may be an integer of 0, 1, 2, or 3. In an embodiment, a may be desirably 0.

In other words, examples of Structural Unit X according to the present disclosure include the following structures (Groups 1 to 37).

[Group 1]

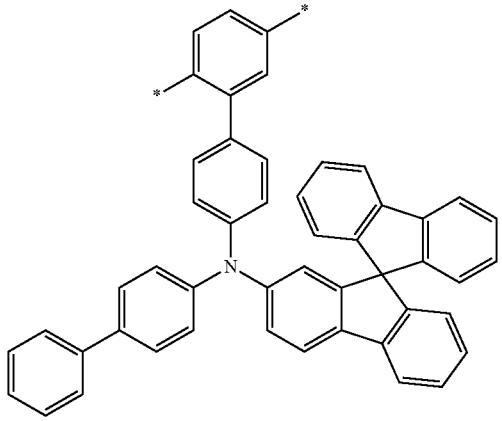

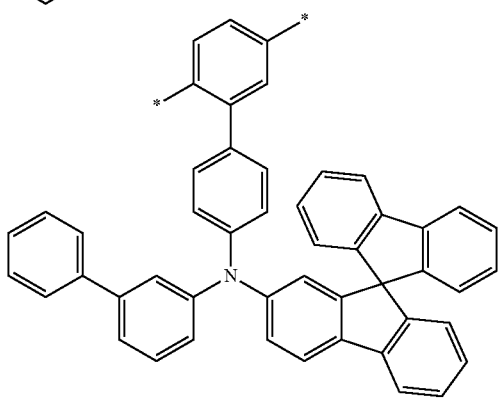

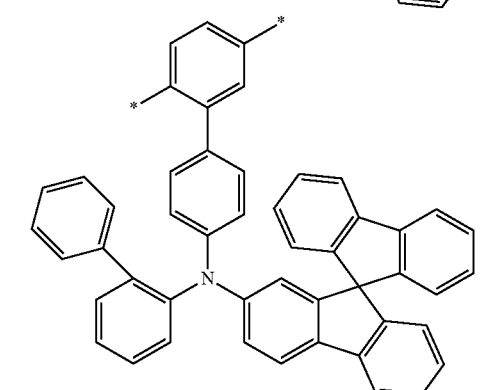

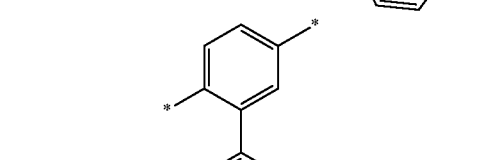

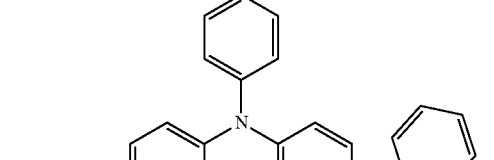

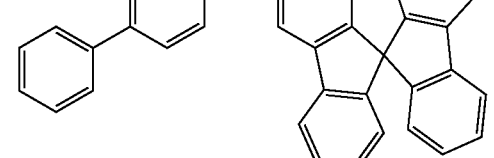

17
-continued
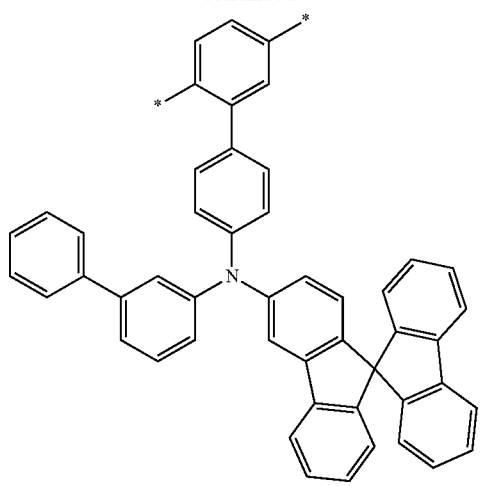
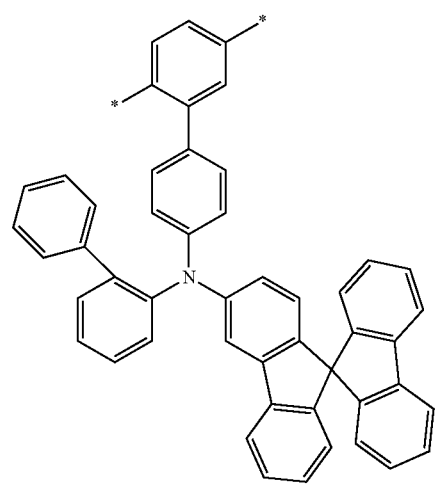
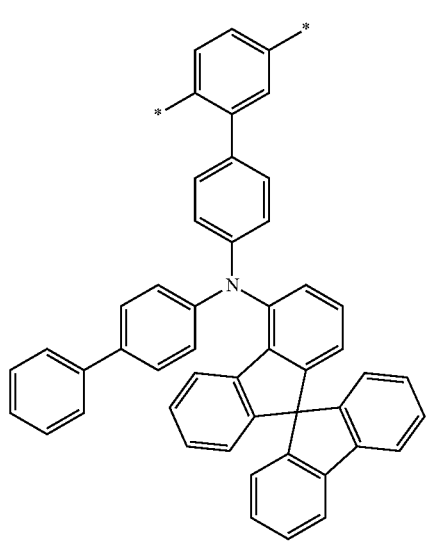
18
-continued
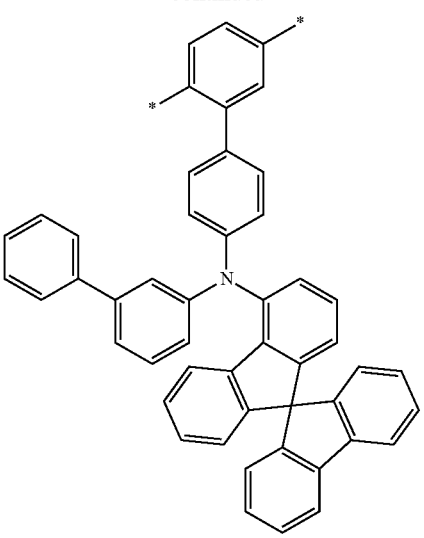
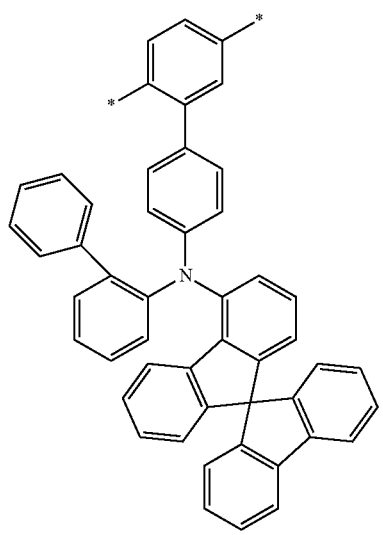
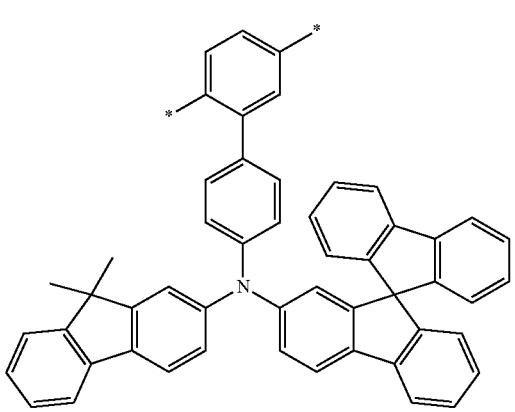

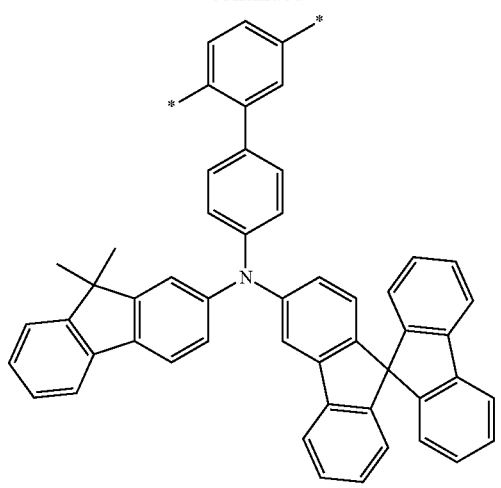
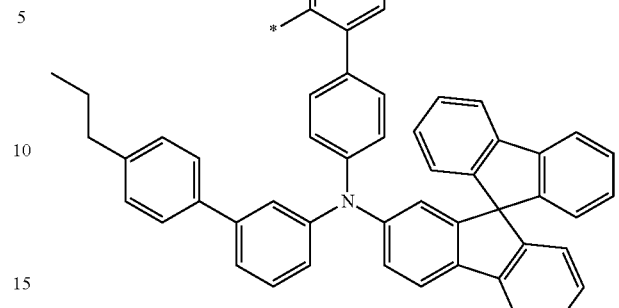
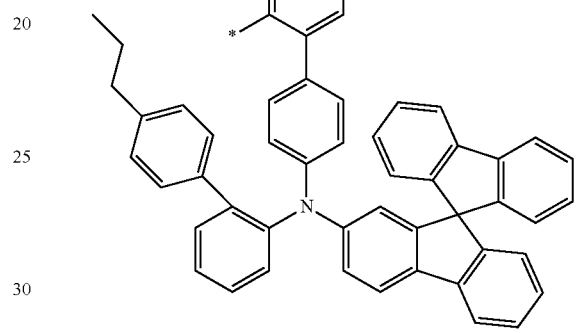
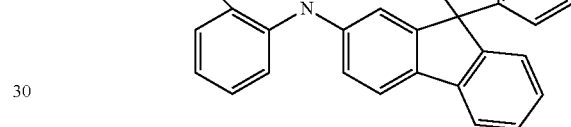
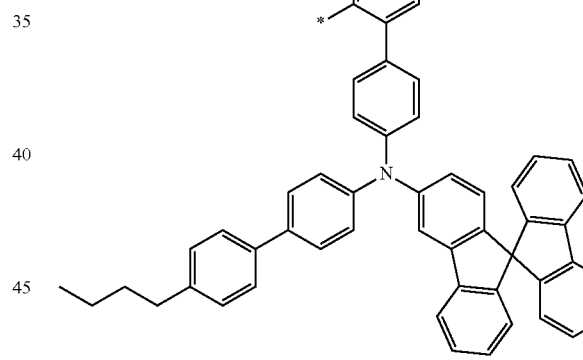
[Group 2]
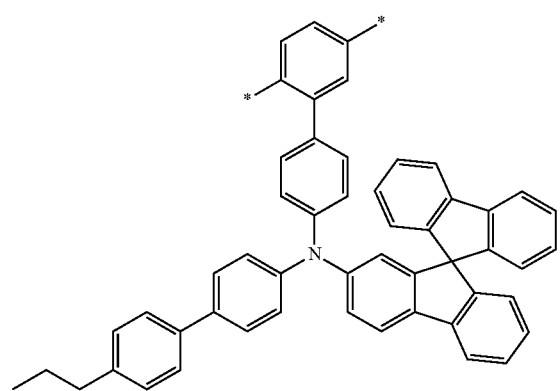
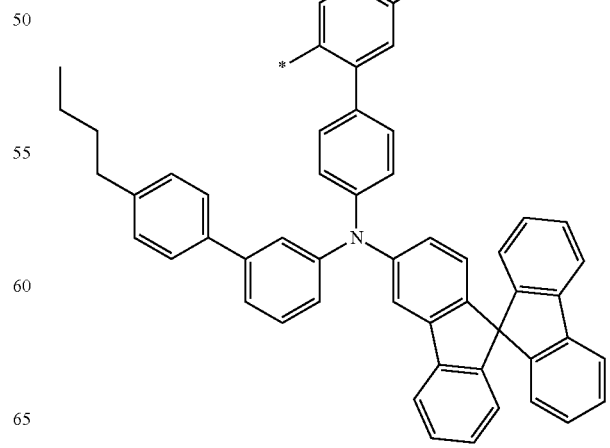

21
-continued
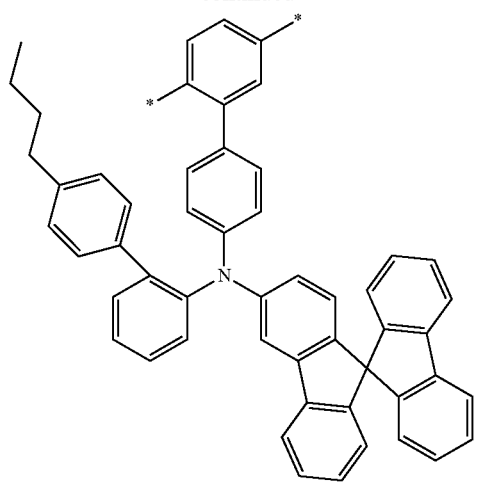
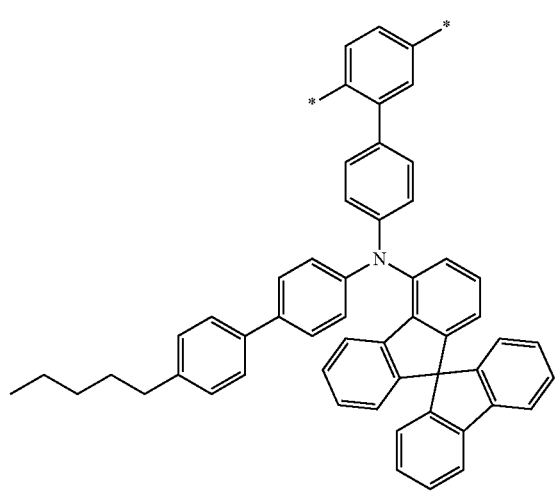
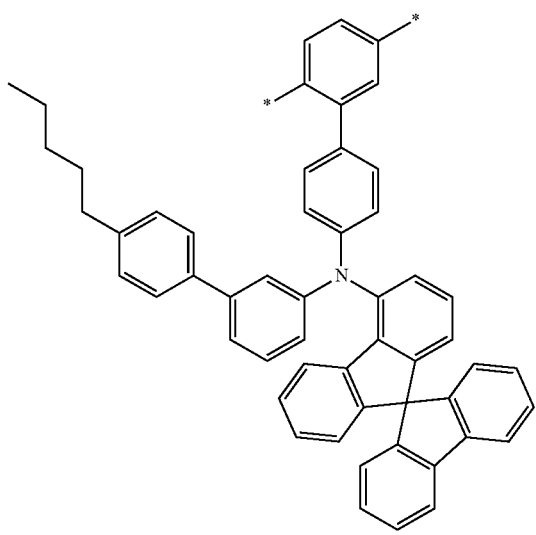
22
-continued
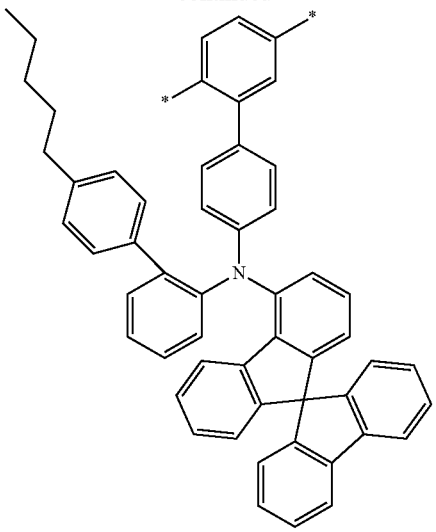
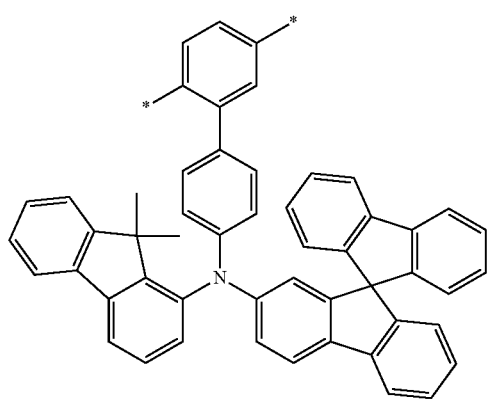
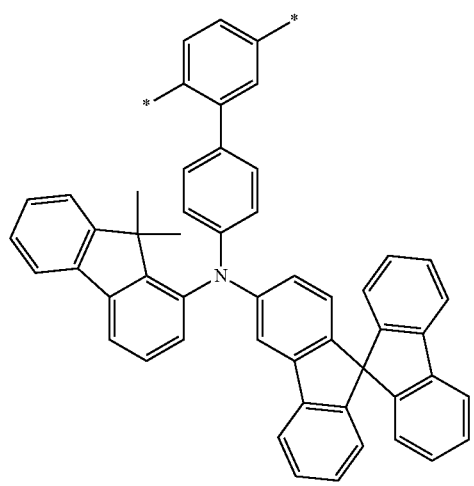

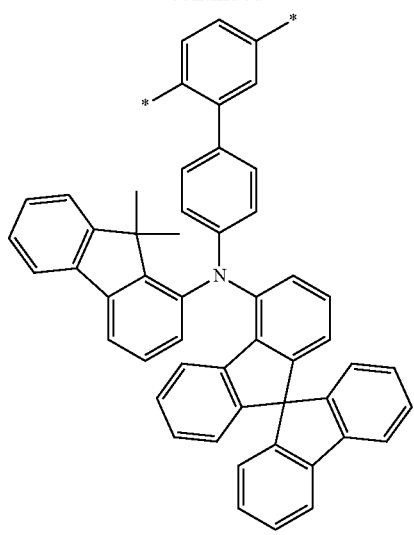
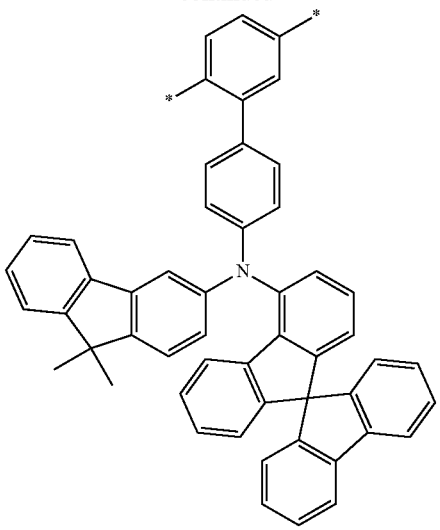
[Group 3]
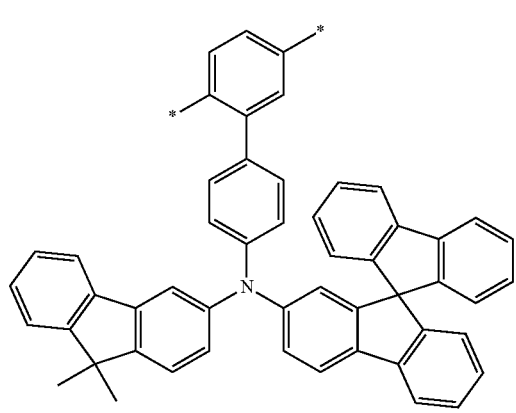
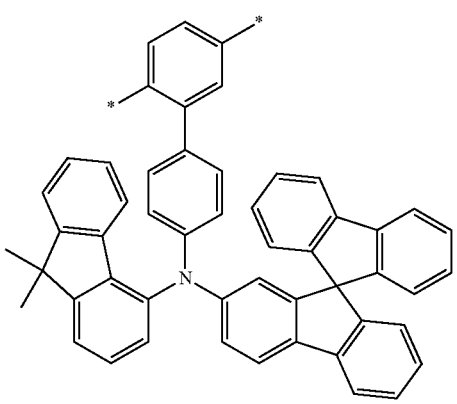
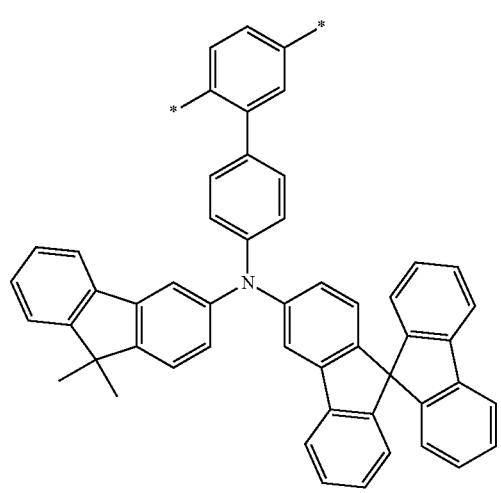
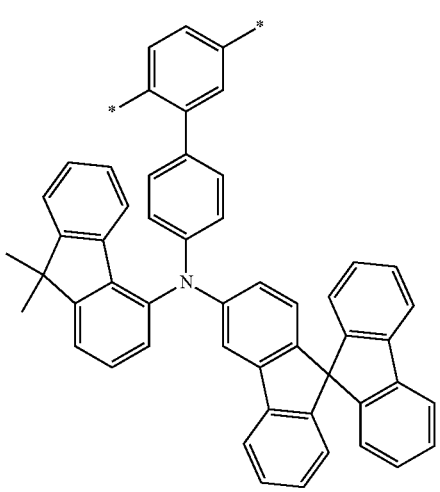

25
-continued
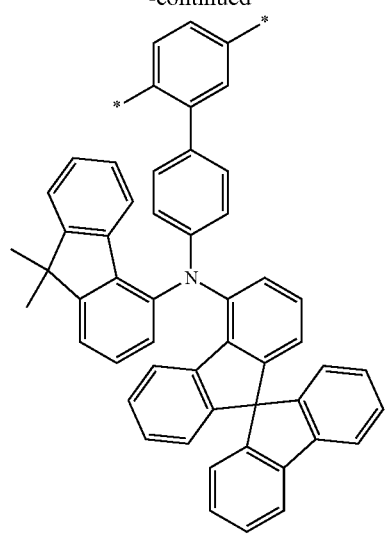
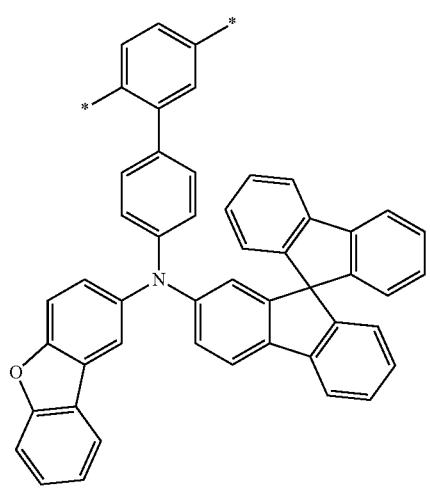
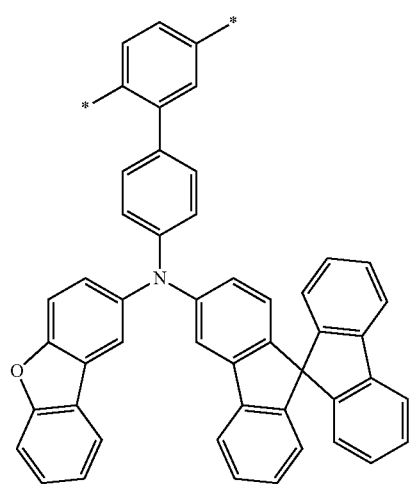
26
-continued
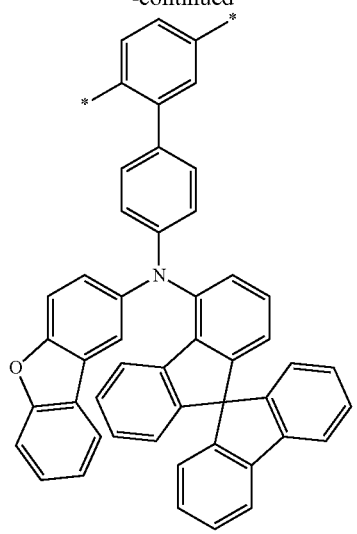
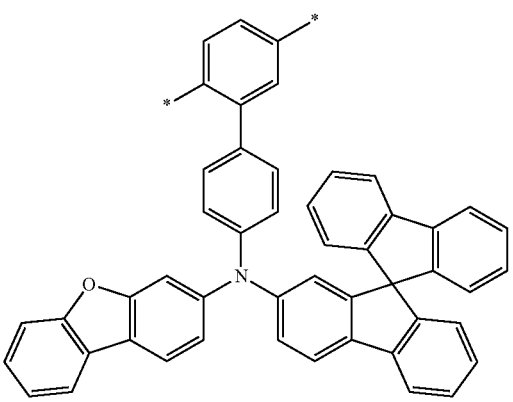
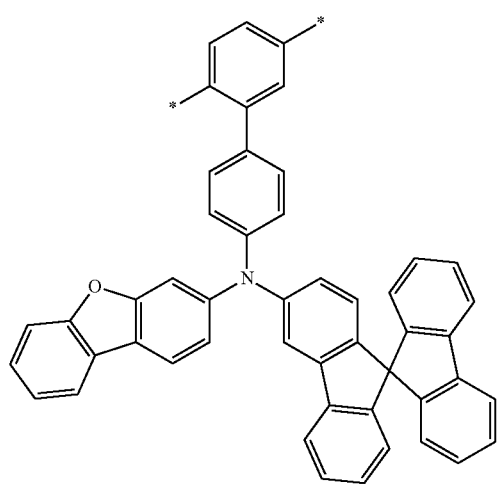

-continued
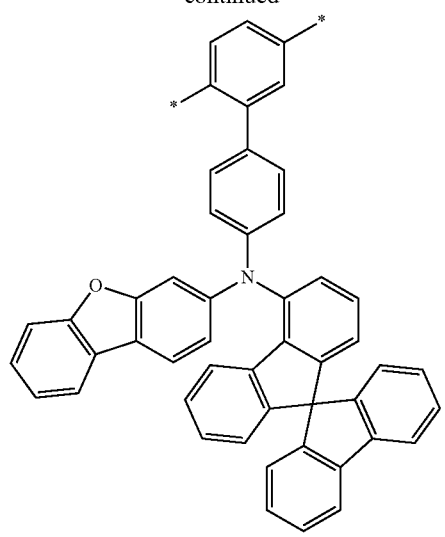
[Group 4]
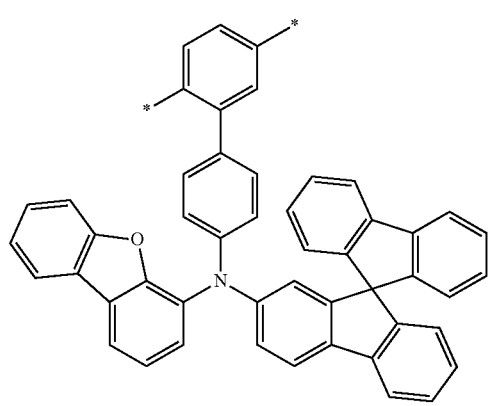
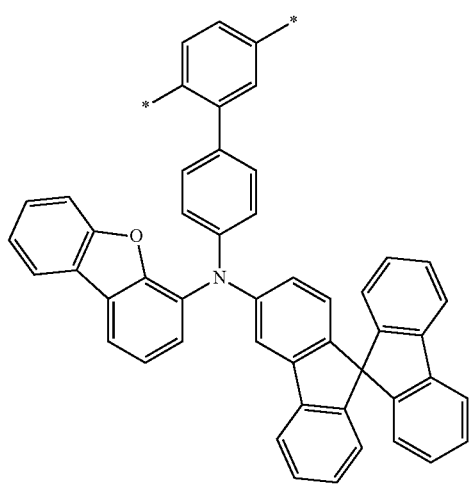
-continued
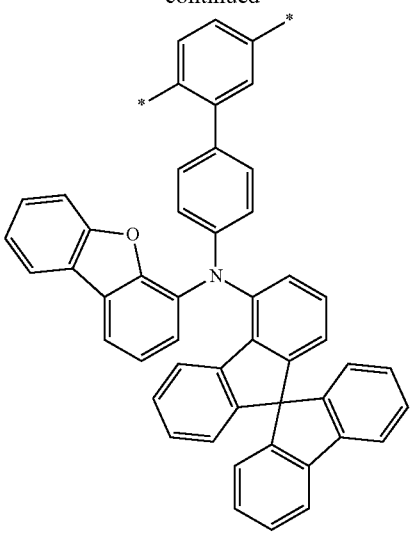
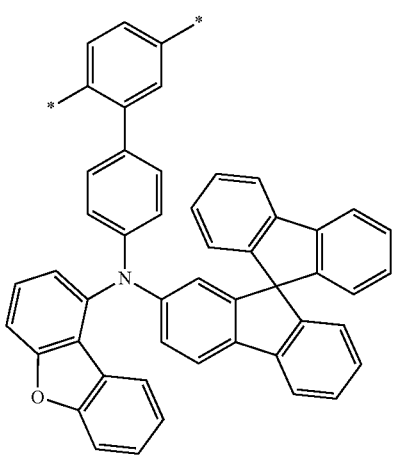
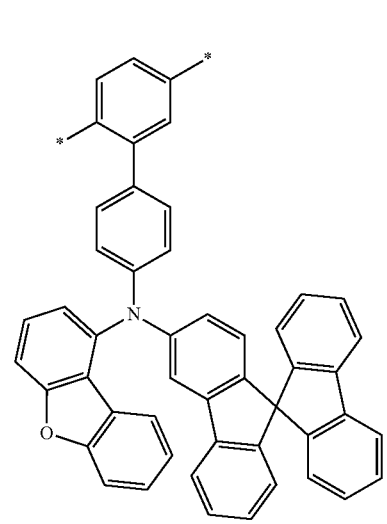

-continued
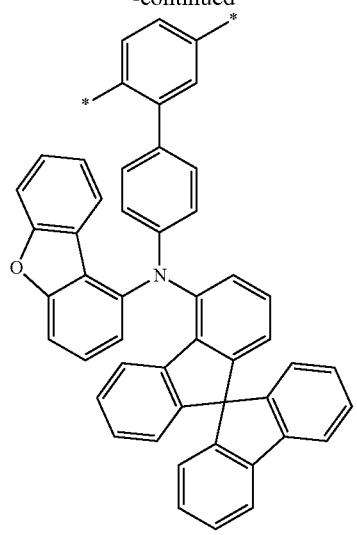
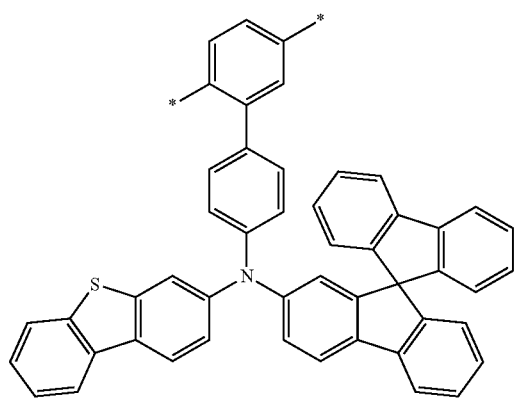
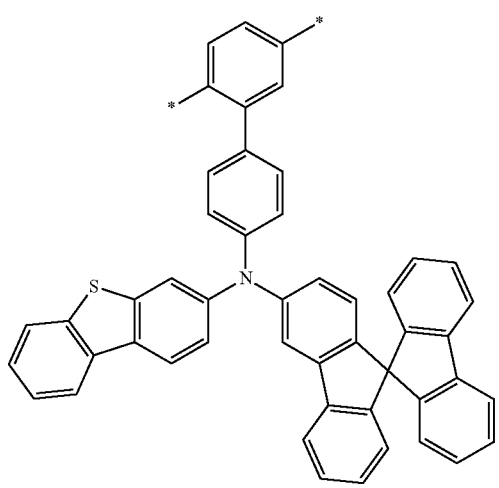
-continued
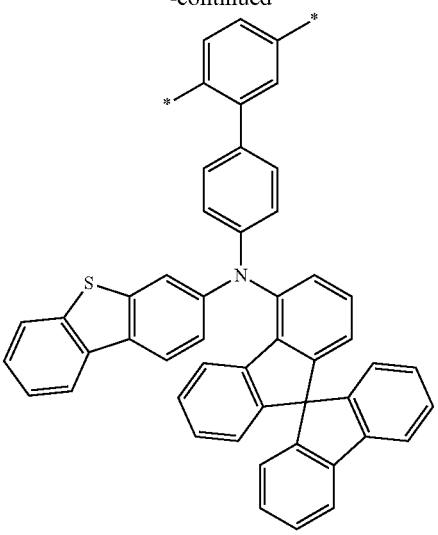
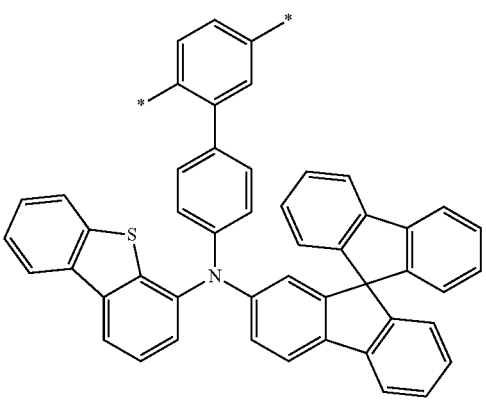
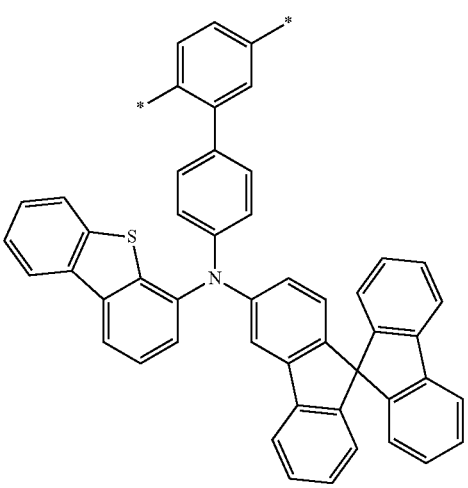

31
-continued
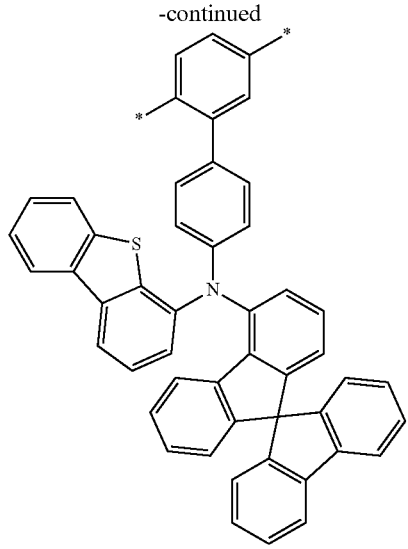
32
-continued
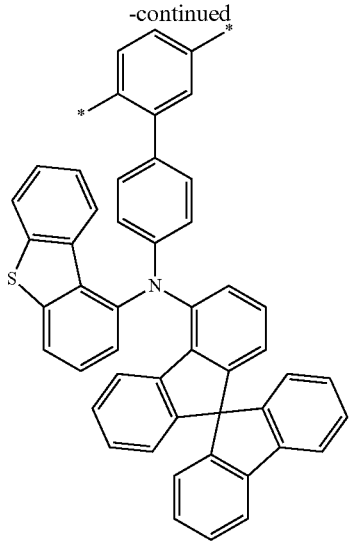
[Group 5]
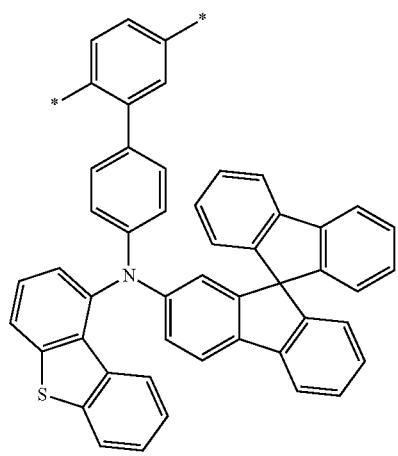
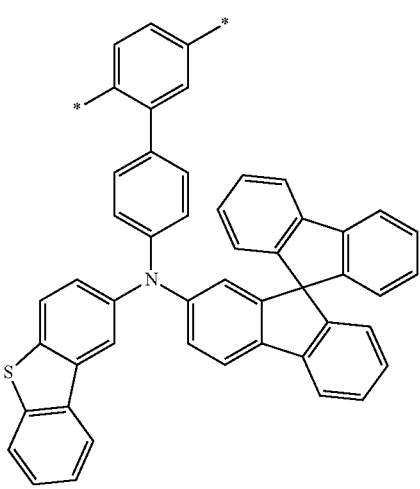
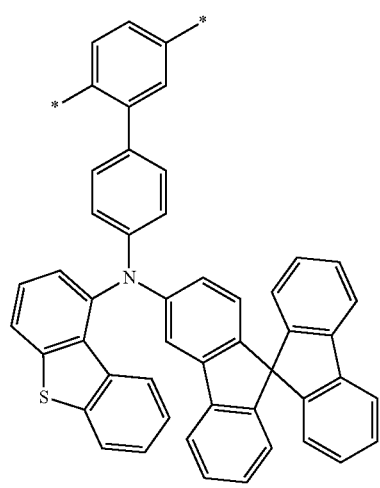
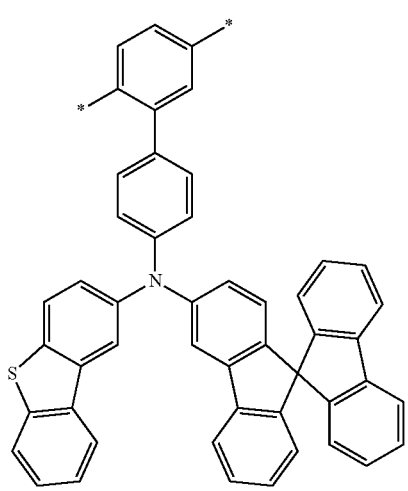

33
-continued
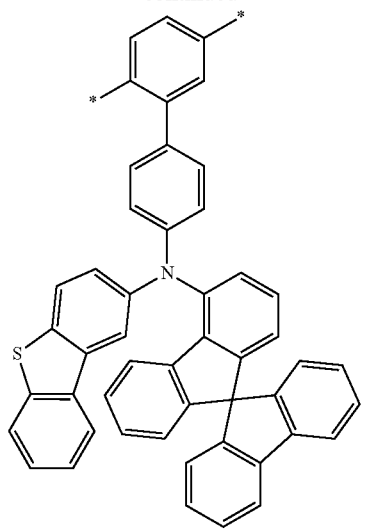
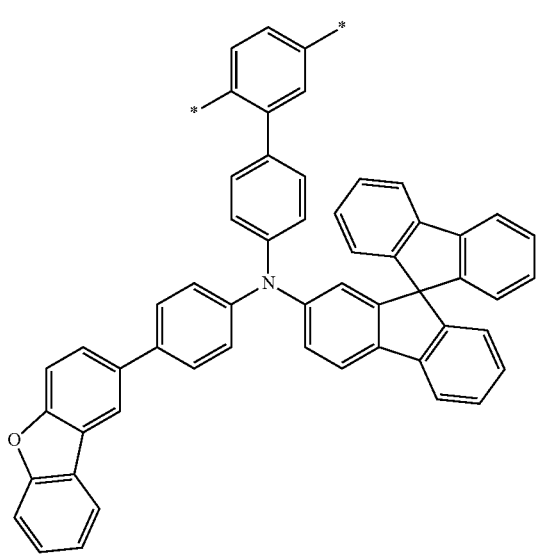
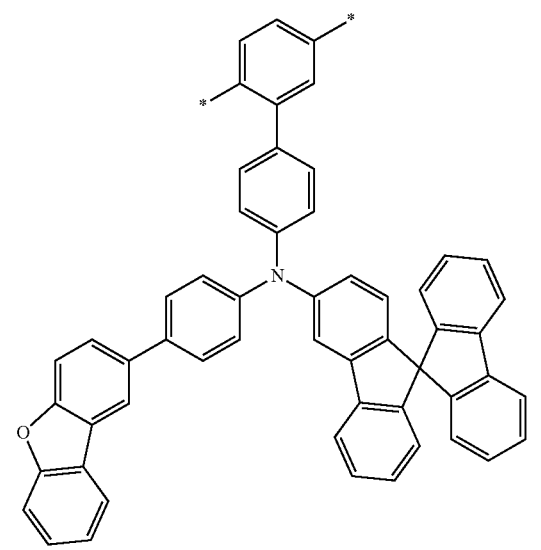
34
-continued
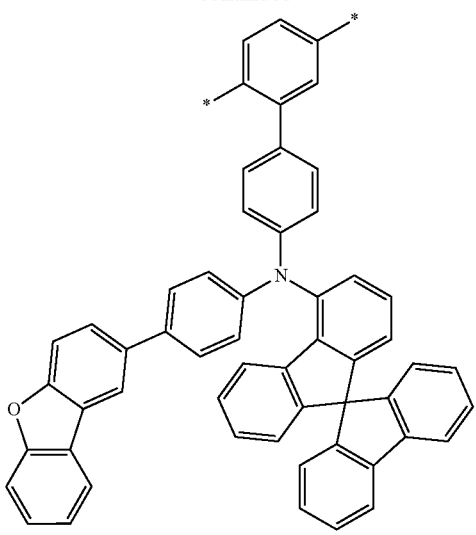
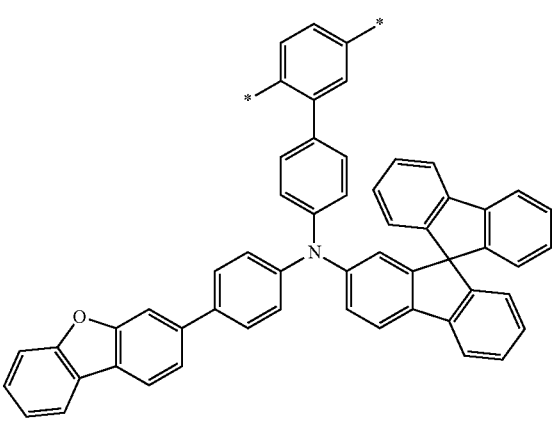
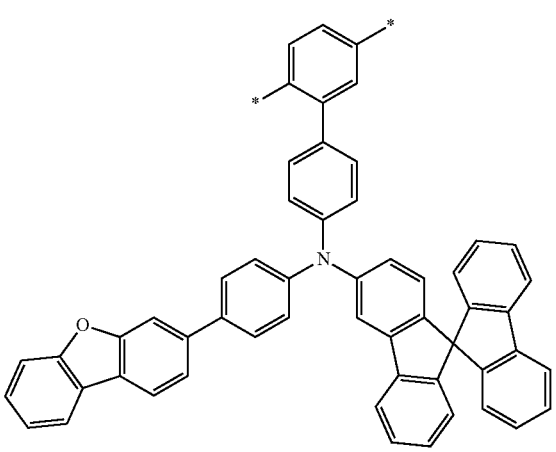

35
-continued
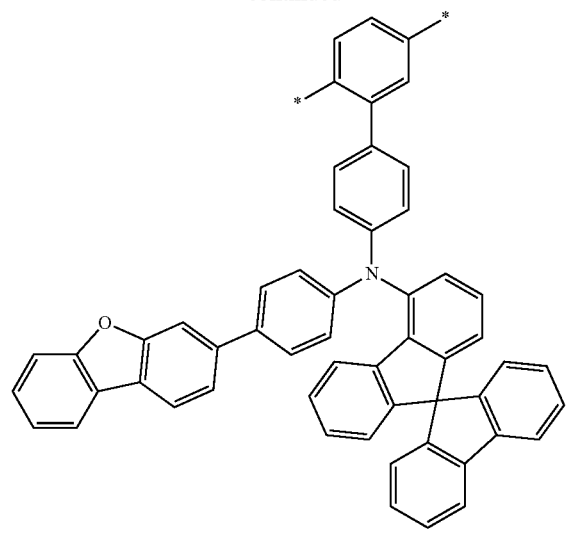
[Group 6]
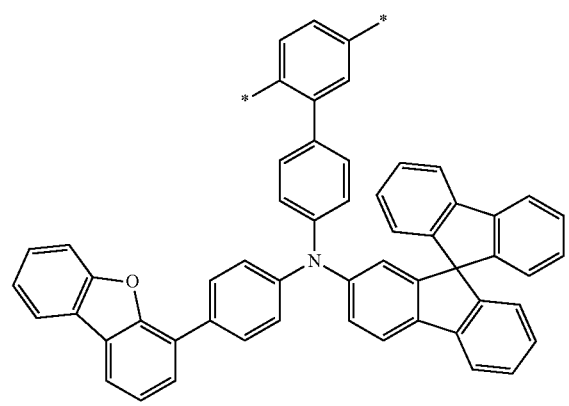
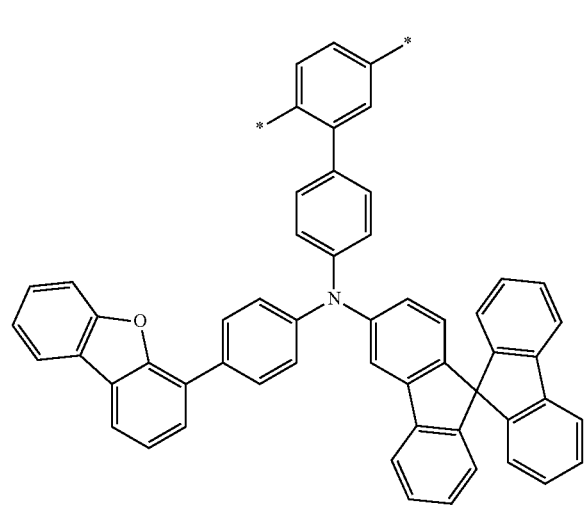
36
-continued
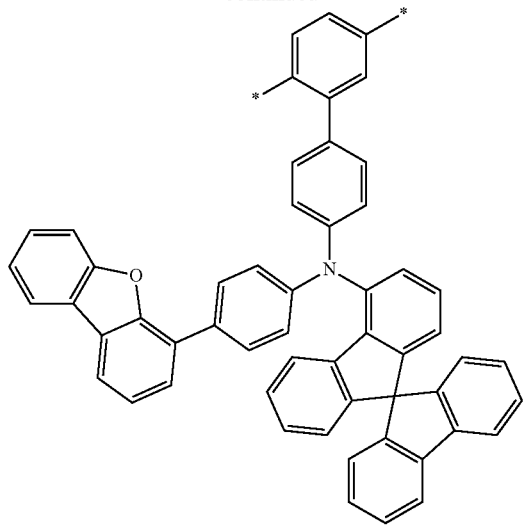
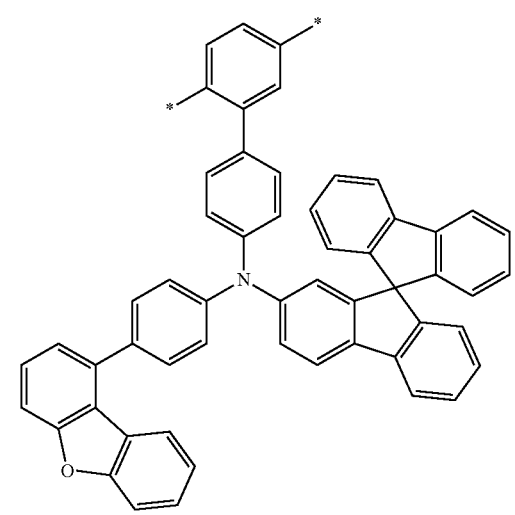
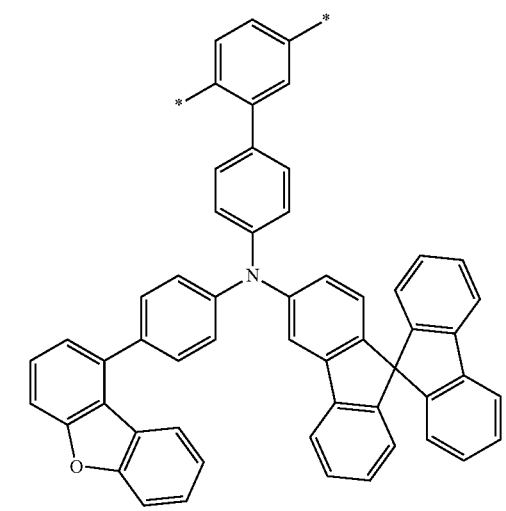

-continued
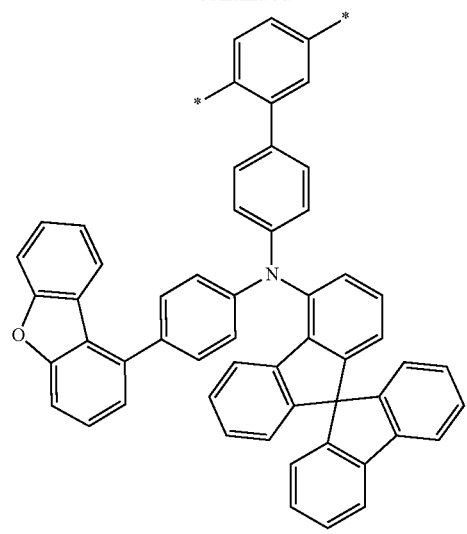
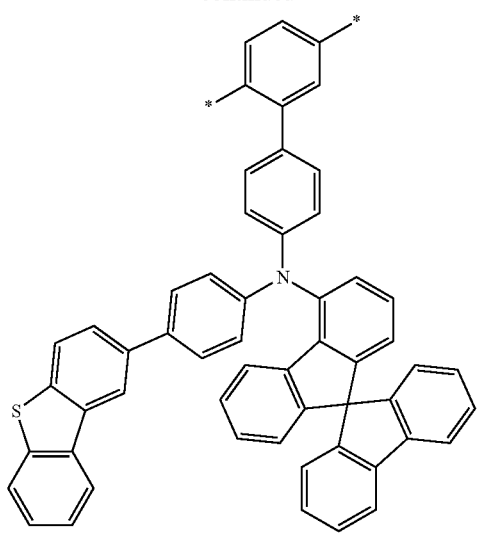
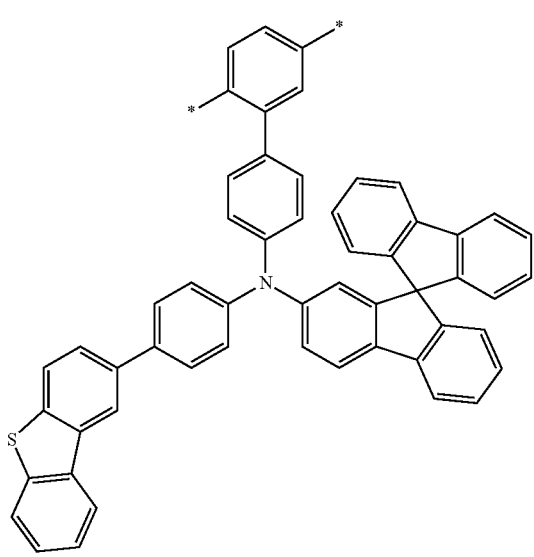
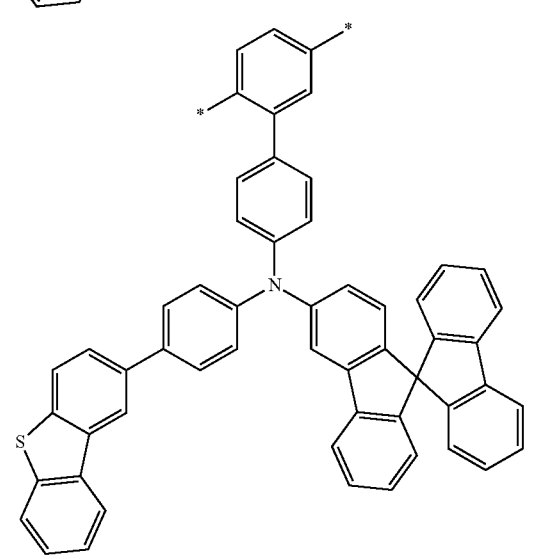
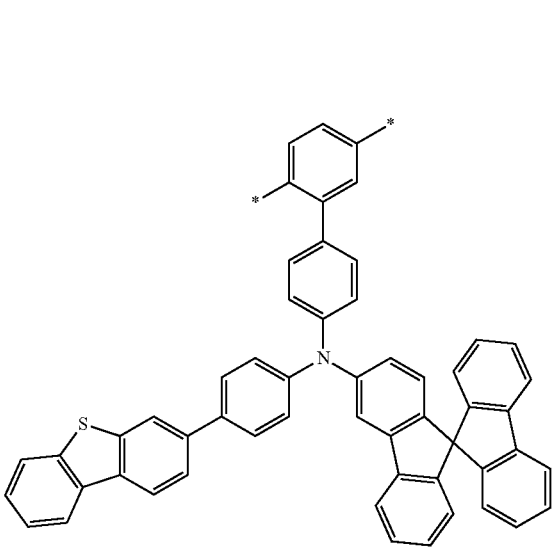

39
-continued
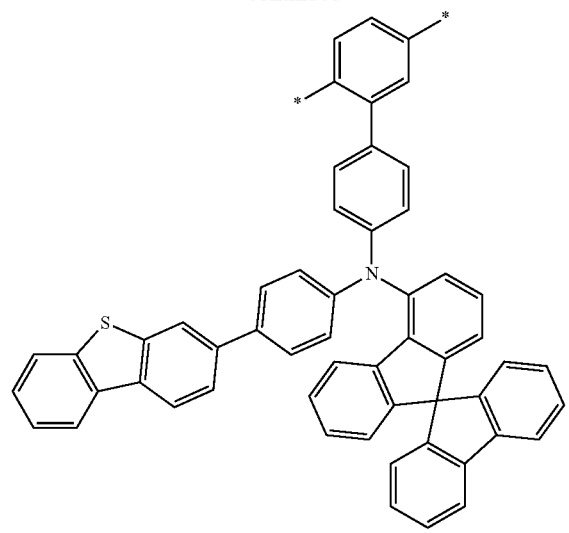
[Group 7]
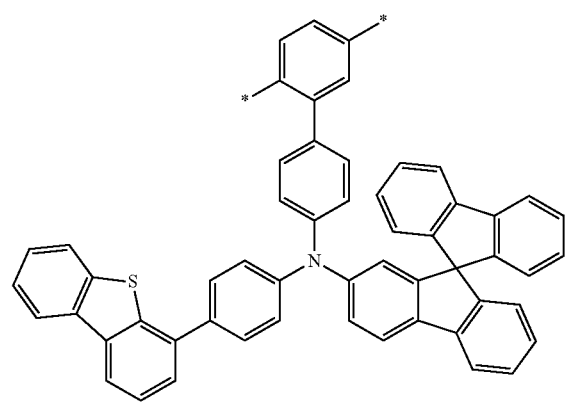
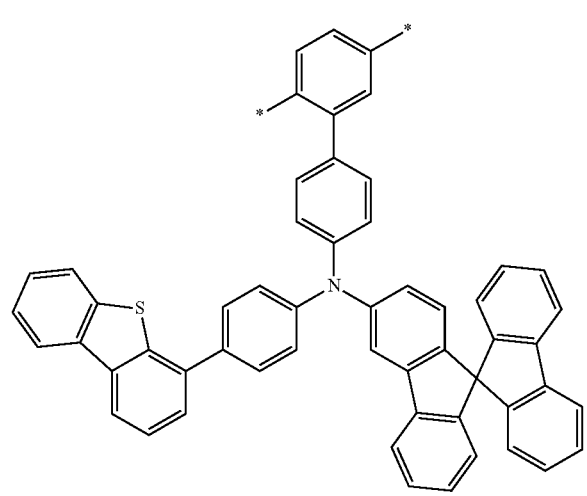
40
-continued
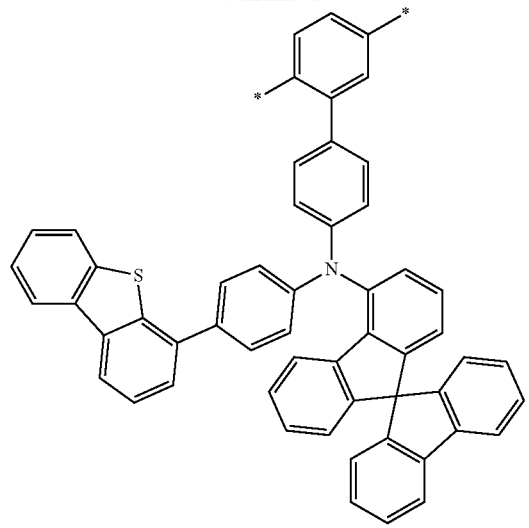
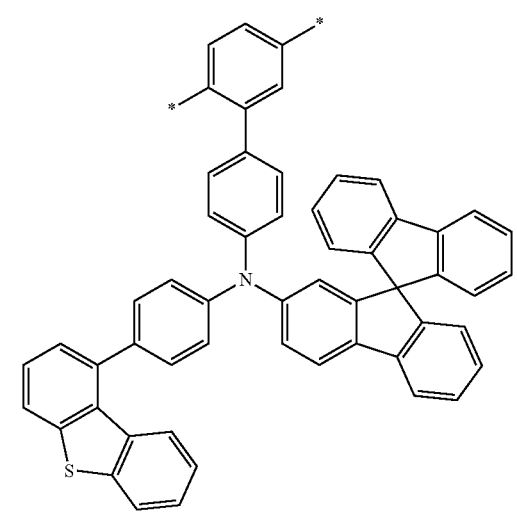
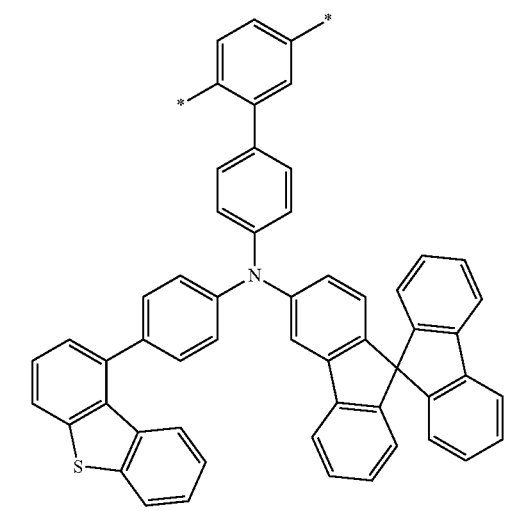

41
-continued
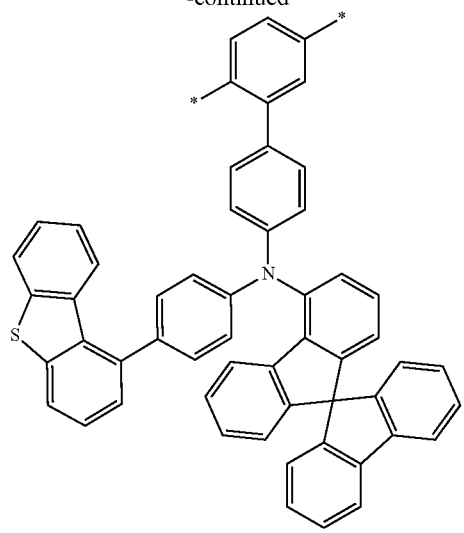
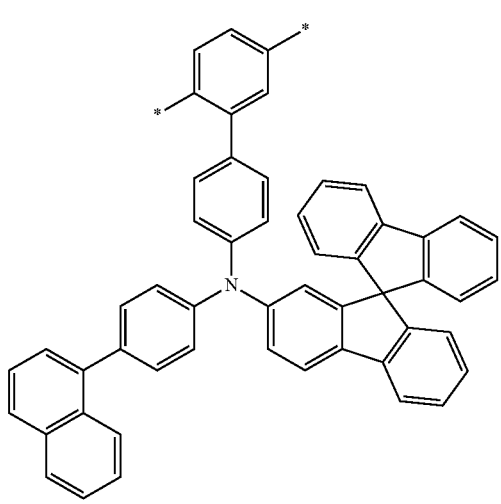
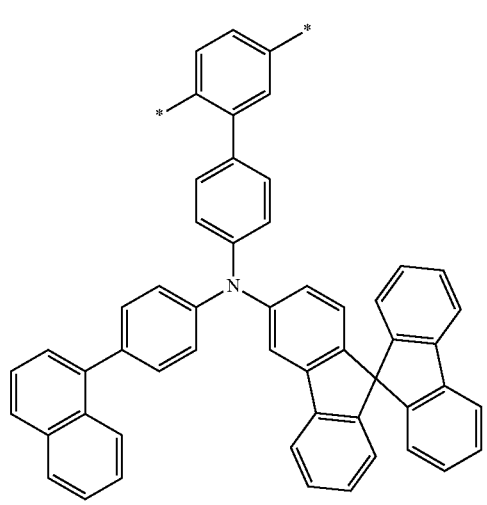
42
-continued
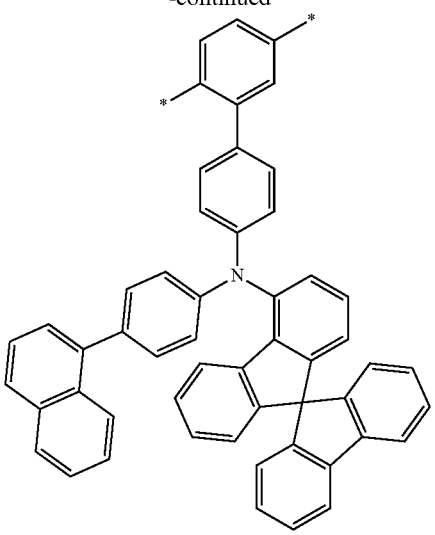
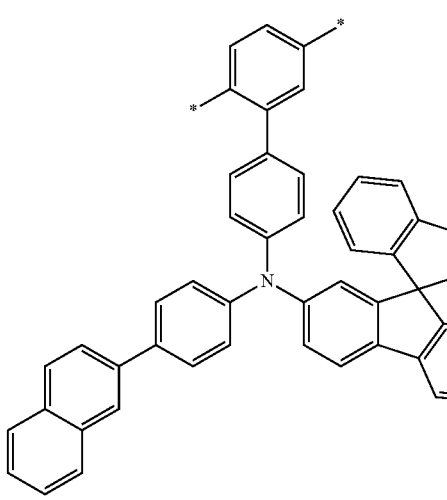
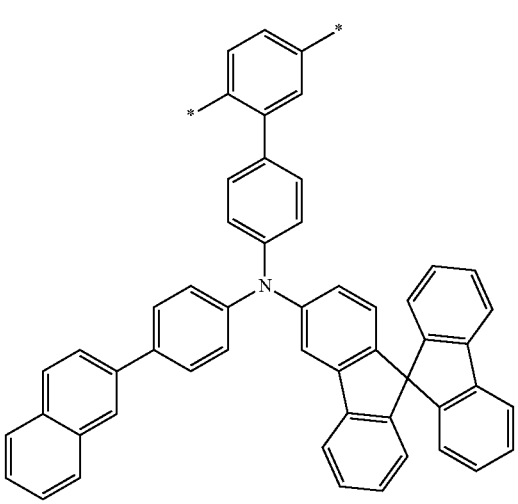

-continued
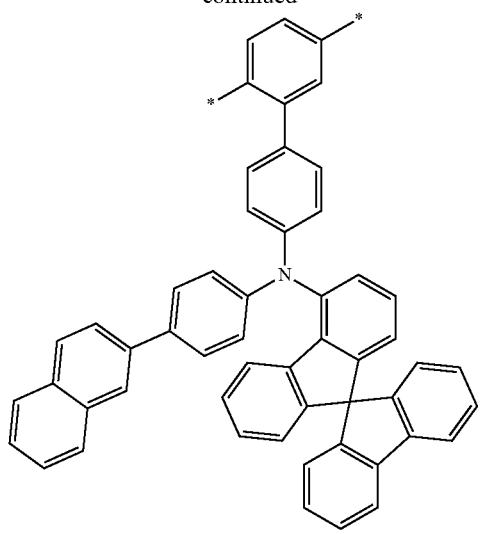
[Group 8]
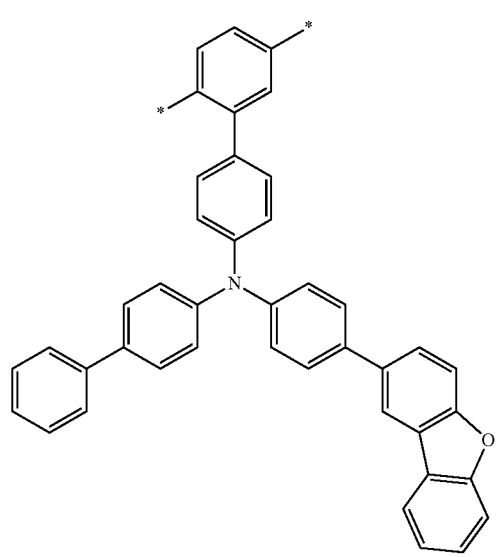
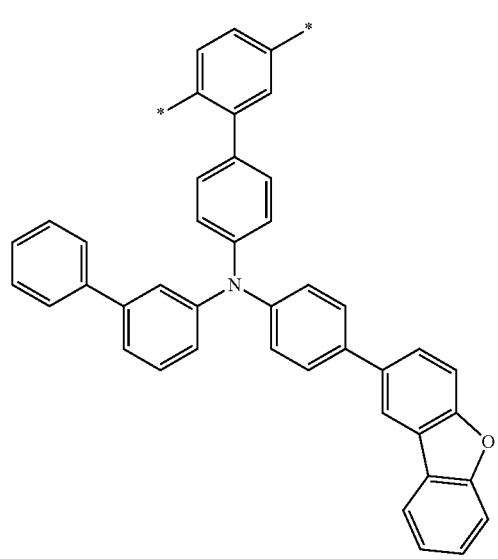
-continued
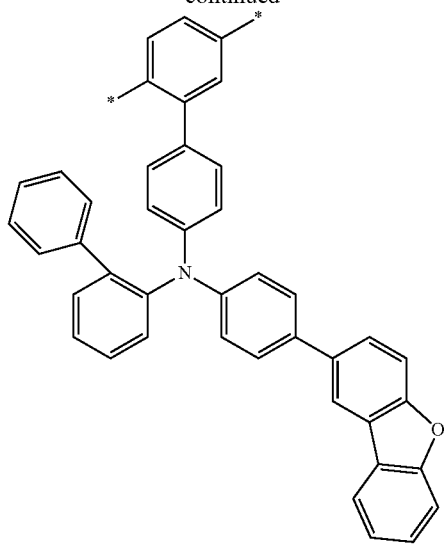
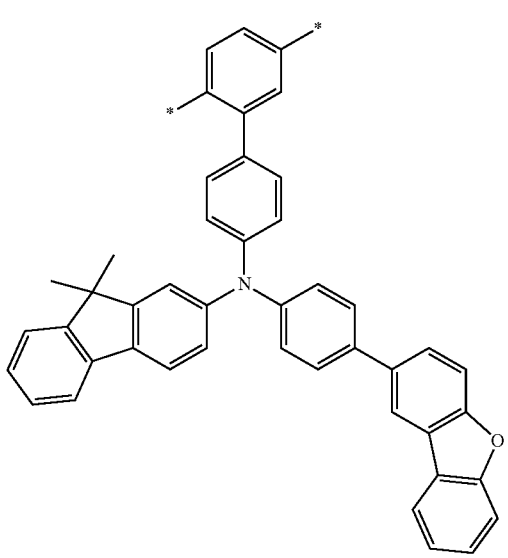
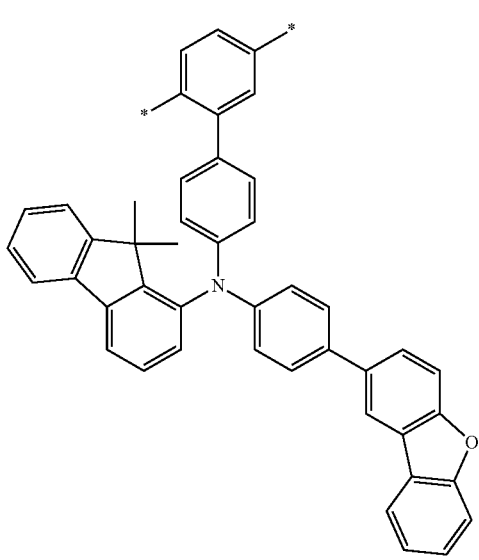

45
-continued
46
-continued
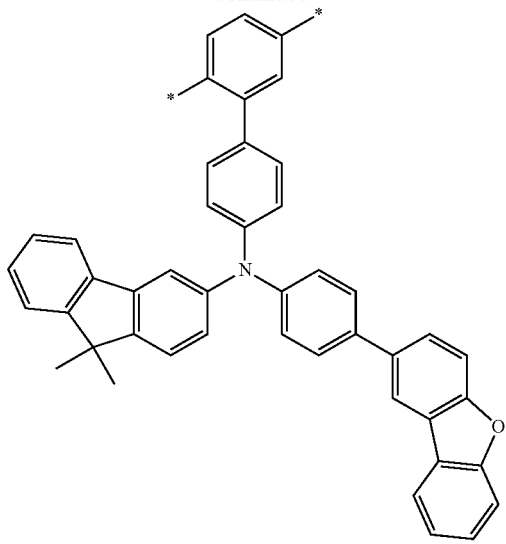
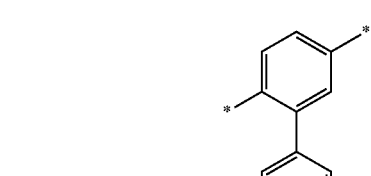
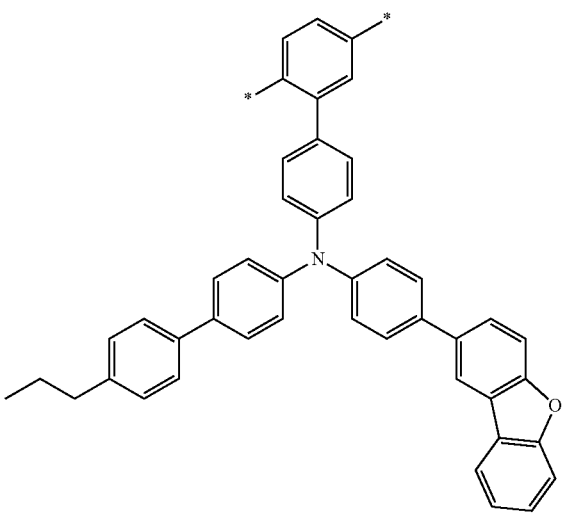
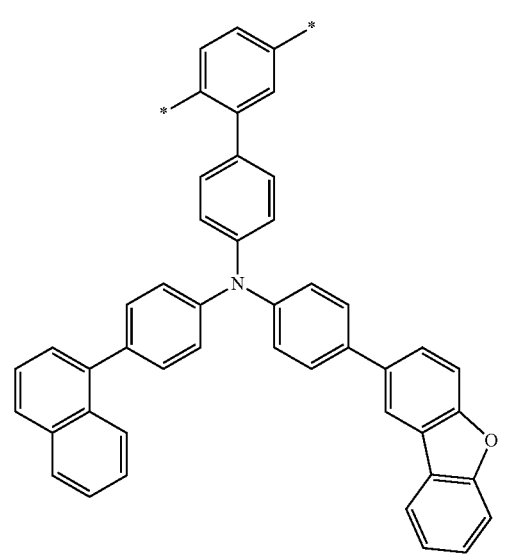

-continued
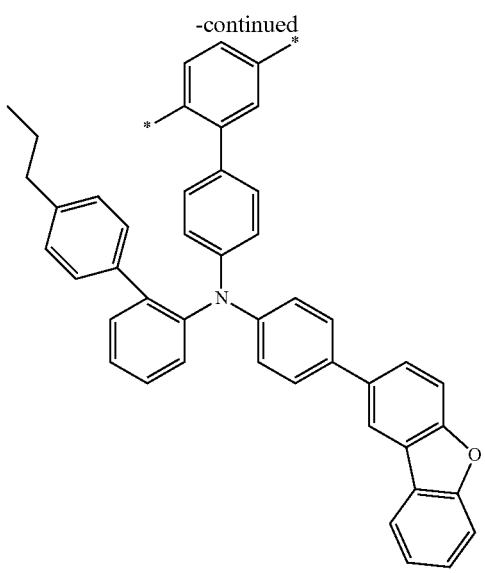
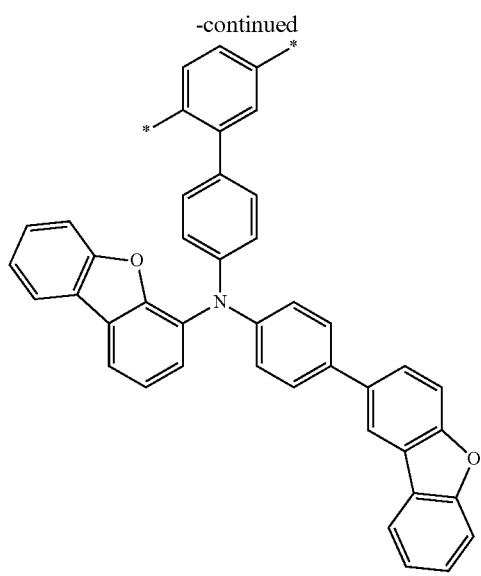
[Group 9]
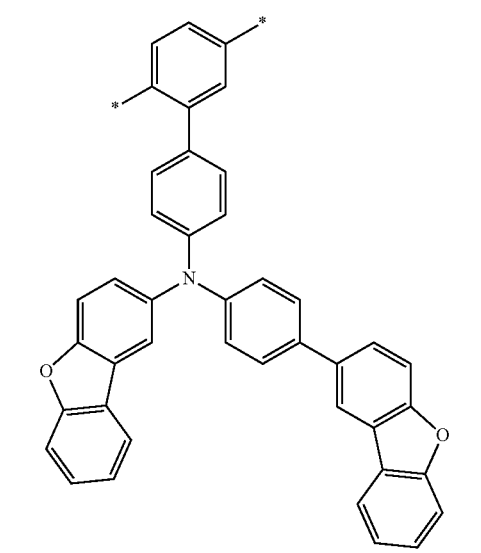
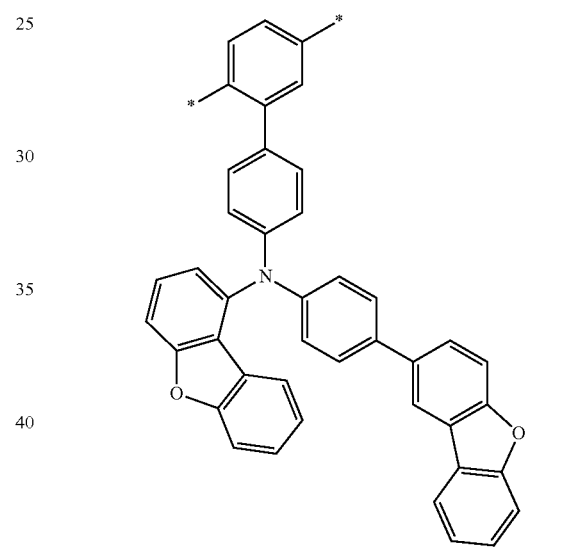
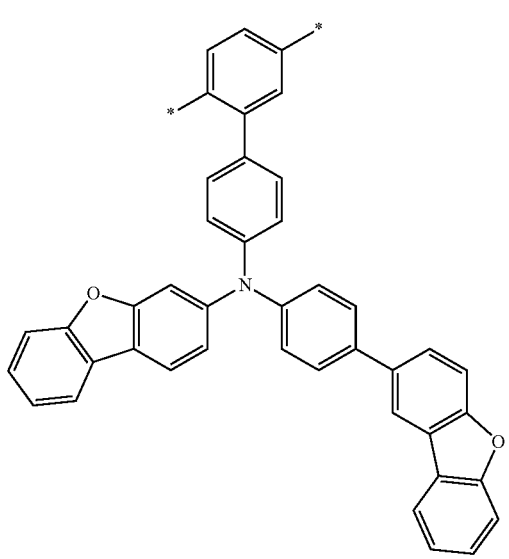
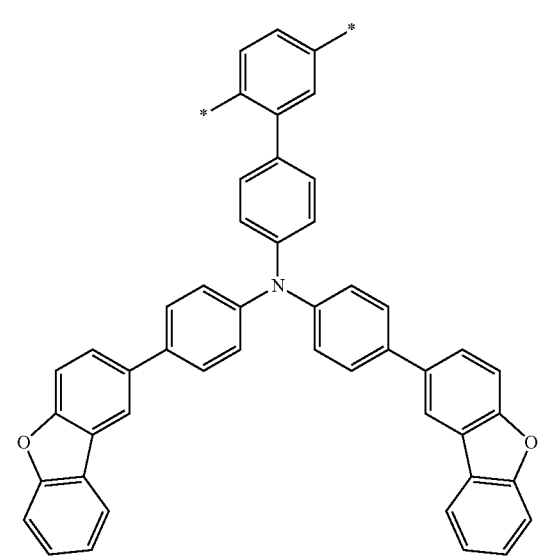

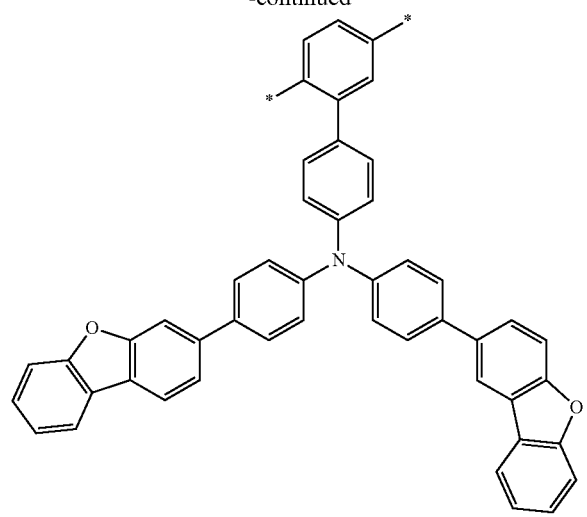
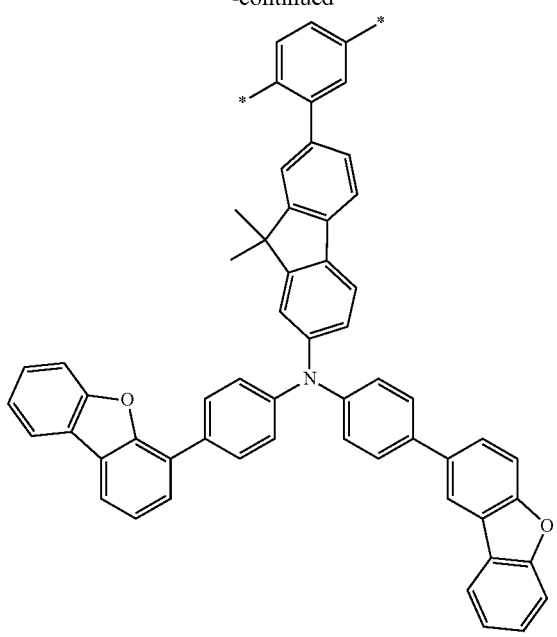
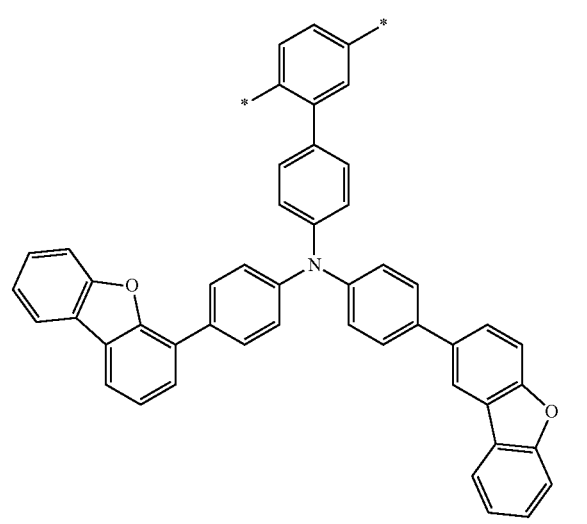
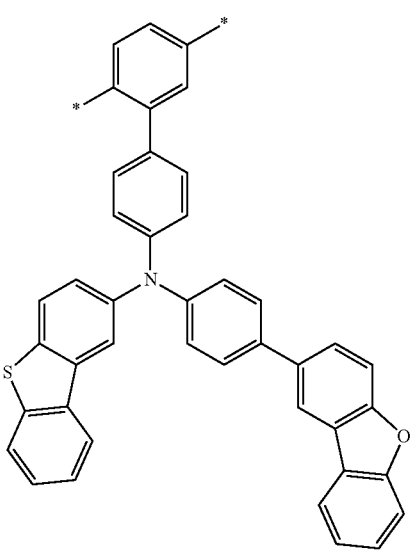
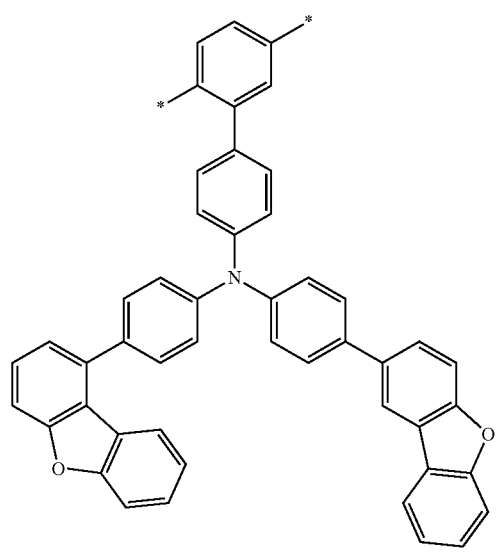
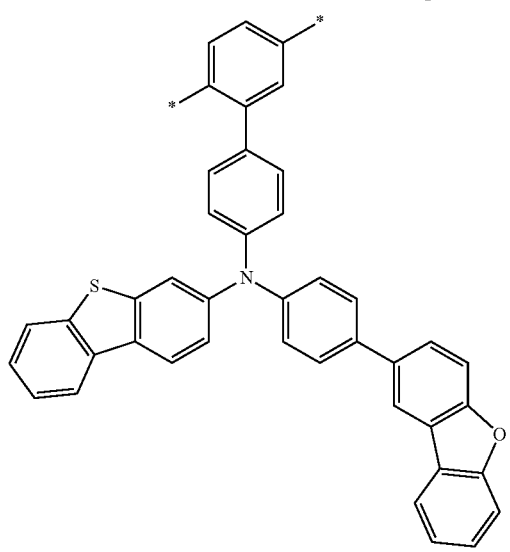

51
-continued
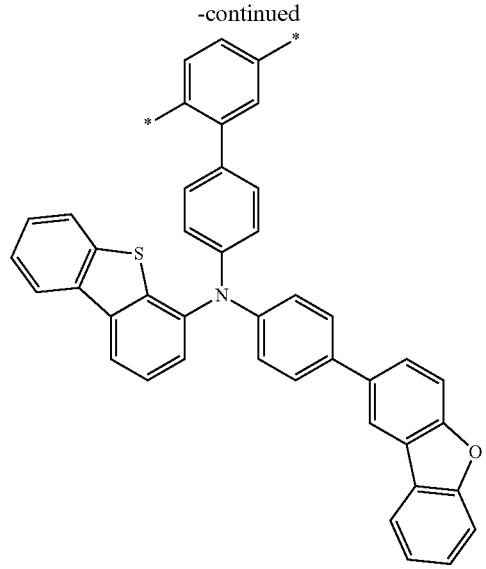
52
-continued
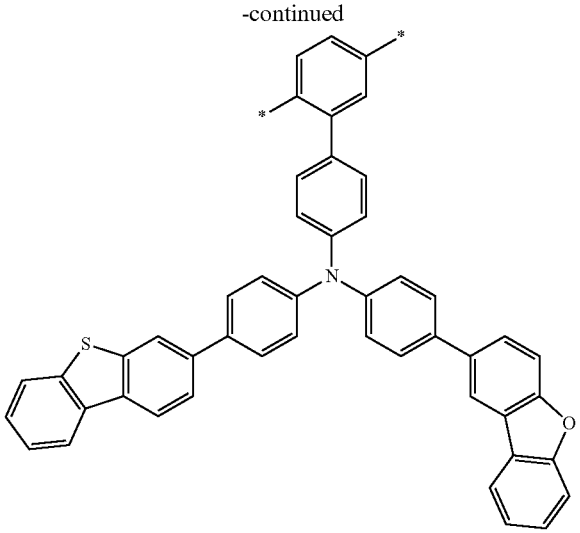
[Group 10]
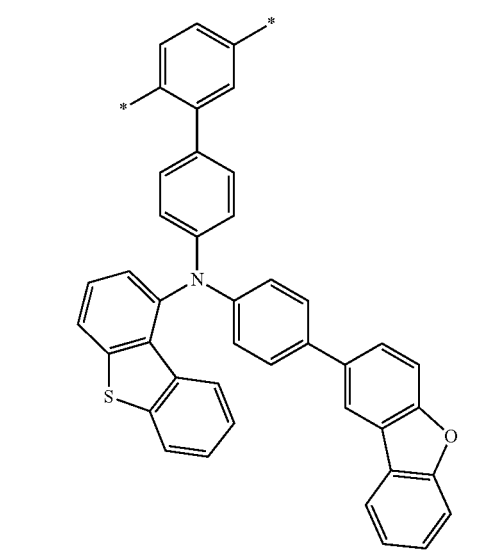
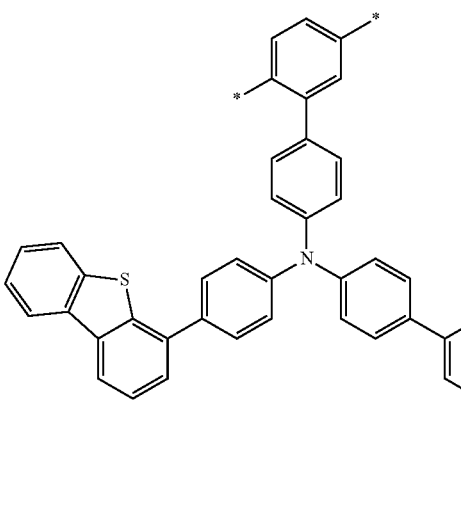
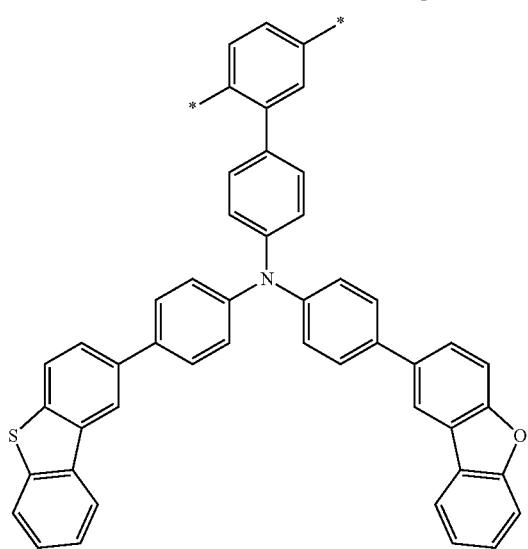
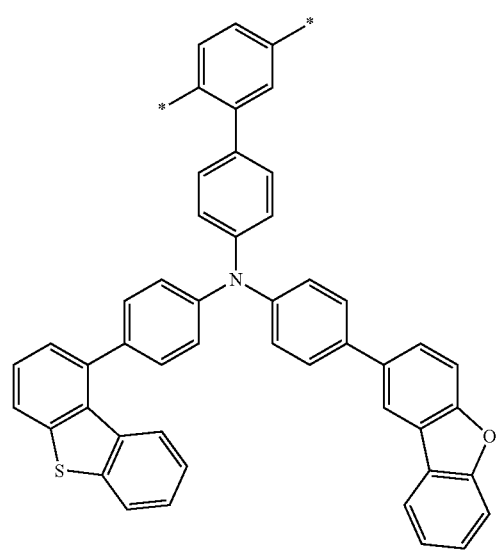

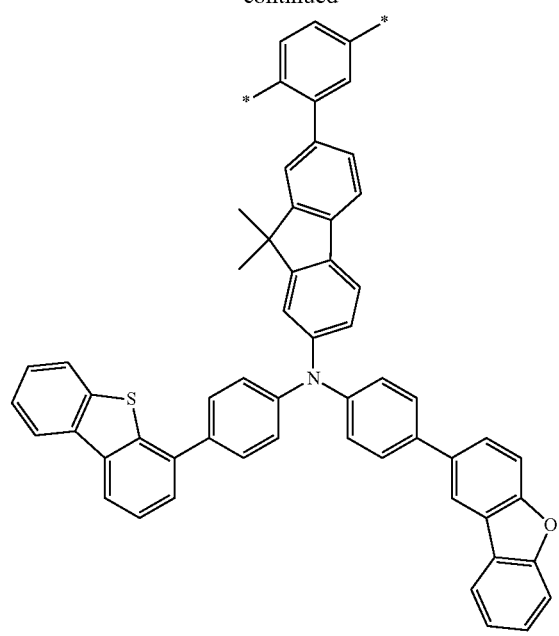
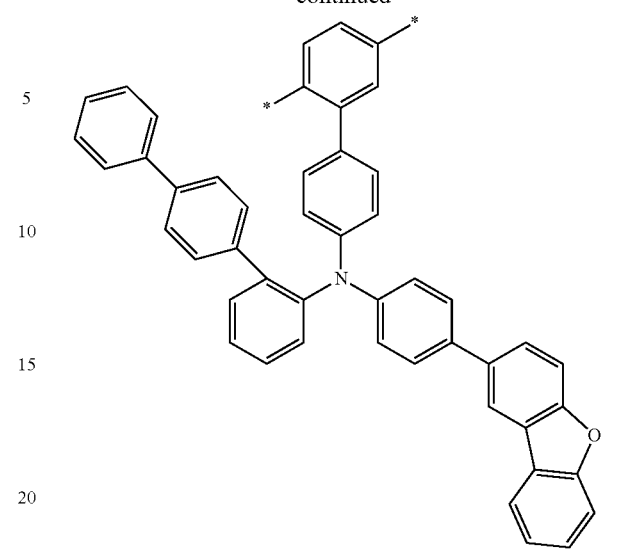
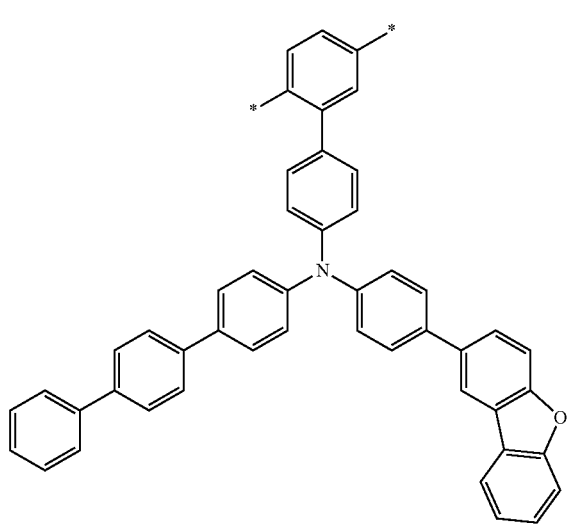
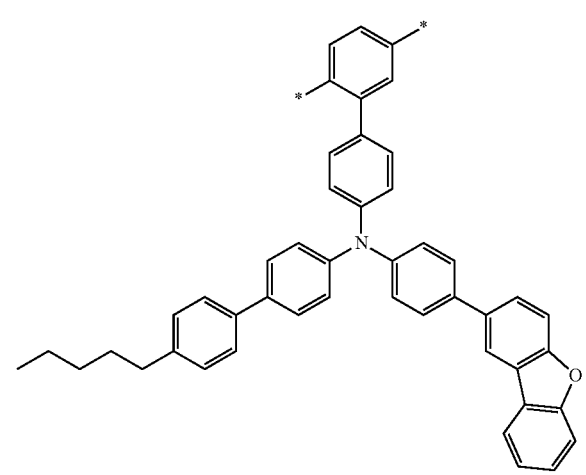
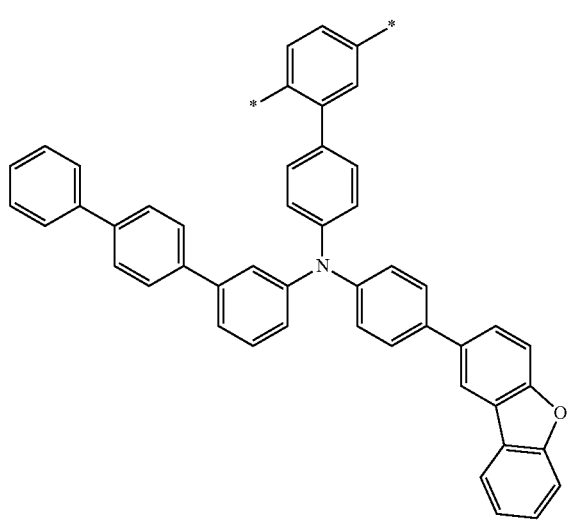

55
-continued
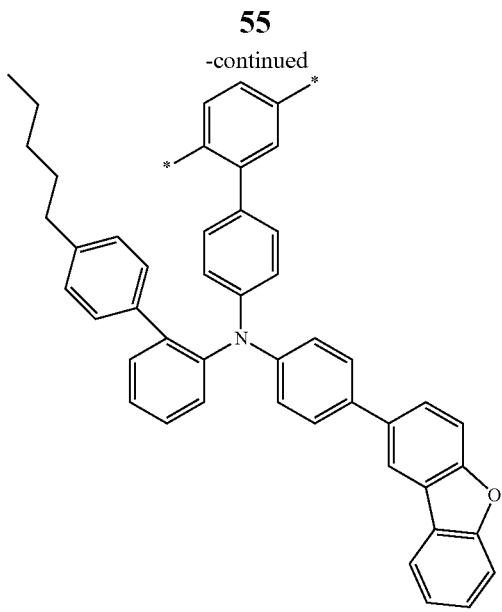
56
-continued
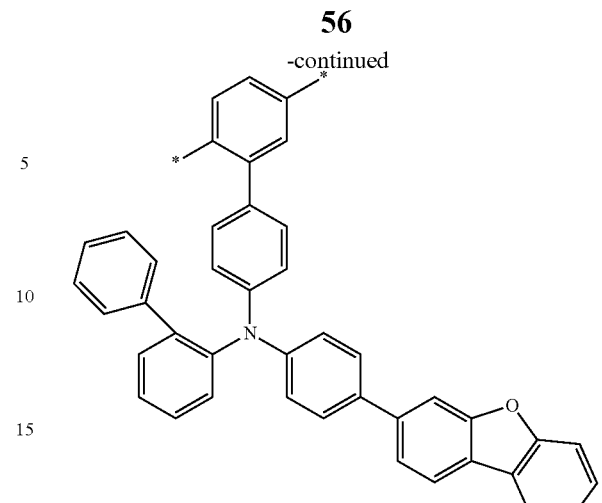
[Group 11]
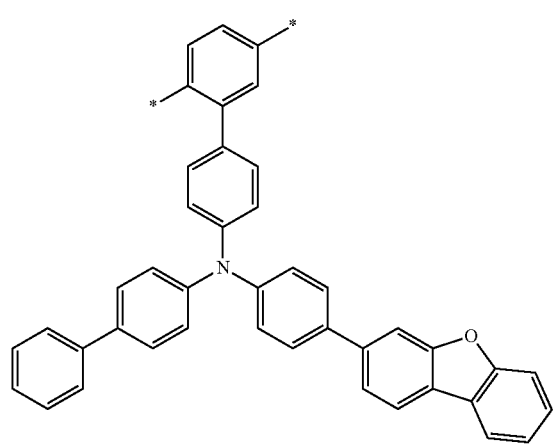
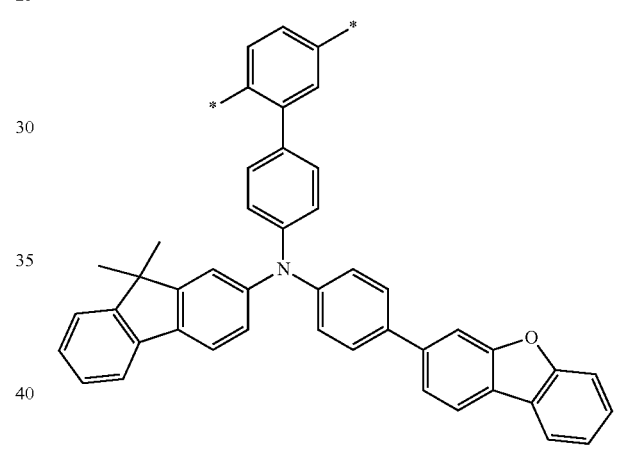
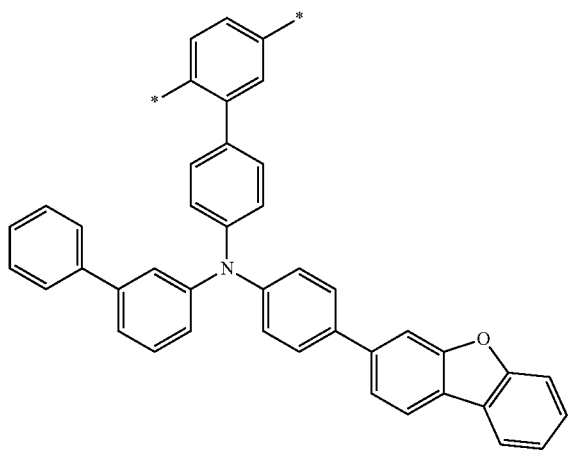
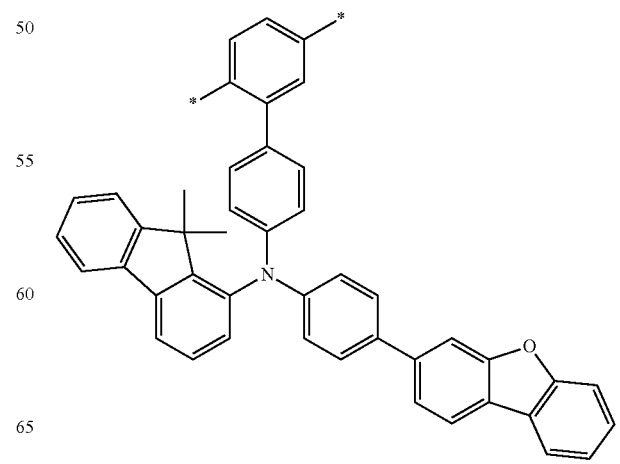

57
-continued
58
-continued
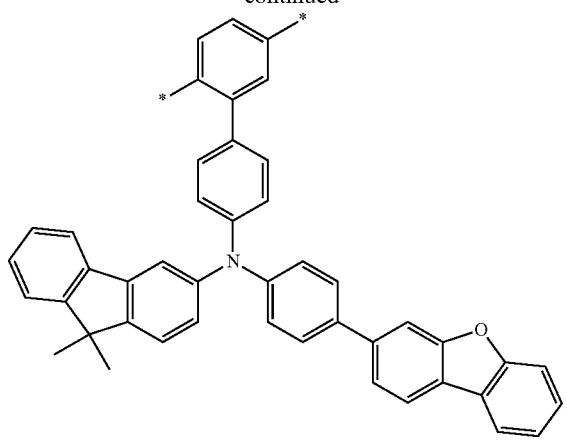
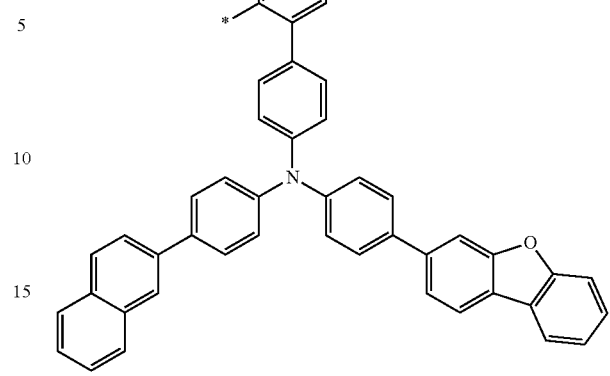
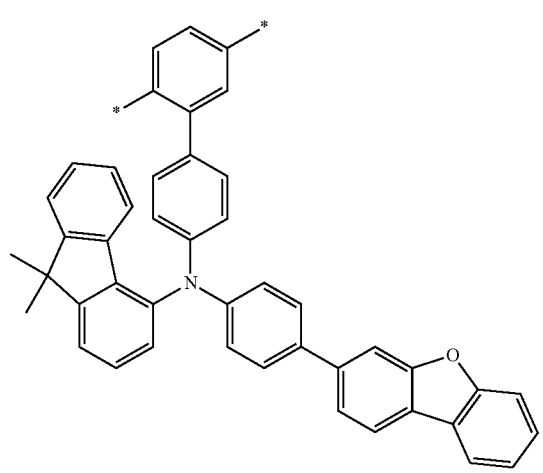
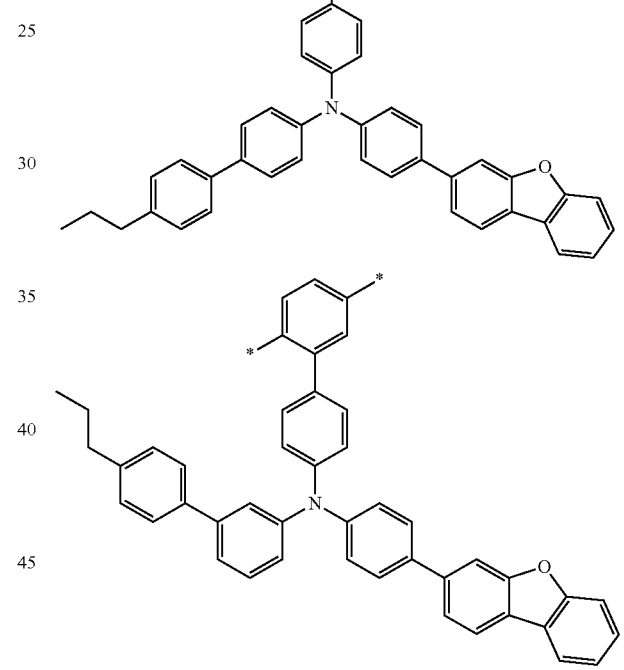
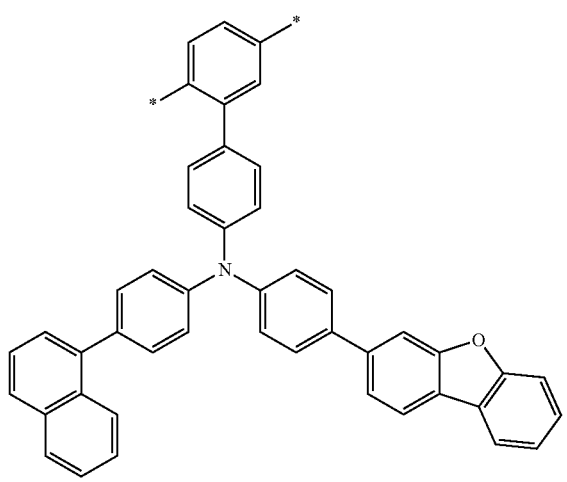
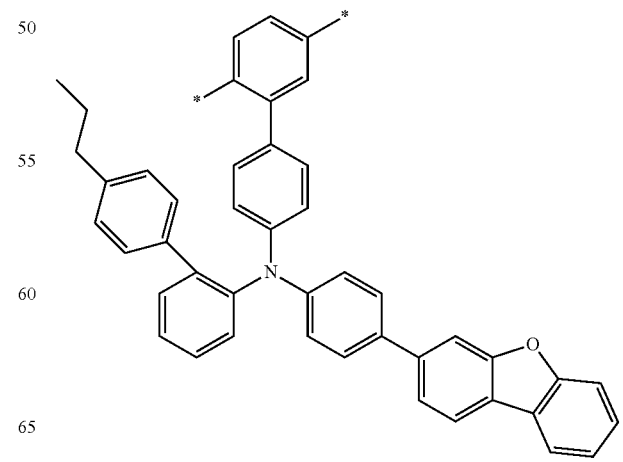

[Group 12]
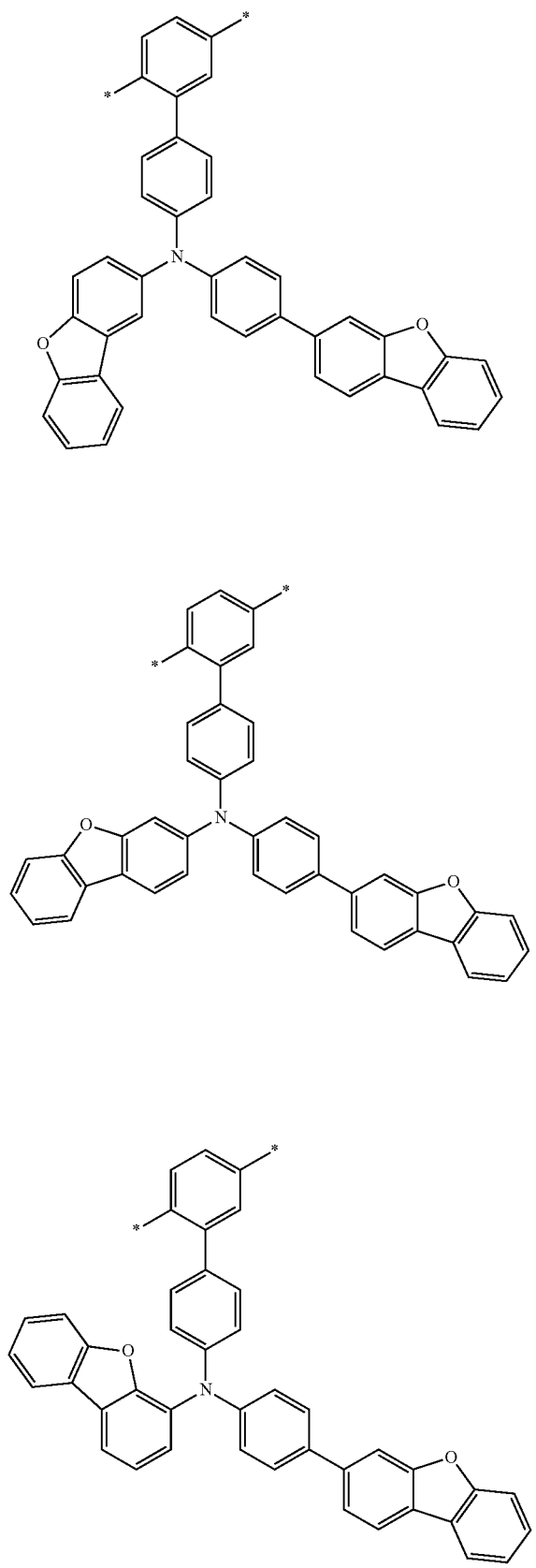
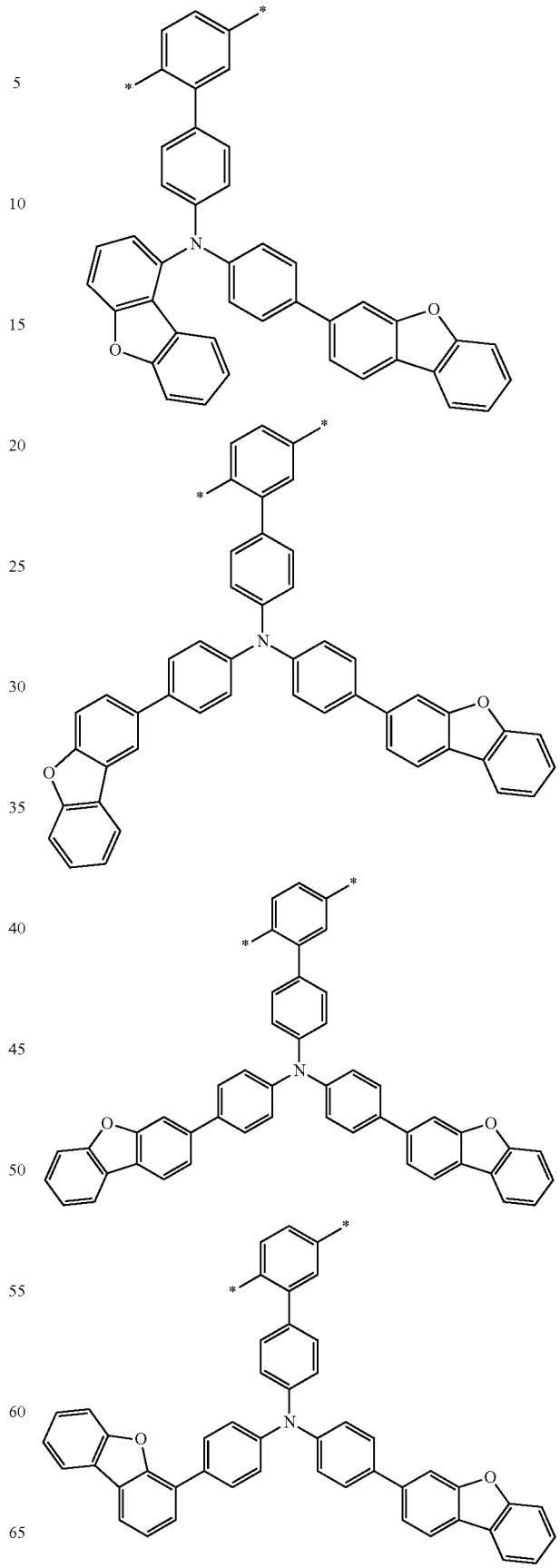

61
-continued
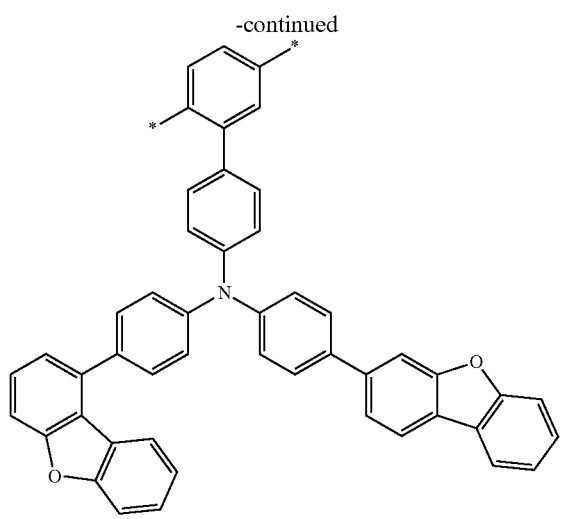
62
-continued
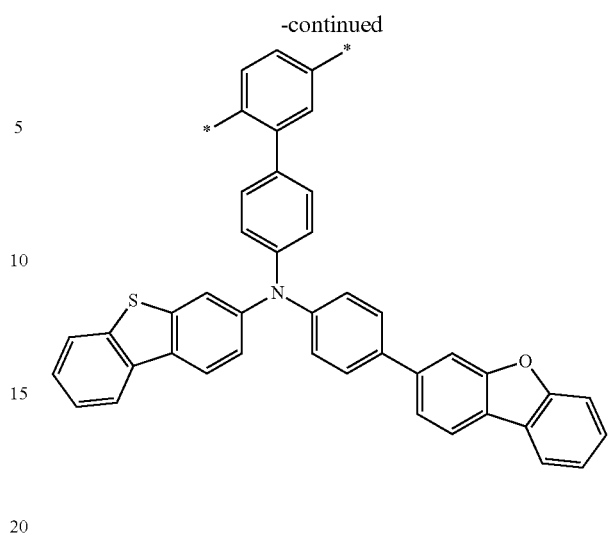
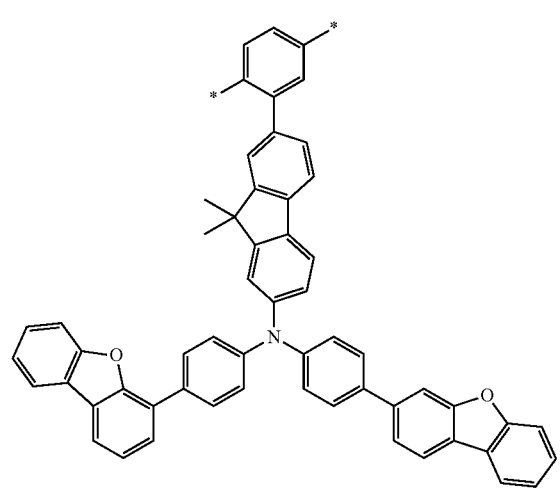
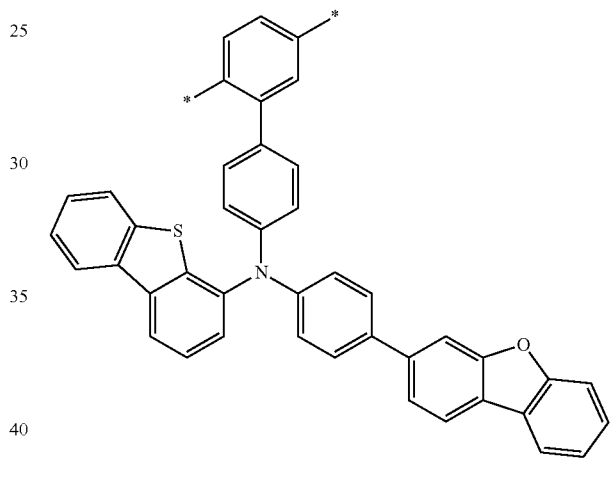
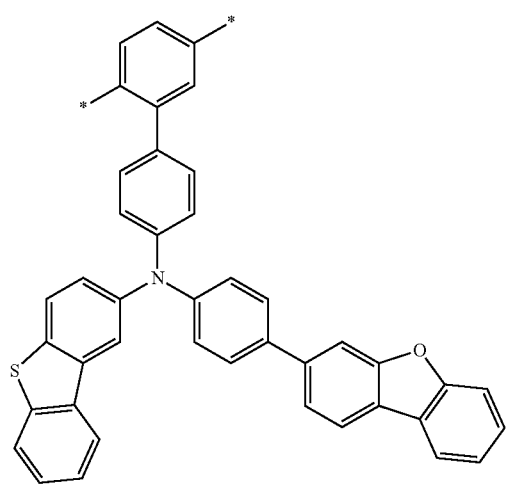
[Group 13]
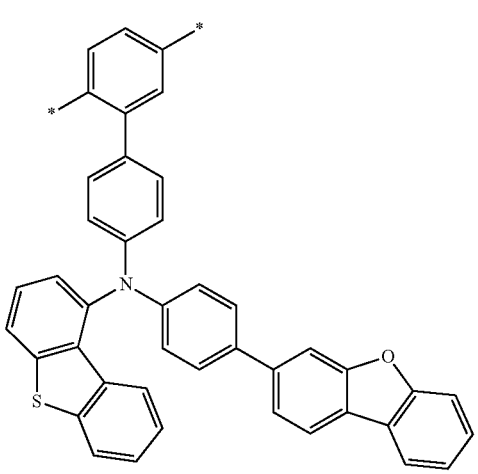

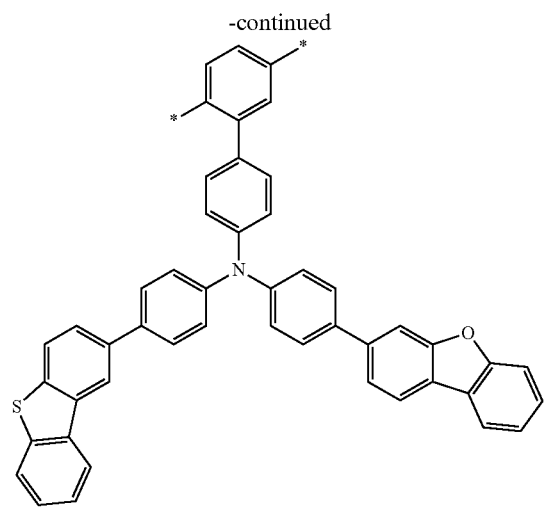
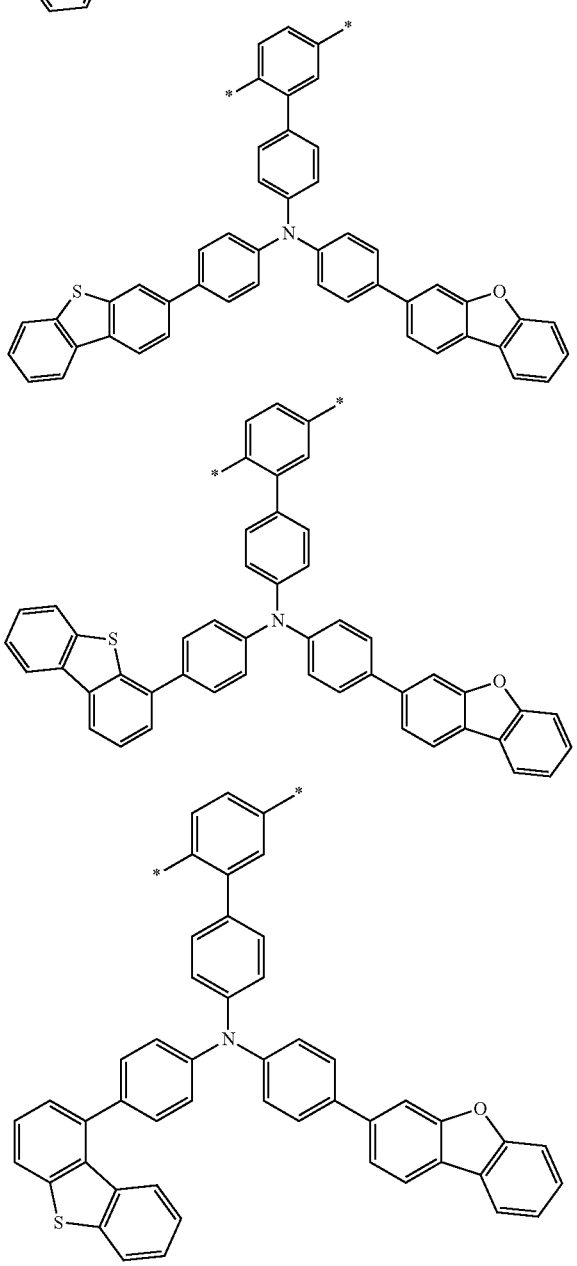
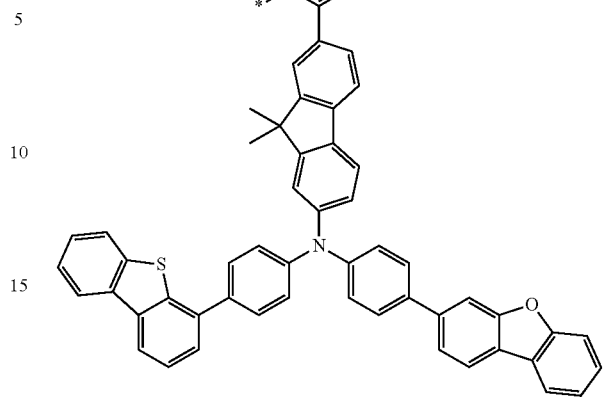
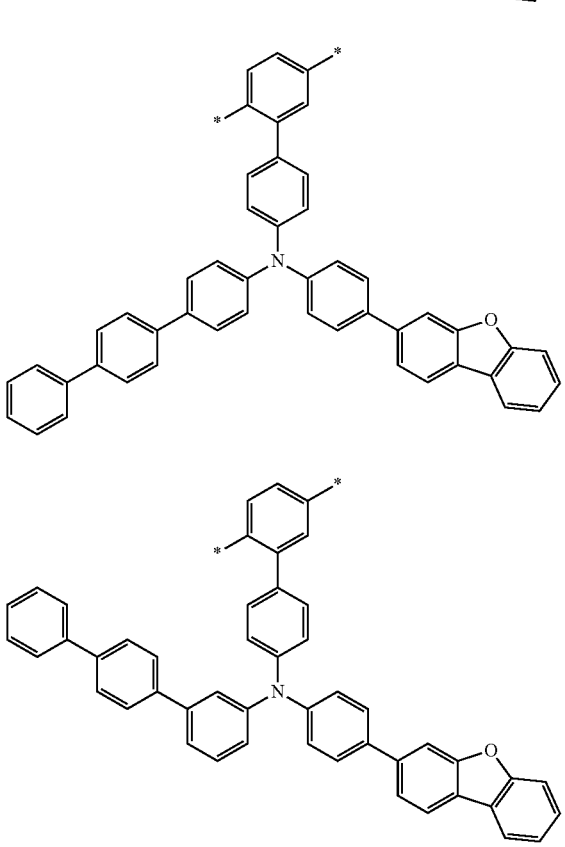

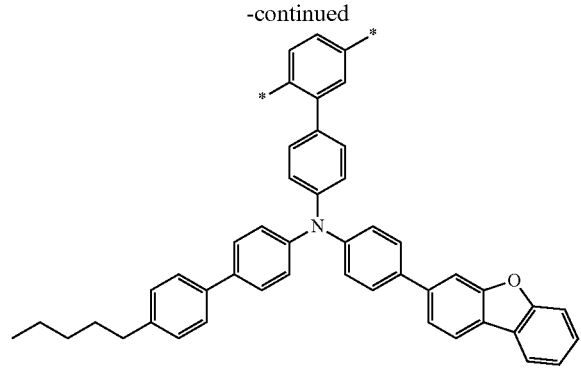
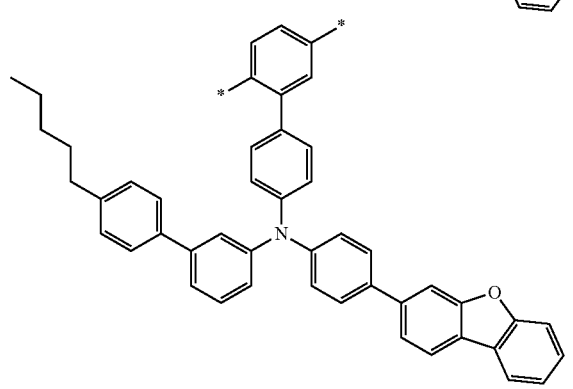
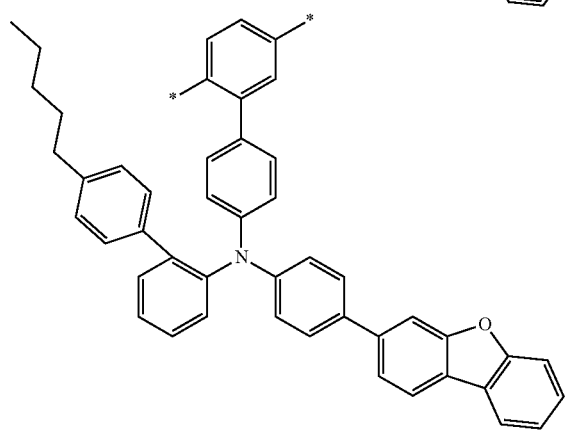
[Group 14]
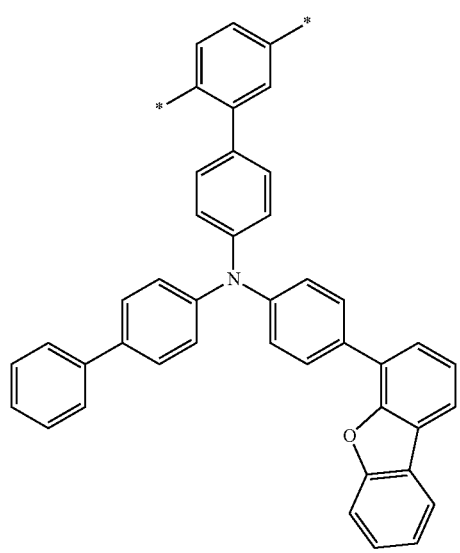
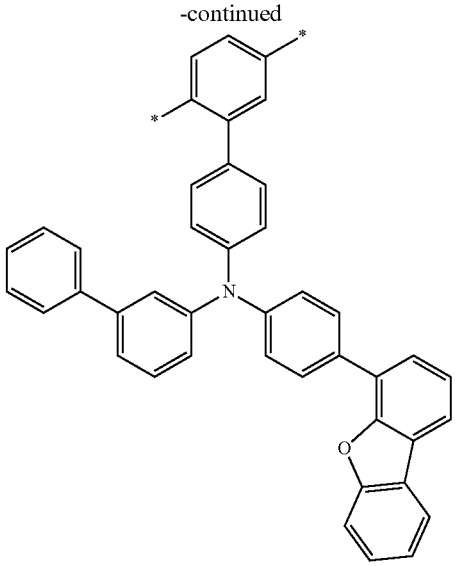
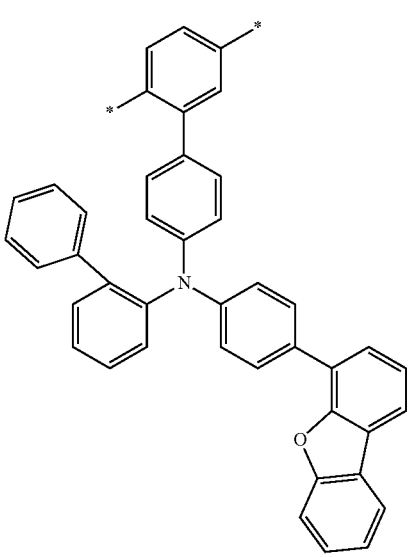
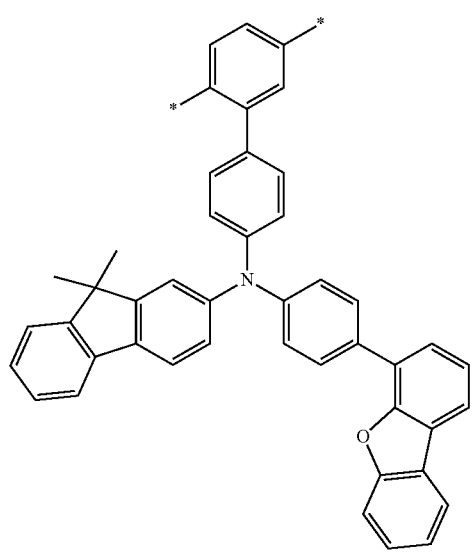

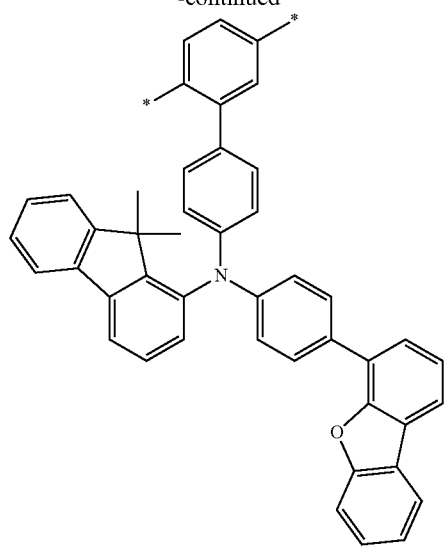
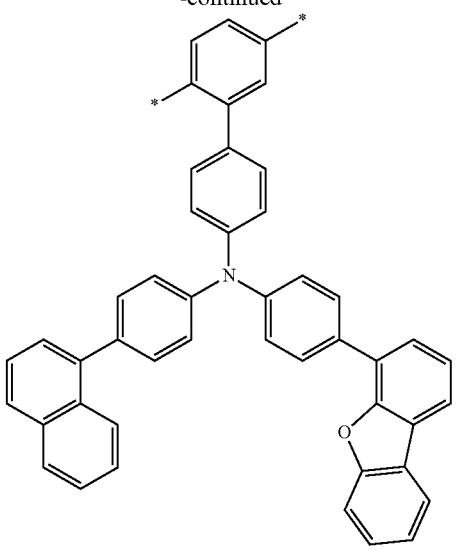
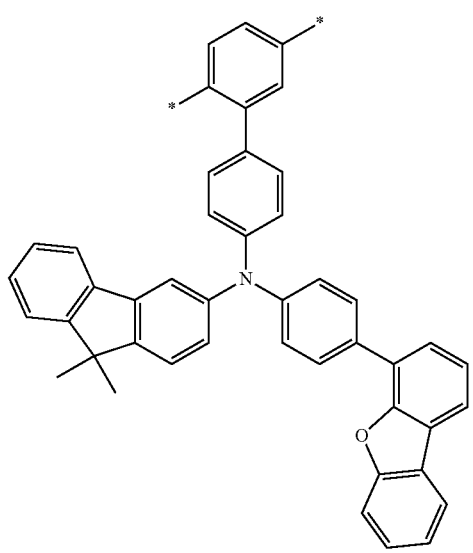
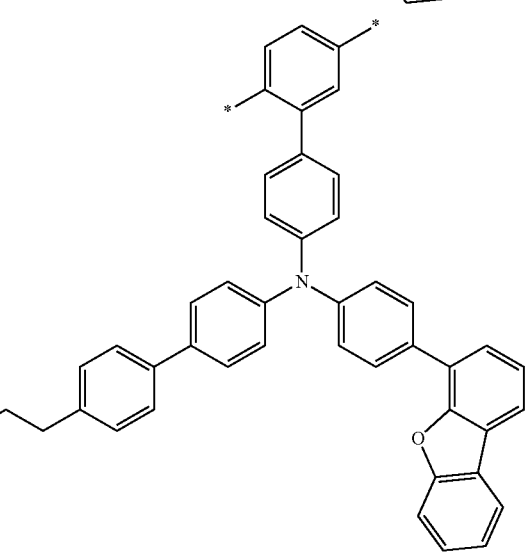

-continued
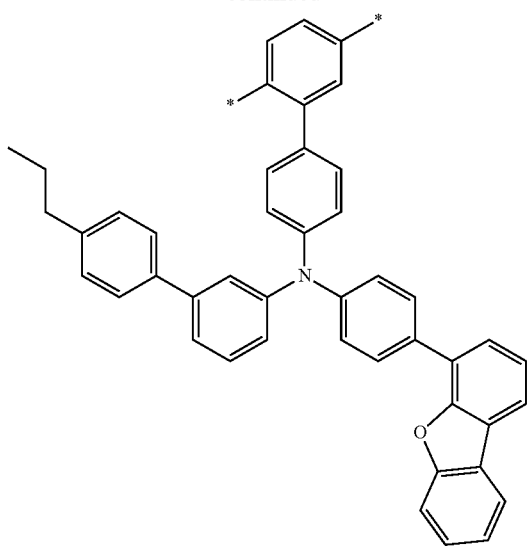
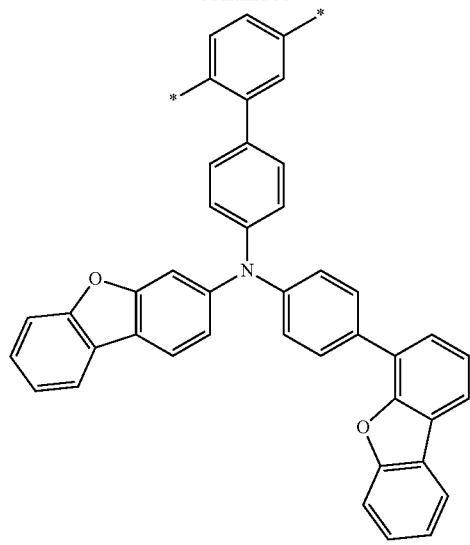
[Group 15]
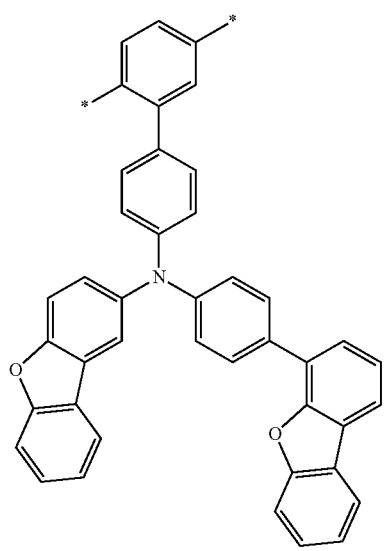
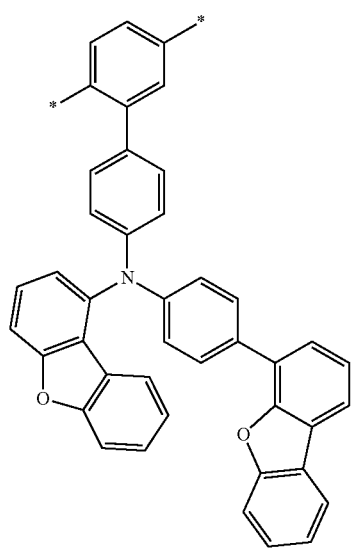

71
-continued
72
-continued
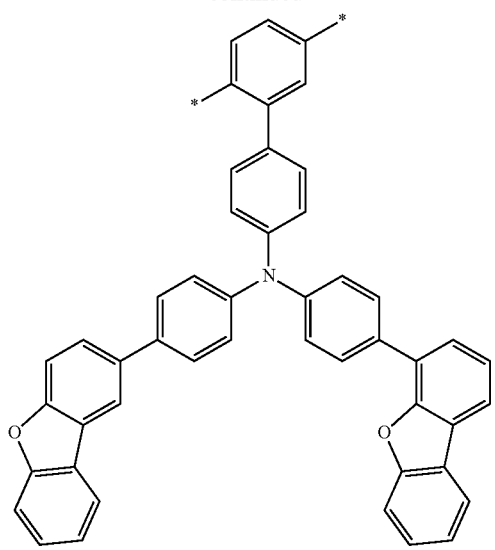
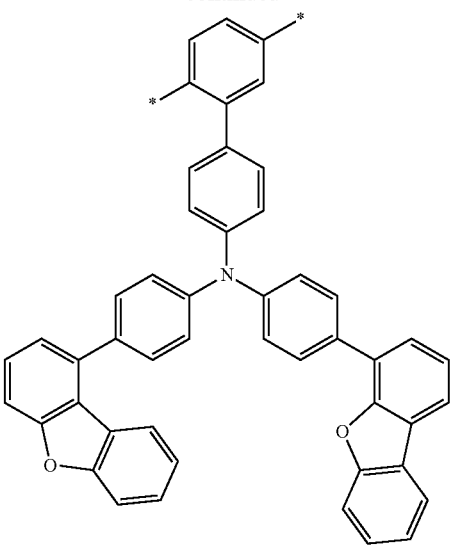
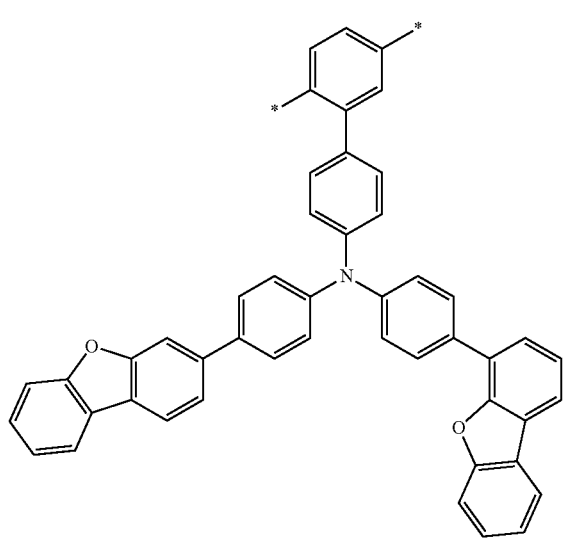
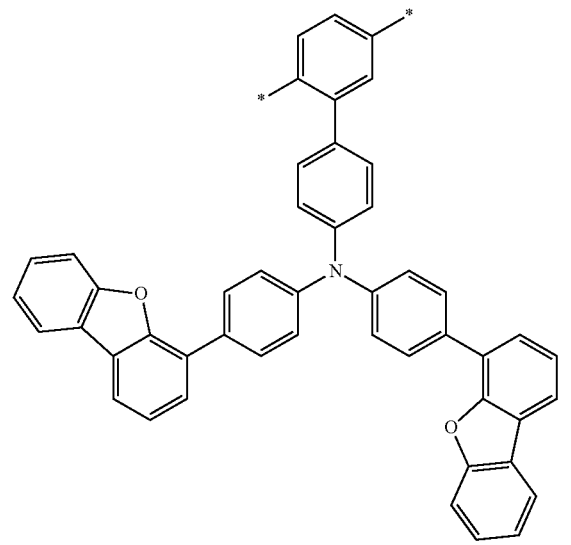
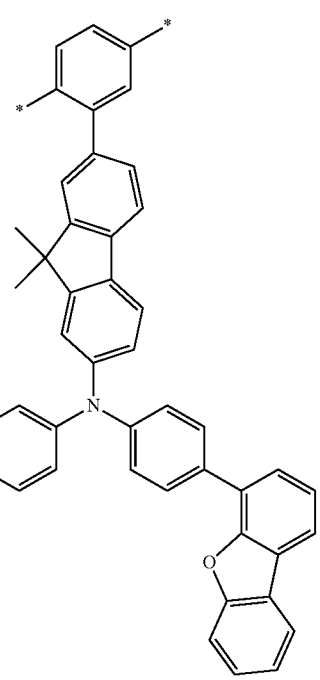

73
-continued
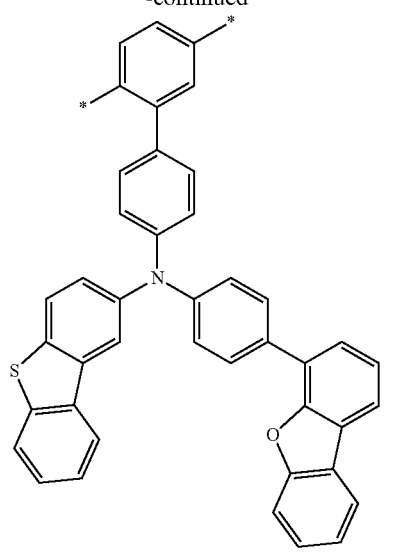
74
-continued
[Group 16]
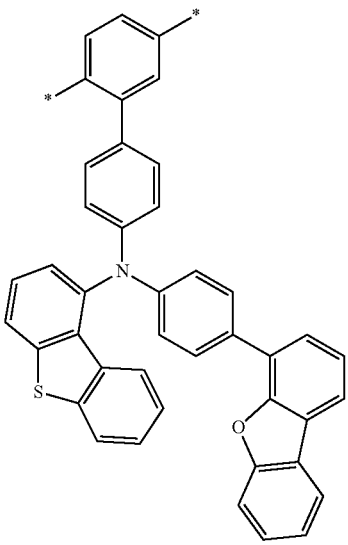
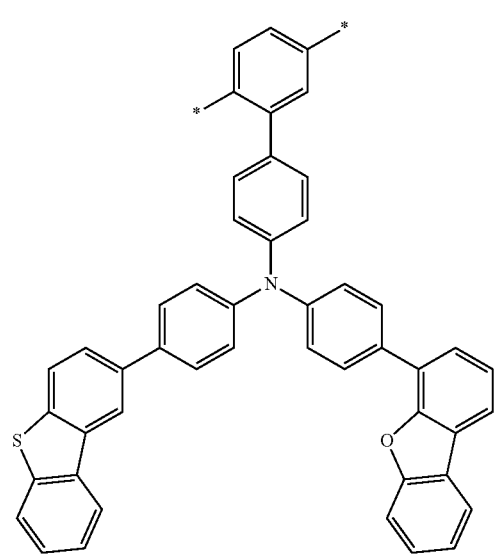
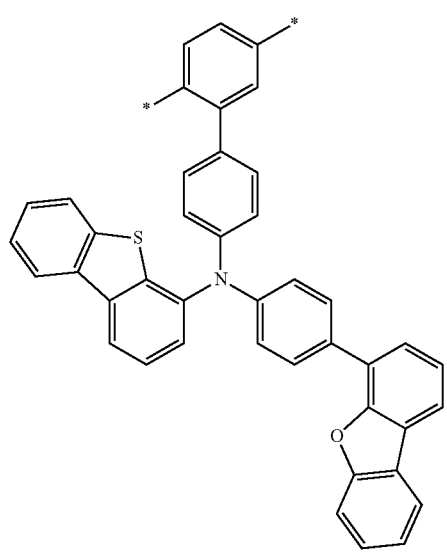

75
-continued
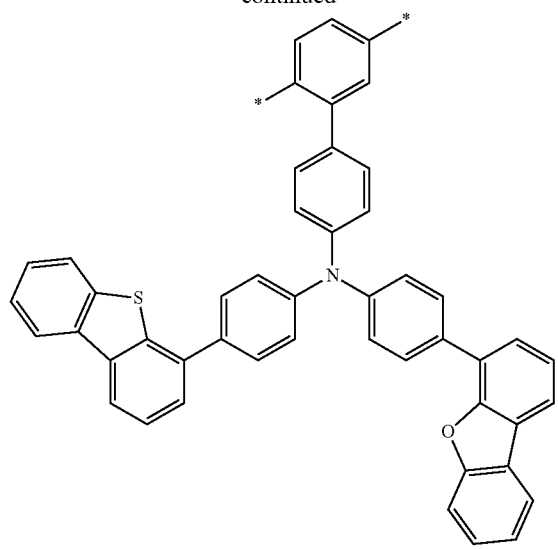
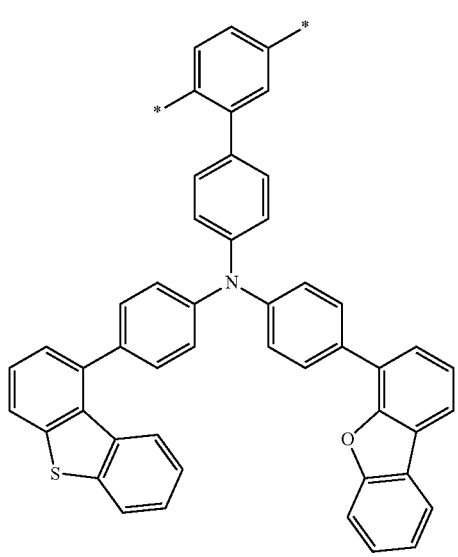
76
-continued
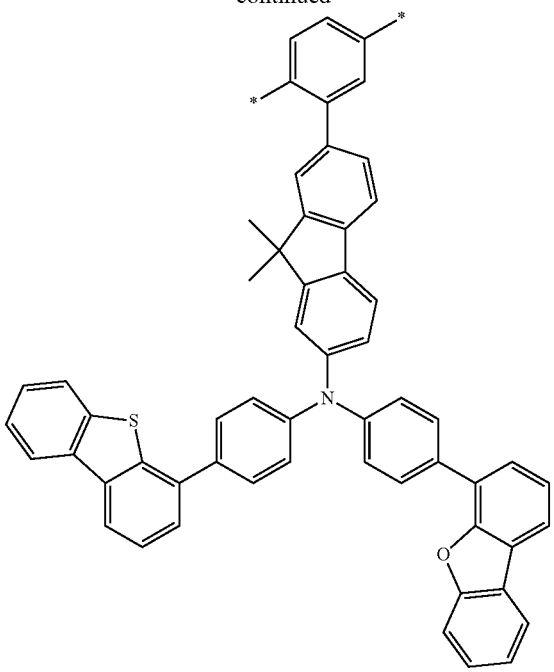
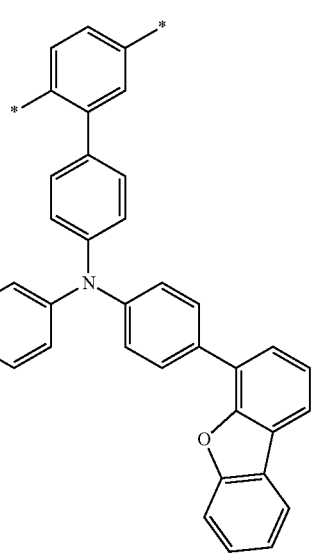

77
-continued
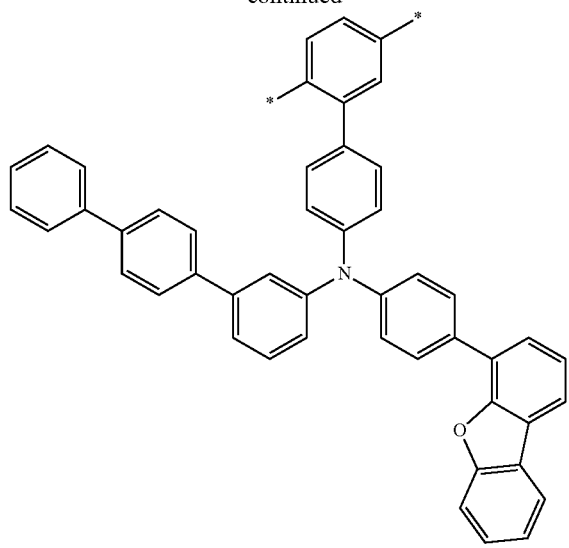
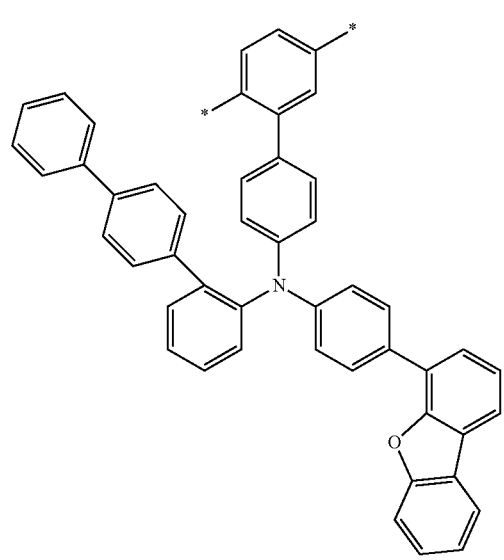
78
-continued
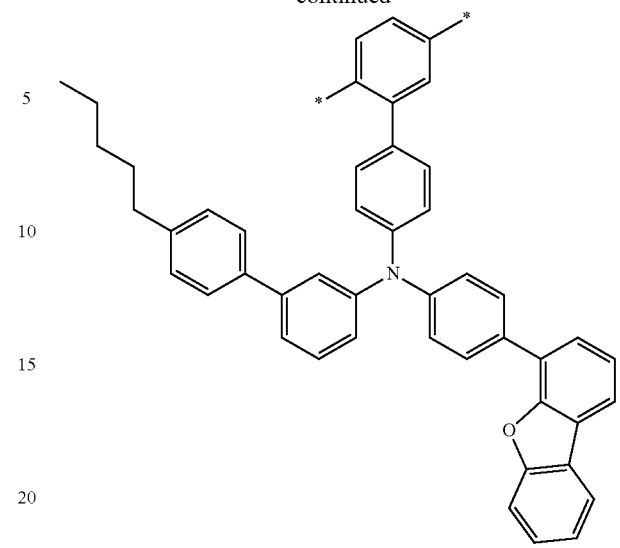
[Group 17]
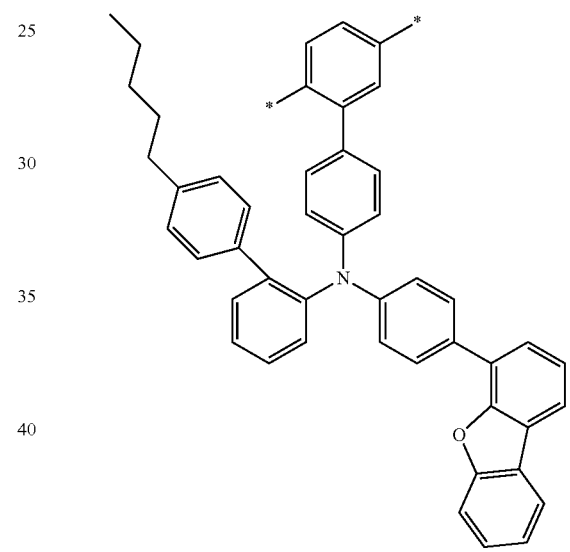
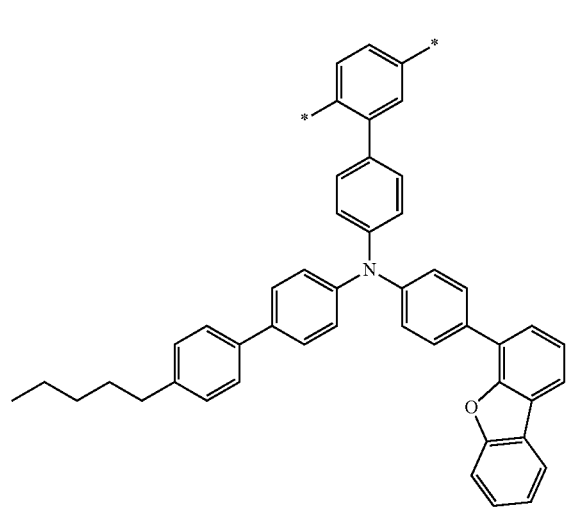
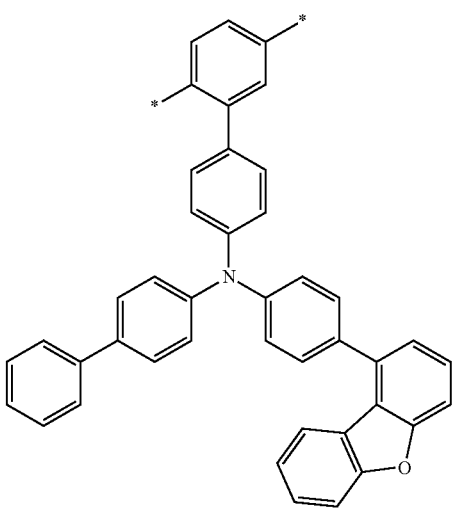

| 79 -continued | 80 -continued |
|---|---|
| 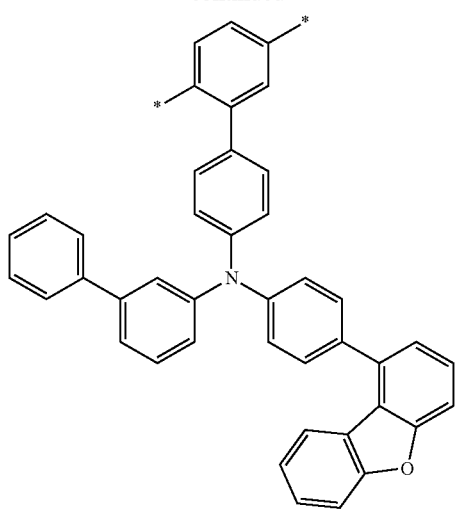 | 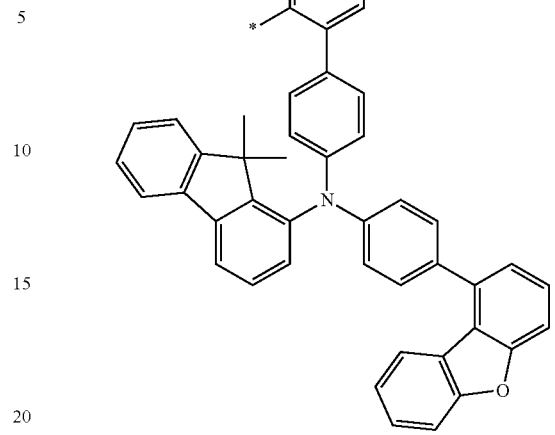 |
| 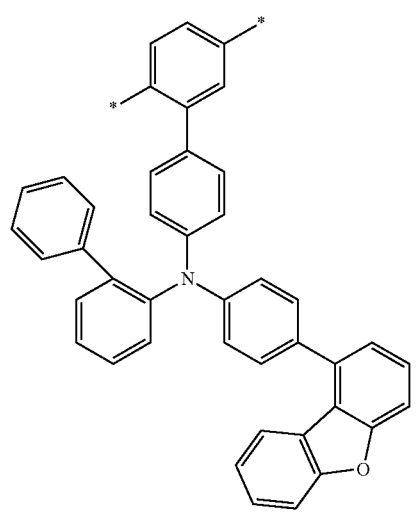 | 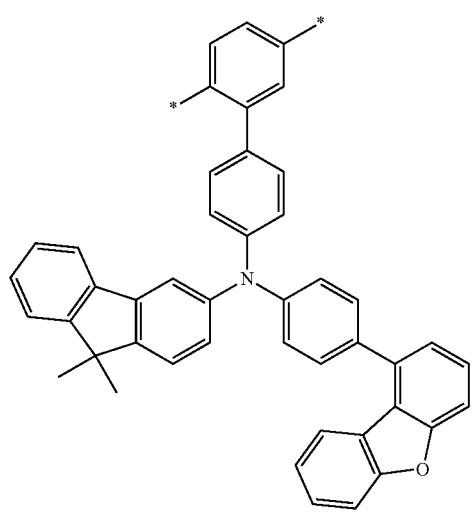 |
| 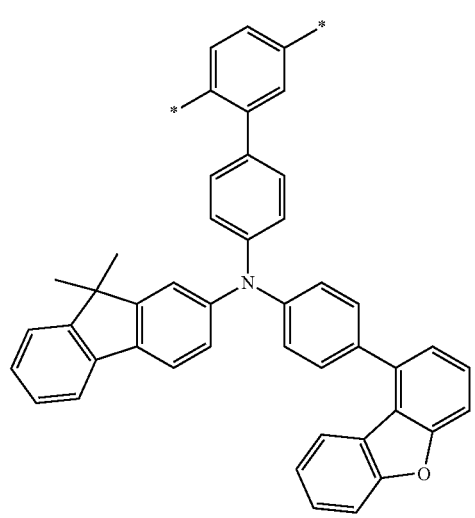 | 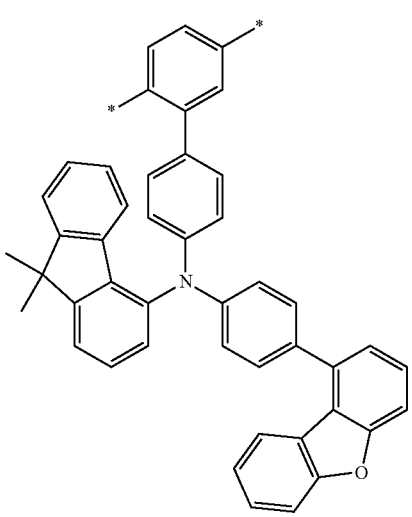 |

81
-continued
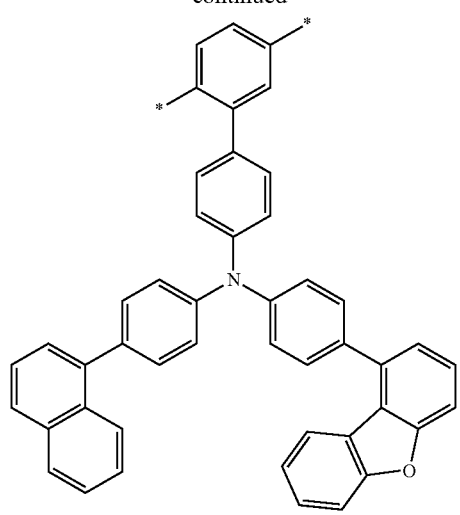
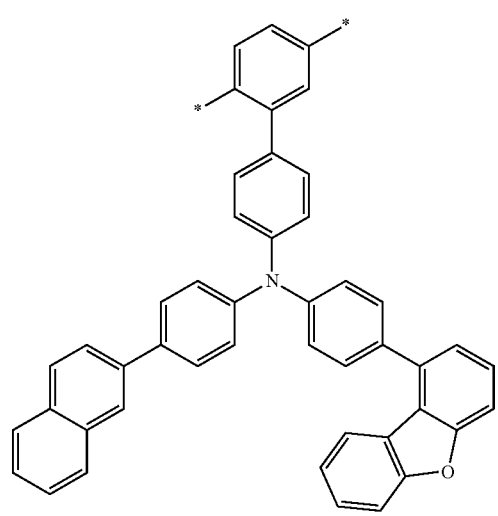
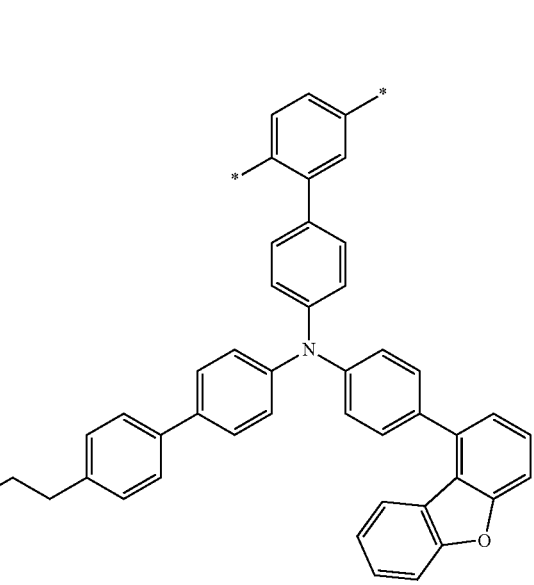
82
-continued
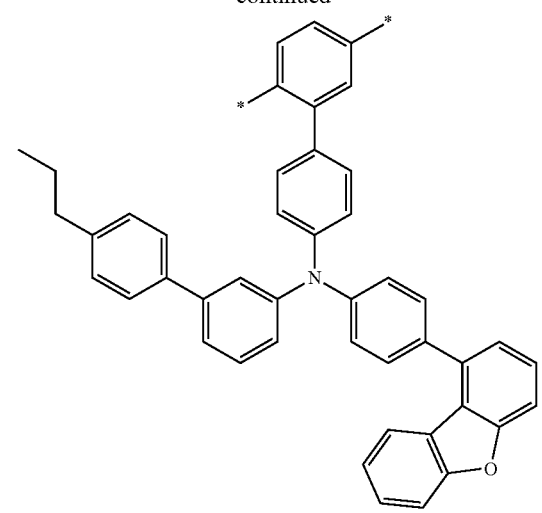
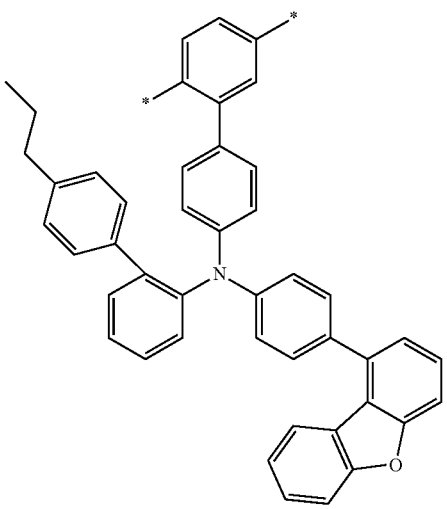
[Group 18]
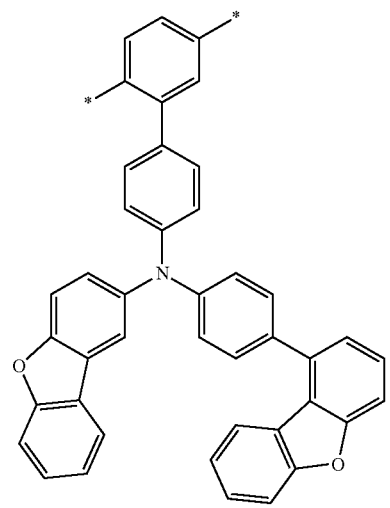

83
-continued
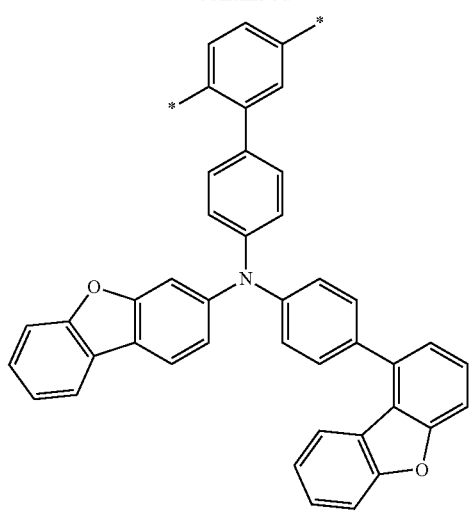
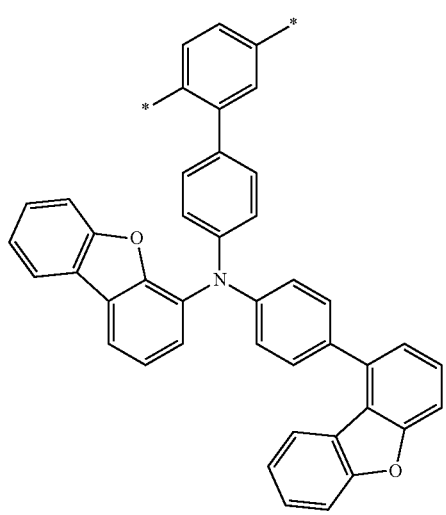
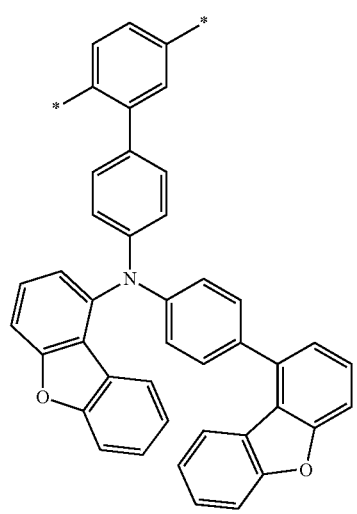
84
-continued
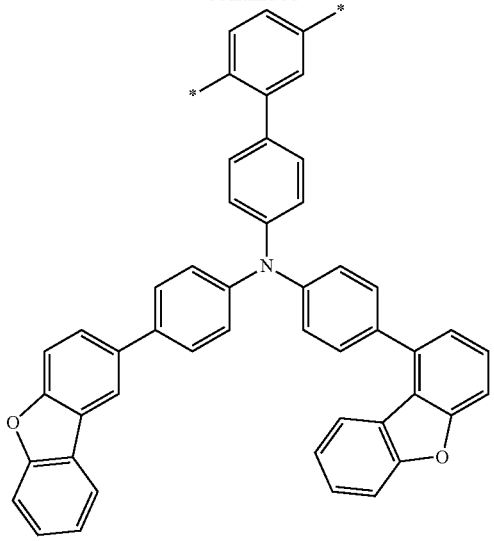
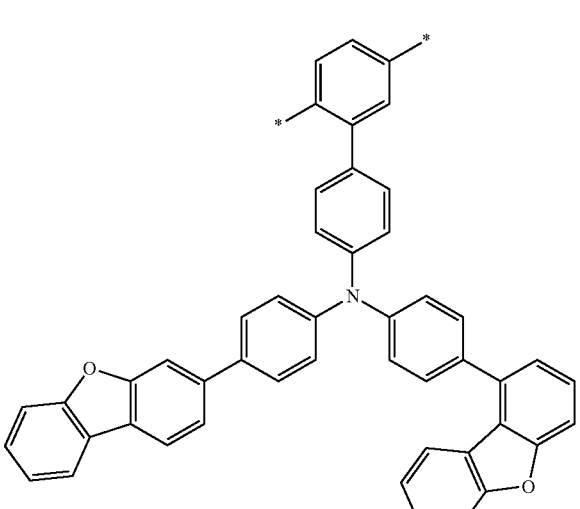
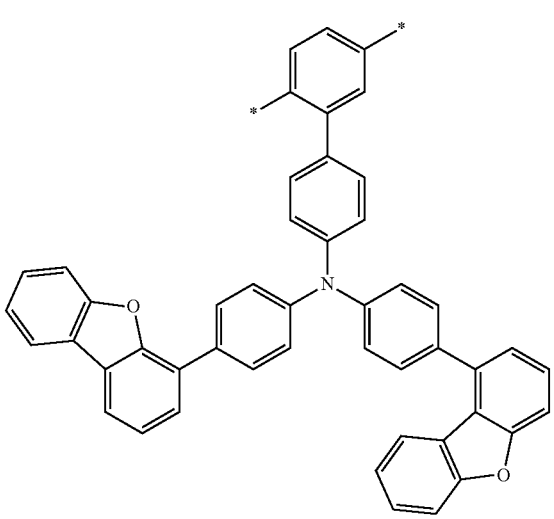

85
-continued
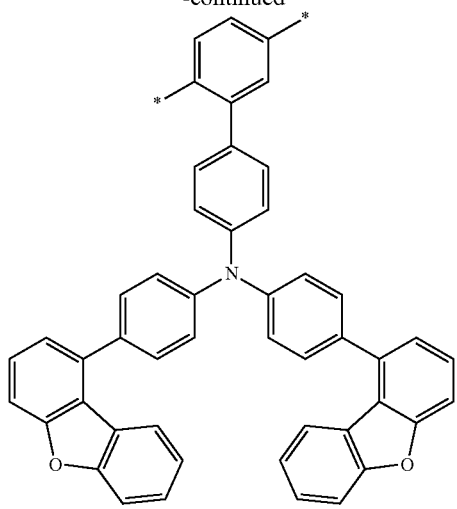
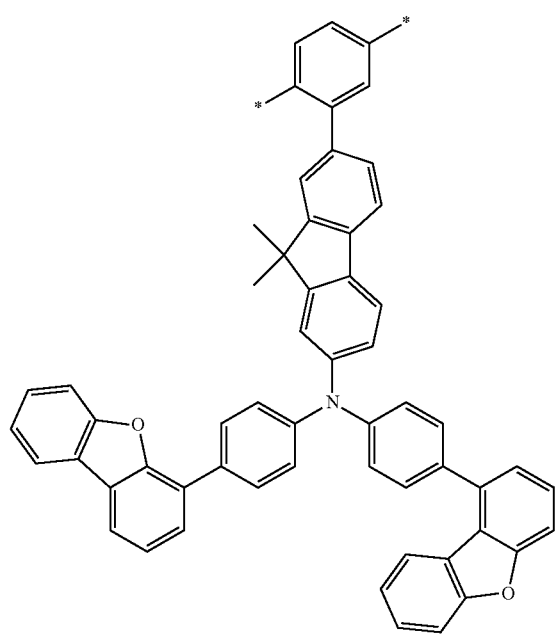
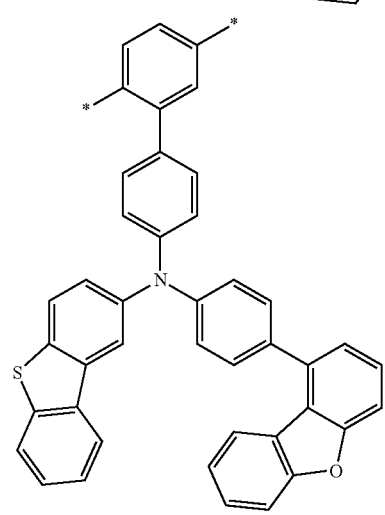
86
-continued
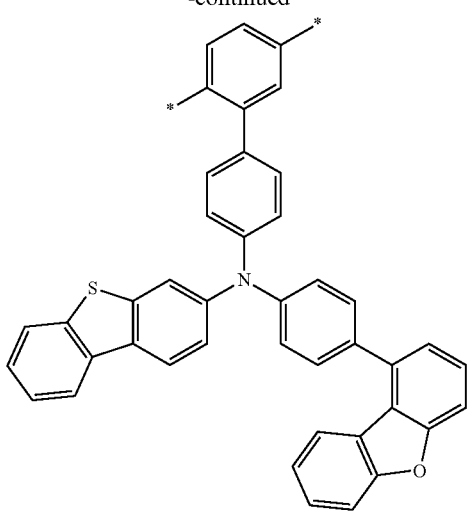
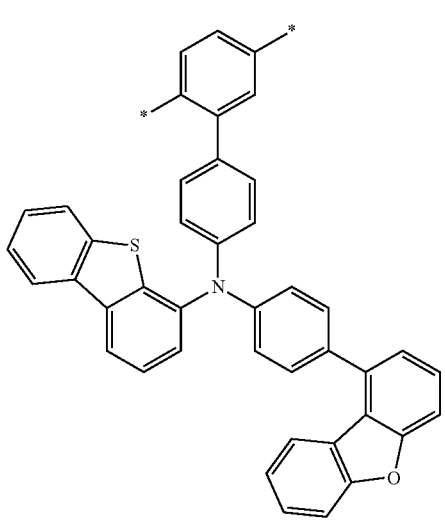
[Group 19]
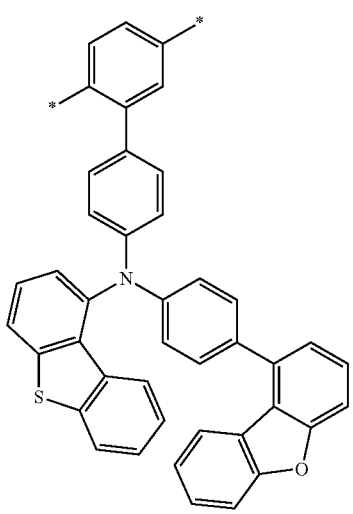

87
-continued
88
-continued
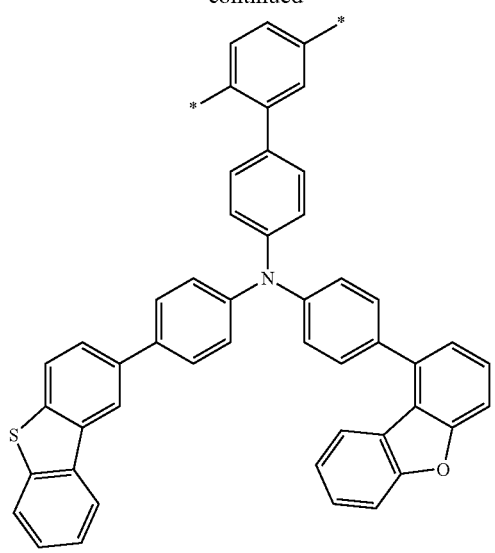
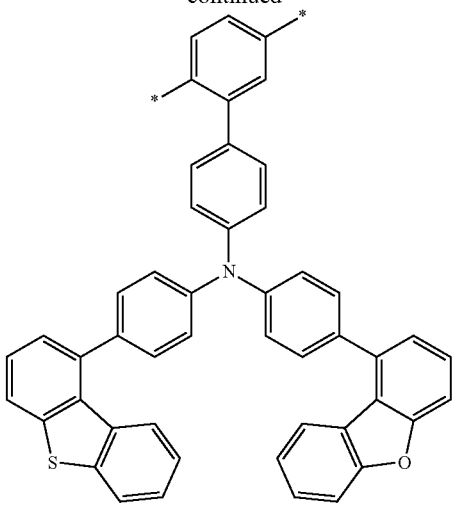
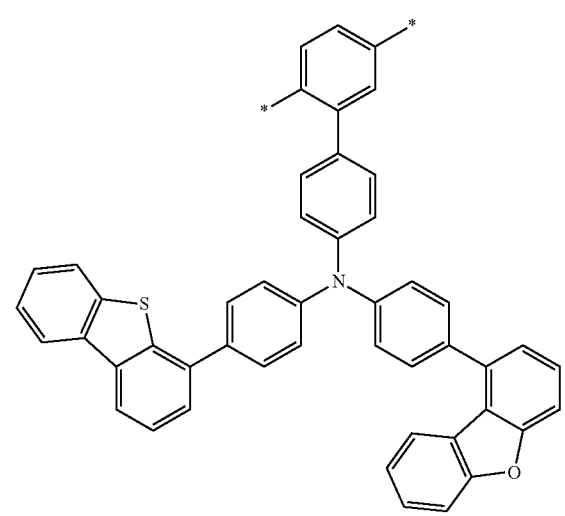
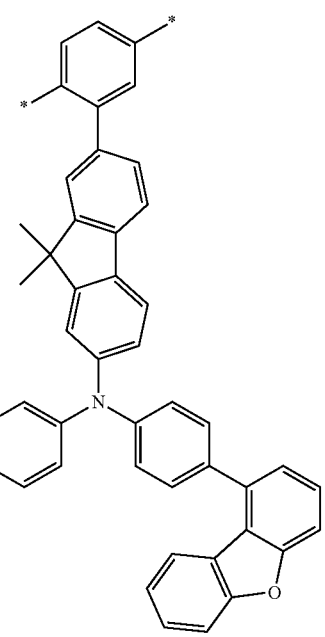

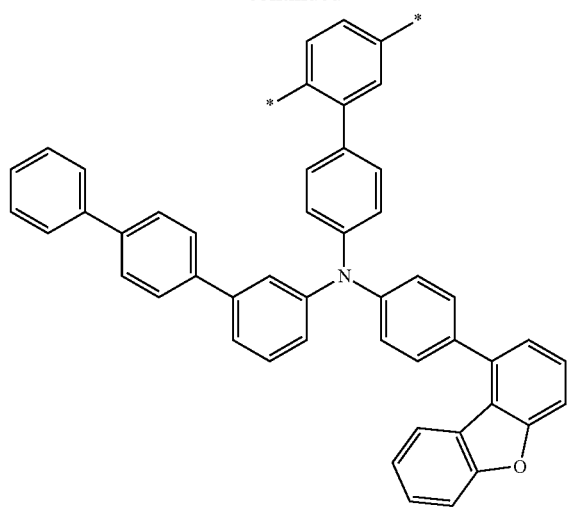
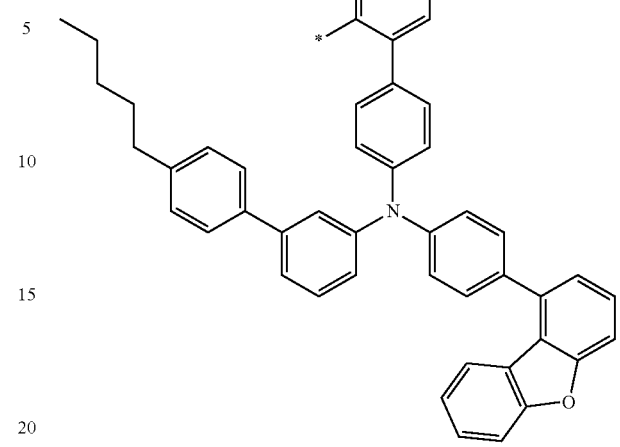
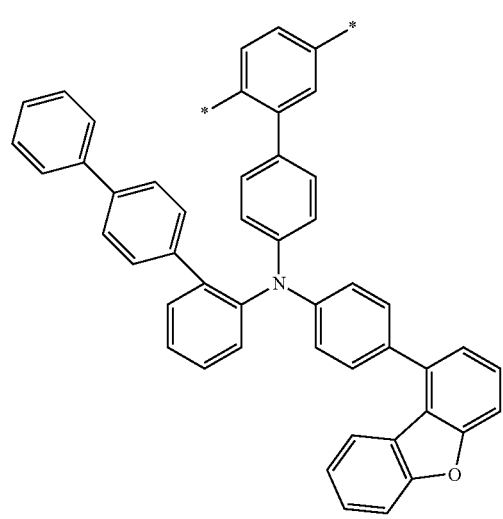
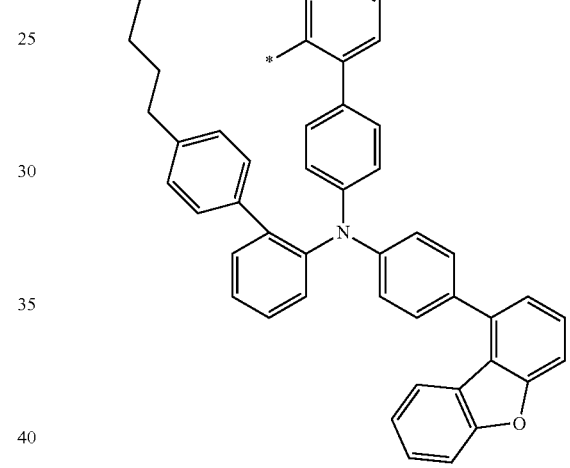
[Group 20]
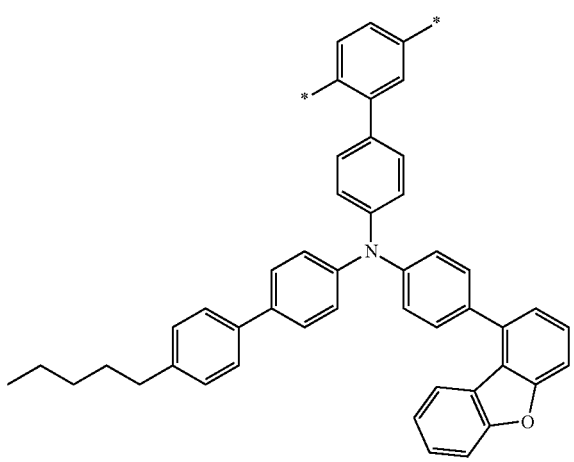
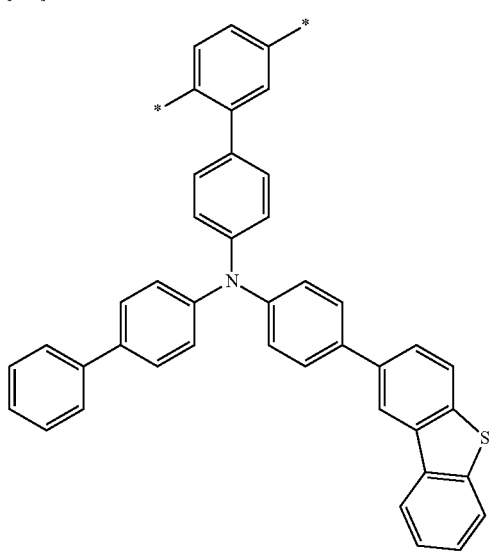

-continued
91
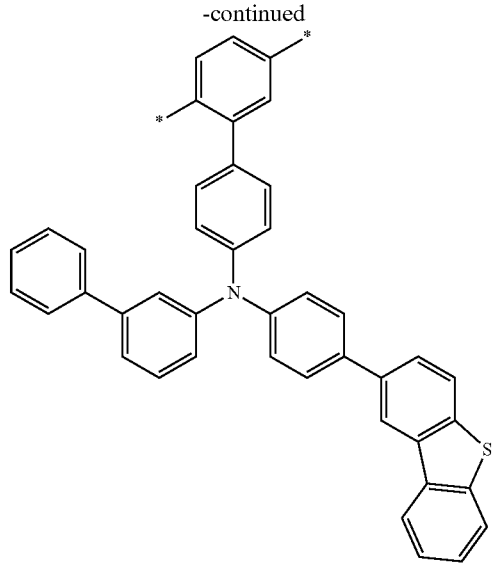
92
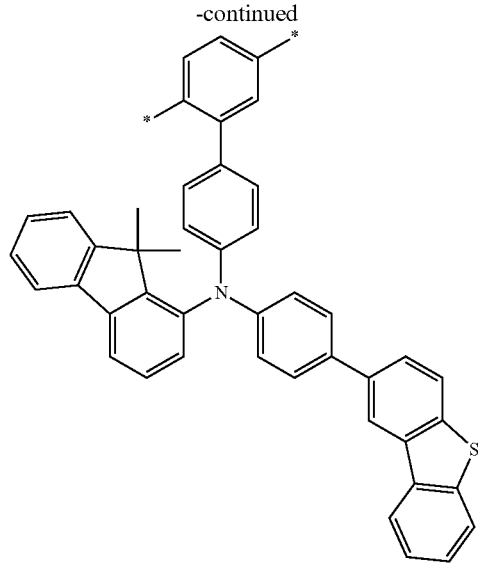
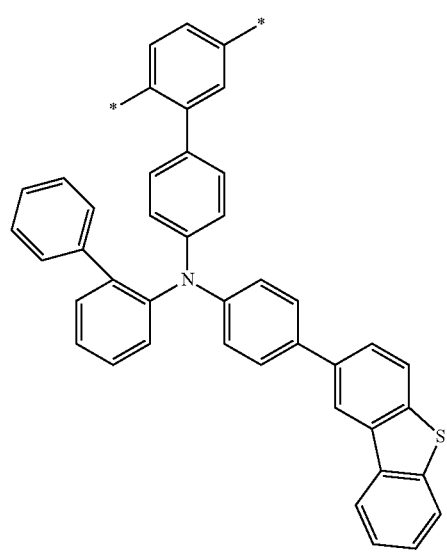
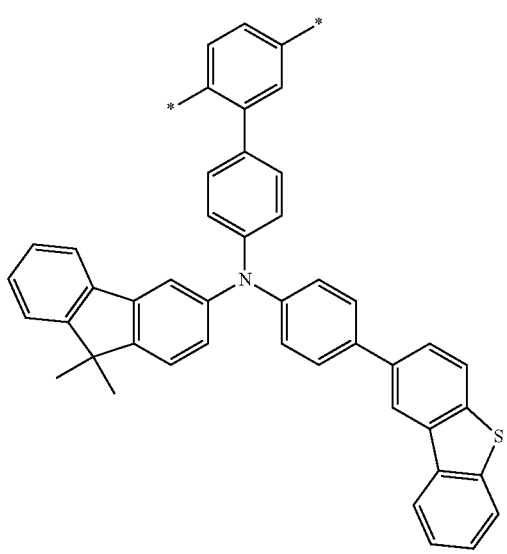
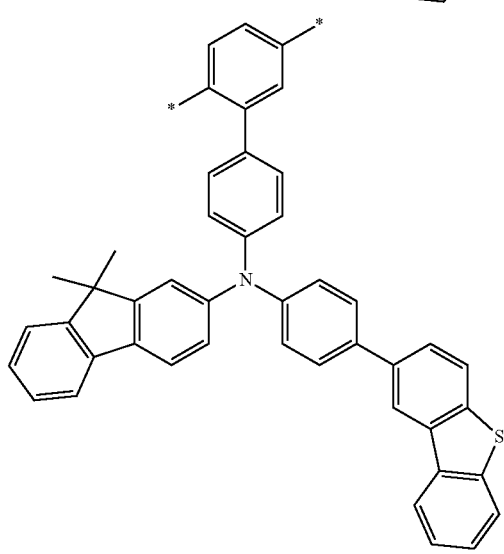
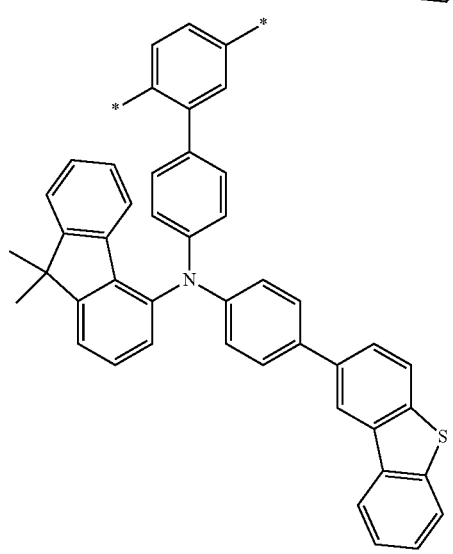

93
-continued
94
-continued
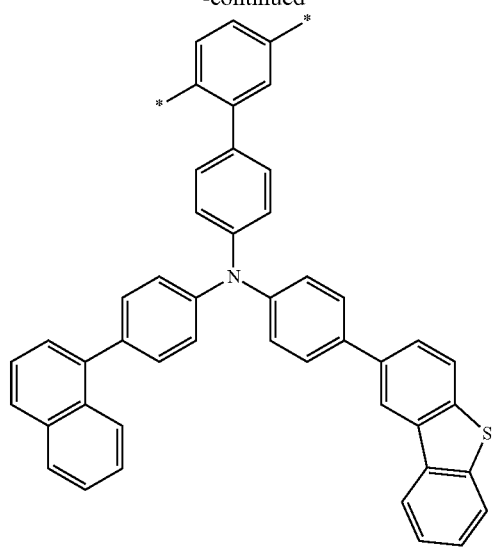
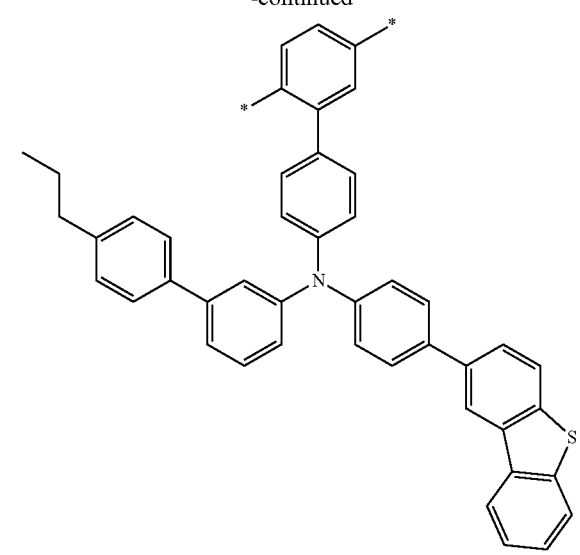
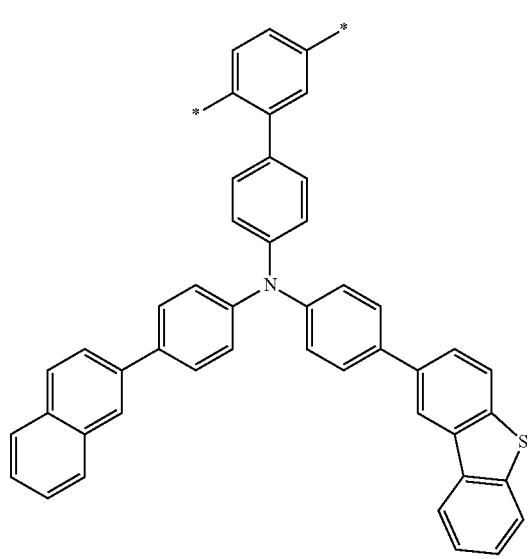
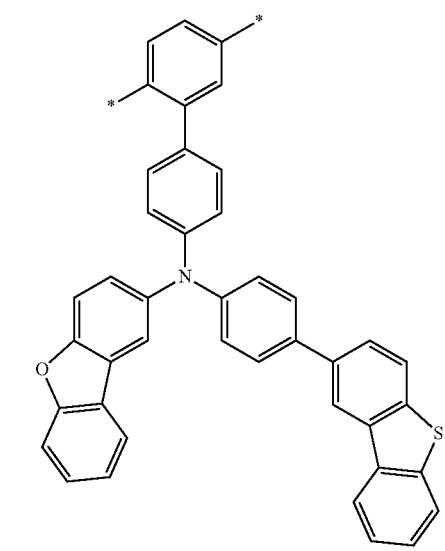
[Group 21]

95
-continued
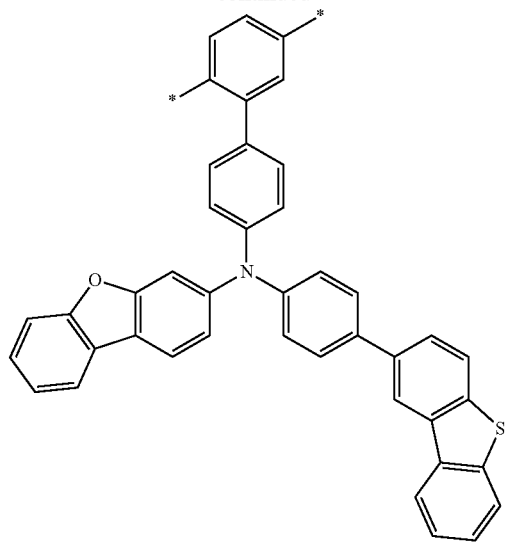
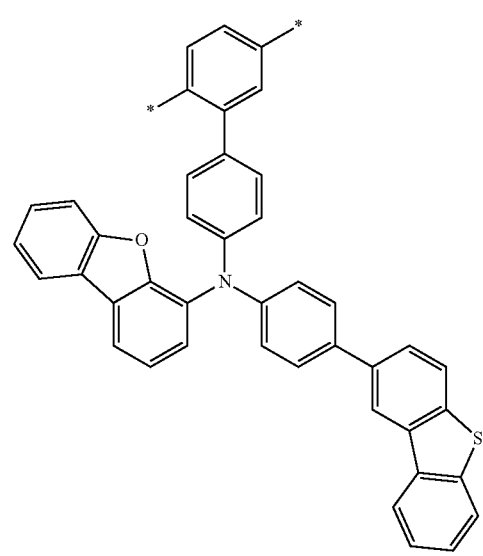
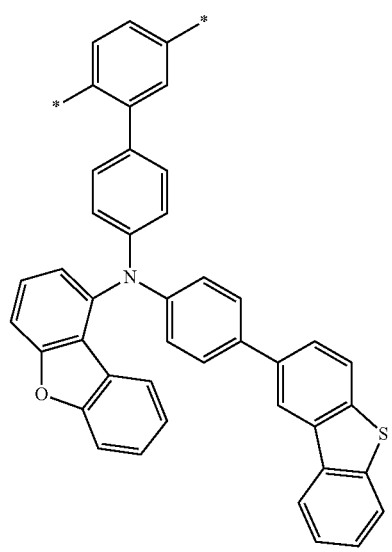
96
-continued
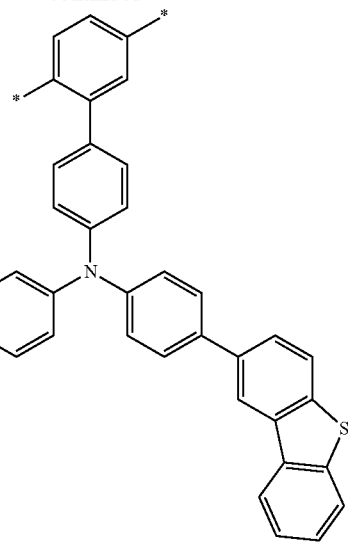
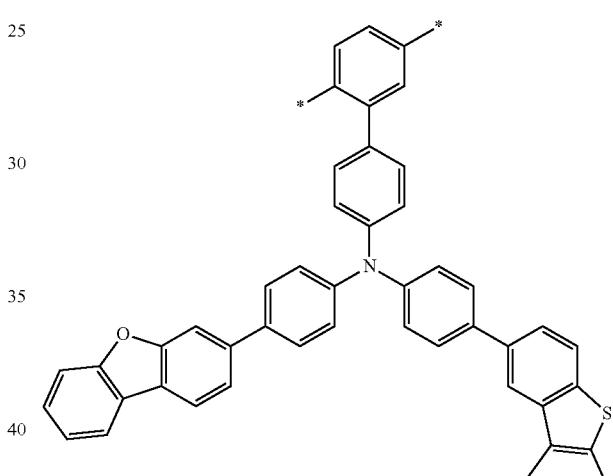
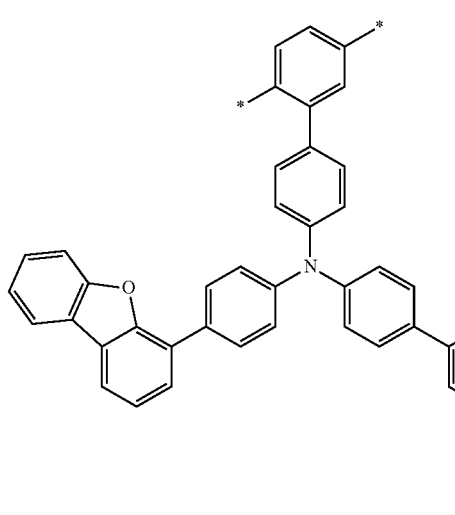

97
-continued
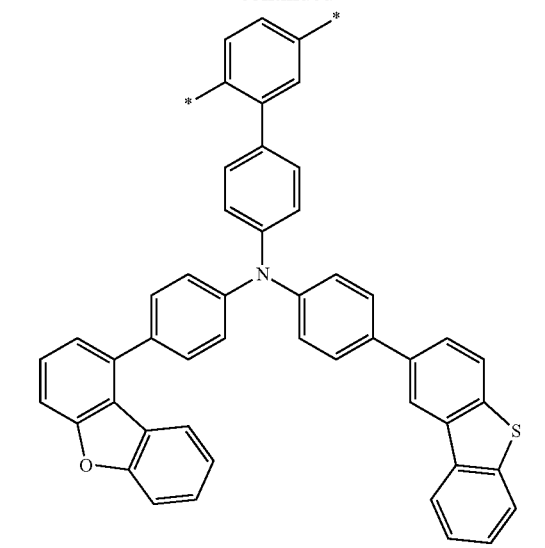
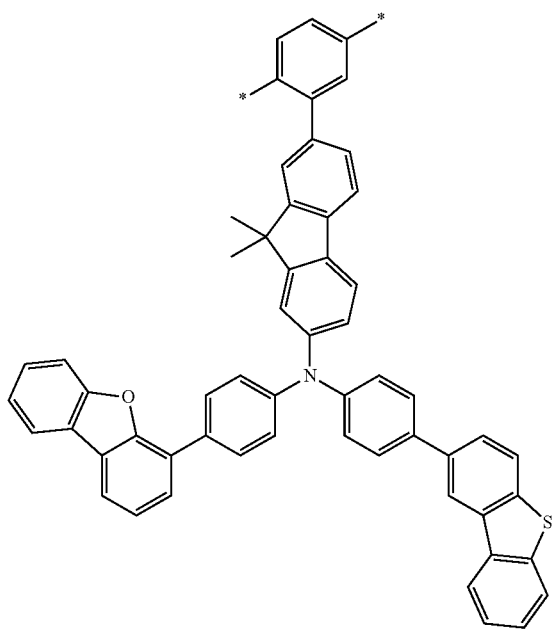
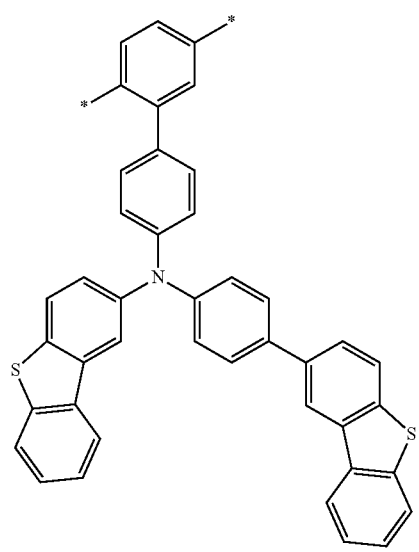
98
-continued
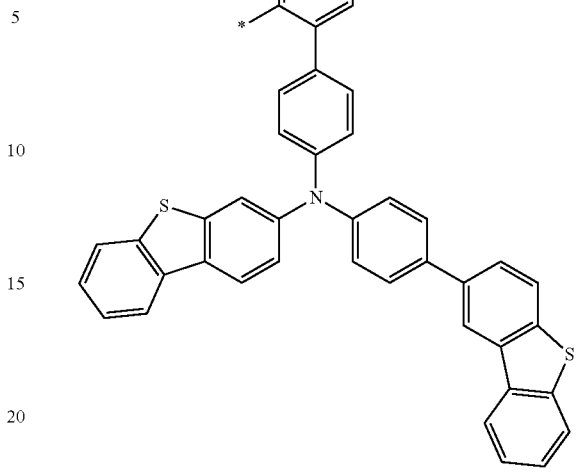
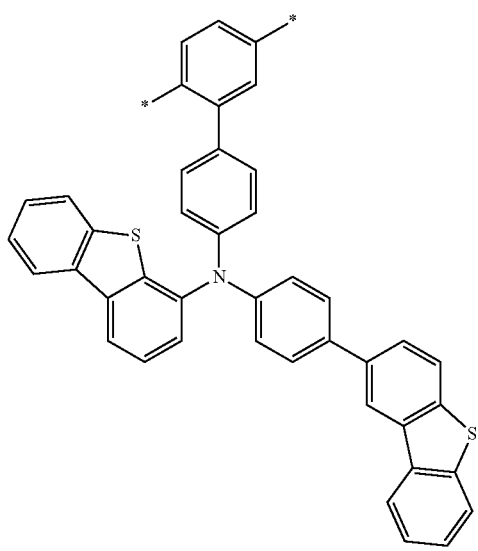
[Group 22]
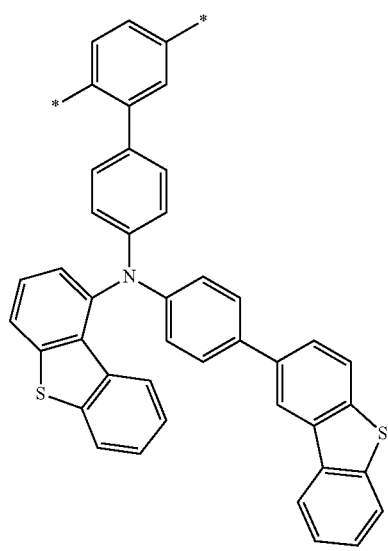

99
-continued
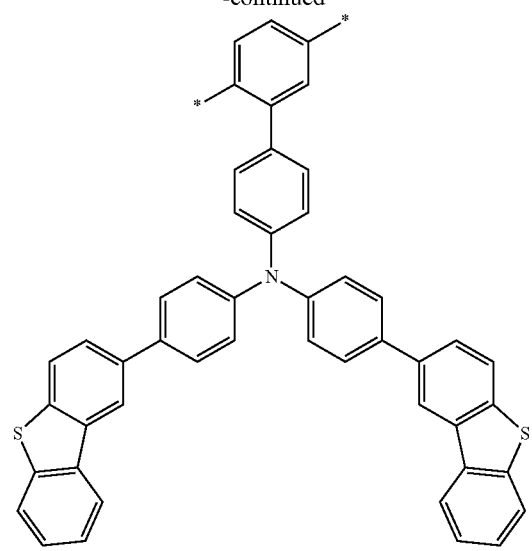
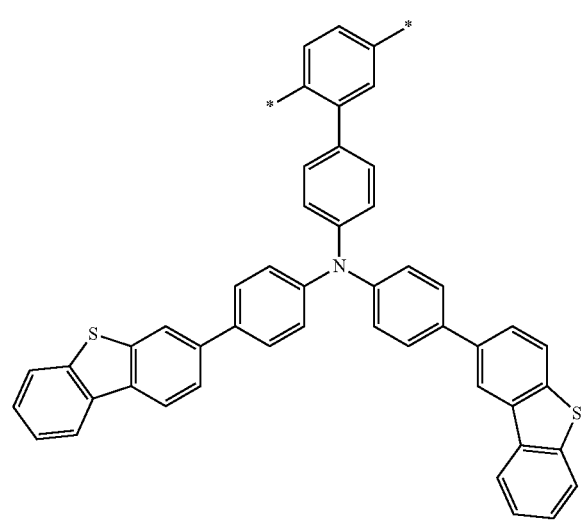
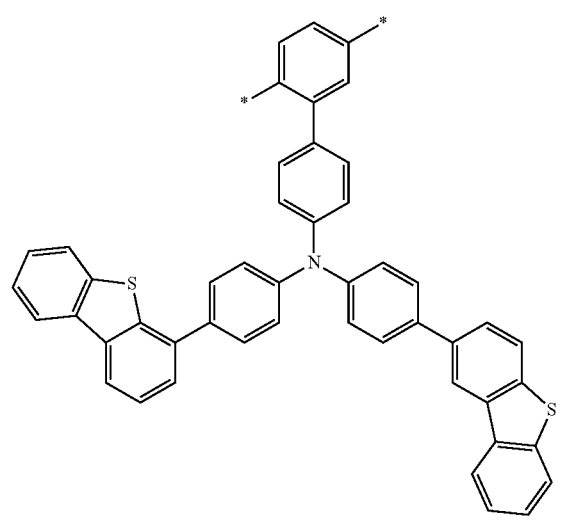
100
-continued
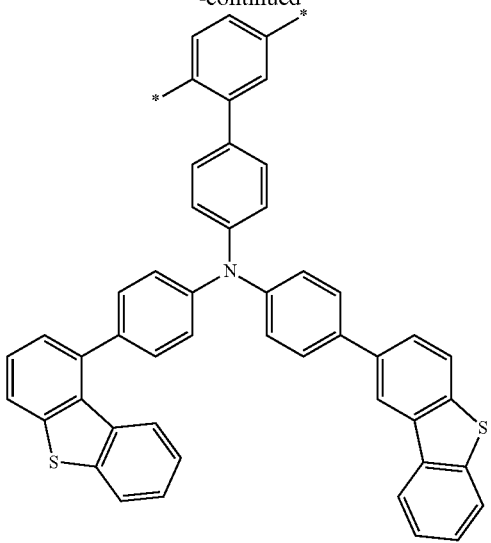
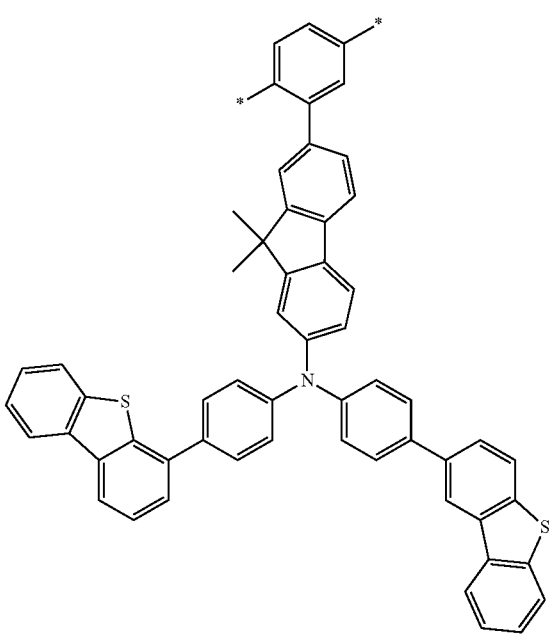
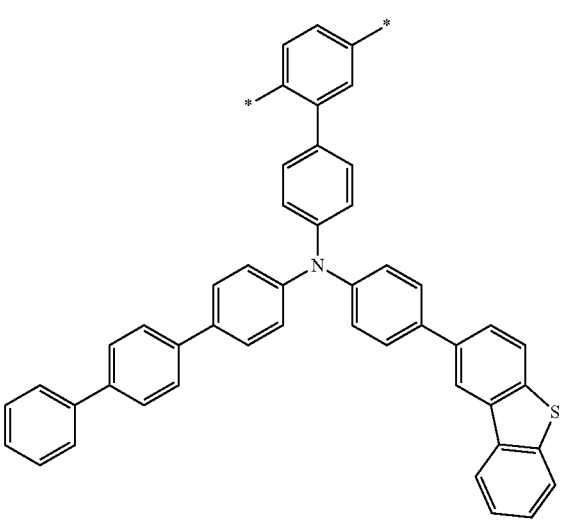

101
-continued
102
-continued
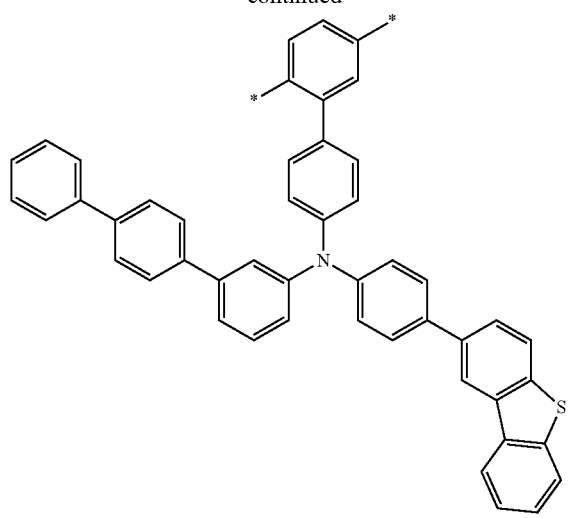
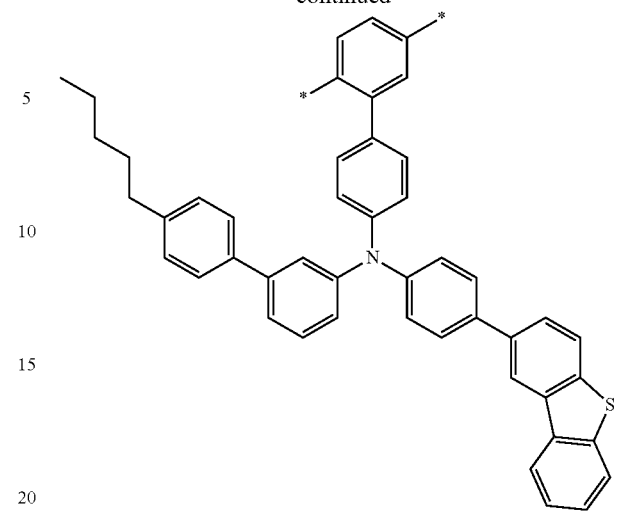
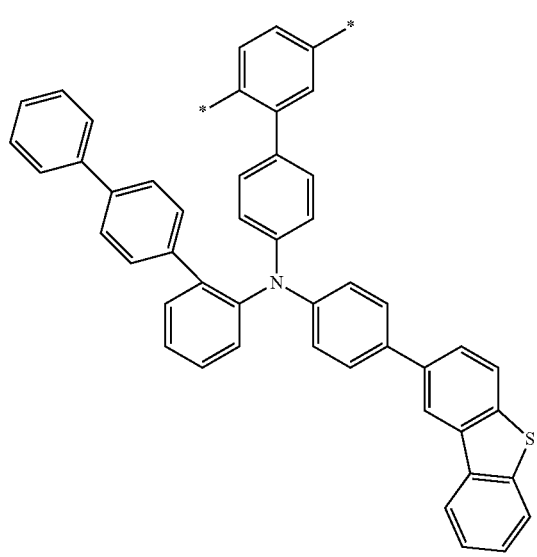
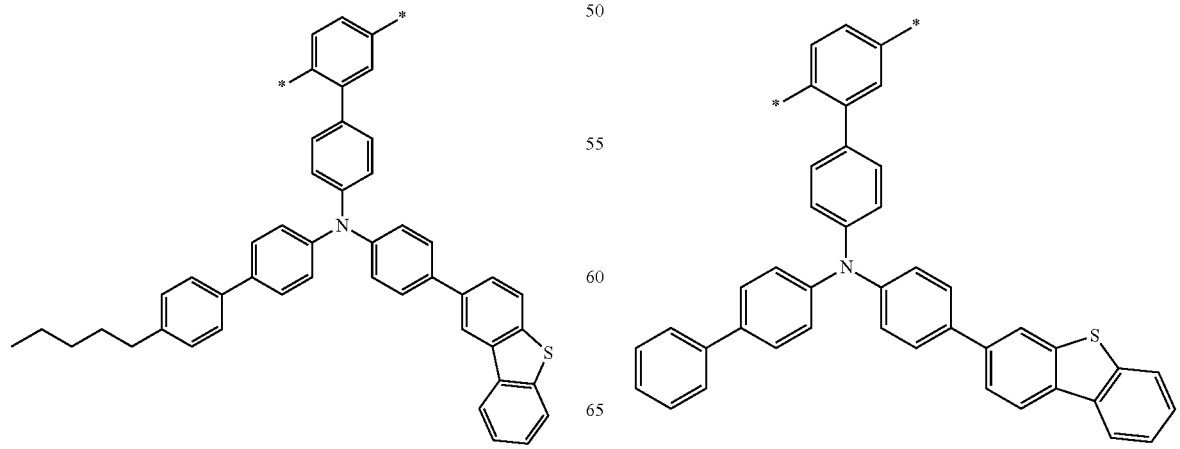
[Group 23]

103
-continued
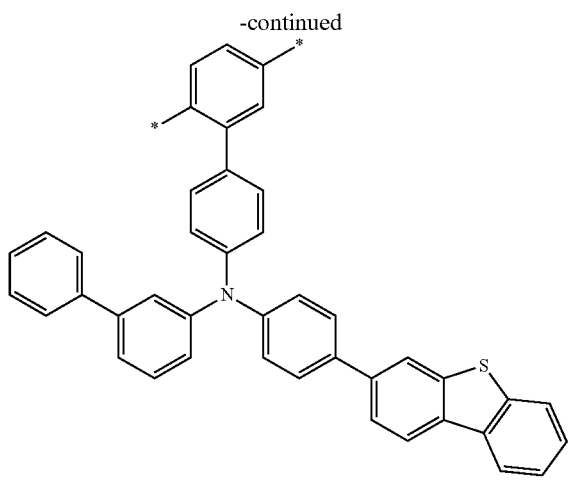
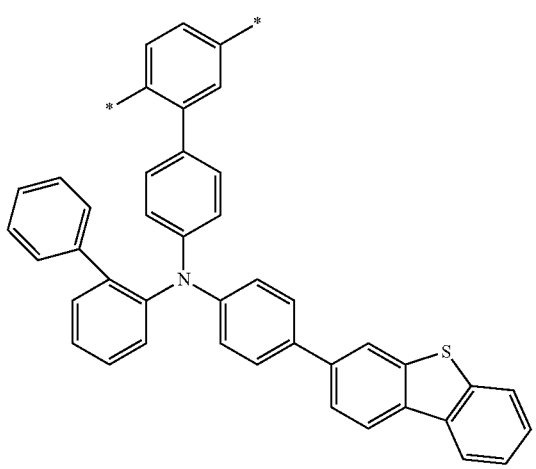
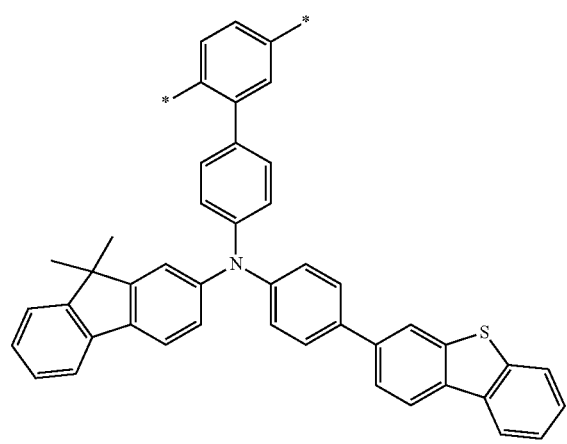
104
-continued
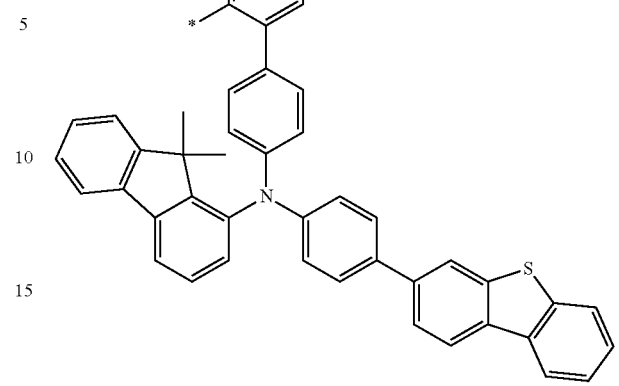
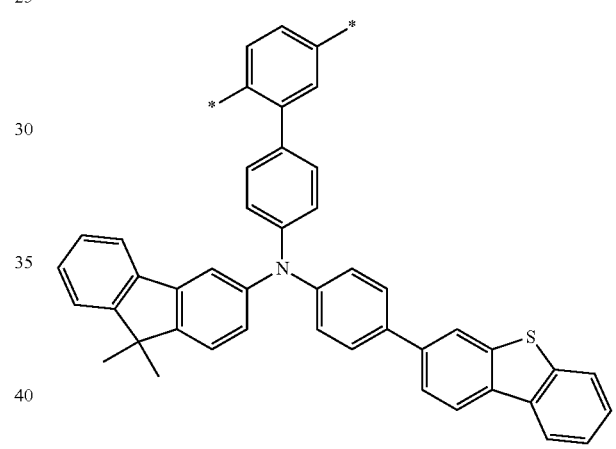
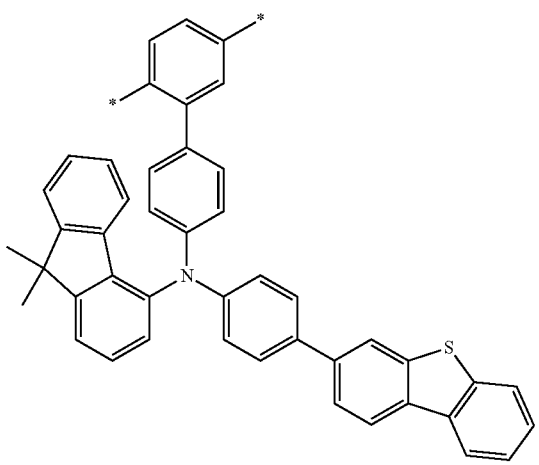

-continued
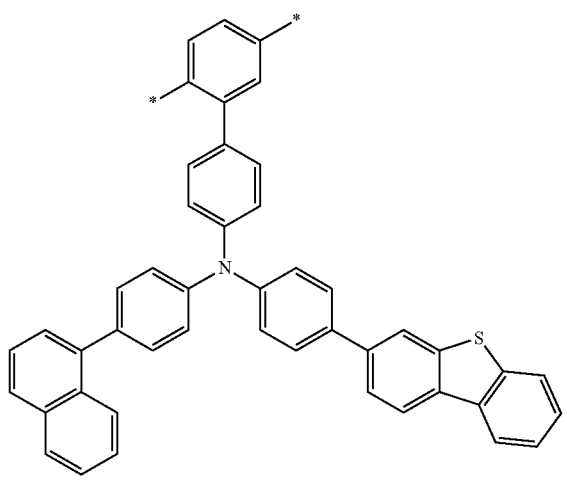
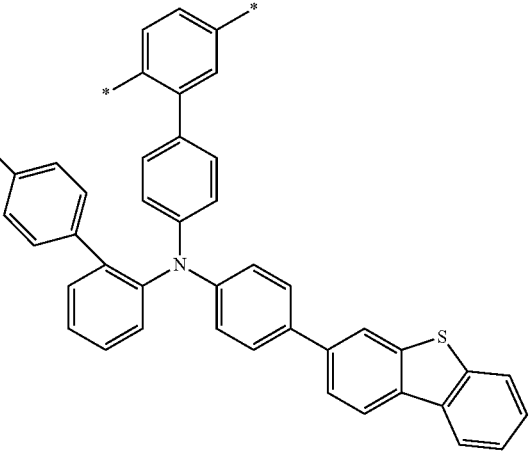
[Group 24]
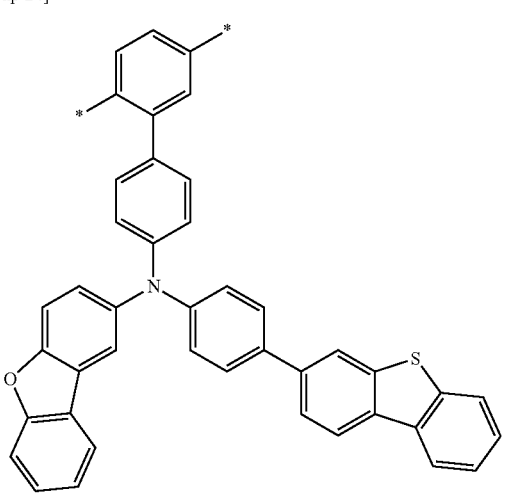
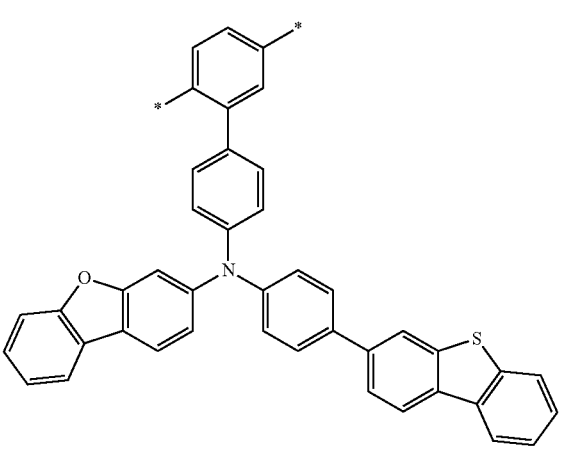

107
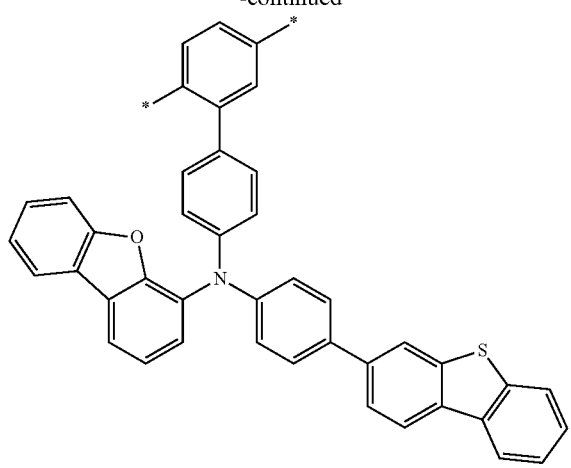
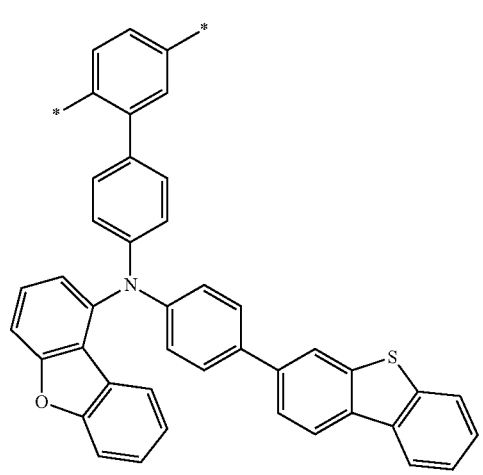
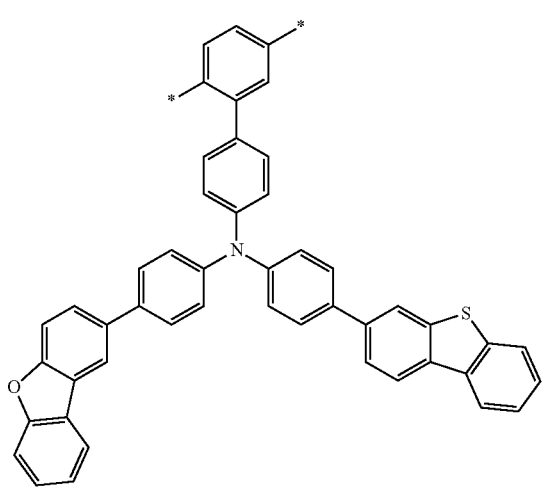
108
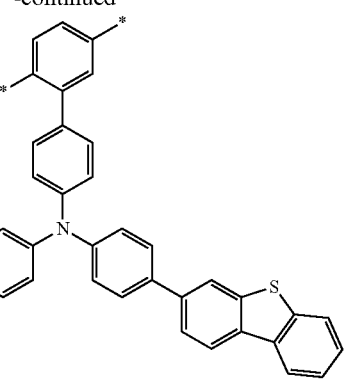
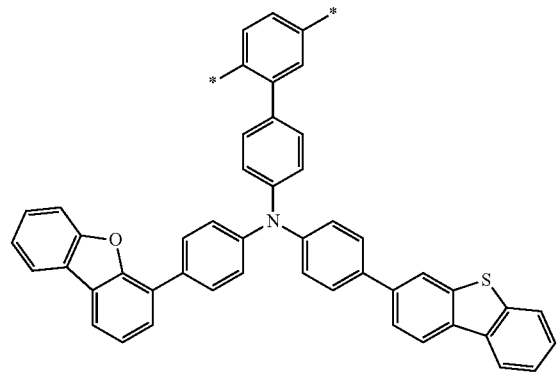
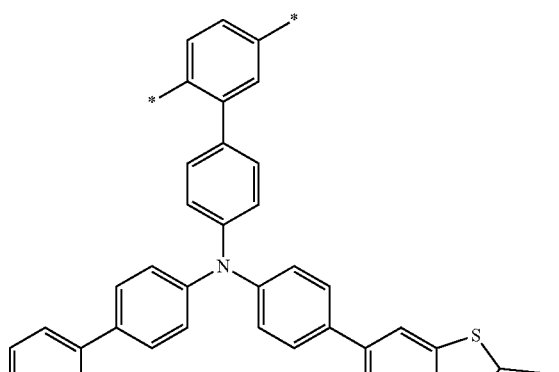
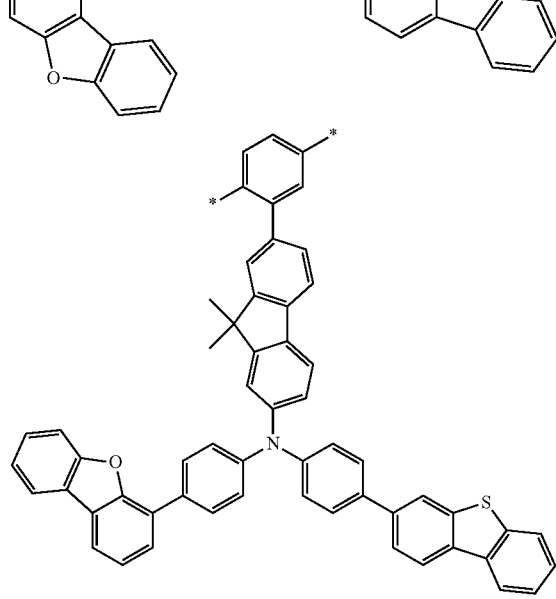

-continued
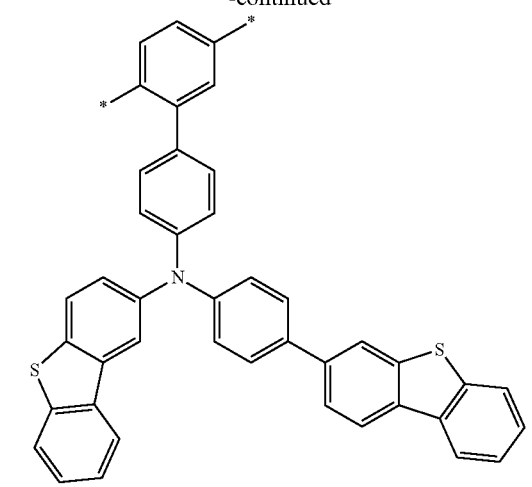
[Group 25]
-continued
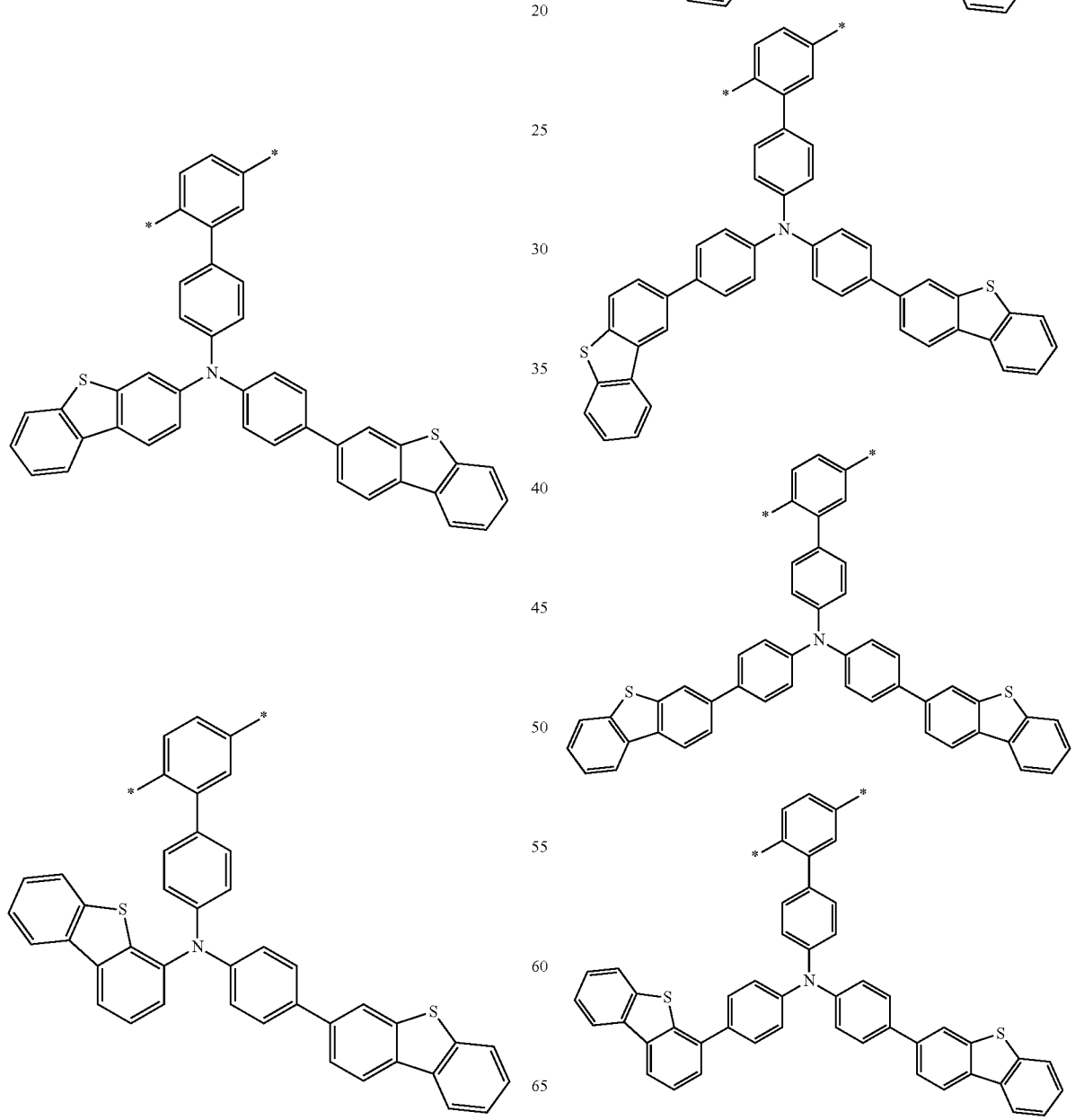

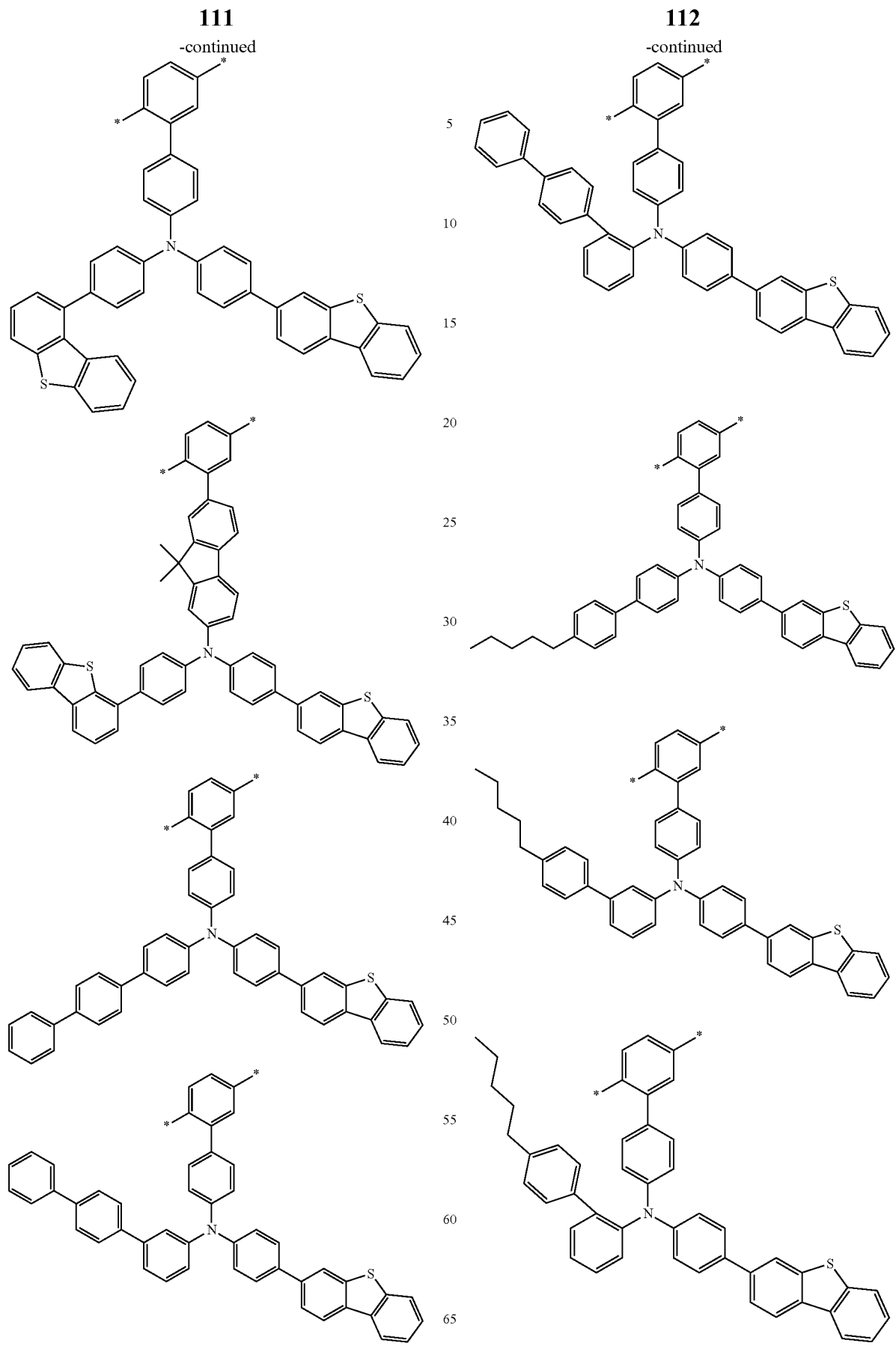

[Group 26]
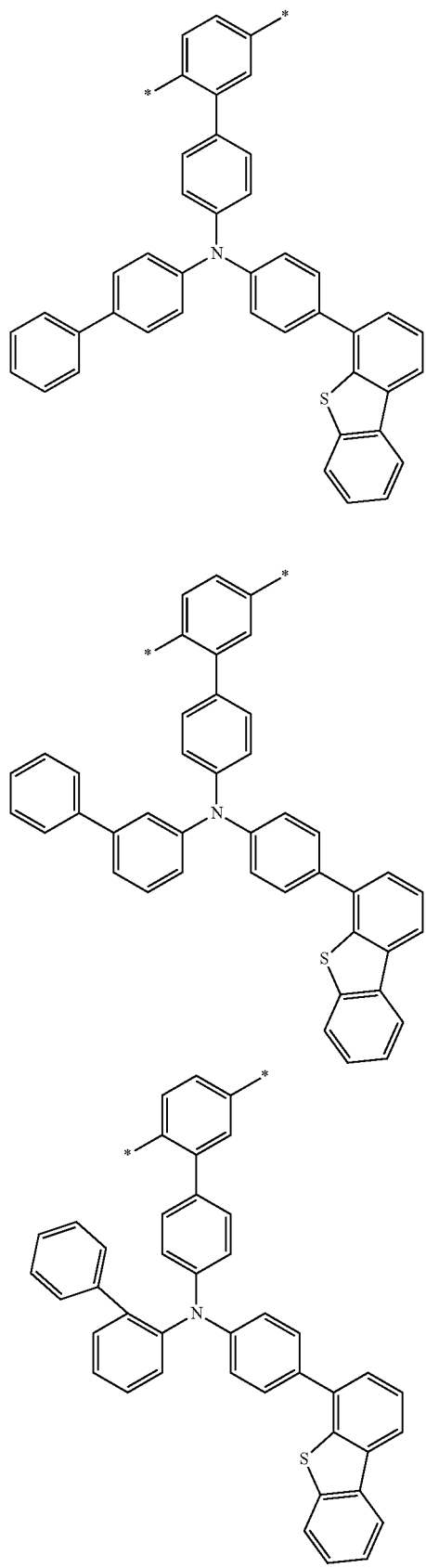
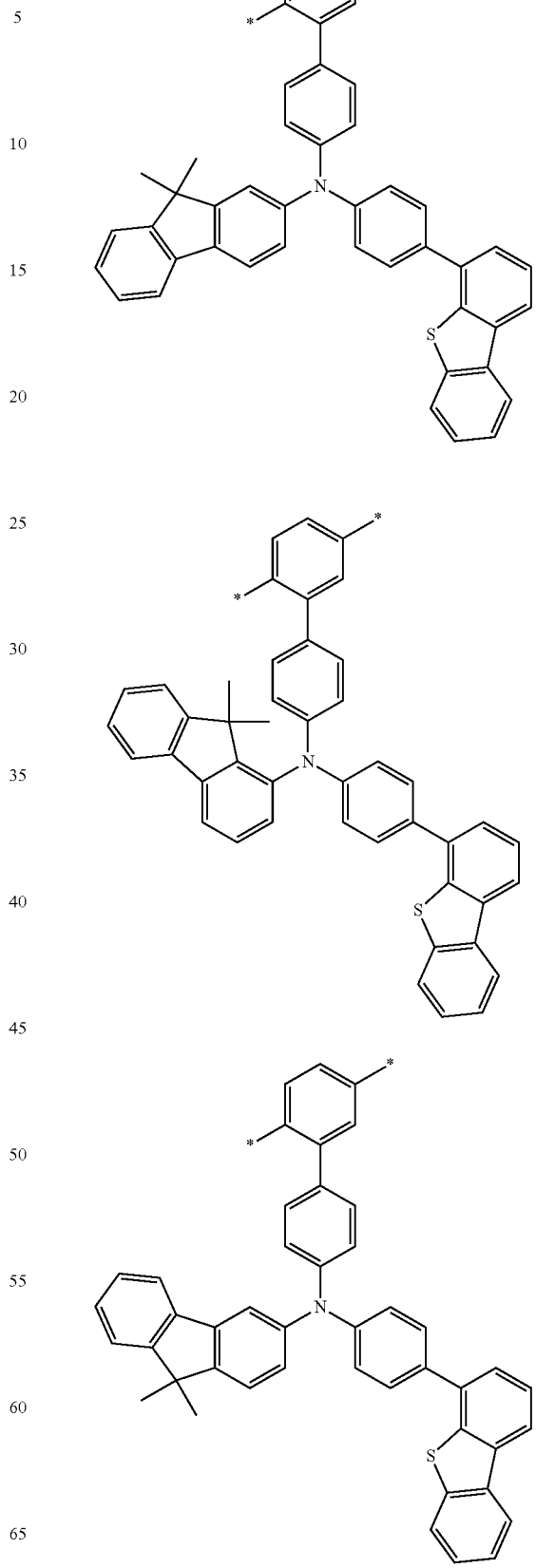

115
-continued
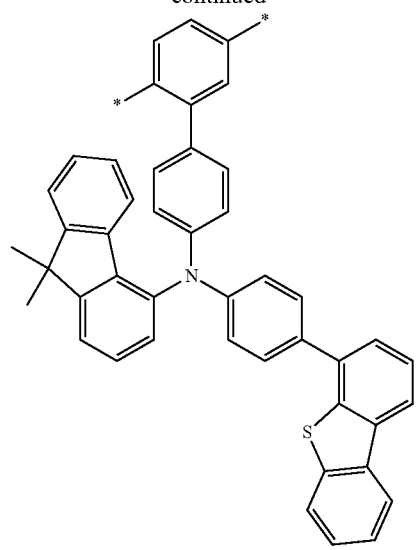
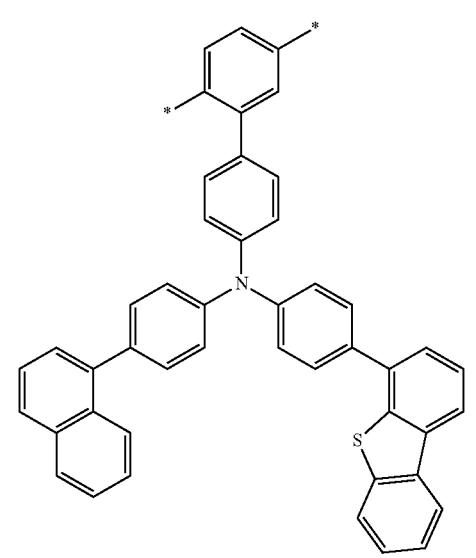
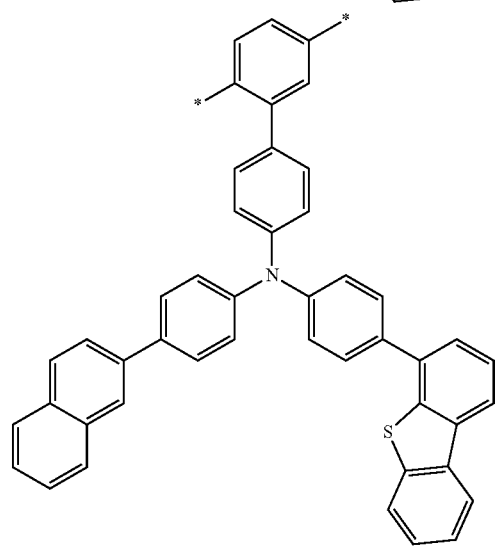
116
-continued
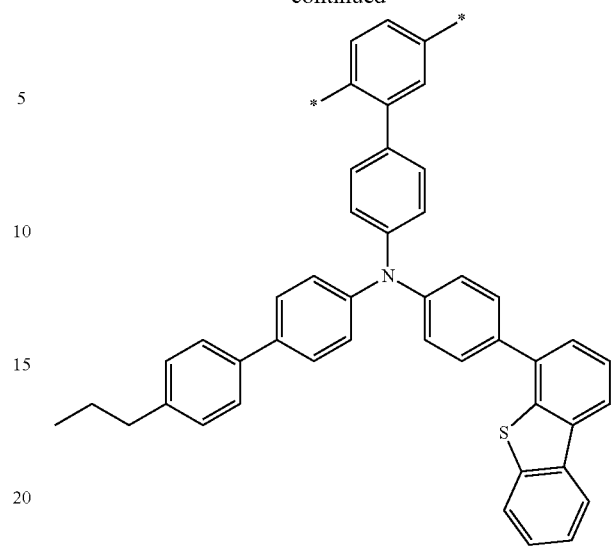
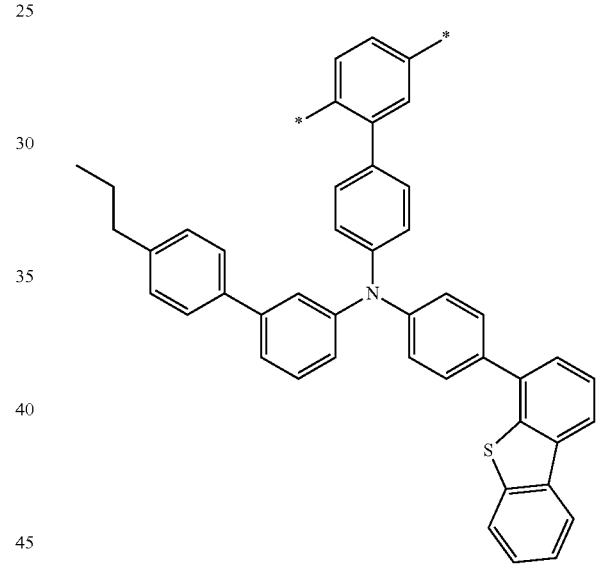
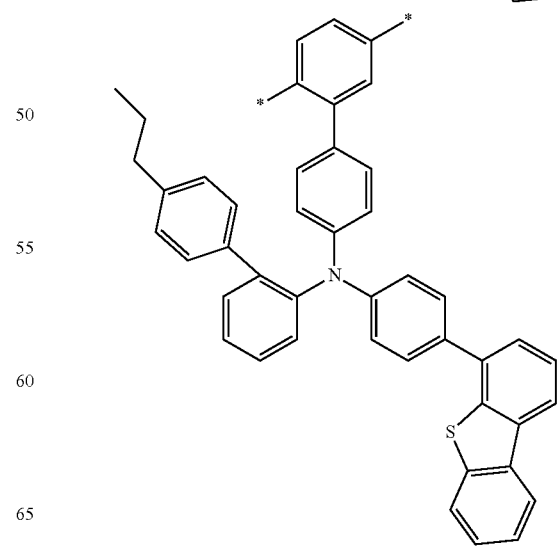

[Group 27]
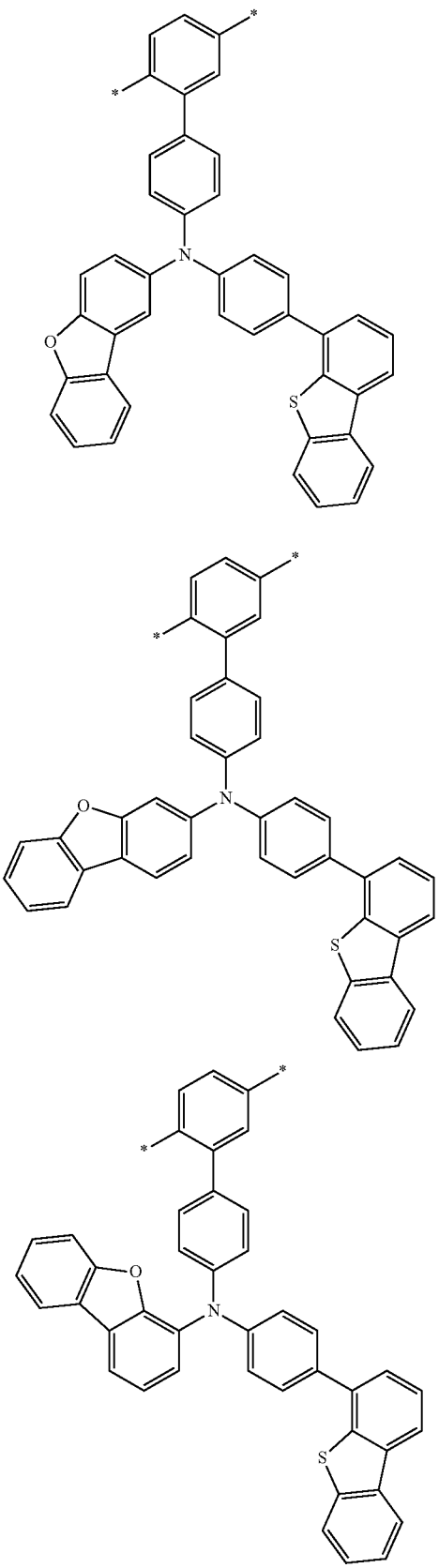
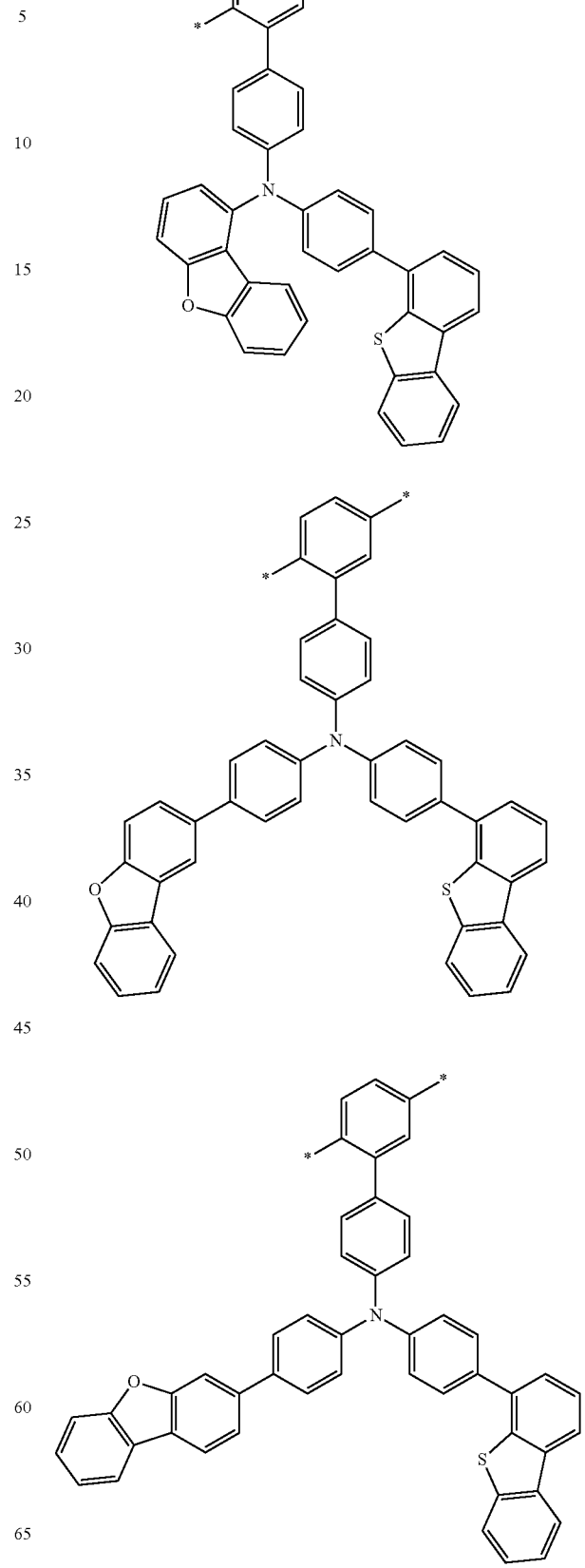

119
-continued
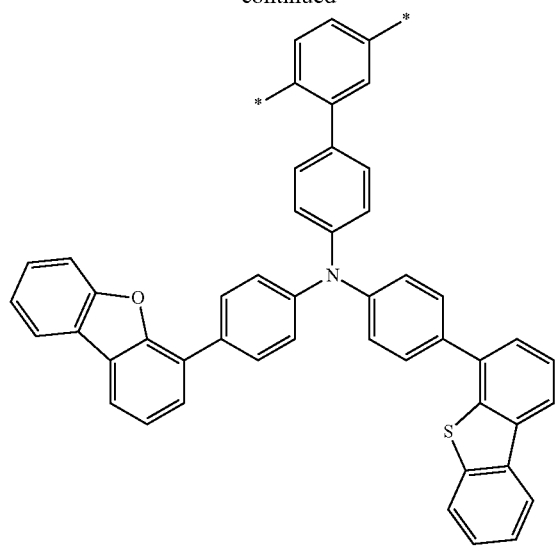
120
-continued
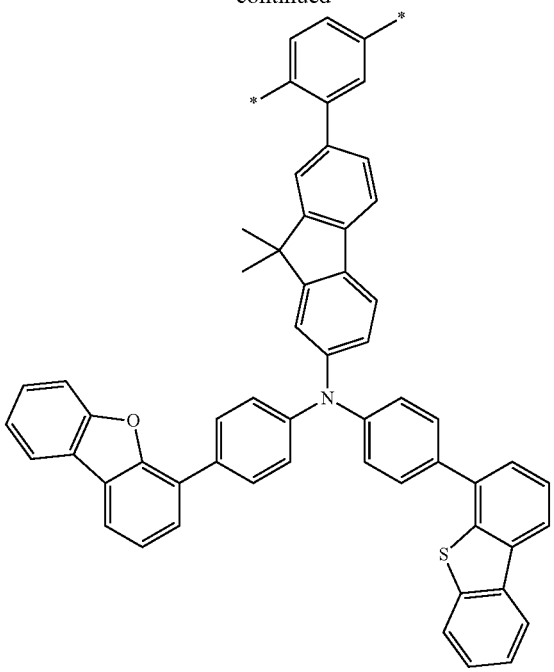
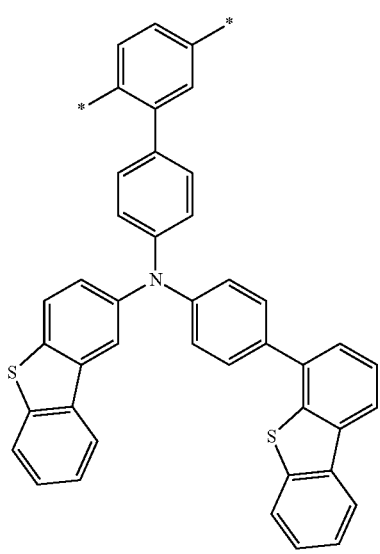

121
-continued
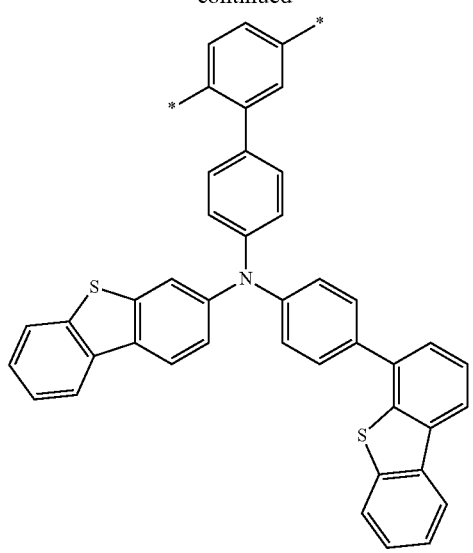
[Group 28]
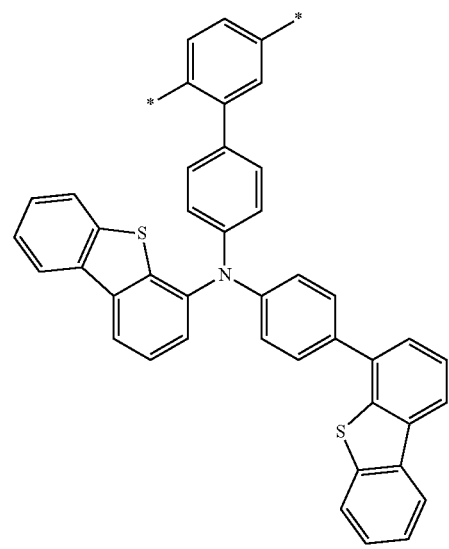
122
-continued
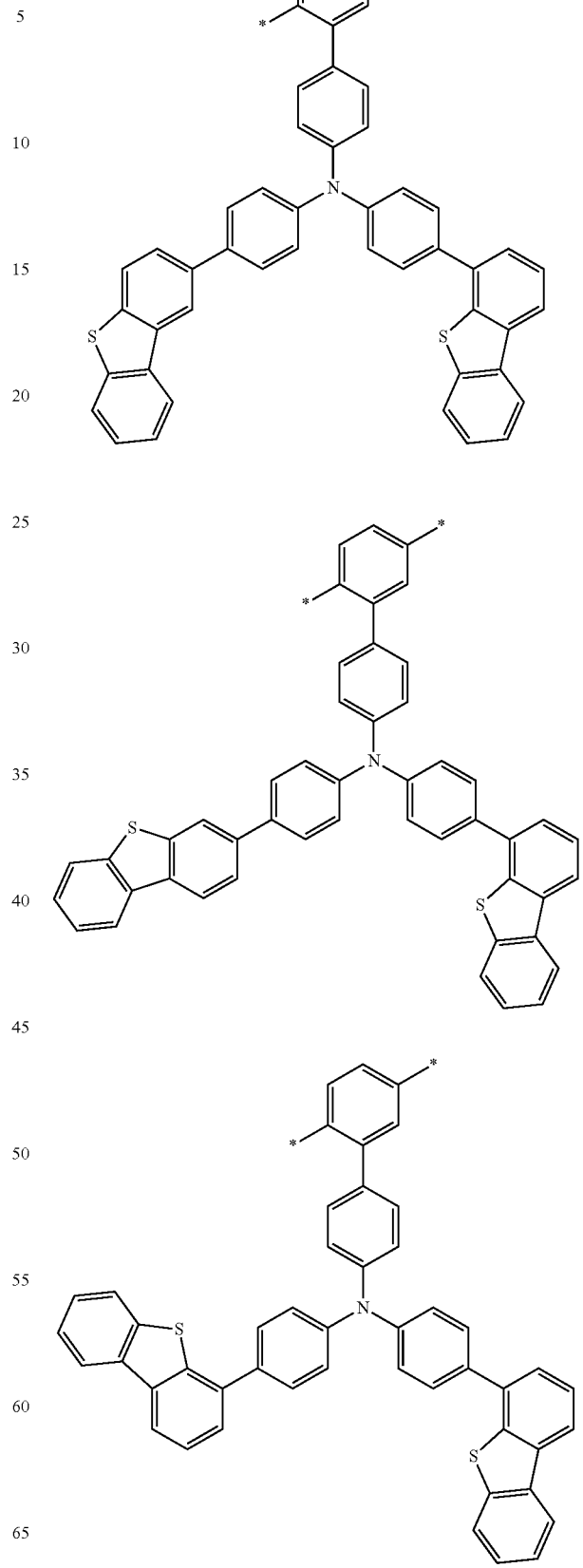

123
-continued
124
-continued
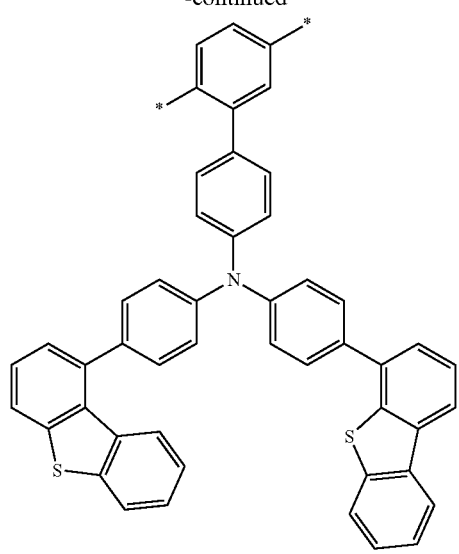
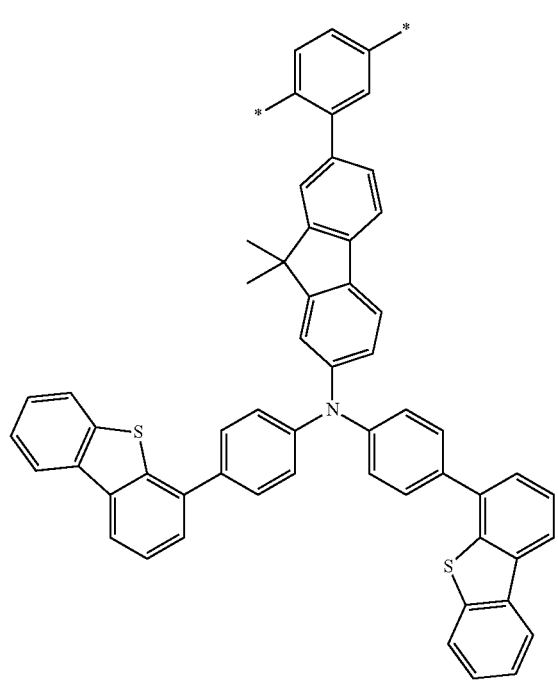
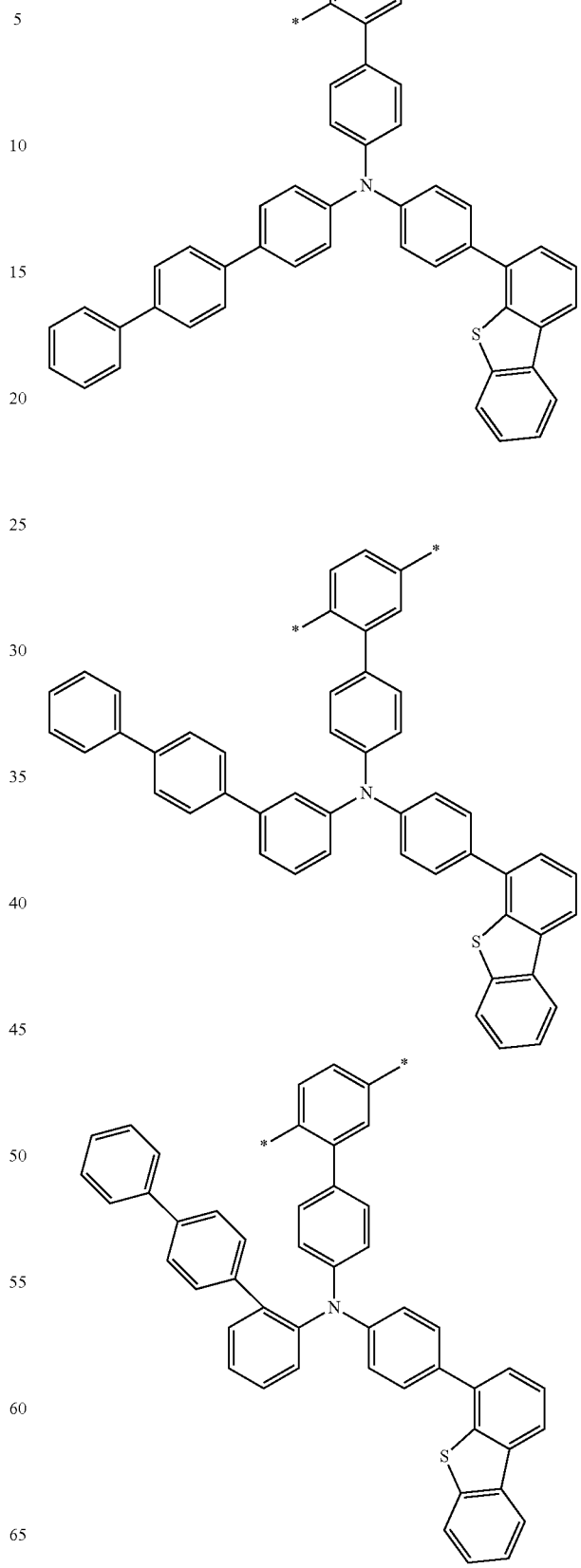

125
-continued
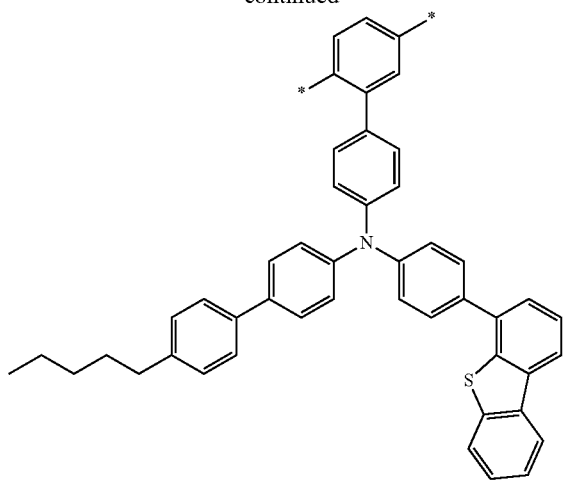
126
-continued
[Group 29]
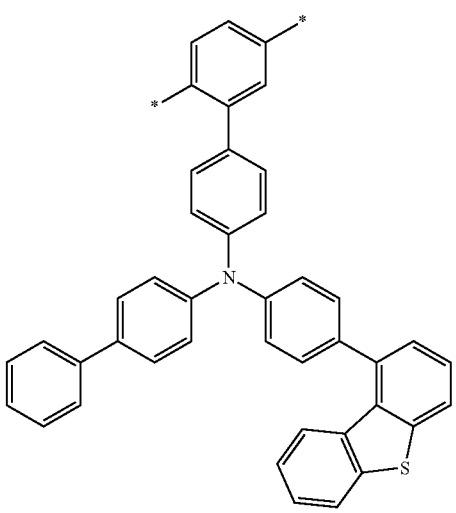
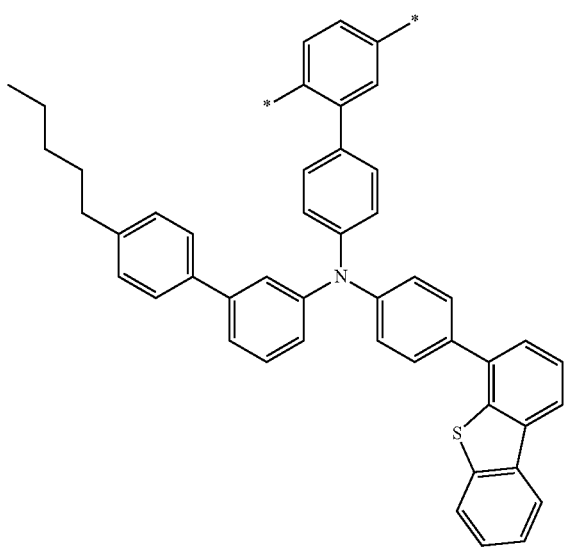
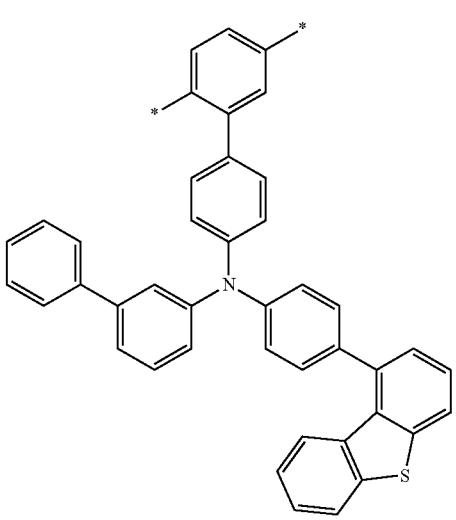
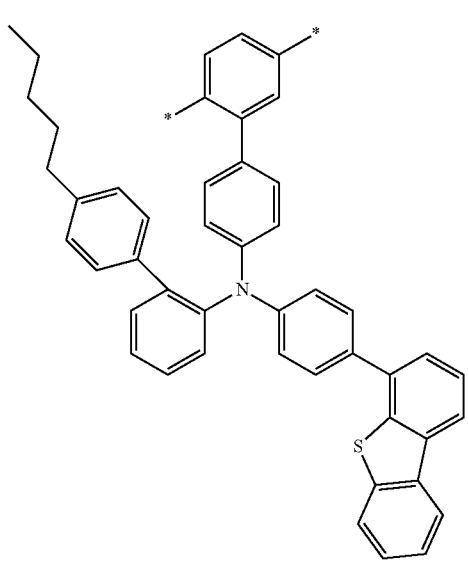
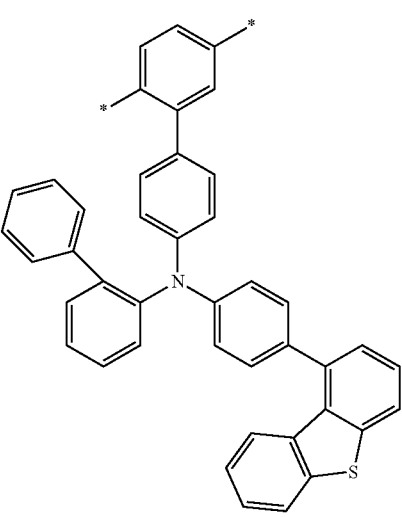

127
-continued
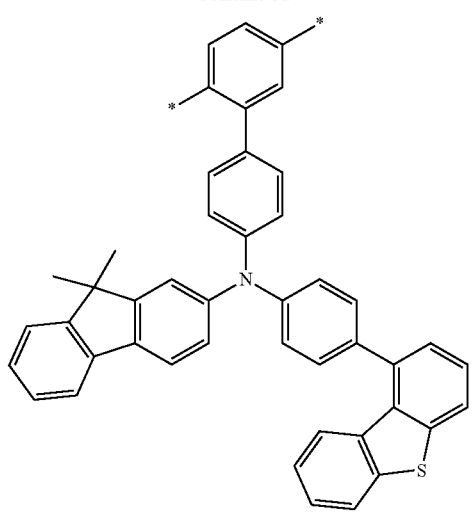
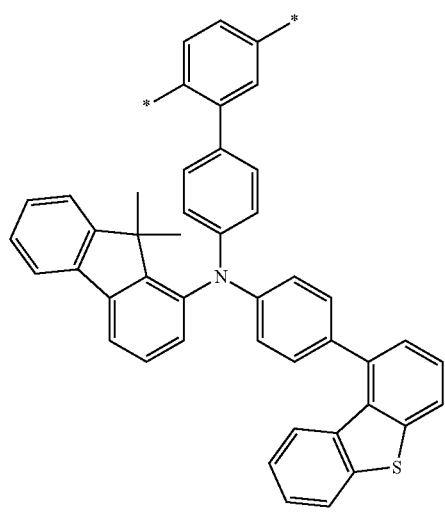
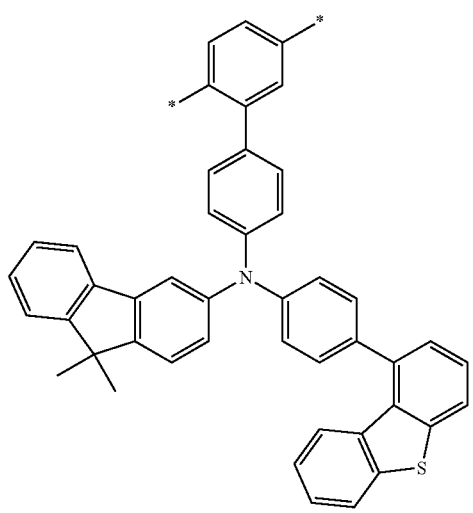
128
-continued
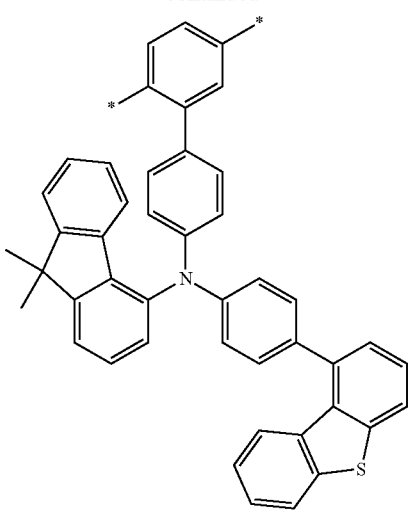
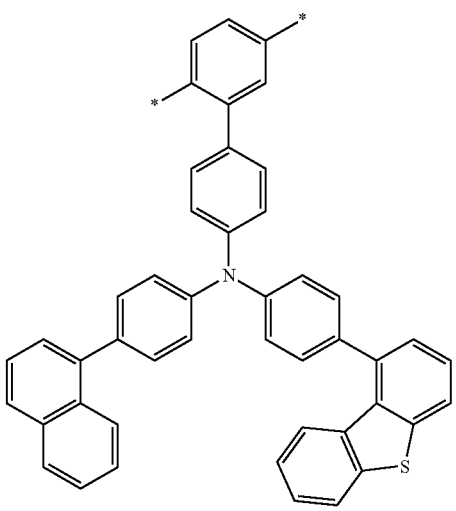
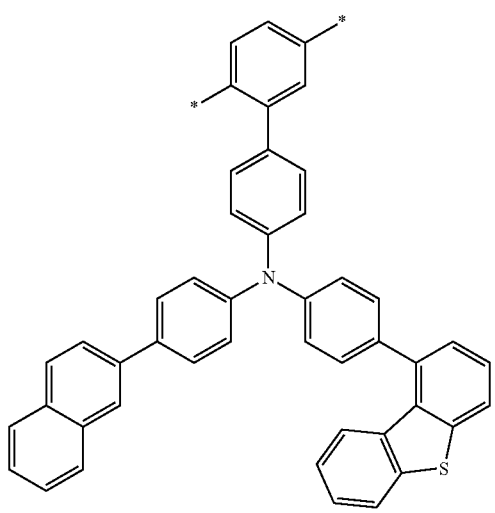

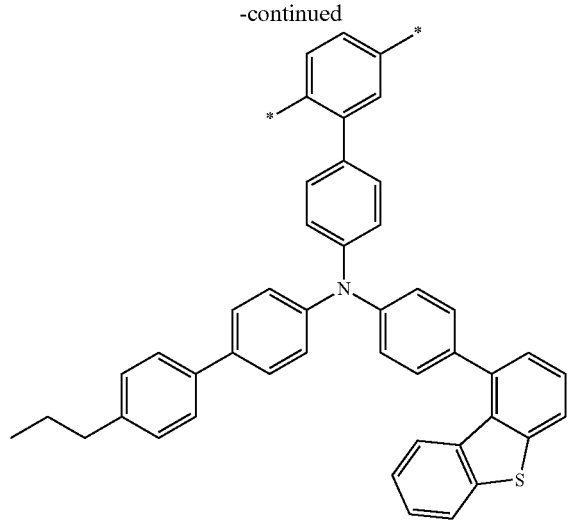
[Group 30]
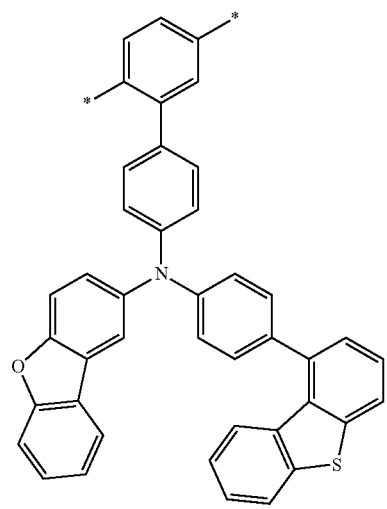
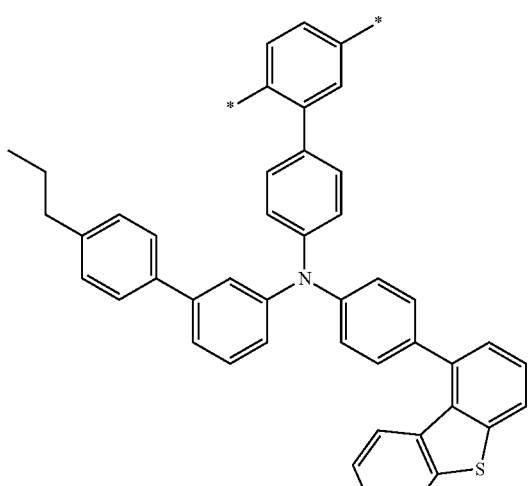
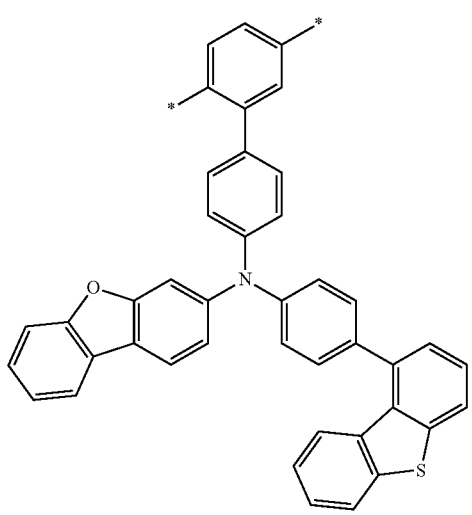
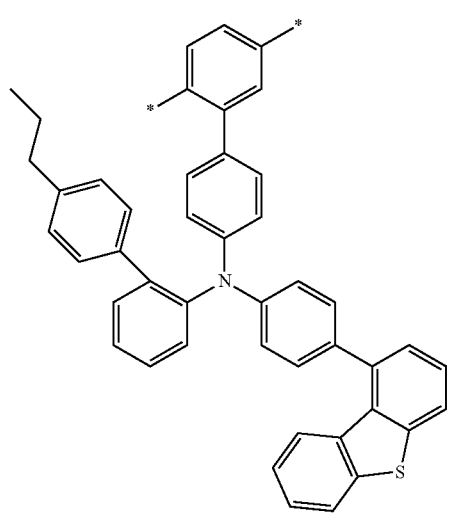
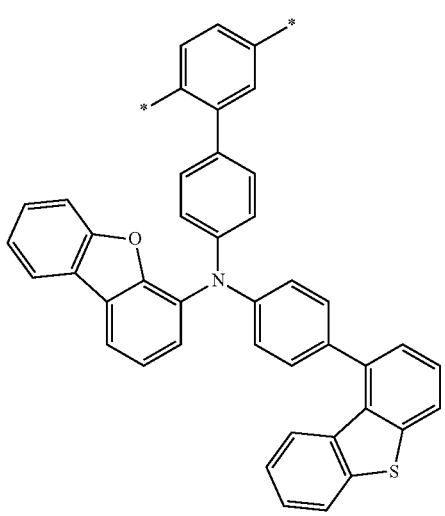

131
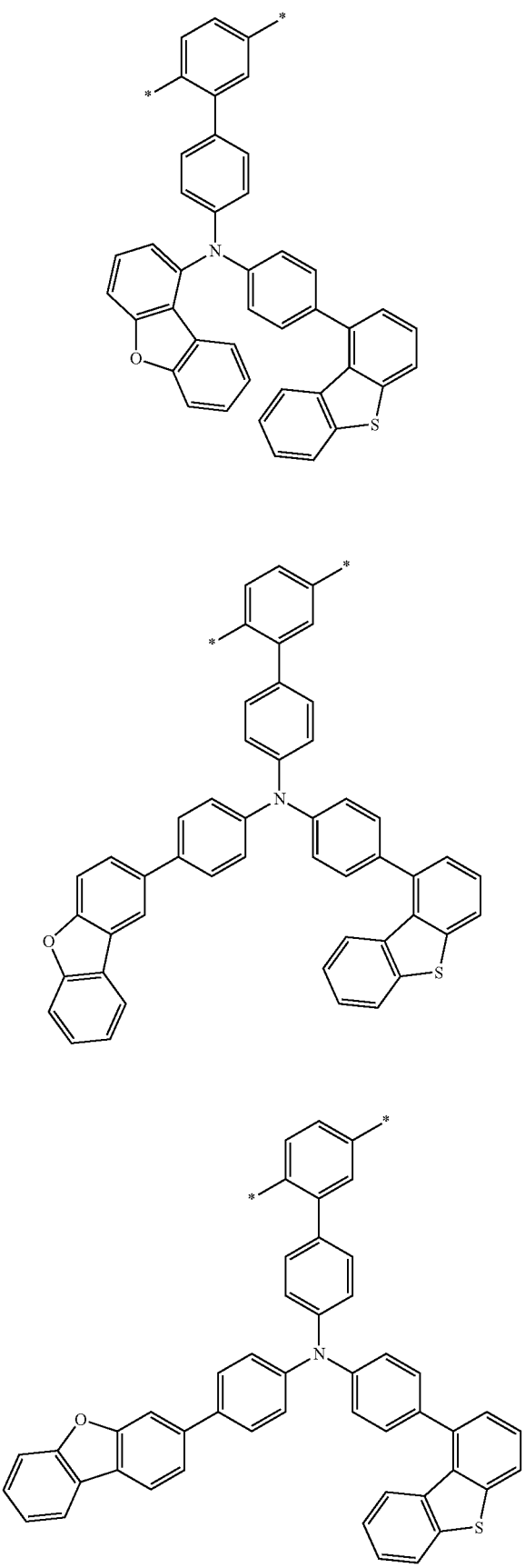
132
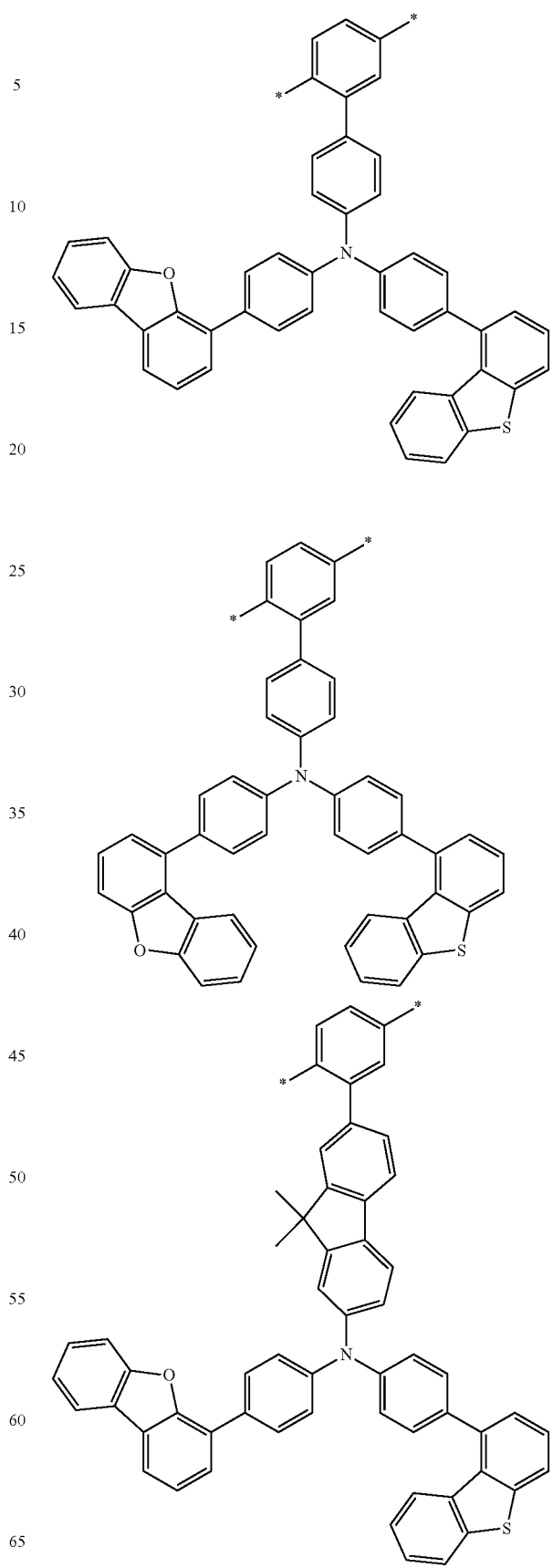

-continued
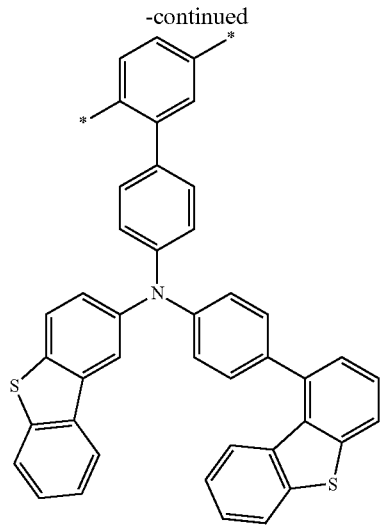
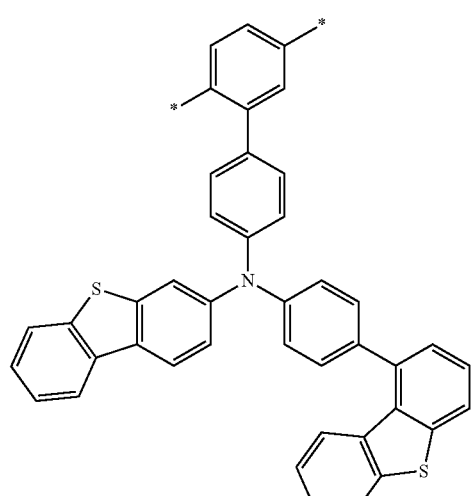
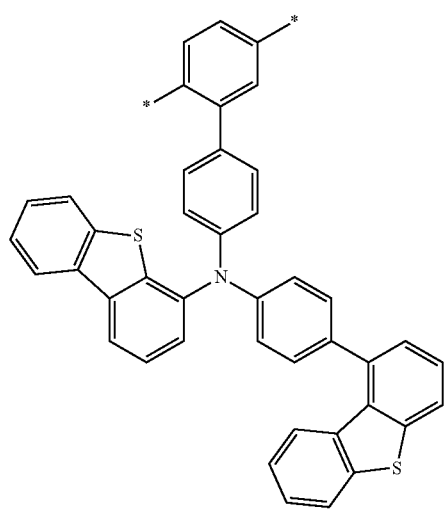
-continued
[Group 31]
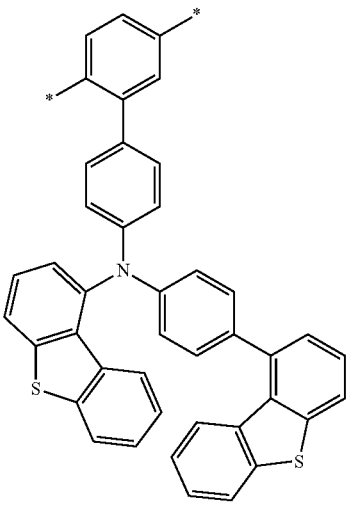
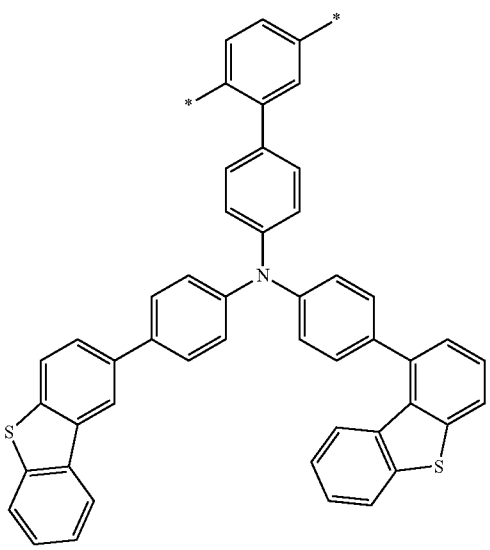
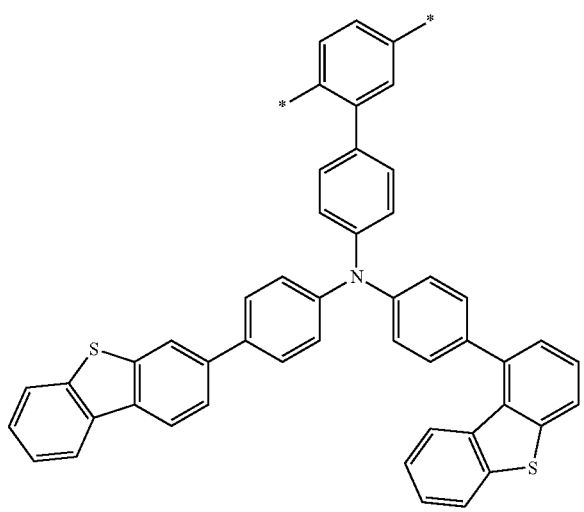

135
-continued
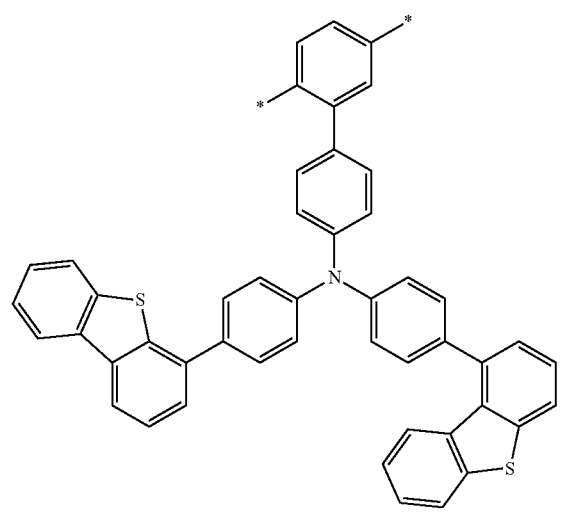
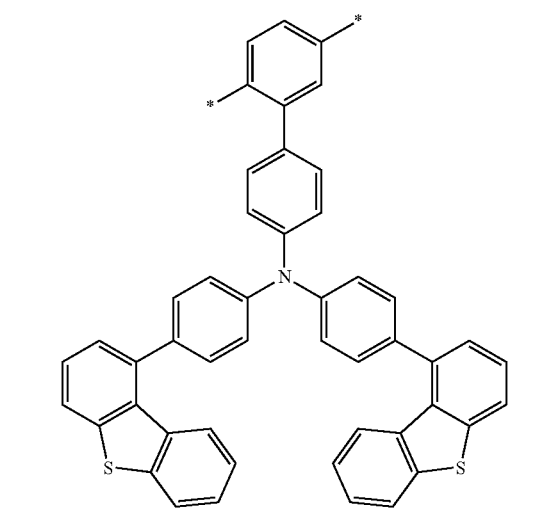
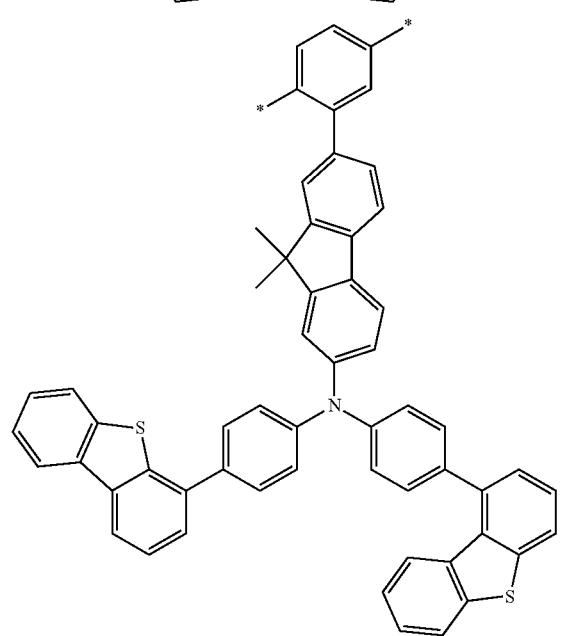
136
-continued
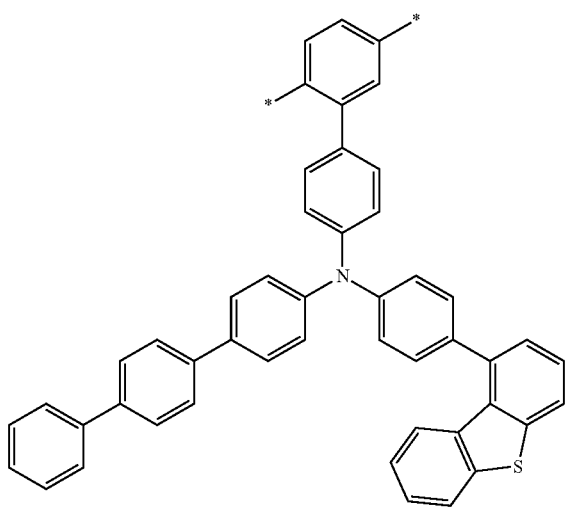
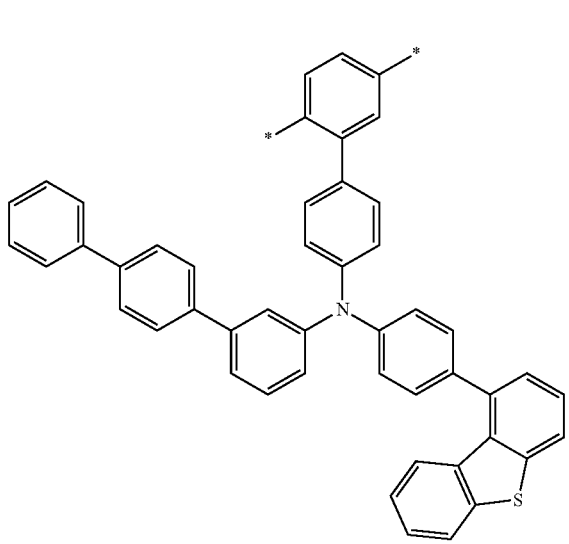
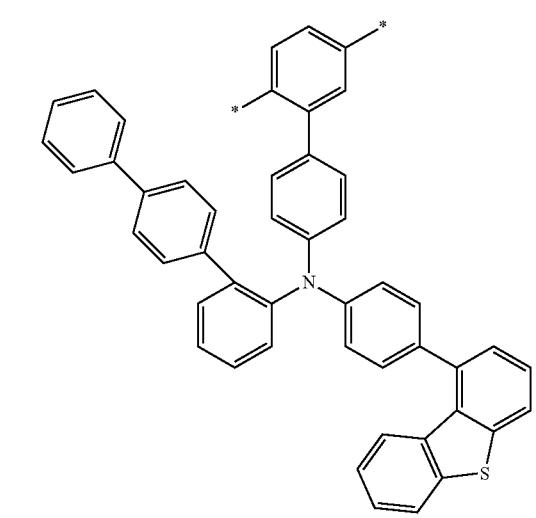

-continued
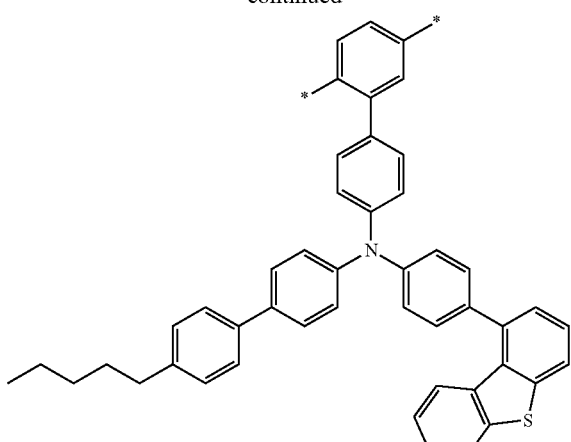
[Group 32]
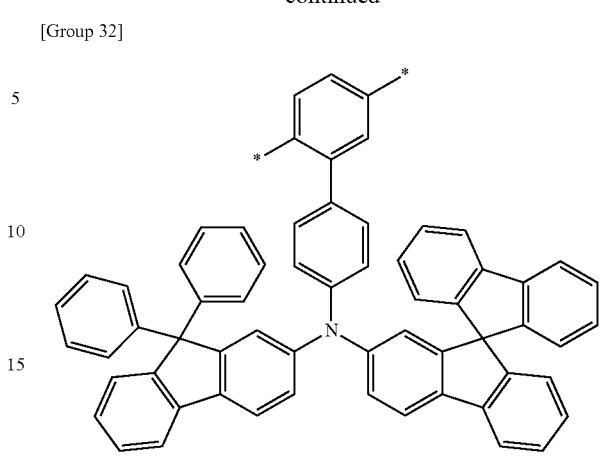
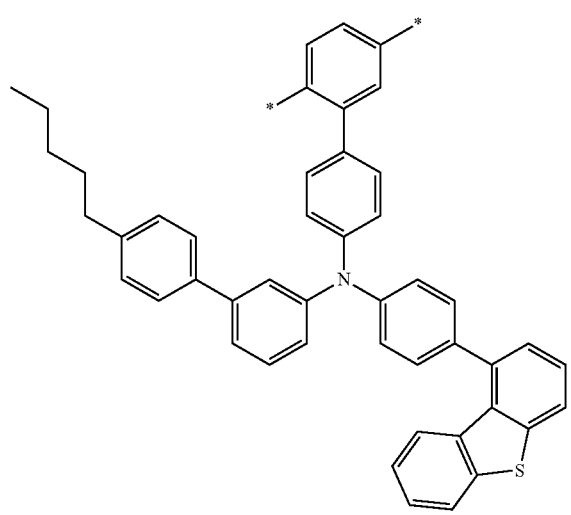
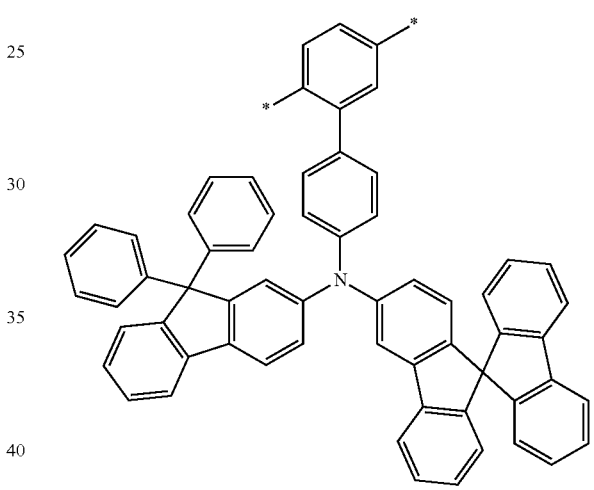
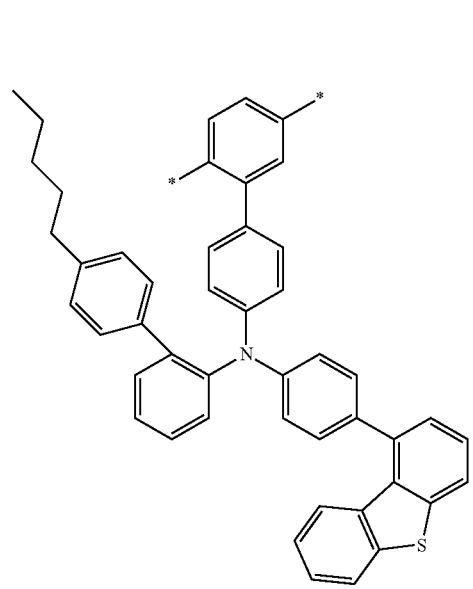
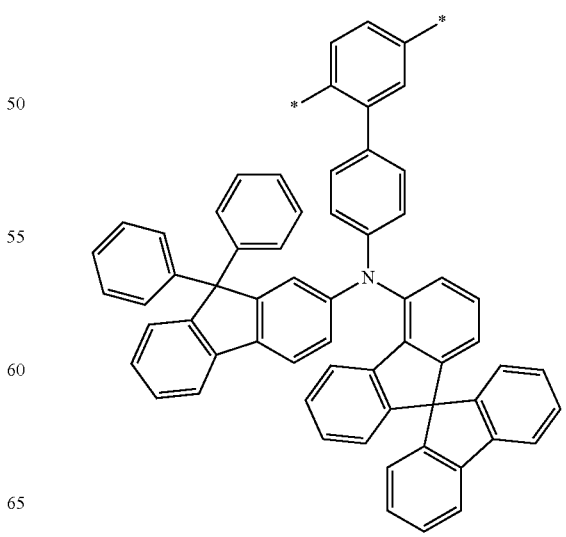

139
-continued
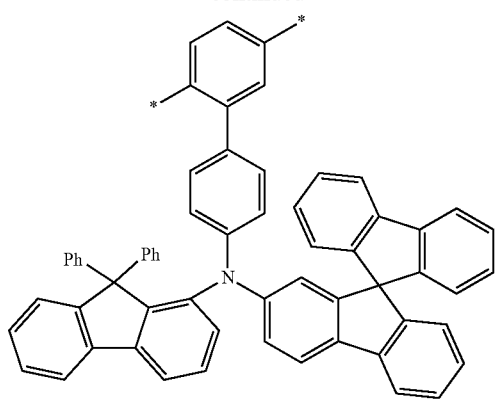
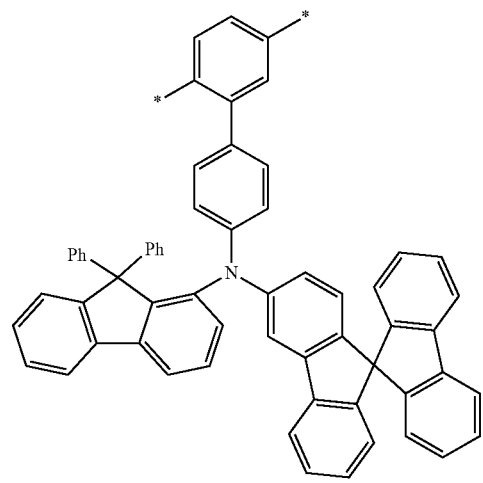
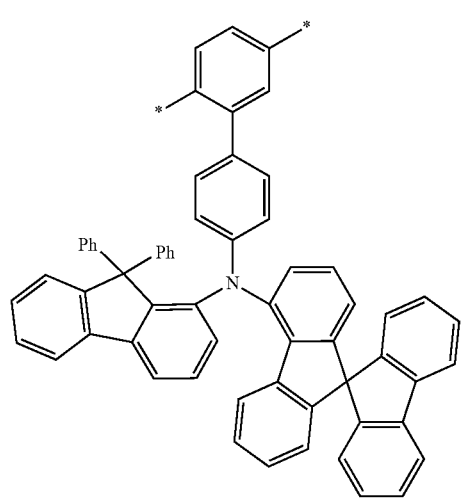
140
-continued
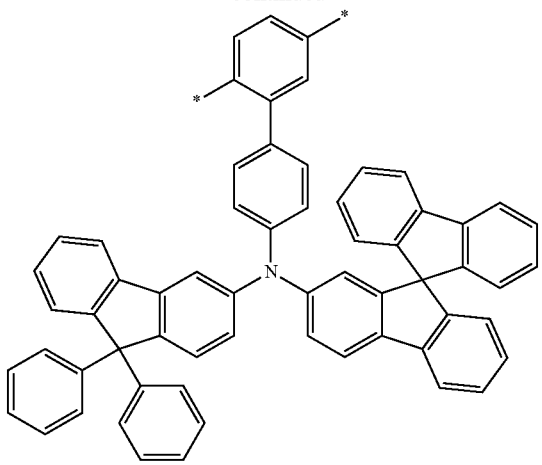
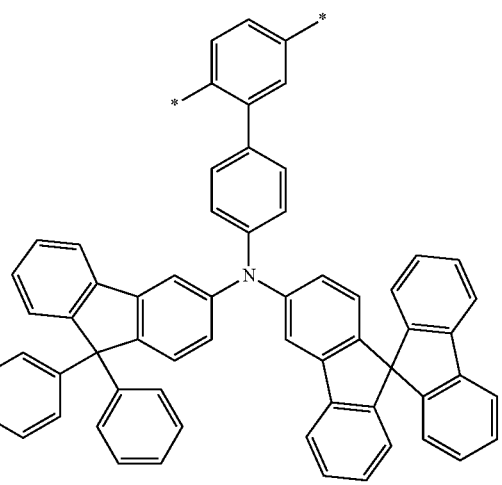
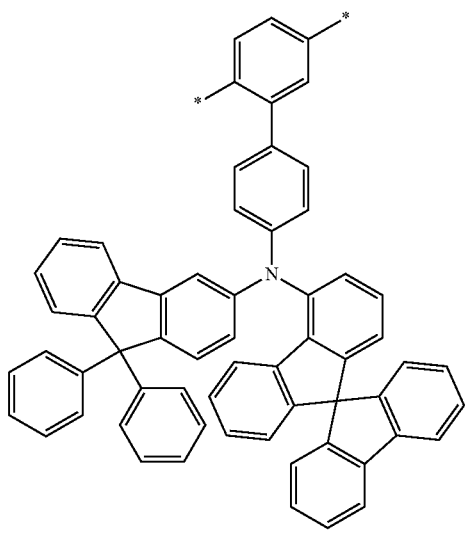

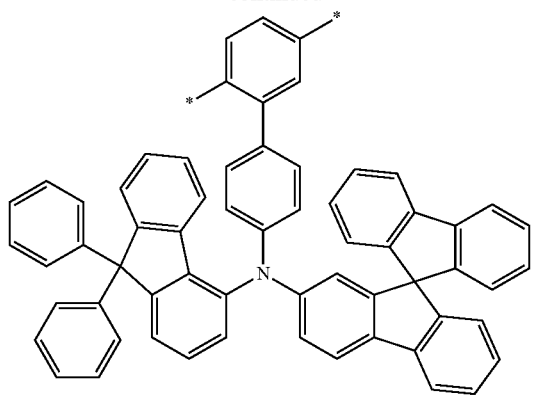
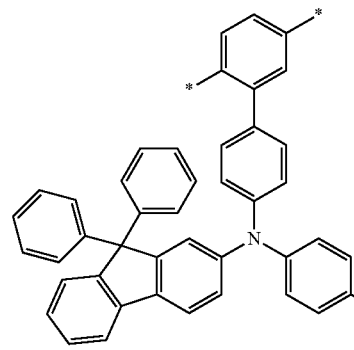
[Group 33]
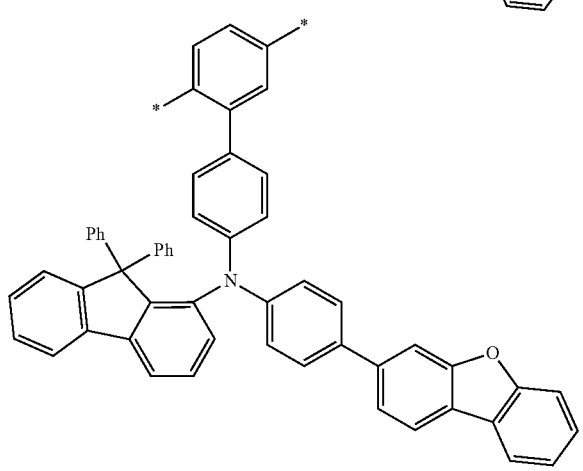
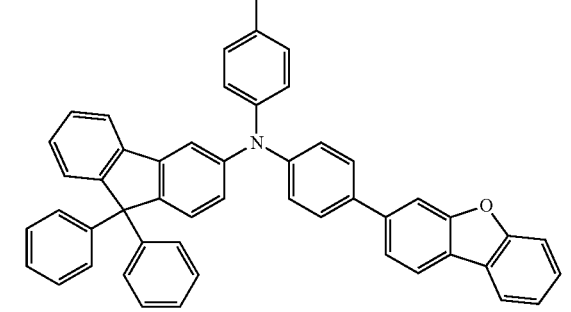
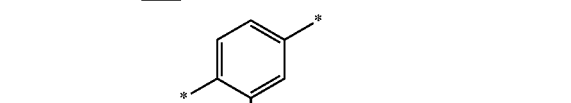
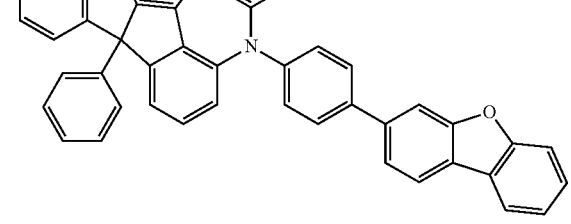

143
-continued
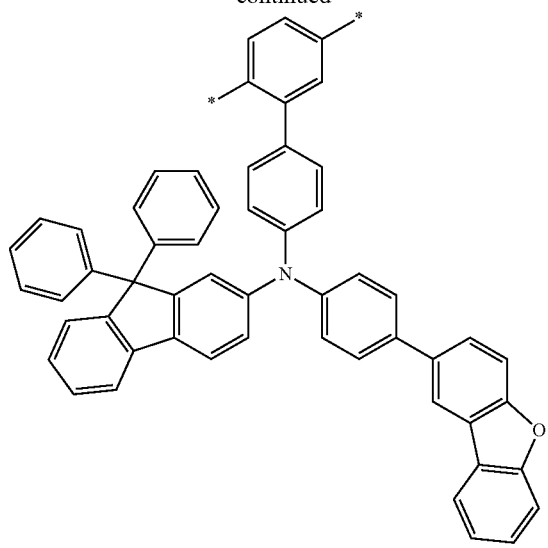
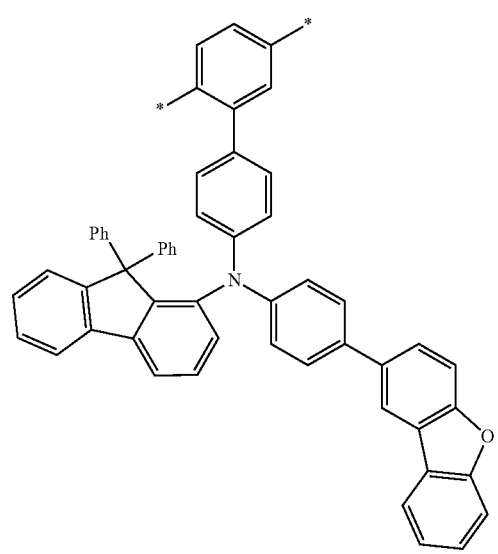
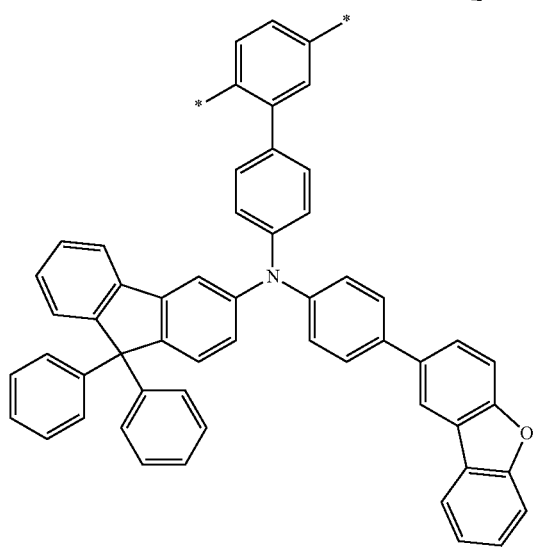
144
-continued
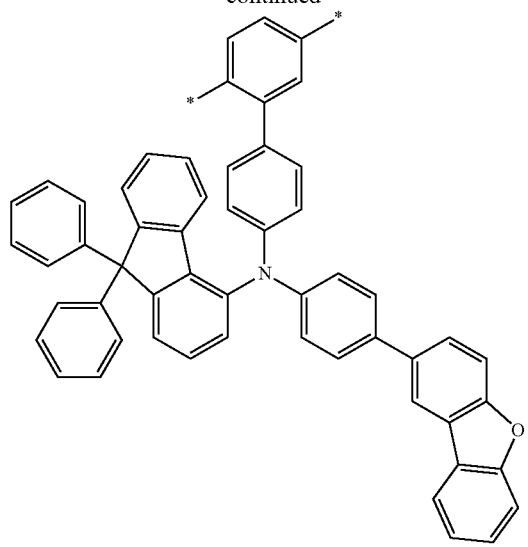
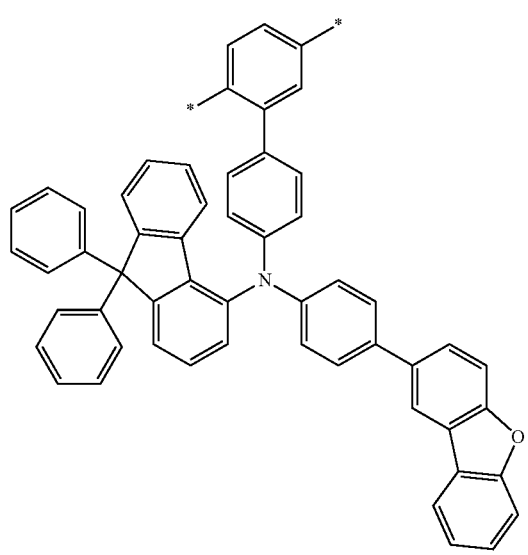
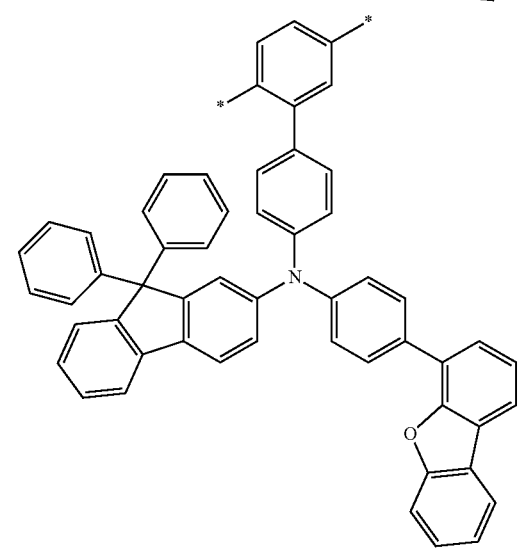

145
-continued
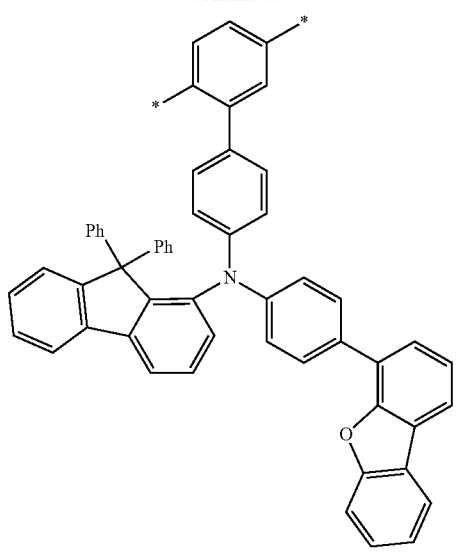
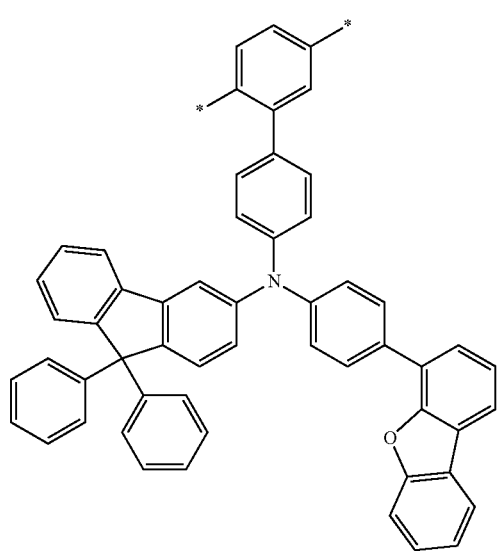
[Group 34]
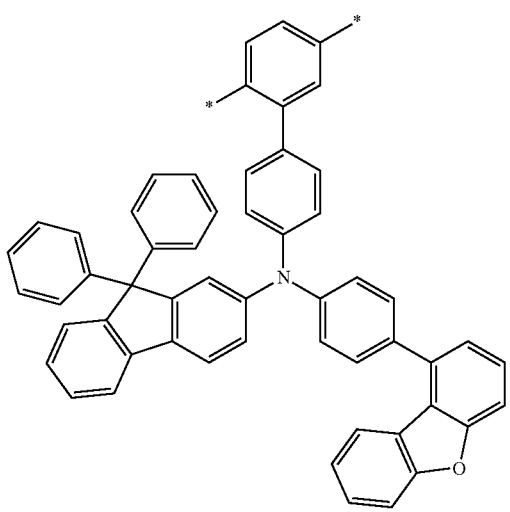
146
-continued
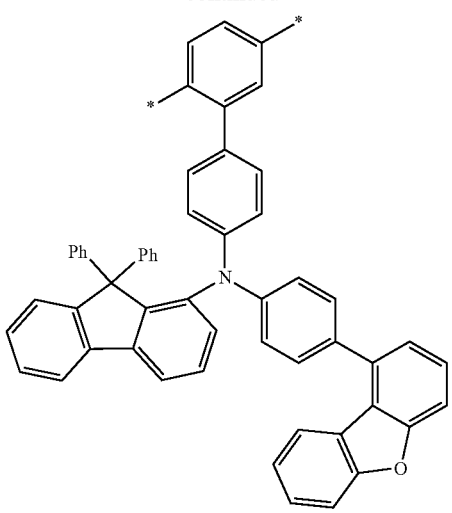
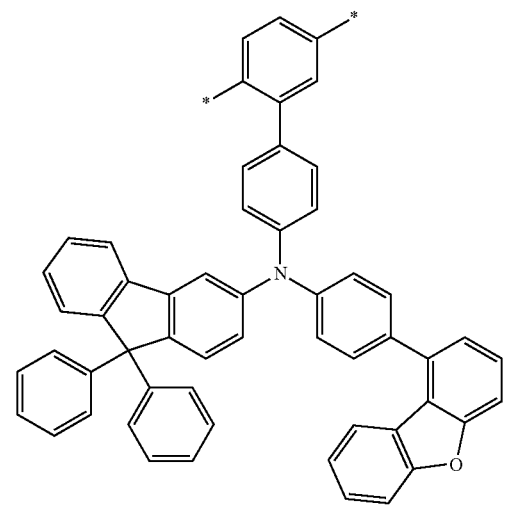
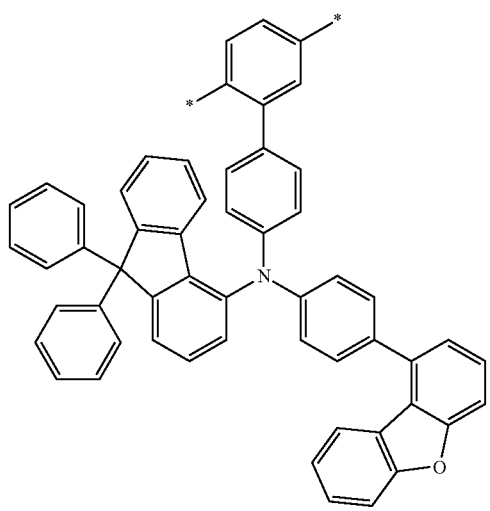

147
-continued
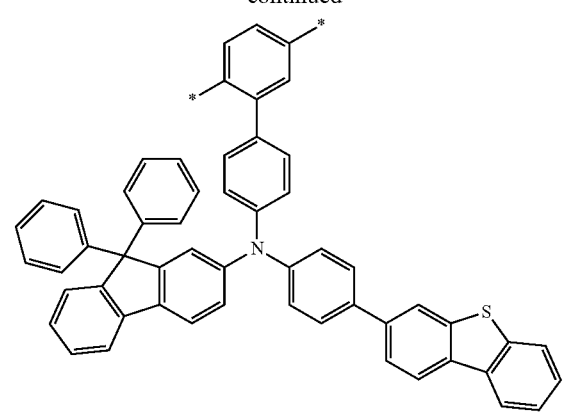
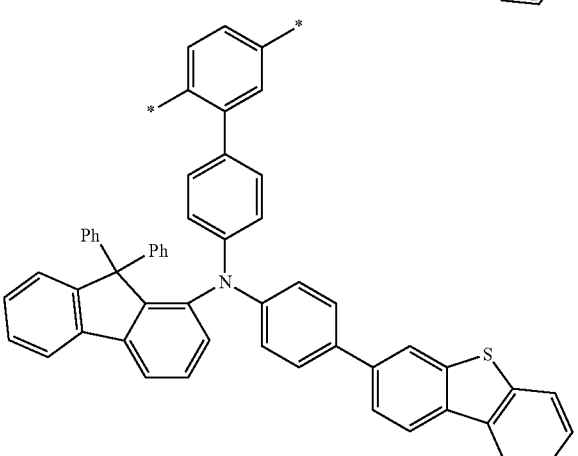
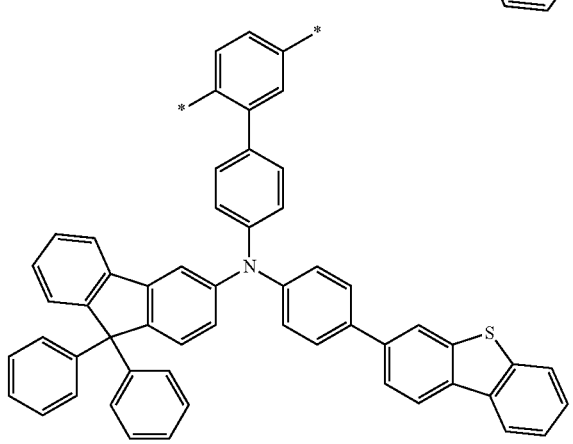
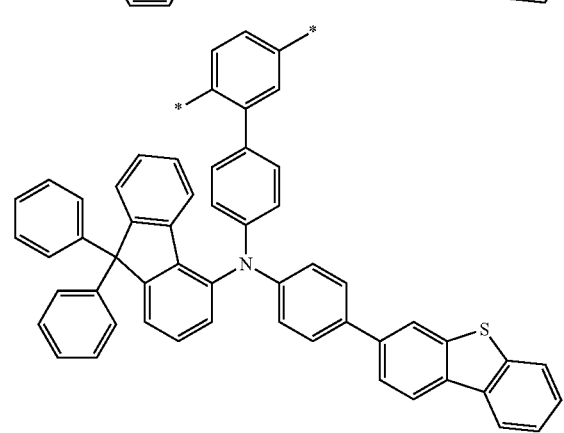
148
-continued
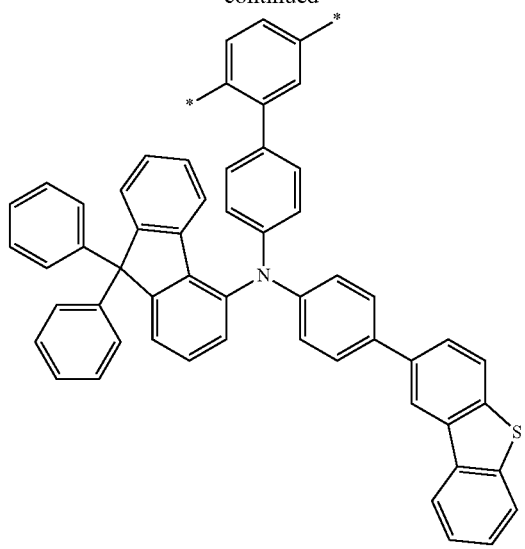
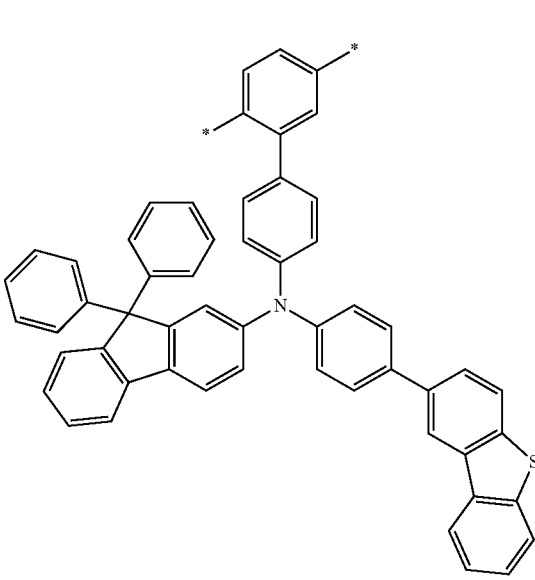
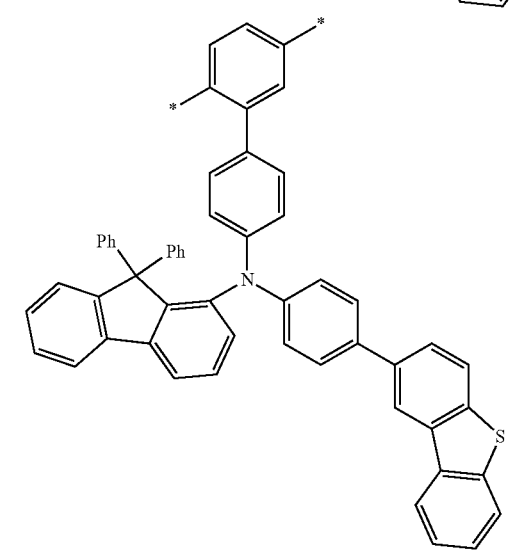

149
-continued
150
-continued
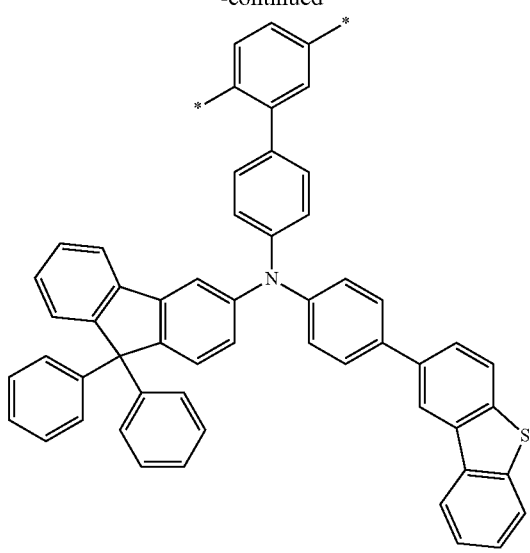
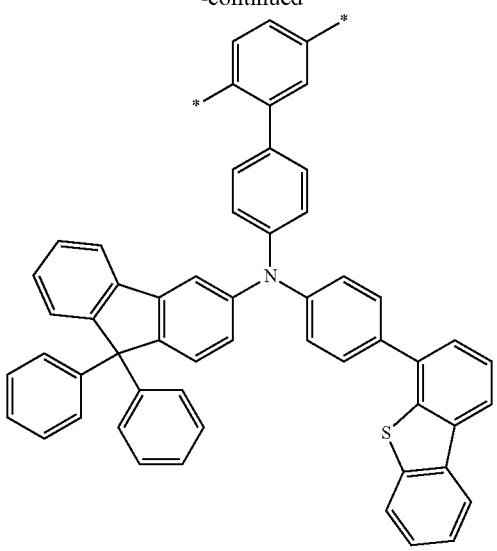
[Group 35]
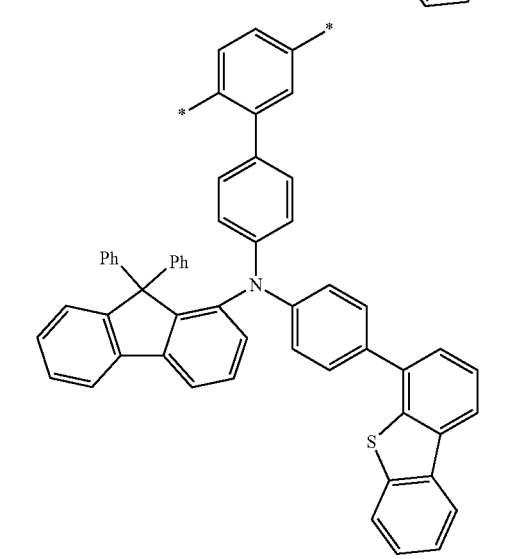
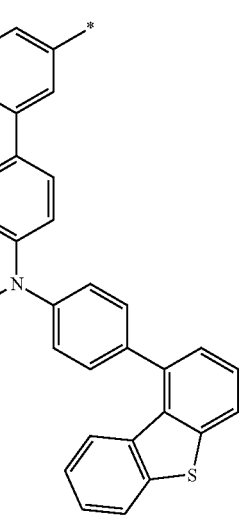

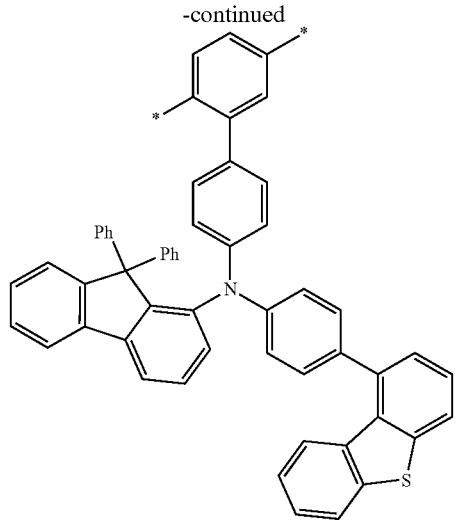
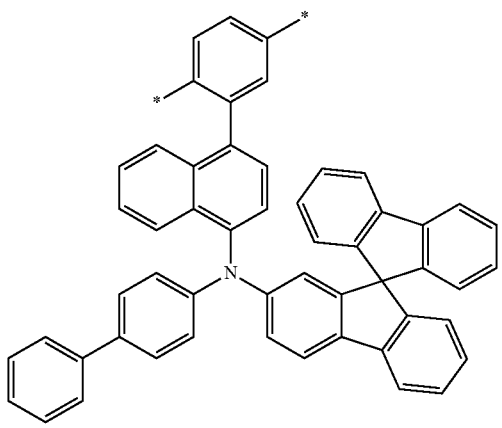
[Group 36]
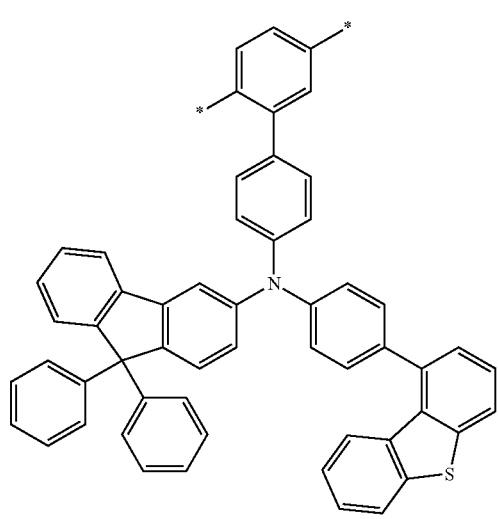
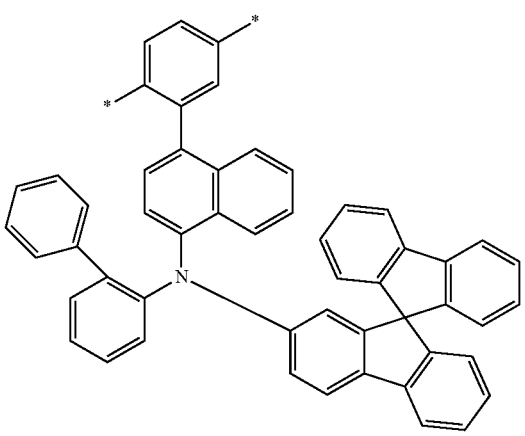
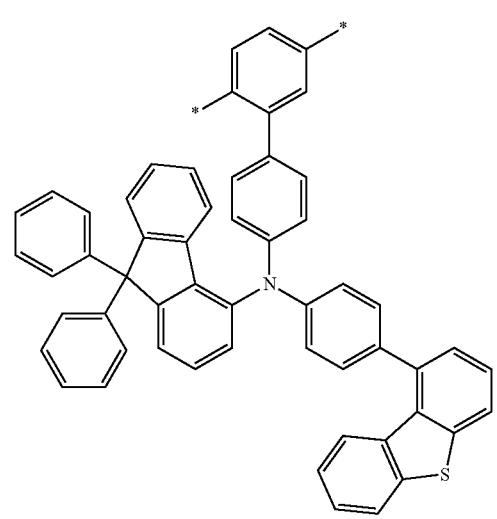 [SMILES: *c1ccc(*)c(-c2ccc(N(c3ccc(-c4cccc5sc6ccccc6c45)cc3)c3cccc4c3-c3ccccc3C4(c3ccccc3)c3ccccc3)cc2)c1]
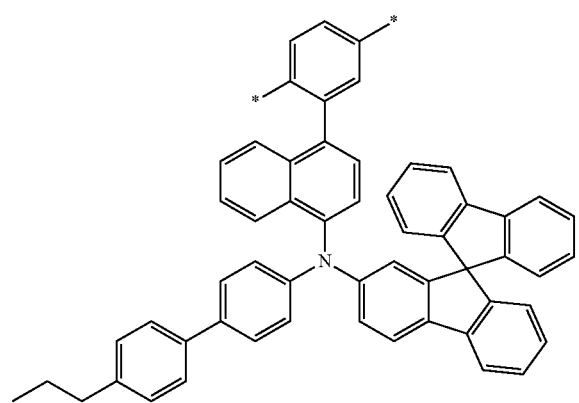

153
-continued
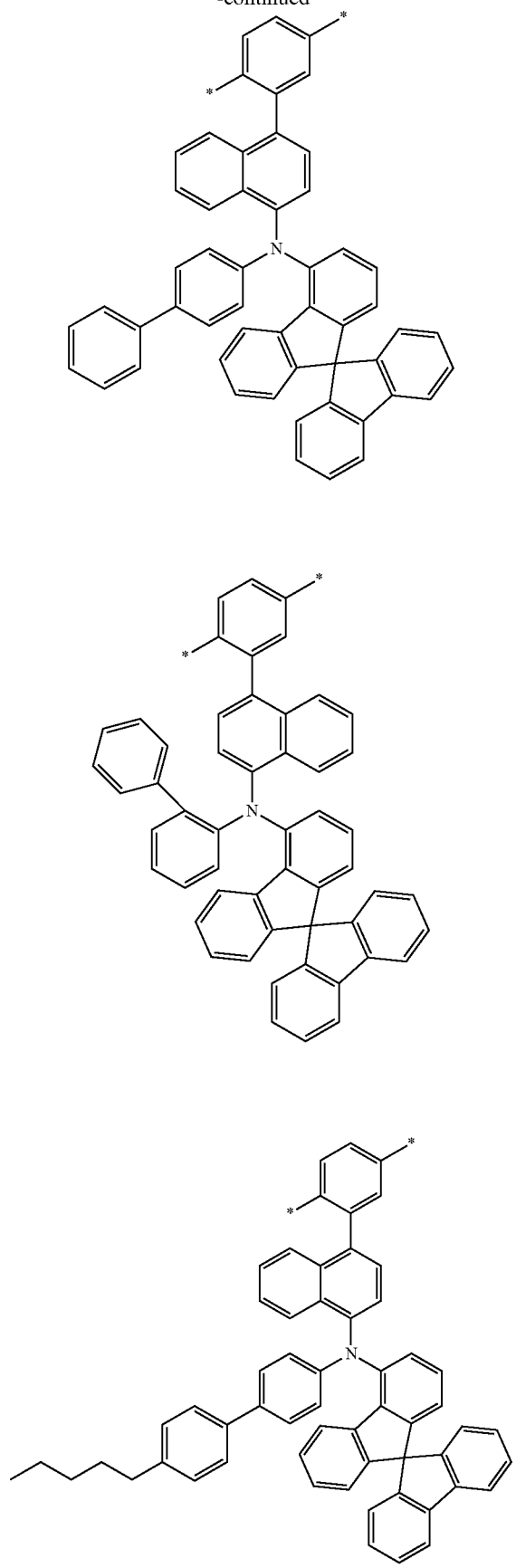
154
-continued
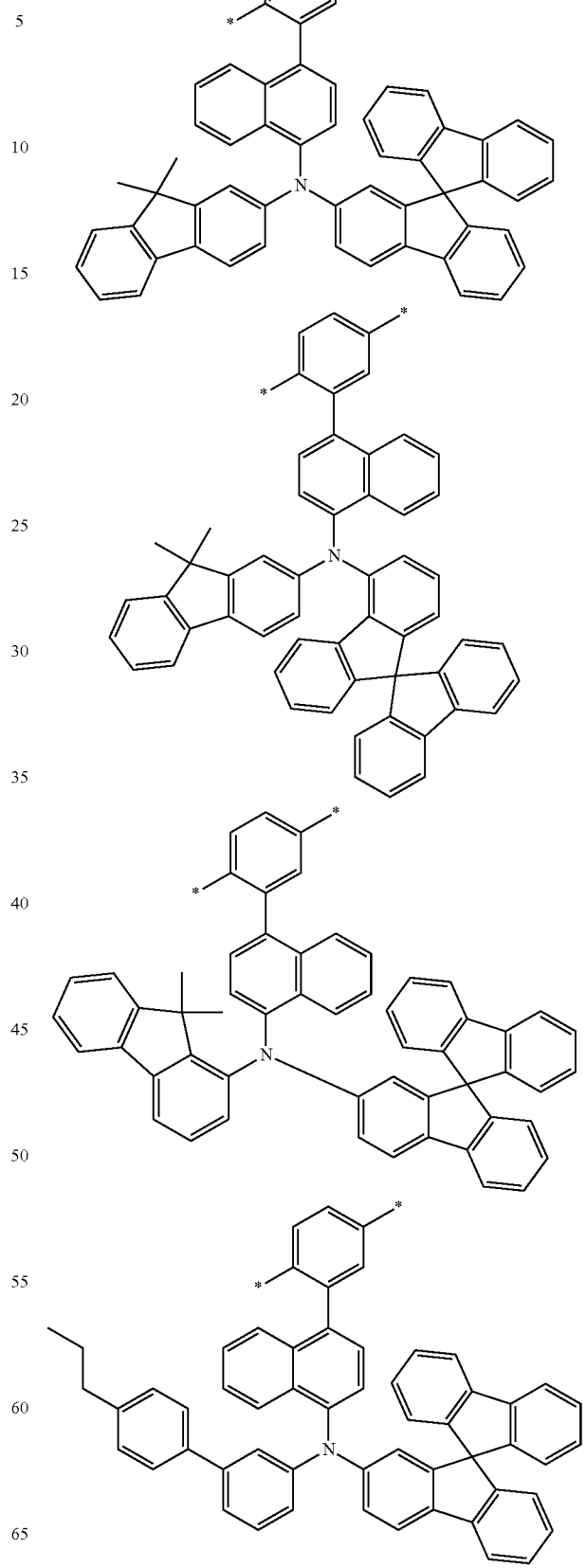

155
-continued

156
-continued

[Group 37]

157
-continued
158
-continued
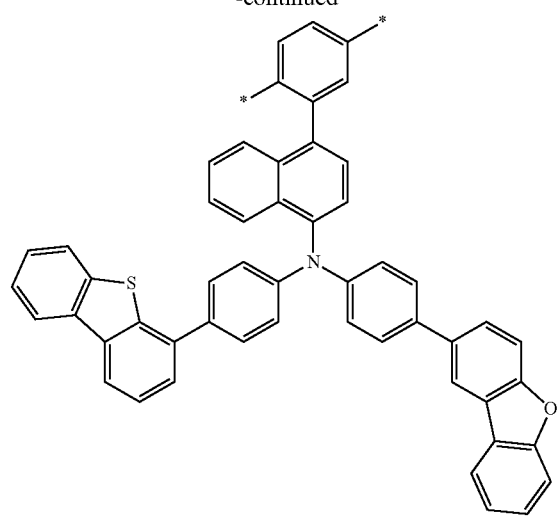
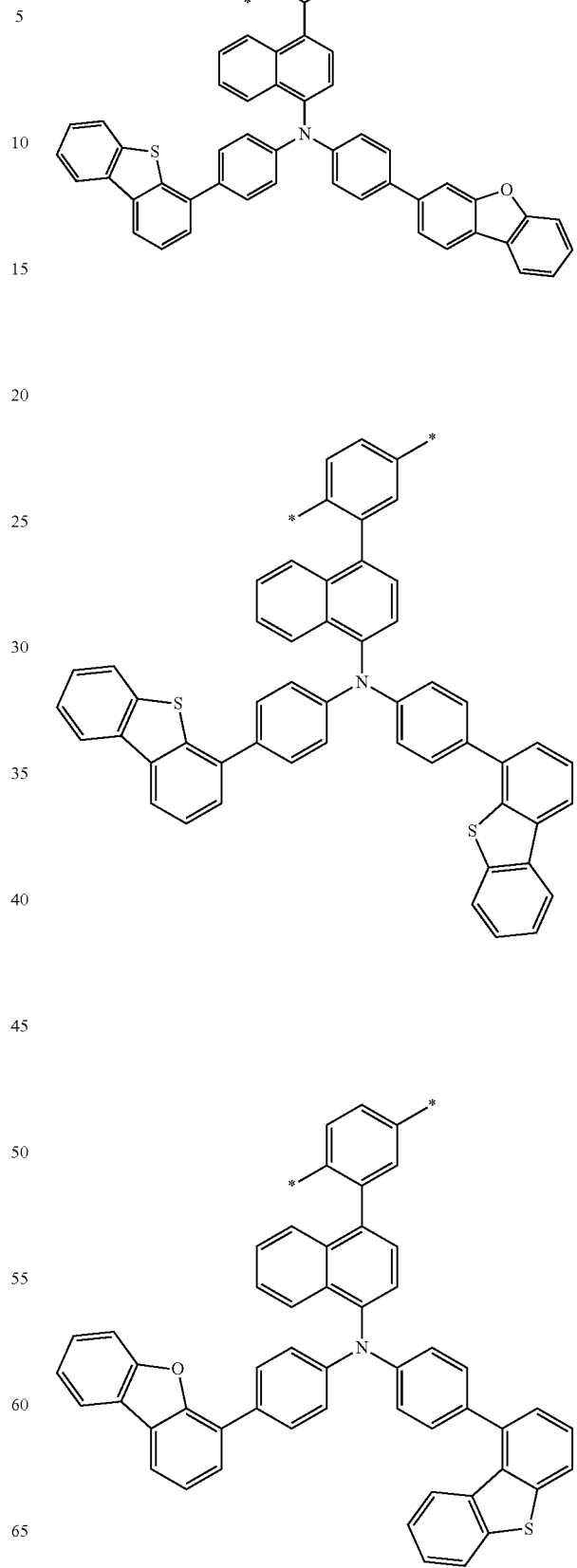

159
-continued
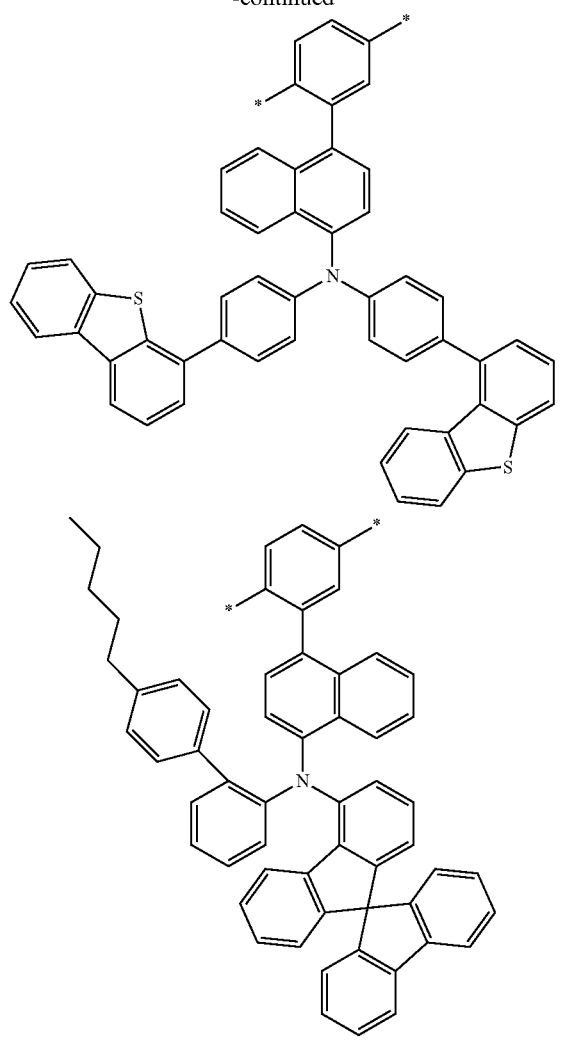
In other words, examples of Structural Unit X (the structural unit on the left side of Chemical Formula 1) according to the present disclosure may be the following structures (Group C). A copolymer having the above structures may exhibit a deeper HOMO level.
[Group C]
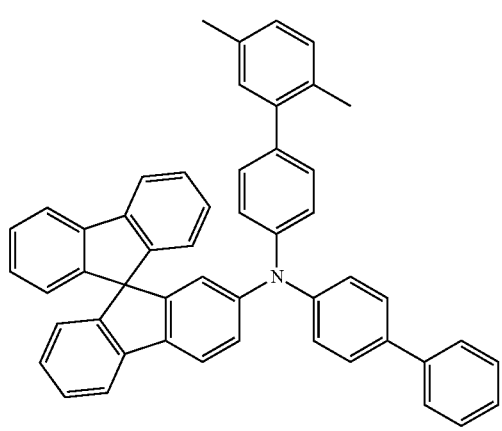
160
-continued
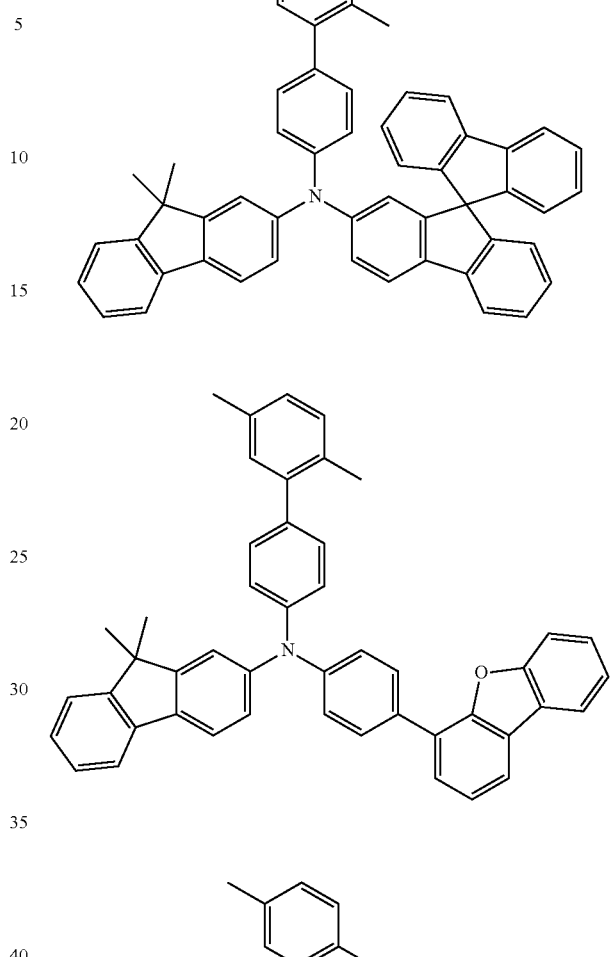
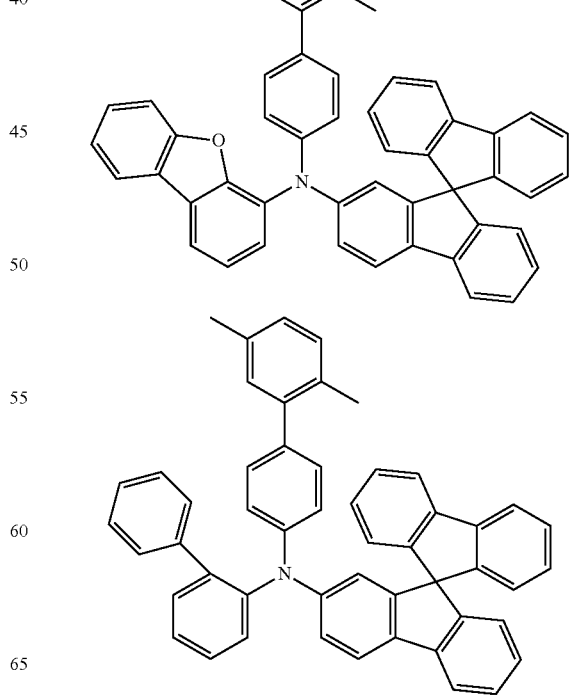

-continued

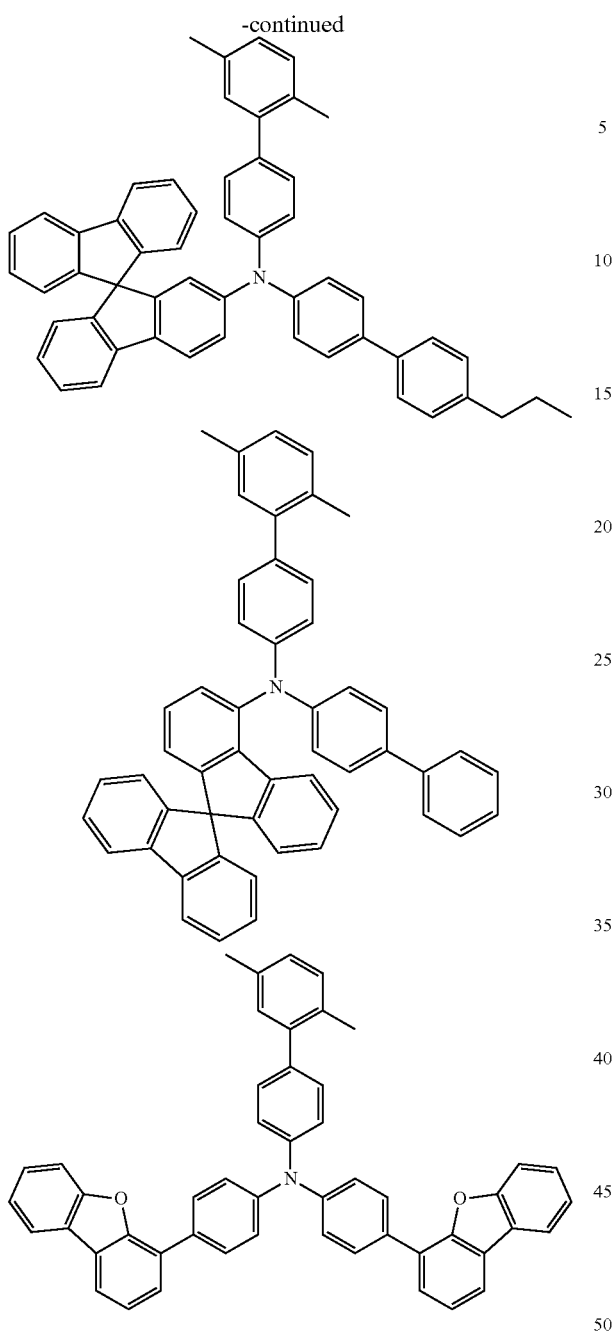

Chemical Formulas 19 to 34

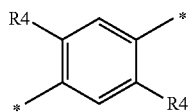  (19)

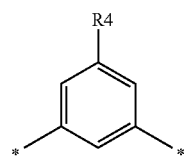  (20)

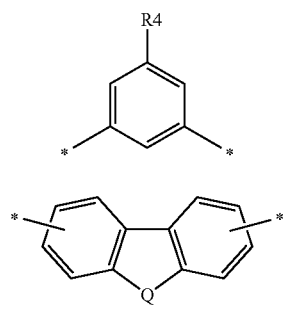  (21)

(22)

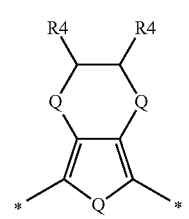  (23)

(24)

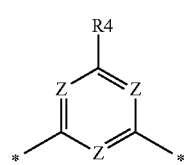  (25)

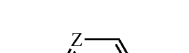  (26)

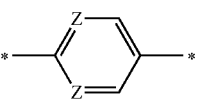  (27)

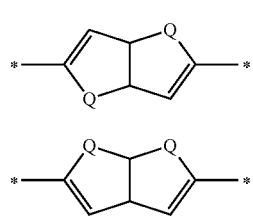  (28)

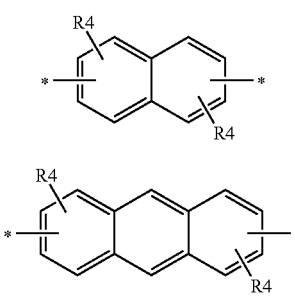  (29)

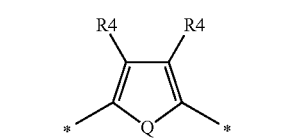

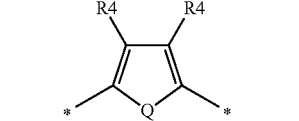

In Chemical Formula 1, in addition to Structural Unit X, Y may be a substituted or unsubstituted aromatic hydrocarbon group having 6 to 60 carbon atoms, or a substituted or unsubstituted aromatic heterocyclic group having 3 to 60 ring-member atoms. Herein, the aromatic hydrocarbon group having 6 to 30 carbon atoms and the aromatic heterocyclic group having 3 to 30 ring-member atoms may be exemplified in the same way as the group derived from the aromatic hydrocarbon compound and heterocyclic aromatic compound in $Ar_1$ and $Ar_2$. Among these, Y may be a group selected from Chemical Formulas 19 to 34. In other words, in an embodiment, in Chemical Formula 1, Y may be a group selected from Chemical Formulas 19 to 34.

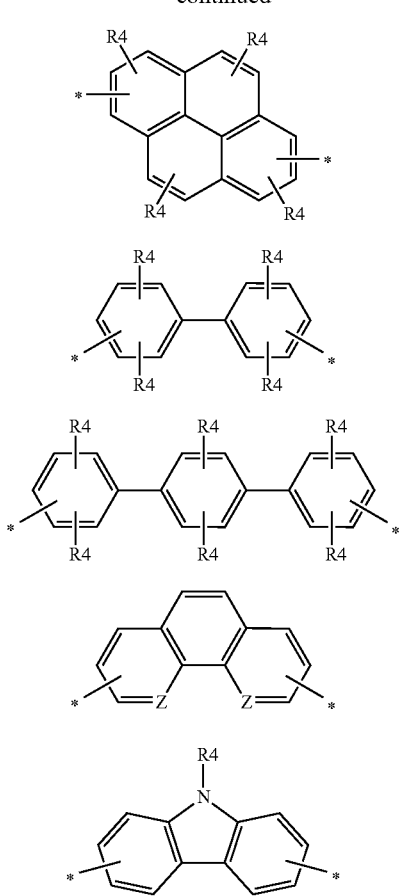

In Chemical Formulas 19 to 34, $R_4$ may independently be a substituted or unsubstituted aromatic hydrocarbon group having 6 to 60 ring carbon atoms, a substituted or unsubstituted aromatic heterocyclic group having 3 to 60 ring-member atoms, an alkyl group having 1 to 60 carbon atoms, or a hydrogen atom. Herein, the aromatic hydrocarbon group having 6 to 30 carbon atoms and the aromatic heterocyclic group having 3 to 30 ring-member atoms may be exemplified in the same way as the group derived from the aromatic hydrocarbon compound and heterocyclic aromatic compound in $Ar_1$ and $Ar_2$. Further, examples of the alkyl group having 1 to 60 carbon atoms may include the same alkyl groups listed in the "substituent" above. Among these, $R_4$ may independently be a linear alkyl group having 3 to 20 carbon atoms, a branched alkyl group having 3 to 20 carbon atoms, or hydrogen, and more desirably a linear alkyl group having 6 to 12 carbon atoms or hydrogen.

Q may each independently be O, S, Se, $CR_{17}R_{18}$, or $SiR_{17}R_{18}$.

$R_{17}$ and $R_{18}$ may each be independently a hydrogen, a deuterium, a substituted or unsubstituted alkyl group, a substituted or unsubstituted aryl group, or a substituted or unsubstituted heteroaryl group. Here, as the alkyl group and the aryl group, an alkyl group and an aryl group as listed in the "substituent" above may be exemplified, respectively. Further, examples of the heteroaryl group may include a 1-pyrrolyl group, a 2-pyrrolyl group, a 3-pyrrolyl group, a pyradinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-carbazolyl group, a 3-carbazolyl group, a 4-carbazolyl group, a 9-carbazolyl group, a 1-acridinyl group, a 2-acridinyl group, a 3-acridinyl group, a 4-acridinyl group, a 9-acridinyl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, and the like.

Z may each independently be $CR_{19}$, N, or $SiR_{19}$, where $R_{19}$ is a hydrogen, a deuterium, a substituted or unsubstituted alkyl group, a substituted or unsubstituted aryl group, or a substituted or unsubstituted hetero represents an aryl group. Herein, as the alkyl group, an alkyl group as listed in the above "substituent" is exemplified. Also, examples of the heteroaryl group may include heteroaryl groups listed for $R_{17}$ and $R_{18}$ above.

* indicates a linking position.

Among the above, Y may be a group represented by Chemical Formula 19, Chemical Formula 20, Chemical Formula 21, or Chemical Formula 29; Y may be a group represented by Chemical Formula 19 wherein each $R_4$ is independently a linear alkyl group having 3 to 20 carbon atoms, a branched alkyl group having 3 to 20 carbon atoms, or a hydrogen atom; Y may be a group represented by Chemical Formula 21 wherein Q is $CR_{17}R_{18}$ and $R_{17}$ and $R_{18}$ are independently a linear or branched alkyl group having 3 to 20 carbon atoms; Y may be a group represented by Chemical Formula 19 wherein $R_4$ is each independently a linear alkyl group having 6 to 12 carbon atoms or a group; or Y may be a group represented by Chemical Formula 21 wherein Q is $CR_{17}R_{18}$ and $R_{17}$ and $R_{18}$ are independently a linear or branched alkyl group having 6 to 12 carbon atoms.

A composition of Structural Unit X in the copolymer of the present disclosure is not particularly limited. Considering the HOMO level of the copolymer (therefore, improvement effect of the hole transport ability and the layer (e.g., hole injection layer, hole transport layer) formed using the copolymer and luminous efficiency), Structural Unit X may be included in an amount of greater than or equal to about 30 mole percent (mol %) and less than or equal to about 90 mol %, for example greater than about 40 mol % and less than about 60 mol % based on the total moles of structural units of the copolymer. In addition, when the copolymer contains 2 or more different forms of Structural Units X, the stated mole percent content of the Structural Unit X means a sum total of Structural Units X of the copolymer.

A Structural Unit Y in the copolymer of the present disclosure is not particularly limited. Considering the HOMO level of the copolymer (therefore, the improvement effect of the hole transport ability of the layer (e.g., hole injection layer, hole transport layer) formed using the copolymer and luminous efficiency), Structural Unit Y may be included in an amount of greater than or equal to about 10 mol % and less than or equal to about 70 mol %, for example greater than about 40 mol % and less than about 60 mol % based on the total moles of structural units of the copolymer. In addition, when the copolymer contains 2 or more different forms of Structural Units Y, the stated mole percent content of the Structural Unit Y means a sum total of Structural Units Y of the copolymer.

The composition ratio (content ratio) of Structural Unit X and Structural Unit Y of the copolymer according to the present disclosure is not particularly limited. Considering the HOMO level of the copolymer (therefore, the improvement effect of the hole transport ability of the layer formed using the copolymer (e.g., hole injection layer, hole transport layer), and luminous efficiency), a composition ratio of Structural Unit X and Structural Unit Y (molar ratio of Structural Unit X:Structural Unit Y) may be about 0.8:1 to about 1.5:1, or for example about 0.9:1 to about 1.1:1. In addition, in the composition ratio, when a copolymer contains two or more different forms of Structural Units X, the stated mole content of Structural Unit X refers to a sum total of Structural Units X in the copolymer. Similarly, when the copolymer contains two or more different forms of Structural Units Y, the stated mole content of the Structural Unit Y refers to a sum total of Structural Units Y in the copolymer.

Although the copolymer of the present disclosure contains Structural Unit X and Structural Unit Y, in addition to these Structural Units X and Y, the copolymer may have other structural units. Herein, the other structural unit may be a structural unit derived from compounds, such as azulene, naphthalene, and anthracene. Here, when the copolymer according to the present disclosure has other structural units, the composition of the other structural units is not particularly limited. Considering the HOMO level of the copolymer (therefore, improvement effect of the hole transport ability of the layer (e.g., hole injection layer, hole transport layer) formed using the copolymer, and the luminous efficiency), other structural units may be included in an amount of greater than 0 mol % to less than about 15 mol %, for example greater than or equal to about 0.5 mol % to less than or equal to about 10 mol % based on the total moles of structural units of the copolymer The weight average molecular weight (Mw) of the copolymer according to the present disclosure is not particularly limited. The weight average molecular weight (Mw) may be, for example, about 5,000 grams per mole (g/mol) to about 1,000,000 g/mol, or for example, about 5,000 g/mol to about 500,000 g/mol, or about 15,000 g/mol to about 300,000 g/mol. With such a weight average molecular weight, it is possible to appropriately adjust the viscosity of the coating liquid for forming a layer (for example, a hole injection layer, a hole transport layer) formed using the copolymer to form a layer having a uniform film thickness.

Moreover, a number average molecular weight (Mn) of a copolymer is not particularly limited. The number average molecular weight (Mn) may be, for example, about 3,000 g/mol to about 500,000 g/mol, or for example about 3,500 g/mol to about 300,000 g/mol. With such a number average molecular weight, it is possible to appropriately adjust the viscosity of the coating solution for forming a layer (for example, a hole injection layer, a hole transport layer) using the copolymer to form a layer having a uniform film thickness. In addition, a polydispersity (weight average molecular weight/number average molecular weight) of the copolymer of the present embodiment may be, for example, about 1.10 to about 5.00, or for example about 1.20 to about 4.00.

Herein, the measurement of the number average molecular weight (Mn) and the weight average molecular weight (Mw) is not particularly limited and may be applied by using a known method or by appropriately changing the known methods. In the present specification, the number average molecular weight (Mn) and the weight average molecular weight (Mw) use values measured by the following method.

The polydispersity (Mw/Mn) of the polymer is calculated by dividing the weight average molecular weight (Mw) by the number average molecular weight (Mn) measured by the following method.

Measurement of Number Average Molecular Weight (Mn) and Weight Average Molecular Weight (Mw)

The number average molecular weight (Mn) and the weight average molecular weight (Mw) of the copolymer (polymeric material) are measured under the following conditions by SEC (Size Exclusion Chromatography) using polystyrene as a standard material.

SEC Measurement Condition

Analysis equipment (SEC): Shimadzu Corporation, Prominence

Column: Polymer Laboratories, PLgel MIXED-B

Column temperature: 40° C.

Flow rate: 1.0 mL/min

Injection amount of sample solution: 20 μL (concentration: about 0.05 mass %)

Eluent: tetrahydrofuran (THF)

Detector (UV-VIS detector): Shimadzu Corporation, SPD-10AV

Standard sample: polystyrene.

The terminal end of the main chain of the copolymer of the present embodiment is not particularly limited and is appropriately defined depending on the type of raw material used The copolymer of the present embodiment may be synthesized by using a known organic synthesis method. The specific synthesis method of the copolymer of the present embodiment may be easily understood by a person of an ordinary skill in the art referring to the examples to be described later. Specifically, the copolymer of the present embodiment may be prepared by a polymerization reaction using at least one monomer (A) represented by Chemical Formula A', or a copolymerization reaction using two or more different types of monomers (A) represented by Chemical Formula A', or a monomer (A) represented by Chemical Formula A' and another monomer corresponding to another structural unit as indicated below.

Chemical Formula A'

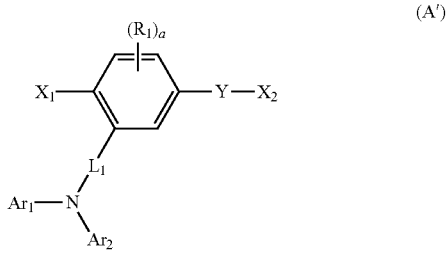

(A')

Alternatively, it may be prepared by a copolymerization reaction using one or more monomers (B) represented by Chemical Formula B' and one or more monomers (C) represented by Chemical Formula C', or a copolymerization reaction using one or more monomers (B) represented by Chemical Formula B' and one or more types of monomer (C) represented by Chemical Formula C', and another monomer corresponding to the other structural unit.

Chemical Formula B'

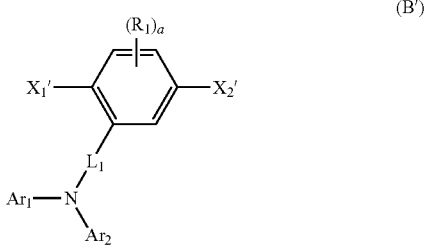

Chemical Formula C'

The monomers used for the polymerization of the copolymer according to the present disclosure may be synthesized by appropriately combining a known synthesis reaction, and their structures may be confirmed by known methods (for example, NMR, LC-MS, etc.). In Chemical Formulas A' to C', $R_1$, $L_1$, $Ar_1$, $Ar_2$, a, and Y are the same as in Chemical Formula 1. $X_1$ and $X_2$ are independently a halogen atom (a fluorine atom, a chlorine atom, a bromine atom, an iodine atom, particularly a bromine atom) or a functional group represented by Chemical Formula D. In Chemical Formula D, $R_A$ to $R_D$ may each independently be an alkyl group having 1 to 3 carbon atoms. In an embodiment, $R_A$ to $R_D$ may be a methyl group. Meanwhile, $X_1$ and $X_2$ of Chemical Formulas A' to C' may be the same or different from each other. In an embodiment, in Chemical Formula A', $X_1$ and $X_2$ may be different. In an embodiment, in Chemical Formula B', $X_1'$ and $X_2'$ may be the same. In an embodiment, in Chemical Formula C', $X_1''$ and $X_2''$ may be the same.

Chemical Formula D

The copolymer according to an embodiment has a Structural Unit X and a Structural Unit Y. As a result, the copolymer has a deep HOMO level. Therefore, when the copolymer is used as a hole injection material or a hole transport material (especially a hole transport material), high luminous efficiency may be achieved. In addition, the copolymer has a relatively high triplet energy level and a relatively low driving voltage. Therefore, when the copolymer is used as a hole injection material or a hole transport material (especially a hole transport material), high hole mobility may be achieved with a low driving voltage. Therefore, the electroluminescence device (especially QLED) using the copolymer has improved luminous efficiency and durability (luminescence life-span).

The copolymer has a deep HOMO level. Specifically, the HOMO level of the copolymer may be about −5.9 eV to about −5.6 eV. Since the copolymer has such a deep HOMO level, in particular, in a quantum dot electroluminescence device including a hole transport layer including the copolymer and a light emitting layer including quantum dots, a difference in the band offset between the hole transport layer and the light emitting layer is small and the ability to transport holes (holes) from the hole transport layer to the light emitting layer may be improved. It is also possible to widen the light emitting area. Therefore, by using the copolymer according to the present disclosure, it is possible to provide an electroluminescence device (especially a QLED) exhibiting high luminous efficiency.

Polymer Composition

The copolymer according to the present disclosure may be used as a lone material as a hole injection layer or a hole transport layer. Alternatively, the copolymer according to the present disclosure may be combined with one or more polymeric materials having a shallower HOMO level than the copolymer. As described above, the HOMO level of the copolymer is quite deep, i.e., less than or equal to about −5.6 eV. For this reason, when the copolymer is used for the hole transport layer (HTL), the difference in the band offset with the light emitting layer (quantum dot (QD) layer) is reduced, and injection performance of holes from the hole transport layer to the light emitting layer may be improved. On the other hand, because the valence band of the hole injection layer is about −5.35 eV, the difference in the band offset from the hole injection layer tends to increase in the above embodiment. For this reason, by combining a polymeric material having a shallower HOMO level than that of the copolymer with the copolymer according to the present disclosure in a hole transport layer, the difference in the band offset with the hole injection layer may be reduced, and hole injection ability to inject holes from the hole injection layer to the hole transport layer is improved. As a result, the luminous efficiency of the electroluminescence device (especially the quantum dot electroluminescence device) may be further improved.

The present disclosure also provides a polymer composition including the copolymer according to the present disclosure and a polymeric material having a HOMO level of greater than or equal to −5.6 eV and less than or equal to −5.3 eV. The HOMO level of the polymeric material is appropriately selected according to the HOMO level of the copolymer to be used in the combined electron transport material. In an embodiment, the HOMO level of the polymeric material may be about −5.50 eV to about −5.35 eV.

The polymeric material to be combined with the copolymer according to the present disclosure is not particularly limited as long as the HOMO level is greater than about −5.6 eV and less than or equal to about −5.3 eV (for example, greater than or equal to about −5.50 eV and less than or equal to about −5.35 eV). That is, the polymeric material according to the embodiment may be represented by Chemical Formula 35.

Chemical Formula 35

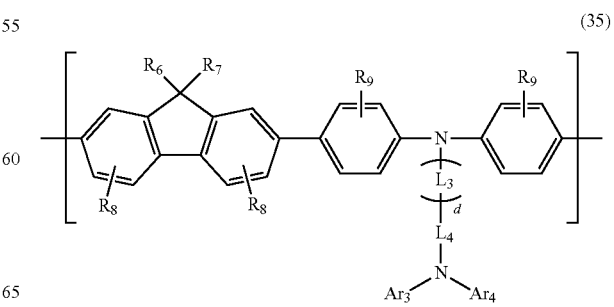

In addition, in the structural unit of Chemical Formula 35 (also referred to as "Structural Unit (A)"), a hydrocarbon group exists in the side chain ($Ar_4$). Accordingly, in the quantum dot electroluminescence device having a hole transport layer including the polymeric material (arylamine-fluorene alternating copolymer) and a light emitting layer including quantum dots, the hydrocarbon group of the side chain of the polymeric material in the hole transport layer and the quantum dots included in the light emitting layer exist more closely, and the hydrocarbon group of the side chain of the polymeric material interacts closely with the quantum dots. Accordingly, holes can be efficiently injected into the quantum dots (high hole injection properties), and durability (luminescence life-span) can be improved.

In the structural unit of Chemical Formula 35, the presence of the nitrogen atom in the main chain cuts the conjugation of the main chain. Accordingly, it is possible to increase the triplet energy level of the polymeric material, to have high bulk mobility according to the main chain, and to achieve high current efficiency. Therefore, improved luminous efficiency may be achieved by the polymer compound having the structural unit of Chemical Formula 35. In addition, in the structural unit of Chemical Formula 35, because the conjugation of the main chain is cut with a nitrogen, the polymeric material of the present disclosure may exhibit properties of a low-molecular compound having an energy level close to that of a quantum dot. For this reason, by using the polymeric material of the present disclosure, an increase of a drive voltage may be suppressed, and a drive voltage may be lowered.

In Chemical Formula 35, $R_6$ to $R_9$ may be independently a hydrogen or a hydrocarbon group having 1 to 16 carbon atoms. Herein, $R_6$ to $R_9$ may be the same or different. In an embodiment, $R_6$ and $R_7$ may be the same. In addition, in Chemical Formula 35, two $R_8$'s may be the same or different, but in an embodiment, two $R_8$'s may be the same. Similarly, two $R_9$'s in Chemical Formula 35 may be the same or different, but in an embodiment, two $R_9$'s may be the same.

The hydrocarbon group having 1 to 16 carbon atoms of $R_6$ to $R_9$ is not particularly limited, and examples thereof may include a linear or branched alkyl group, a linear or branched alkenyl group, a linear or branched alkynyl group, and cycloalkyl group. For example, when $R_6$ to $R_9$ are an alkenyl group or an alkynyl group, the carbon number of $R_6$ to $R_9$ may be 2 to 16. Similarly, when $R_6$ to $R_9$ are a cycloalkyl group, the carbon number of $R_6$ to $R_9$ may be 3 to 16.

The alkyl group having 1 to 16 carbon atoms may be, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethyl propyl group, an n-hexyl group, an isohexyl group, a 1,3-dimethyl butyl group, a 1-isopropyl propyl group, a 1,2-dimethylbutyl group, an n-heptyl group, a 1,4-dimethyl pentyl group, a 3-ethyl pentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, an n-nonyl group, a 3,5,5-trimethyl hexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, and the like.

Examples of the alkenyl group having 2 to 16 carbon atoms may include a vinyl group, an allyl group, a 1-propenyl group, a 2-butenyl group, a 1,3-butadienyl group, a 2-pentenyl group, and an isopropenyl group.

Examples of the alkynyl group having 2 to 16 carbon atoms include an ethynyl group and a propargyl group.

Examples of the cycloalkyl group having 3 to 16 carbon atoms may include a cyclopropyl group, a cyclobutyl group, a cyclopentyl group, and a cyclohexyl group.

Among them, from the viewpoint of more appropriate HOMO level control, $R_6$ and $R_7$ may each independently be a linear alkyl group having 4 to 15 carbon atoms or a branched alkyl group having 4 to 15 carbon atoms, for example, a linear alkyl group having 5 to 12 carbon atoms or a branched alkyl group having 5 to 12 carbon atoms, for example, a linear alkyl group having 6 to 10 carbon atoms, or for example a linear alkyl group having 6 to 8 carbon atoms.

In the above embodiment, high hole injection properties, higher triplet energy level, lower driving voltage, film-forming properties, and a balance of two or more thereof (particularly a balance between hole injection properties and film-forming properties) may also be achieved. In addition, from the viewpoint of more appropriate control of the HOMO level, each $R_8$ and $R_9$ may be independently a hydrogen (unsubstituted) or a linear alkyl group having 1 to 8 carbon atoms or branched alkyl group having 3 to 8 carbon atoms; for example, $R_8$ and $R_9$ may each independently be a hydrogen (unsubstituted) or a linear alkyl group having 3 to 6 carbon atoms; or for example $R_8$ and $R_9$ may each independently be a hydrogen. In the above embodiment, high hole injection properties, higher triplet energy level, lower driving voltage, film-forming properties, and a balance of two or more of these (particularly, a balance between hole injection properties and film-forming properties) may also be achieved.

In Chemical Formula 35, $L_3$ may be a substituted or unsubstituted aromatic hydrocarbon group having 6 to 25 carbon atoms, or a substituted or unsubstituted aromatic heterocyclic group. Here, the aromatic hydrocarbon group is not particularly limited, but may be an aromatic hydrocarbon group having 6 to 25 carbon atoms. Specifically, the aromatic hydrocarbon group may be a divalent group derived from aromatic hydrocarbons such as benzene (phenylene group), pentalene, indene, naphthalene, anthracene, azulene, heptalene, acenaphthene, phenalene, fluorene, phenanthrene, biphenyl, terphenyl, quaterphenyl, pyrene, 9,9-diphenyl fluorene, 9,9'-spirobi[fluorene], and 9,9-dialkyl fluorene. The aromatic heterocyclic cyclic group is not particularly limited, but may be an aromatic heterocyclic cyclic group having 12 to 25 carbon atoms. Specifically, the aromatic heterocyclic cyclic group may be a divalent groups derived from heterocyclic aromatic compounds such as acridine, phenazine, benzoquinoline, benzoisoquinoline, phenanthridine, phenanthroline, anthraquinone, fluorenone, dibenzofuran, dibenzothiophene, carbazole, imidazophenanthridine, benzimidazophenanthridine, 9-phenylcarbazole, xanthone, thioxanthone, and anthraquinoline. Among these, $L_3$ may be a divalent group derived from a compound selected from benzene, fluorene, dibenzofuran, dibenzothiophene, and biphenyl. More preferably, $L_3$ may be a divalent group derived from a compound selected from benzene (o, m, or p-phenylene group), dibenzofuran, and fluorene. Particularly, $L_3$ may be a phenylene group (particularly a p-phenylene group). Such $L_1$ may be appropriately controlled according to the HOMO level of the polymeric material. In addition, higher hole injection properties, higher triplet energy levels, lower driving voltages, and film-forming properties and a balance of two or more thereof (particularly, balance between hole injection properties and film-forming properties) may be achieved. In addition, in an embodiment, $L_3$ may be unsubstituted, or any hydrogen may be replaced by a substituent.

Here, when any one of the hydrogens in $L_3$ is replaced, the number of substituents introduced is not particularly limited, but may be 1 to 3, 1 to 2, or for example 1.

When $L_3$ has a substituent, the bonding position of the substituent is not particularly limited. The substituent may be present as distally as possible to the nitrogen of the main chain to which $L_3$ is linked. By the presence of a substituent at this position, the HOMO level of the polymeric material may be appropriately controlled. In addition, higher hole injection properties, higher triplet energy levels, lower driving voltages, and a balance of two or more thereof (particularly, balance between hole injection properties and film-forming properties) may be achieved.

Among the above, $L_3$ may be a divalent group selected from the following groups. In other words, in an embodiment, in Chemical Formula 35, d may be 1 or 2 (particularly 1), and $L_3$ may be each independently a divalent group selected from structures of Chemical Formula 35-1.

Meanwhile, in the structures of Chemical Formula 35-1, each of $R_{111}$ to $R_{125}$ independently represents a hydrogen, a linear hydrocarbon group having 1 to 16 carbon atoms or a branched hydrocarbon group having 3 to 16 carbon atoms (particularly, $R_{111}$ to $R_{125}$ are hydrogen).

Chemical Formula 35-1

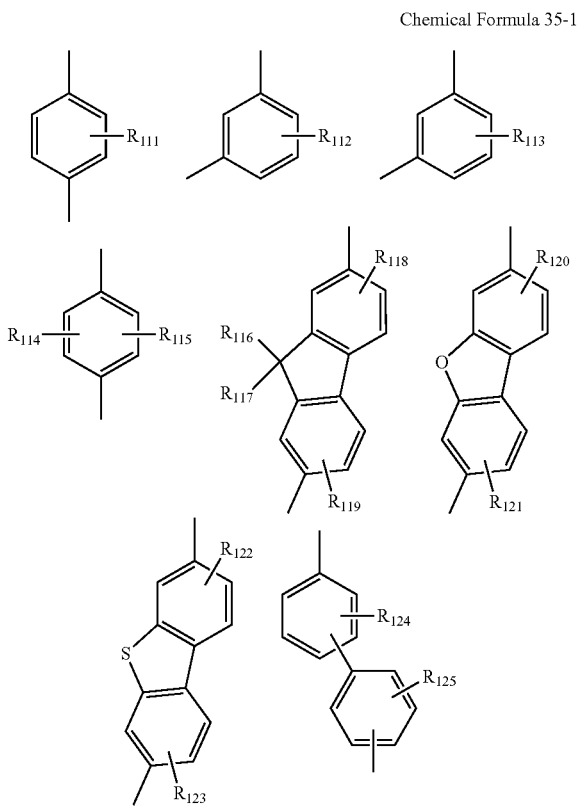

In Chemical Formula 35, d may be 0, 1, or 2. When d is 0, $L_3$ may be a single bond. In addition, when d is 2, the two $L_3$ may be the same or different from each other. From the viewpoint of more appropriate control of the HOMO level, d may be 0 or 1, and desirably 1. In the above embodiment, high hole injection properties, higher triplet energy levels, lower driving voltages, and film-forming properties, and a balance of two or more thereof (particularly a balance between hole injection properties and film forming performance) may also be achieved.

In Chemical Formula 35, $L_4$ may be a substituted or unsubstituted divalent or trivalent aromatic hydrocarbon group having 6 to 25 carbon atoms or a substituted or unsubstituted divalent or trivalent aromatic heterocyclic group. At this time, $L_4$ may form a ring with $Ar_3$. Alternatively, when $L_4$ forms a ring with $Ar_3$, $L_4$ is a trivalent group. When $L_4$ does not form a ring with $Ar_3$, $L_4$ is a divalent group.

Here, the aromatic hydrocarbon group and aromatic heterocyclic group having 6 to 25 ring-member atoms as $L_4$ are not particularly limited. When $L_4$ does not form a ring with $Ar_3$, a divalent group derived from an aromatic hydrocarbon having 6 to 25 carbon atoms as defined for $L_3$ may be exemplified. Similarly, in the above case, the aromatic heterocyclic group as $L_4$ is not particularly limited, and examples of the divalent group derived from the heterocyclic aromatic compound defined for $L_3$ may be exemplified. Moreover, when $L_4$ forms a ring with $Ar_3$, it may be exemplified by converting the divalent group derived from an aromatic hydrocarbon having 6 to 25 carbon atoms defined in $L_3$ into a trivalent group. Similarly, in the above case, the aromatic heterocyclic cyclic group as $L_4$ is not particularly limited, and may be exemplified by converting a divalent group derived from the heterocyclic aromatic compound defined in $L_3$ into a trivalent group. Among these, $L_4$ may be a divalent or trivalent group derived from a compound selected from benzene, fluorene, dibenzofuran, dibenzothiophene, and biphenyl. In an embodiment, $L_4$ may be a divalent group derived from a compound selected from benzene, fluorene, and dibenzofuran (for example, o, m, or p-phenylene group) or a trivalent group (for example, 1,3, 4-phenylene group)

In an embodiment, $L_4$ may a benzene-derived divalent (phenylene group) (particularly a p-phenylene group) or a trivalent group (particularly a 1,3,4-phenylene group). Such $L_4$ may appropriately control the HOMO level of the polymeric material. In addition, a higher hole injection properties, higher triplet energy levels, lower driving voltages, and a balance of two or more thereof (especially a balance between hole injection properties and film-forming properties) may be achieved. In addition, in an embodiment, $L_4$ may be unsubstituted, or any hydrogen may be replaced by the substituent. In addition, when any one of the hydrogen in $L_4$ is replaced, the substituent is not specifically limited and the above examples may be applicable. In an embodiment, $L_4$ may be unsubstituted.

In Chemical Formula 35, $Ar_3$ may be a substituted or unsubstituted divalent aromatic hydrocarbon group having 6 to 25 carbon atoms or a substituted or unsubstituted divalent aromatic heterocyclic group.

The aromatic hydrocarbon group having 6 to 25 carbon atoms as $Ar_3$ is not particularly limited, and examples of the divalent group derived from the aromatic hydrocarbon having 6 to 25 carbon atoms defined for $L_3$ may be exemplified. Similarly, the aromatic heterocyclic cyclic group as $Ar_3$ is not particularly limited, and examples of the divalent group derived from the heterocyclic aromatic compound defined for $L_3$ may be exemplified. Among these, those selected from a phenylene group, a biphenylene group, a dibenzofuranyl group and a fluorenyl group may be selected. More preferably, $Ar_3$ may be a phenylene group (o, m, or p-phenylene group). In an embodiment, $Ar_3$ may be an o-phenylene group. Such $Ar_3$ may appropriately control the HOMO level of the polymeric material. In addition, higher hole injection properties, higher triplet energy levels, lower driving voltages, and a balance of two or more thereof (particularly, balance between hole injection properties and film-forming properties) may be achieved. In addition, $Ar_3$ may be unsubstituted, or any hydrogen atom may be replaced by the substituent. On the other hand, when any one of the hydrogen atoms of $Ar_3$ is replaced, the substituent is not particularly limited, and the above examples may be applied. In an embodiment, $Ar_3$ may be a divalent group selected from a group derived from benzene that is unsubstituted or substituted with a linear alkyl group having 3 to 10 carbon atoms or a branched alkyl group having 3 to 10 carbon atoms; a biphenylene group that is unsubstituted or substituted with a linear alkyl group having 3 to 10 carbon atoms or a branched alkyl group having 3 to 10 carbon atoms; and a fluorenyl group that is unsubstituted or substituted with a linear alkyl group having 3 to 10 carbon atoms or a branched alkyl group having 3 to 10 carbon atoms. In an embodiment, $Ar_3$ may be an o, m, or p-phenylene group that is unsubstituted or substituted with a linear or branched alkyl group having 3 to 10 carbon atoms, and in an embodiment, $Ar_3$ may be an o-phenylene group that is unsubstituted or substituted with a linear alkyl group having 5 to 8 carbon atoms.

Alternatively, when $Ar_3$ has a substituent (that is, a substituted divalent aromatic hydrocarbon group or a substituted divalent aromatic heterocyclic group having 6 to 25 ring-member atoms), the position of the substituent is not particularly limited, but with respect to the nitrogen atom to be bonded with $Ar_3$, it may be present at a position as far apart as possible. For example, when $Ar_3$ is an o-phenylene group, the substituent may be at a para position with respect to the nitrogen atom. With this arrangement, the HOMO level of the polymeric material may appropriately be controlled. In addition, since the distance between the polymeric material and the quantum dot becomes closer and the interaction between the polymeric material in the hole transport layer and the quantum dot in the light emitting layer becomes stronger, the hole injection properties (therefore, durability luminescence life-span) may be improved.

Moreover, $Ar_3$ may form a ring with $Ar_4$ or $L_4$. As described above, when $Ar_3$ forms a ring with $Ar_4$ or $L_4$, a higher triplet energy level may be imparted. Among these, from the viewpoint of more appropriate control of the HOMO level, $Ar_3$ may form a ring with $L_4$. When $Ar_3$ forms a ring with $L_4$, the ring structure formed by $Ar_3$ and $L_4$ is not particularly limited, but $Ar_3$ and $L_4$ may form a carbazole ring. In other words, in an embodiment, $-L_4-N(Ar_3)(Ar_4)$ in Chemical Formula 35 may be selected from structures of Chemical Formula 35-2.

Chemical Formula 35-2

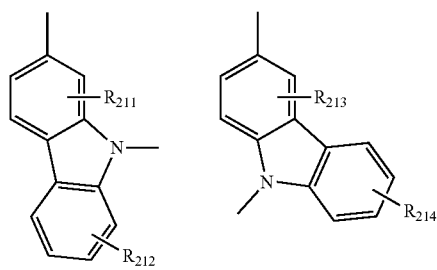

In Chemical Formula 35-2, each $R_{211}$ to $R_{214}$ are independently a hydrogen, a linear alkyl group having 3 to 10 carbon atoms, or a branched alkyl group having 3 to 10 carbon atoms.

In an embodiment, $Ar_3$ and $L_4$ may form a carbazole ring of Chemical Formula 35-3.

Chemical Formula 35-3

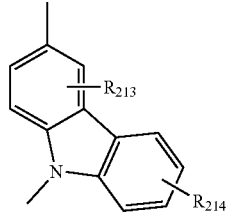

In Chemical Formula 35-3, each $R_{211}$ to $R_{214}$ are independently a hydrogen, a linear alkyl group having 3 to 10 carbon atoms, or a branched alkyl group having 3 to 10 carbon atoms. In an embodiment, $R_{211}$ and $R_{213}$ are hydrogen, and $R_{212}$ and $R_{214}$ are a hydrogen or a linear alkyl group having 5 to 8 carbon atoms.

In Chemical Formula 35, $Ar_4$ may be a monovalent or divalent aromatic hydrocarbon group having 6 to 25 carbon atoms which is substituted with a linear hydrocarbon group having 1 to 12 carbon atoms or a branched hydrocarbon group having 3 to 12 carbon atoms or a monovalent or divalent aromatic heterocyclic group which is substituted with a linear hydrocarbon group having 1 to 12 carbon atoms or a branched hydrocarbon group having 3 to 12 carbon atoms. At this time, $Ar_4$ may form a ring with $Ar_3$. On the other hand, when $Ar_4$ forms a ring with $Ar_3$, $Ar_4$ is a divalent group. When $Ar_4$ does not form a ring with $Ar_3$, $Ar_4$ is a monovalent group.

Herein, the aromatic hydrocarbon group and aromatic heterocyclic group having 6 to 25 ring-member atoms as $Ar_4$ are not particularly limited. When $Ar_4$ does not form a ring with $Ar_3$, it may be exemplified by converting the divalent group derived from an aromatic hydrocarbon having 6 to 25 carbon atoms defined in $L_3$ into a monovalent group. Similarly, in the above case, the aromatic heterocyclic cyclic group as $Ar_4$ is not particularly limited, and may be exemplified by converting a divalent group derived from a heterocyclic aromatic compound defined in $L_3$ into a monovalent group. Moreover, when $Ar_4$ forms a ring with $Ar_3$, a divalent group derived from an aromatic hydrocarbon having 6 to 25 carbon atoms as defined for $L_3$ may be exemplified. Similarly, in the above case, the aromatic heterocyclic group as $Ar_4$ is not particularly limited, and examples of the divalent group derived from the heterocyclic aromatic compound defined in $L_3$ are exemplified. Among these, $Ar_4$ may be a group derived from a compound selected from benzene, biphenyl, dibenzofuranyl group and fluorenyl group.

In an embodiment, $Ar_4$ may be a group derived from benzene (a phenyl group or an o, m, or p-phenylene group). In an embodiment, $Ar_4$ may be a phenyl group when $Ar_4$ does not form a ring with $Ar_3$, or an o-phenylene group when $Ar_4$ forms a ring with $Ar_3$. Such $Ar_4$ (unsubstituted form) may appropriately control the HOMO level of the polymeric material. Further, a higher hole injection properties, higher triplet energy levels, lower driving voltages, and a balance of two or more thereof (particularly, a balance between hole injection properties and film-forming properties) may be achieved. In addition, in an embodiment, $Ar_4$ may be unsubstituted, or any hydrogen may be replaced by a substituent.

Moreover, $Ar_4$ may have a linear hydrocarbon group having 1 to 12 carbon atoms or a branched hydrocarbon group having 3 to 12 carbon atoms as a substituent. By disposing such a hydrocarbon group at the terminal end of the polymeric material, the polymeric material according to the present disclosure in the hole transport layer may interact closely with the quantum dots in the light emitting layer, so that holes may be efficiently injected into the quantum dots (high hole injection properties) to improve durability (luminescence life-span). Herein, the hydrocarbon group having 1 to 12 carbon atoms is not particularly limited, and examples thereof may include a linear or branched alkyl group, alkenyl group, or alkynyl group, and a cycloalkyl group. Meanwhile, when $Ar_4$ is an alkenyl group or an alkynyl group, the carbon number of $Ar_4$ may be 2 to 16. Similarly, when $Ar_4$ is a cycloalkyl group, the carbon number of $Ar_4$ may be 3 to 6.

The alkyl group having 1 to 12 carbon atoms may be, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethyl propyl group, an n-hexyl group, an isohexyl group, a 1,3-dimethylbutyl group, a 1-isopropyl propyl group, a 1,2-dimethylbutyl group, an n-heptyl group, a 1,4-dimethyl pentyl group, a 3-ethyl pentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, an n-nonyl group, a 3,5,5-trimethyl hexyl group, an n-decyl group, an isodecyl group, an n-undecyl group, a 1-methyldecyl group, an n-dodecyl group, and the like.

Examples of the alkenyl group having 2 to 16 carbon atoms may include a vinyl group, an allyl group, a 1-propenyl group, a 2-butenyl group, a 1,3-butadienyl group, a 2-pentenyl group, or an isopropenyl group.

Examples of the alkynyl group having 2 to 16 carbon atoms may include an ethynyl group or a propargyl group.

Examples of the cycloalkyl group having 3 to 6 carbon atoms may include a cyclopropyl group, a cyclobutyl group, a cyclopentyl group, or a cyclohexyl group.

Among these, the hydrocarbon group present in $Ar_4$ may be a linear alkyl group having 4 to 10 carbon atoms and a branched alkyl group having 4 to 10 carbon atoms. By increasing the number of carbon atoms (long chain) of the hydrocarbon group present in $Ar_4$ in this way, the HOMO level of the polymeric material may be appropriately controlled. In addition, since a distance between the polymeric material and the quantum dot becomes closer and the interaction between the polymeric material in the hole transport layer and the quantum dot in the light emitting layer becomes stronger, so that the hole injection properties (therefore, durability (luminescence life-span)) may be further improved. In other words, in an embodiment, $Ar_4$ may be a group derived from a compound selected from benzene, biphenyl, dibenzofuran, and fluorene, and at the same time, may be substituted with a linear alkyl group having 4 to 10 carbon atoms or a branched alkyl group having 4 to 10 carbon atoms. In an embodiment, the hydrocarbon group of $Ar_4$ may be a linear alkyl group having 5 to 8 carbon atoms. In other words, in an embodiment, $Ar_4$ may be a group derived from benzene (phenyl group, o, m, or p-phenylene group) substituted with a linear alkyl group having 5 to 8 carbon atoms. In an embodiment, the hydrocarbon group of $Ar_4$ may be a linear alkyl group having 6 to 8 carbon atoms. In other words, in an embodiment, $Ar_4$ may be a phenyl group (when $Ar_4$ does not form a ring with $Ar_3$) or an o-phenylene group ($Ar_4$ forms a ring with $Ar_3$).

The position of the hydrocarbon group of $Ar_4$ is not particularly limited, but may be present at a position as far apart as possible from the nitrogen of $-L_4-N(Ar_3)(Ar_4)$. For example, when $Ar_3$ forms a ring with $L_4$ and $Ar_4$ is a phenyl group, the hydrocarbon group may be present at the para position with respect to the nitrogen. With this arrangement, a distance between the polymeric material and the quantum dots becomes closer, and an interaction between the polymeric material in the hole transport layer and the quantum dots in the light emitting layer becomes stronger, so that hole injection properties (therefore, durability (luminescence lifetime)) may also be improved.

$Ar_4$ may form a ring with $Ar_3$. When $Ar_4$ forms a ring with $Ar_3$, the ring structure formed with $Ar_4$ and $Ar_3$ is not particularly limited, but $Ar_4$ and $Ar_3$ may form a carbazole ring. In other words, in an embodiment of the present disclosure, in Chemical Formula 35, $Ar_3$ forms a ring with $Ar_4$, and $—N(Ar_3)(Ar_4)$ may have a group selected from structures of Chemical Formula 35-4.

[Chemical Formula 35-4]

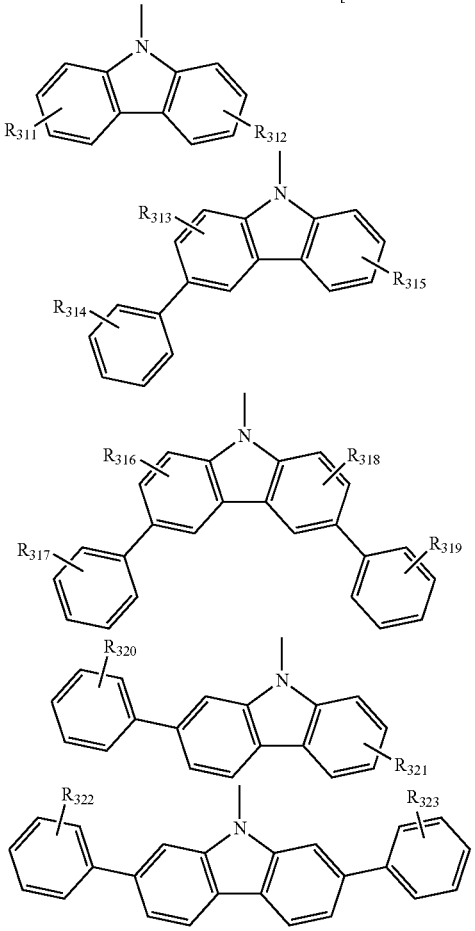

In Chemical Formula 35-4, each $R_{311}$ to $R_{323}$ may be independently a hydrogen or a hydrocarbon group having 1 to 16 carbon atoms, and at least one of $R_{311}$ to $R_{323}$ may be a linear hydrocarbon group having 1 to 12 carbon atoms or a branched hydrocarbon group having 1 to 12 carbon atoms (for example a linear alkyl group having 4 to 10 carbon atoms or a branched chain alkyl group having 4 to 10 carbon atoms, for example a linear alkyl group having 5 to 8 carbon atoms, or for example a linear alkyl group having 6 to 8 carbon atoms).

In an embodiment, $Ar_4$ and $Ar_3$ may form a carbazole ring of the structure of Chemical Formula 35-5. In other words, in an embodiment, $-L_4-N(Ar_3)(Ar_4)$ in Chemical Formula 35 has the structure of Chemical Formula 35-5.

Chemical Formula 35-5

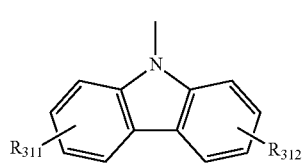

Chemical Formula 35-5, each $R_{311}$ may be a hydrogen, a linear alkyl group having 4 to 10 carbon atoms, or a branched alkyl group having 4 to 10 carbon atoms (for example a hydrogen or a linear alkyl group having 5 to 8 carbon atoms) and $R_{312}$ may be a linear alkyl group having 4 to 10 carbon atoms, or a branched alkyl group having 4 to 10 carbon atoms (for example a linear alkyl group having 5 to 8 carbon atoms, or particularly a linear alkyl group having 6 to 8 carbon atoms).

Accordingly, the structural unit (Structural Unit (A)) of Chemical Formula 35 according to the present disclosure may be selected from Group 38.

[Group 38]

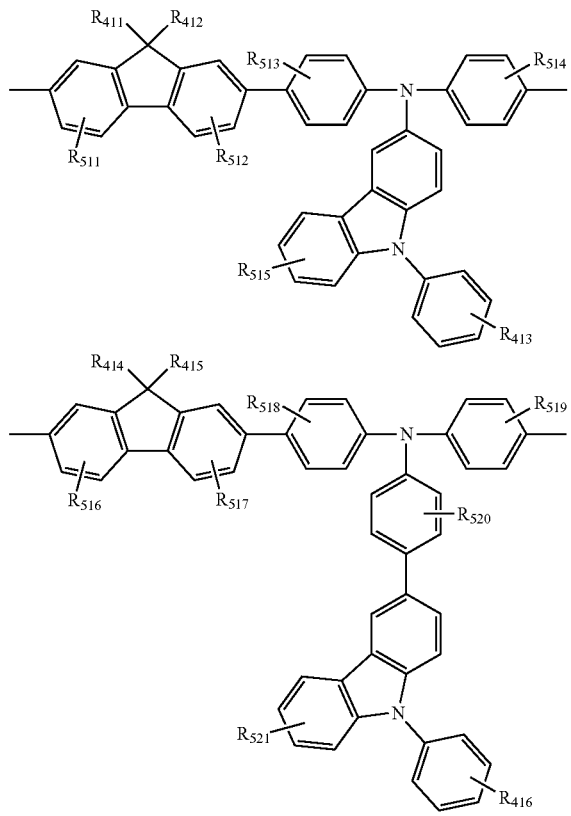

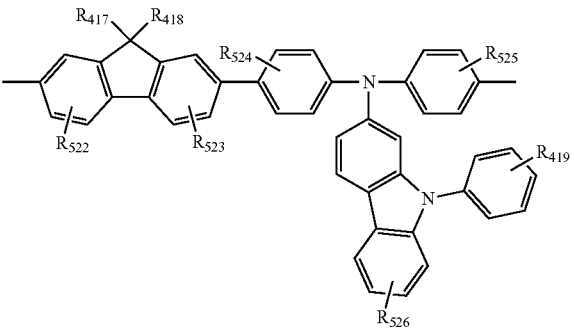

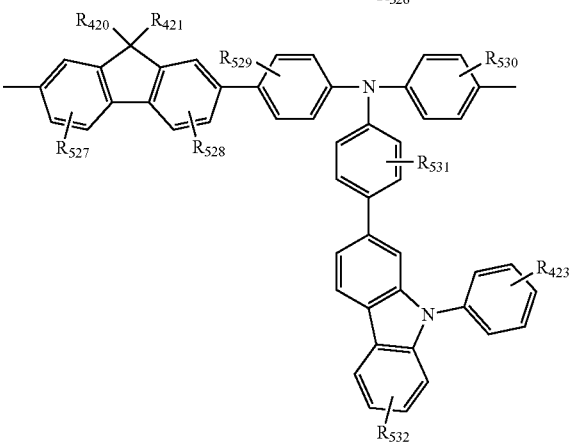

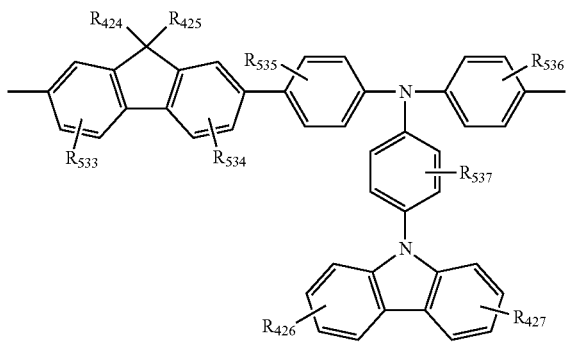

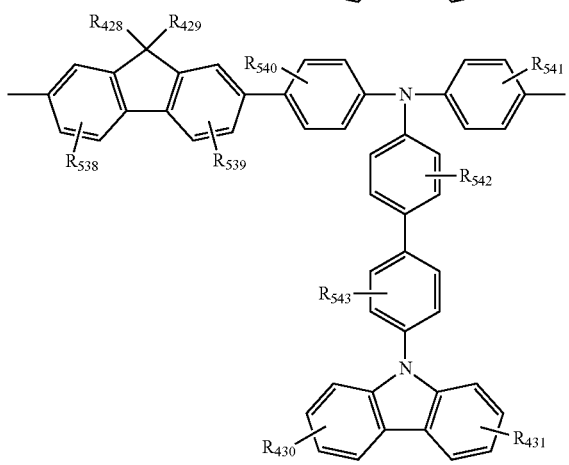

In Group 38, each of $R_{411}$ to $R_{431}$ may be independently a linear alkyl group having 1 to 12 carbon atoms or a branched alkyl group having 3 to 12 carbon atoms, and each of $R_{511}$ to $R_{543}$ may be independently a hydrogen or a hydrocarbon having 1 to 16 carbon atoms.

The composition in particular of Structural Unit (A) in the polymeric material of the present disclosure is not limited. Considering the durability (luminescence life-span) and the effect of improving the hole transport ability of a layer (for example, a hole injection layer, a hole transport layer) formed using the obtained polymeric material, Structural Unit (A) may be included in an amount of greater than or equal to about 10 mol % and less than or equal to 100 mol %, for example greater than about 50 mol % and less than or equal to 100 mol %, or 100 mol % based on the entire structural units constituting the polymeric material. In other words, in an embodiment, Structural Unit (A) may be included in a ratio of greater than or equal to about 10 mol % and less than or equal to 100 mol % based on the entire structural units. In an embodiment of the present disclosure, Structural Unit (A) may be included in a ratio of greater than about 50 mol % and less than or equal to 100 mol % based on the entire structural units. In another embodiment of the present invention, the polymeric material may be composed of Structural Unit (A) alone (that is, the ratio of Structural Unit (A) based on the entire structural units=100 mol %). On the other hand, when a polymeric material may include 2 or more types of Structural Units (A), content of the structural unit (A) means a sum total of structural units (A).

As described above, the polymeric material of the present disclosure may be composed of Structural Unit (A) alone. Alternatively, the polymeric material of the present disclosure may further include other structural units other than Structural Unit (A). In the case of including other structural units, other structural units are not particularly limited as long as the effects of the polymeric material (particularly high triplet energy level and low driving voltage) are not impaired. Specifically, the structural unit selected from Group 39 may be used. Meanwhile, hereinafter, the structural unit represented by Group 39 is also referred to as a "Structural Unit (B)."

[Group 39]

Structural Unit (B)

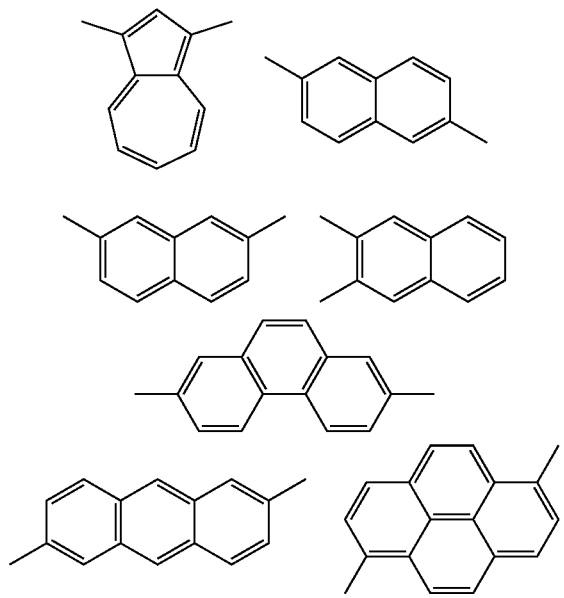

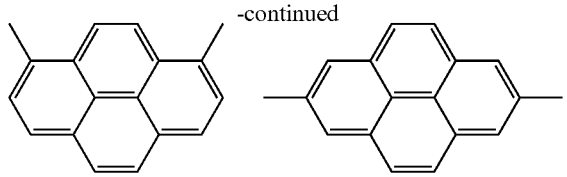

The composition of Structural Unit (B) in the polymeric material of the present embodiment is not particularly limited. Considering the film-forming easiness of the obtained polymer compound and the effect of improving the film strength, Structural Unit (B) may be included in an amount of greater than or equal to about 1 mol % and less than or equal to about 10 mol % based on the total moles of structural units of the polymeric material. On the other hand, when the polymeric material contains two or more different forms of Structural Units (B), the stated content of Structural Unit (B) means a sum total of Structural Units (B).

The weight average molecular weight (Mw) of the polymeric material is not particularly limited as long as the desired effect of the present disclosure is obtained. The weight average molecular weight (Mw) may be, for example, about 12,000 g/mol to about 1,000,000 g/mol, or for example about 50,000 g/mol to about 500,000 g/mol. With such a weight average molecular weight, it is possible to appropriately adjust the viscosity of a coating solution for forming a layer (for example, a hole injection layer, a hole transport layer) using a polymeric material to form a layer with a uniform film thickness.

Moreover, a number average molecular weight (Mn) of the polymeric material is not particularly limited, as long as the desired effect of the present disclosure is acquired. The number average molecular weight (Mn) may be, for example, about 10,000 g/mol to about 250,000 g/mol, or for example, about 30,000 g/mol to about 100,000 g/mol. With such a number average molecular weight, it is possible to appropriately adjust the viscosity of the coating solution for forming a layer (for example, a hole injection layer, a hole transport layer) using the polymeric material to form a layer having a uniform film thickness. In addition, the polydispersity (weight average molecular weight/number average molecular weight) of the polymeric material of the present embodiment may be, for example, about 1.2 to about 4.0, or for example about 1.5 to about 3.5.

Herein, the measurement of the number average molecular weight (Mn) and the weight average molecular weight (Mw) is not particularly limited and may be applied by using a known method or by appropriately changing the known methods. In the present specification, the number average molecular weight (Mn) and the weight average molecular weight (Mw) use values measured by the above method. On the other hand, the polydispersity (Mw/Mn) of the polymer is calculated by dividing the weight average molecular weight (Mw) by the number average molecular weight (Mn) measured by the above method.

The polymeric material according to the present embodiment may be synthesized by using a known organic synthesis method. A specific method for synthesizing the polymeric material of the present embodiment may be easily understood by a person of an ordinary skill in the art referring to the examples to be described later. Specifically, the polymeric material of the present embodiment may be prepared by polymerization using one or more monomers (35') represented by Chemical Formula 35', or by a copolymerization reaction of one or more monomers (35') represented by Chemical Formula 35' and another monomer corresponding to the other structural unit.

Chemical Formula 35'

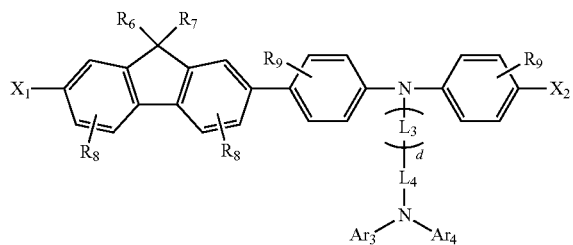

(35')

Alternatively, the polymeric material may be prepared by a copolymerization reaction one or more monomers (36') represented Chemical Formula 36' and one or more monomers (37) represented by Chemical Formula 37', or one or more monomers (36) represented by Chemical Formula 36', one or more monomers (37) represented by Chemical Formula 37', and other monomers corresponding to the other structural units.

Chemical Formula 36'

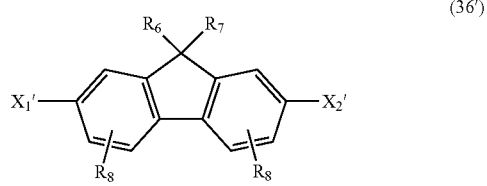

(36')

Chemical Formula 37'

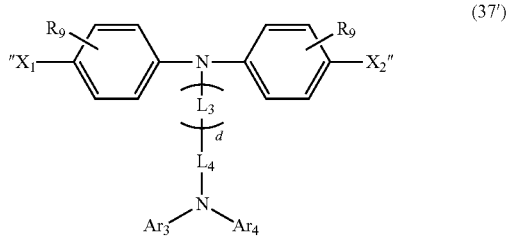

(37')

In the present disclosure, the monomer used for polymerization of a polymeric material may be synthesized by appropriately combining known synthesis reactions, and its structure may also be determined by a known method (e.g., NMR, LC-MS, etc.).

In Chemical Formulas 35' to 37', $R_6$ to $R_9$, $L_3$, $L_4$, $Ar_3$, $Ar_4$, and d are as defined in Chemical Formula 35. $X_1$ and $X_2$ are each independently a halogen atom (a fluorine atom, a chlorine atom, a bromine atom, an iodine atom, particularly a bromine atom) or a functional group represented by Chemical Formula D. On the other hand, in Chemical Formula D, $R_A$ to $R_D$ are each independently an alkyl group having 1 to 3 carbon atoms. In an embodiment, $R_A$ to $R_D$ may be a methyl group. Meanwhile, $X_1$ and $X_2$ of Chemical Formulas 35' to 37' may be the same or different from each other. In an embodiment, in Chemical Formula 35', $X_1$ and $X_2$ may be different. In an embodiment, in Chemical Formula 36', $X_1'$ and $X_2'$ may be the same. In an embodiment, in Chemical Formula 37', $X_1''$ and $X_2''$ may be the same.

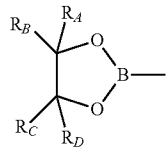

Chemical Formula D

A mixing ratio of the copolymer and the polymeric material in the polymer composition according to the present embodiment is not particularly limited, and may be appropriately selected depending on the desired HOMO level of the mixture of the copolymer and the polymeric material. The mixing ratio of the copolymer and the polymeric material in the polymer composition (the mixing weight ratio of the copolymer and the polymeric material in the polymer composition) may be about 0.11:1 to about 4.0:1, or for example about 0.25:1 to about 4.0:1.

Electroluminescence Device Material

The copolymer or polymer composition according to the present embodiment may be used as an electroluminescence device material. According to the present embodiment, the electroluminescence device material which has the improved luminous efficiency is provided. In addition, according to the copolymer or polymer composition according to the present embodiment, an electroluminescence device material having excellent durability (luminescence life-span), high triplet energy level (current efficiency) and low driving voltage is also provided. In addition, the copolymer or polymer composition according to the present embodiment exhibits high solubility in a solvent and high heat resistance. Therefore, it is possible to easily form a film (thin film) by the wet (coating) method. Accordingly, in another embodiment, an electroluminescence device material including the aforementioned copolymer or polymer composition is provided. Alternatively, the use of the copolymer according to the invention or the polymer composition according to the invention as electroluminescence device material is provided.

In addition, the copolymer according to the present embodiment has a deep HOMO level of less than or equal to about −5.6 eV. For this reason, the copolymer or polymer composition according to the present embodiment may be suitably used for a quantum dot electroluminescence device (especially a hole transport layer).

Electroluminescence Device

As described above, the copolymer or polymer composition according to the present embodiment may be used for an electroluminescence device. In other words, an electroluminescence device includes a pair of electrodes and one or more organic layers between the electrodes and including the copolymer or polymer composition or the electroluminescence device material of the present embodiment. Such an electroluminescence device may exhibit improved luminous efficiency (especially excellent luminous efficiency with a low driving voltage).

Accordingly, according to an embodiment, an electroluminescence device includes a first electrode and a second electrode, and one or more organic layers disposed between the first electrode and the second electrode, wherein at least one layer of the one or more organic layers includes the aforementioned copolymer or polymer composition (particularly the polymer composition of the present invention). The purpose (or effect) of the present disclosure may also be achieved by the electroluminescence device according to the present embodiment. In an embodiment, the electroluminescence device further includes a light emitting layer between the electrodes and including a light emitting material capable of emitting light from triplet excitons. On the other hand, the electroluminescence device of the present embodiment may be an example of the electroluminescence device according to the present disclosure.

In addition, the present embodiment provides a method of manufacturing an electroluminescence device that includes a pair of electrodes and at least one organic film disposed between the electrodes and including the copolymer or polymer composition according to the present embodiment. At least one of the layers is formed by a coating method. In addition, by this method, the present embodiment provides an electroluminescence device in which at least one layer of the organic film is formed by a coating method.

The copolymer or polymer composition of the present embodiment, and the electroluminescence device material (EL device material) according to the present embodiment (hereinafter collectively, also referred to as "copolymer/EL device material") have improved solubility in an organic solvent. For this reason, the copolymer/EL device material according to the present embodiment may be used for manufacturing devices (especially thin films) by a coating method (wet process). For this reason, the present embodiment provides a liquid composition including the copolymer or polymer composition and a solvent or a dispersion medium. Such a liquid composition is an example of the liquid composition according to the present disclosure.

In addition, as described above, the electroluminescence device material according to the embodiment may be used for the manufacture of devices (particularly thin films) by a coating method (wet process). In view of the above, the present embodiment provides a thin film including the aforementioned copolymer or polymer composition. Such a thin film is an example of the thin film according to the present disclosure.

Further, the EL device material according to the present embodiment has improved hole injection properties and hole mobility.

For this reason, it may be also desirably used in the formation of any one organic film of a hole injection material, a hole transport material, or a light emitting material (host). Among them, from the viewpoint of hole transportability, it may be used as a hole injection material or a hole transport material, and particularly a hole transport material.

In other words, the present embodiment provides a composition including the copolymer or polymer composition and at least one material selected from a hole transport material, an electron transport material, and a light emitting material. Here, the light emitting material included in the composition is not particularly limited, but may include an organometal complex (light emitting organometal complex compound) or a semiconductor nanoparticle (semiconductor inorganic nanoparticle).

Hereinafter, referring to FIG. 1, an electroluminescence device according to the present embodiment is described in detail. FIG. 1 is a schematic view showing an electroluminescence device according to the present embodiment. In addition, in this specification, an "electroluminescence device" may be abbreviated as "EL device."

As shown in FIG. 1, the EL device 100 according to the present embodiment includes a substrate 110, a first electrode 120 on the substrate 110, a hole injection layer 130 on the first electrode 120, a hole transport layer 140 on the hole injection layer 130, a light emitting layer 150 on hole transport layer 140, an electron transport layer 160 on light emitting layer 150, an electron injection layer 170 on the electron transport layer 160, and a second electrode 180 on the electron injection layer 170.

Herein, the copolymer/EL device material according to the present embodiment is included in, for example, any one organic film (organic layer) disposed between the first electrode 120 and the second electrode 180. Specifically, the copolymer/EL device material may be included in the hole injection layer 130 as a hole injection material, in the hole transport layer 140 as a hole transport material, or in the light emitting layer 150 as a light emitting material (host). The copolymer/EL device material may be included in the hole injection layer 130 as a hole injection material or in the hole transport layer 140 as a hole transport material. The copolymer/EL device material may be included in the hole transport layer 140 as a hole transport material. That is, in an embodiment, the organic film including the copolymer/EL device material may be in a hole transport layer, a hole injection layer, or a light emitting layer. In an embodiment, the organic film including the copolymer/EL device material may be included in a hole transport layer or a hole injection layer. In an embodiment, the organic film including the copolymer/EL device material may be included in a hole transport layer.

In addition, the organic film including the copolymer according to the present embodiment/EL device material may be formed by a coating method (solution coating method). Specifically, the organic film may be formed by a solution coating method such as a spin coating method, a casting method, a micro gravure coating method, a gravure coating method, a bar coating method, a roll coating method, a wire bar coating method, a dip coating method, a spray coating method, a screen printing method, a flexographic printing method, an offset printing method, an inkjet printing method, and the like.

As the solvent used in the solution coating method, any solvent may be used as long as it is capable of dissolving the copolymer/EL device material, and the solvent may be appropriately selected according to types of the copolymer or polymer composition (copolymer or polymeric material). For example, the solvent may be toluene, xylene, ethylbenzene, diethylbenzene, methylene, propylbenzene, cyclohexylbenzene, dimethoxybenzene, anisole, ethoxytoluene, phenoxytoluene, isopropylbiphenyl, dimethylanisole, phenyl acetate, phenyl propionate, methyl benzoate, ethyl benzoate, cyclohexane, and the like. An amount of the solvent used is not particularly limited, but considering the ease of coating, a concentration of the copolymer or polymer composition may desirably be greater than or equal to about 0.1 wt % and less than or equal to about 10 wt %, or greater than or equal to about 0.5 wt % and less than or equal to about 5 wt %.

In addition, the film-formation method of layers other than the organic film including the copolymer/EL device material/is not specifically limited. The layers other than the organic film including the copolymer/EL device material according to the present embodiment may be formed by, for example, a vacuum deposition method or may be formed by a solution coating method.

The substrate 110 may be a substrate used in a general EL device. For example, the substrate 110 may be a semiconductor substrate such as a glass substrate, a silicon substrate, and the like, or a transparent plastic substrate.

On the substrate 110, a first electrode 120 is formed. The first electrode 120 is specifically an anode, and is formed by a material having a large work function among a metal, an alloy, or a conductive compound. For example, the first electrode 120 may be formed as a transmissive electrode by indium tin oxide (In$_2$O$_3$—SnO$_2$: ITO), indium zinc oxide (In$_2$O$_3$—ZnO), tin oxide (SnO$_2$), zinc oxide (ZnO) or the like due to improved transparency and conductivity. The first electrode 120 may be formed as a reflective electrode by laminating magnesium (Mg), aluminum (Al), or the like on the transparent conductive layer. After forming the first electrode 120 on the substrate 110, washing and UV-ozone treatment may be performed as necessary.

On the first electrode 120, a hole injection layer 130 is formed. The hole injection layer 130 is a layer that facilitates injection of holes from the first electrode 120, and may be formed to have a thickness (dry film thickness; the same below) of specifically greater than or equal to about 10 nm and less than or equal to about 1000 nm, or greater than or equal to about 20 nm and less than or equal to about 50 nm.

The hole injection layer 130 may be formed of a known hole injection material. The known hole injection material of the hole injection layer 130 may include, for example, triphenylamine-containing poly(ether ketone) (TPAPEK), 4-isopropyl-4'-methyldiphenyl iodonium tetrakis(pentafluorophenyl)borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4"-tris(3-methylphenylphenylamino)triphenylamine (m-MTDATA), N,N'-di(1-naphthyl)-N,N'-diphenylbenzidine (NPB), 4,4',4"-tris(diphenylamino)triphenylamine (TDATA), 4,4',4"-tris(N,N-2-naphthylphenylamino)triphenylamine (2-TNATA), polyaniline/dodecylbenzenesulphonic acid, poly(3,4-ethylenedioxythiophene)/poly(4-styrenesulfonate) (PEDOT/PSS), and polyaniline/10-camphorsulfonic acid, and the like.

On the hole injection layer 130, a hole transport layer 140 is formed. The hole transport layer 140 is a layer having a function of transporting holes, and may be formed with a thickness of, for example, greater than or equal to about 10 nm and less than or equal to about 150 nm, and more specifically greater than or equal to about 20 nm and less than or equal to about 50 nm. The hole transport layer 140 may be formed by a solution coating method which includes the copolymer or polymer composition according to the present embodiment. According to this method, current efficiency of the EL device 100 may be improved and a driving voltage may be decreased. Further, durability (luminescence life-span) of the EL device 100 may be increased. In addition, current efficiency of the EL device 100 may be improved and a driving voltage may be decreased. In addition, because the hole transport layer may be formed by the solution coating method, a large area may be formed efficiently.

The hole transport layer 140 may be formed of a known hole transport material in combination with the copolymer or polymer composition according to the present embodiment. The known hole transport material may include, for example, 1,1-bis[(di-4-tolylamino) phenyl] cyclohexane (TAPC), a carbazole derivative such as N-phenylcarbazole, polyvinylcarbazole, and the like, N,N'-bis(3-methylphenyl)-N, N'-diphenyl-[1,1-biphenyl]-4,4'-diamine (TPD), 4,4',4"-tris(N-carbazolyl) triphenylamine (TCTA), and N,N'-di(1-naphthyl)-N,N'-diphenylbenzidine (NPB).

On the hole transport layer 140, a light emitting layer 150 is formed. The light emitting layer 150 is a layer that emits light by fluorescence, phosphorescence, and the like, and is formed using a vacuum deposition method, a spin coating method, an inkjet printing method, or the like. The light emitting layer 150 may be formed with a thickness of, for example, about 10 nm to about 60 nm, and more specifically about 20 nm to about 50 nm. As the light emitting material of the light emitting layer 150 may include a known light emitting material. However, the light emitting material included in the light emitting layer 150 is desirably a light emitting material capable of emitting light (i.e., phosphorescence emission) from triplet excitons. In such a case, the driving life-span of the EL device 100 may be further improved.

The light emitting layer 150 is not particularly limited and may have a known configuration. Desirably, the light emitting layer may include a semiconductor nanoparticle or an organometal complex. That is, in an embodiment of the present disclosure, the organic film has a light emitting layer including semiconductor nanoparticles or organometal complexes. When the light emitting layer includes semiconductor nanoparticles, the EL device may be a quantum dot electroluminescence device (QLED) or a quantum dot light emitting diode. In addition, when the light emitting layer includes an organometal complex, the EL device is an organic electroluminescence device (OLED).

In the form in which the light emitting layer includes semiconductor nanoparticles (QLED), the light emitting layer may include a plurality of semiconductor nanoparticles (quantum dots) arranged in a single layer or a plurality of layers. Herein, the semiconductor nanoparticles (quantum dots) may be particles of predetermined sizes that have a quantum confinement effect. The diameter of the semiconductor nanoparticles (quantum dots) is not particularly limited but is greater than or equal to about 1 nm and less than or equal to about 10 nm.

The semiconductor nanoparticles (quantum dots) arranged in the light emitting layer may be synthesized by a wet chemical process, an organometal chemical deposition process, a molecular beam epitaxy process, or another similar process. Among them, the wet chemical process is a method of growing a particle by putting a precursor material in an organic solvent.

In the wet chemistry process, when crystals grow, the organic solvent naturally coordinates to the surface of the quantum dot crystals and acts as a dispersing agent, thereby controlling the growth of the crystals. For this reason, in the wet chemical process, compared with gas phase deposition methods, such as metal organic chemical vapor deposition (MOCVD) and molecular beam epitaxy (MBE), growth of semiconductor nanoparticles may be easily controlled at a low cost.

The semiconductor nanoparticles (quantum dots) may adjust energy bandgaps by an adjustment in size, so that light of various wavelengths may be obtained from the light emitting layer (quantum dot light emitting layer). Thus, a plurality of differently sized quantum dots may embody a display that discharges (or emits) light of multiple wavelengths. The sizes of the quantum dots may be selected to emit red, green, and blue light to form a color display. In addition, the sizes of the quantum dots may be combined so that various color lights emit white light.

The semiconductor nanoparticles (quantum dots) may be semiconductor material selected from a Group II-VI semiconductor compound; a Group III-V semiconductor compound; a Group IV-VI semiconductor compound; a Group IV element or compound; and a combination thereof.

The Group II-VI semiconductor compound is not particularly limited, but includes, for example, a binary compound selected from CdSe, CdTe, ZnS, ZnSe, ZnTe, ZnO, HgS, HgSe, HgTe, and a mixture thereof; a ternary compound selected from CdSeS, CdSeTe, CdSTe, ZnSeS, ZnTeSe, ZnSTe, HgSeS, HgSeTe, HgSTe, CdZnS, CdZnSe, CdZnTe, CdHgS, CdHgSe, CdHgTe, HgZnS, HgZnSe, HgZnTe, and a quaternary compound selected from CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V semiconductor compound is not particularly limited, but includes, for example, a binary compound selected from GaN, GaP, GaAs, GaSb, AlN, AlP, AlAs, AlSb, InN, InP, InAs, InSb, and a mixture thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI semiconductor compound is not particularly limited, but includes, for example, a binary compound selected from SnS, SnSe, SnTe, PbS, PbSe, PbTe, and a mixture thereof; a ternary compound selected from SnSeS, SnSeTe, SnSTe, PbSeS, PbSeTe, PbSTe, SnPbS, SnPbSe, SnPbTe, and a mixture thereof; and a quaternary compound selected from SnPbSSe, SnPbSeTe, SnPbSTe, and a mixture thereof.

The Group IV element or compound is not particularly limited, but includes, for example, a single element compound selected from Si, Ge, and a mixture thereof; and a binary compound selected from SiC, SiGe, and a mixture thereof.

The semiconductor nanoparticles (quantum dots) may have a homogeneous single structure or a double structure of a core-shell. The core-shell may include different materials. The material constituting each core and shell may be made of different semiconductor compounds. However, an energy bandgap of the shell material is larger than an energy bandgap of the core material. Specifically, structures such as ZnTeSe/ZnSe/ZnS, CdSe/ZnS, InP/ZnS, and the like are desirable.

For example, a process of producing a quantum dot having a core (CdSe)-shell (ZnS) structure is described. First, crystals are formed by injecting core (CdSe) precursor materials of $(CH_3)_2Cd$ (dimethyl cadmium), TOPSe (trioctylphosphine selenide) and the like into an organic solvent using TOPO (trioctylphosphine oxide) as a surfactant. At this time, after maintaining a certain time at high temperature so that the crystals grow to a certain size, the precursor materials of the shell (ZnS) are injected, to form a shell on the surface of the core already generated. As a result, a quantum dot of CdSe/ZnS capped with TOPO may be produced.

In addition, in the embodiment (OLED) in which the light emitting layer includes an organometal complex, the light emitting layer 150 may include, for example 6,9-diphenyl-9'-(5'-phenyl-[1,1':3',1"-terphenyl]-3-yl)3,3'-bi[9H-carbazole], 3,9-diphenyl-5-(3-(4-phenyl-6-(5'-phenyl-[1,1':3',1"-terphenyl]-3-yl)-1,3,5,-triazin-2-yl)phenyl)-9H-carbazole, 9,9'-diphenyl-3,3'-bi[9H-carbazole], tris(8-quinolinato)aluminium ($Alq_3$), 4,4'-bis(carbazol-9-yl)biphenyl (CBP), poly (n-vinyl carbazole) (PVK), 9,10-di(naphthalene)anthracene (ADN), 4,4',4'''-tris(N-carbazolyl)triphenylamine (TCTA), 1,3,5-tris(N-phenyl-benzimidazol-2-yl)benzene (TPBI), 3-tert-butyl-9,10-di(naphth-2-yl)anthracene (TBADN), distyrylarylene (DSA), 4,4'-bis(9-carbazole)-2,2'-dimethyl-bipheny (dmCBP), and the like, as a host material.

In addition, the light emitting layer 150 may include, for example, perylene or a derivative thereof, rubrene, or a derivative thereof, coumarin, or a derivative thereof, 4-dicyanomethylene-2-(pdimethylaminostyryl)-6-methyl-4H-pyran (DCM), or a derivative thereof, an iridium (Ir) complex such as bis[2-(4,6-difluorophenyl)pyridinate]picolinate iridium(III) (Flrpic)), bis(1-phenylisoquinoline) (acetylacetonate)iridium(III) ($Ir(piq)_2(acac)$), tris(2-phenylpyridine) iridium (III) ($Ir(ppy)_3$), tris(2-(3-p-xylyl)phenyl)pyridine iridium (III), an osmium (Os) complex, a platinum complex, and the like, as a dopant material. Among these, it is desirable that the light emitting material includes a light emitting organometal complex compound, and in particular, an iridium complex, e.g., a green light emitting iridium complex.

A method for forming the light emitting layer is not particularly limited. It may be formed by coating (solution coating method) coating liquid including a semiconductor nanoparticle or an organometal complex. At this time, it is desirable to select a solvent which does not dissolve the materials (hole transport material, particularly the copolymer or polymeric composition) in the hole transport layer as the solvent constituting the coating liquid.

On the light emitting layer 150, an electron transport layer 160 is formed. The electron transport layer 160 is a layer having a function of transporting electrons, and is formed using a vacuum deposition method, a spin coating method, an inkjet method, or the like. For example, the electron transport layer 160 may be formed to have a thickness of greater than or equal to about 15 nanometers (nm) and less than or equal to about 50 nm.

The electron transport layer 160 may be formed of a known electron transport material. The known electron transport material may include, for example, (8-quinolinato) lithium (lithium quinolate) (Liq), tris(8-quinolinato) aluminium (Alq3), or a compound having a nitrogen-containing aromatic ring. Examples of the compound having the nitrogen-containing aromatic ring may include, for example, a compound including a pyridine ring such as 1,3,5-tri[(3-pyridyl)-phen-3-yl]benzene), a compound including a triazine ring such as 2,4,6-tris(3'-(pyridin-3-yl)biphenyl-3-yl)-1,3,5-triazine), a compound including an imidazole ring such as 2-(4-(N-phenylbenzoimidazolyl-1-yl-phenyl)-9,10-dinaphthylanthracene or 1,3,5-tris(N-phenyl-benzimidazol-2-yl)benzene, TPBI). The electron transport material may be used alone or as a mixture of two or more materials thereof.

On the electron transport layer 160, an electron injection layer 170 is formed. The electron injection layer 170 is a layer having a function of facilitating injection of electrons from the second electrode 180. The electron injection layer 170 is formed using a vacuum deposition method or the like. The electron injection layer 170 may be formed to have a thickness of greater than or equal to about 0.1 nm and less than or equal to about 5 nm, and more specifically, greater than or equal to about 0.3 nm and less than or equal to about 2 nm. As a material for forming the electron injection layer 170, any known material may be used. For example, the electron injection layer 170 may be formed of a lithium compound such as (8-quinolinato) lithium (lithium quinolate) (Liq) and lithium fluoride (LiF), sodium chloride (NaCl), cesium fluoride (CsF), lithium oxide ($Li_2O$), or barium oxide (BaO).

On the electron injection layer 170, a second electrode 180 is formed. The second electrode 180 is formed using a vacuum deposition method or the like. Specifically, the second electrode 180 is a cathode, and is formed by a material having a small work function such as metals, alloys, or conductive compounds. For example, the second electrode 180 may be formed as a reflective electrode with a metal such as lithium (Li), magnesium (Mg), aluminum (Al), calcium (Ca), or aluminum-lithium (Al—Li), magnesium-indium (Mg—In), magnesium-silver (Mg—Ag), or the like. The second electrode 180 may be formed to have a thickness of greater than or equal to about 10 nm and less than or equal to about 200 nm, and more and specifically, greater than or equal to about 50 nm and less than or equal to about 150 nm. Alternatively, the second electrode 180 may be formed as a transmissive electrode by a thin film of less than or equal to about 20 nm of a metal material or a transparent conductive layer such as indium tin oxide ($In_2O_3$—$SnO_2$) or indium zinc oxide ($In_2O_3$—ZnO).

The EL device 100 according to the present embodiment has been described above as an example of the electroluminescence device according to the present disclosure. The EL device 100 according to the present embodiment further improves luminous efficiency (current efficiency) and reduces a driving voltage by installing an organic film (particularly a hole transport layer or a hole injection layer) including the copolymer or polymer composition. In addition, durability (luminescence life-span) may be further improved (especially when the polymer composition according to the present disclosure is used), and the driving voltage may be reduced.

The stacked structure of the EL device 100 according to the present embodiment is not limited to the above embodiments. The EL device 100 according to the present embodiment may have another known stacked structure. For example, in the EL device 100, one or more layers of the hole injection layer 130, the hole transport layer 140, the electron transport layer 160 and the electron injection layer 170 may be omitted or another layer may be further included. In addition, each layer of the EL device 100 may be formed in a single layer or in a plurality of layers.

For example, the EL device 100 may further include a hole blocking layer between the hole transport layer 140 and the light emitting layer 150 in order to prevent excitons or holes from diffusing into the electron transport layer 160. The hole blocking layer may be formed by, for example, an oxadiazole derivative, a triazole derivative, or a phenanthroline derivative.

In addition, the copolymer or polymer composition according to the present embodiment may be applied to electroluminescence devices other than the QLED or OLED. Other electroluminescence devices including the copolymer or polymer composition according to the present embodiment may include, but are not particularly limited to, for example, organic inorganic perovskite light emitting devices.

EXAMPLES

The present disclosure is described in more detail using the following examples and comparative examples. However, the technical range of the present disclosure is not limited to the following examples. In the following examples, unless specifically described, each operation was performed at room temperature (25° C.). In addition, unless specifically stated, "%" and "a part" mean "mass %" and "a part by mass", respectively.

Synthesis Example 1

Synthesis of Intermediate 1-1

Intermediate 1-1 is synthesized according to Reaction Scheme 1-1.

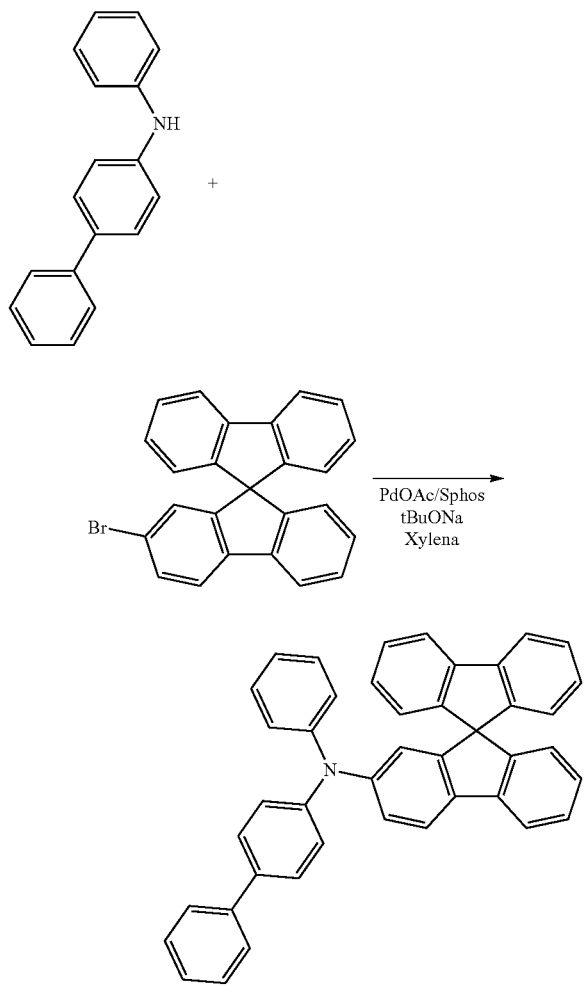

Reaction Scheme 1-1

Intermediate 1-1

Under an argon atmosphere, 2-bromo-9,9'-spirobi[9H-fluorene] (5.0 g, 12.6 mmol) (Tokyo Chemical Industry Co., Ltd.), N-phenyl-4-biphenyl amine (3.1 g, 12.6 mmol), sodium tert-butoxide (tBuONa) (2.42 g, 25.2 mmol), and 100 mL of dehydrated xylene are added to a reactor and stirred for 30 minutes.

Subsequently, tris(dibenzylideneacetone)dipalladium ($Pd_2(dba)_3$) (0.173 g, 0.189 mmol) and 2-dicyclohexylphosphino-2',6'-dimethoxy biphenyl (SPhos) (0.155 g, 0.378 mmol) are added to the reactor and stirred under reflux for 4 hours.

After completing the reaction, the mixture is cooled to room temperature, filtered through Celite® and the filtrate is concentrated. 2-Propanol is added to the concentrated residue and washed (twice) to obtain 7.1 g of a solid (Intermediate 1-1) (Yield: 99%).

Synthesis of Intermediate 1-2

Intermediate 1-2 is synthesized according to Reaction Scheme 1-2.

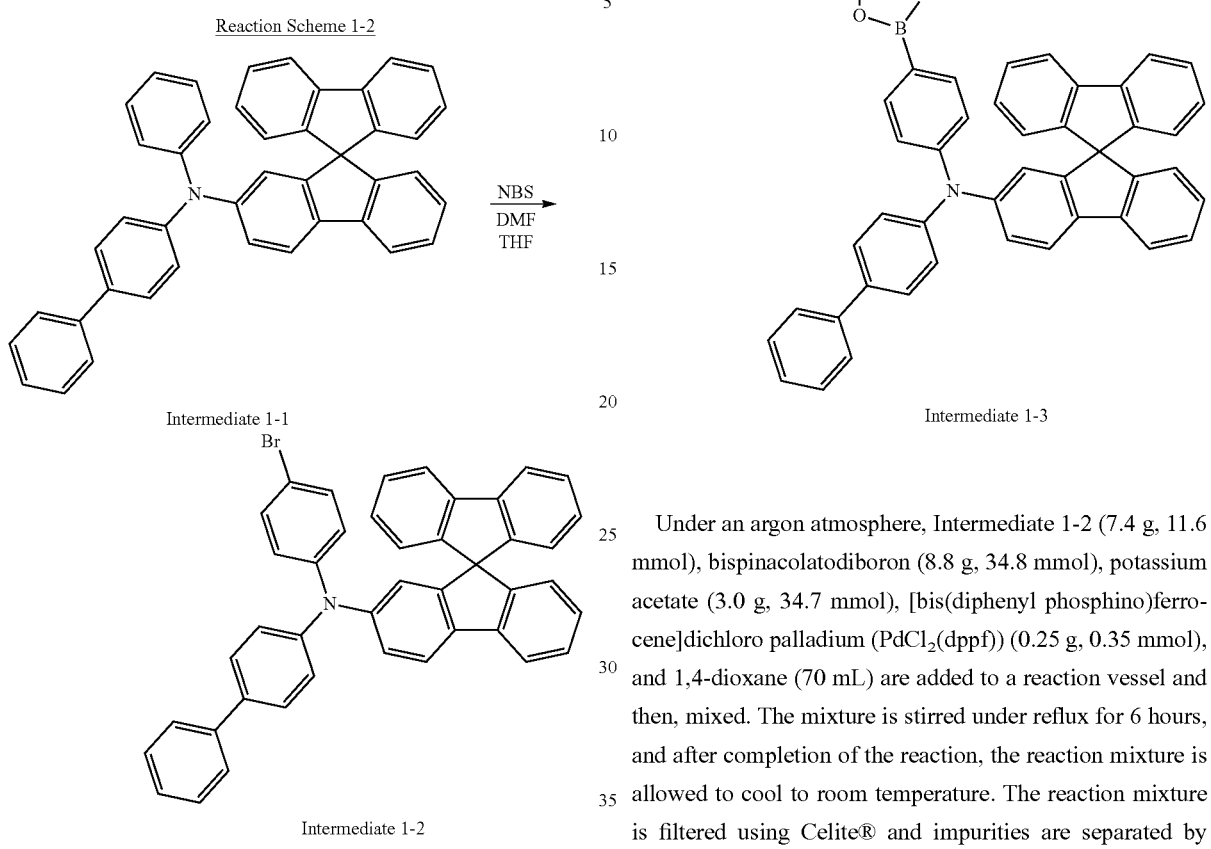

Under an argon atmosphere, Intermediate 1-1 (11.0 g, 20.5 mmol), N,N-dimethyl formamide (DMF) (200 mL), and tetrahydrofuran (THF) (200 mL) are added to a reactor and stirred at room temperature. N-Bromo succinimide (NBS) (3.7 g, 20.5 mmol) dissolved in DMF (200 mL) is added dropwise, followed by stirring for 14 minutes. Toluene (100 mL) is added and the mixture is washed with water (200 mL), and the organic layer is separated and dried with magnesium sulfate. The solvent is removed under reduced pressure, and the resulting product purified by column chromatography to obtain 10.6 g of a solid (Intermediate 1-2) (Yield: 80%).

Synthesis of Intermediate 1-3

Intermediate 1-3 is synthesized according to Reaction Scheme 1-3.

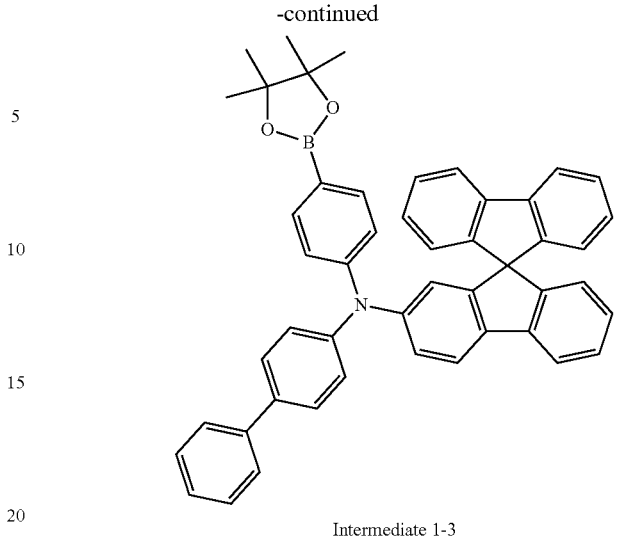

Under an argon atmosphere, Intermediate 1-2 (7.4 g, 11.6 mmol), bispinacolatodiboron (8.8 g, 34.8 mmol), potassium acetate (3.0 g, 34.7 mmol), [bis(diphenyl phosphino)ferrocene]dichloro palladium ($PdCl_2$(dppf)) (0.25 g, 0.35 mmol), and 1,4-dioxane (70 mL) are added to a reaction vessel and then, mixed. The mixture is stirred under reflux for 6 hours, and after completion of the reaction, the reaction mixture is allowed to cool to room temperature. The reaction mixture is filtered using Celite® and impurities are separated by filtration. Then, the solvent is removed under reduced pressure from the filtrate, and the concentrate purified by column chromatography to obtain Intermediate 1-3 (7.8 g) (Yield: 98%).

Synthesis of Compound 1

Compound 1 is synthesized according to Reaction Scheme 1.

[Reaction Scheme 1]

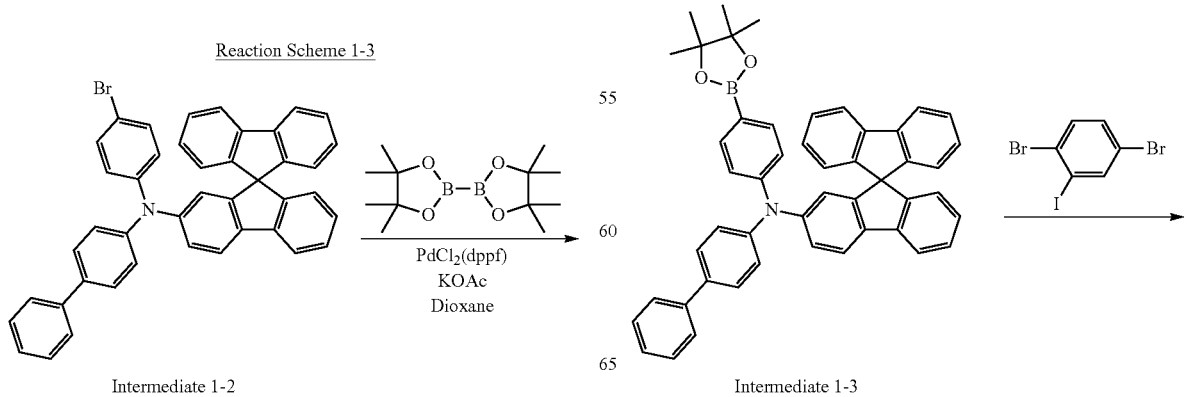

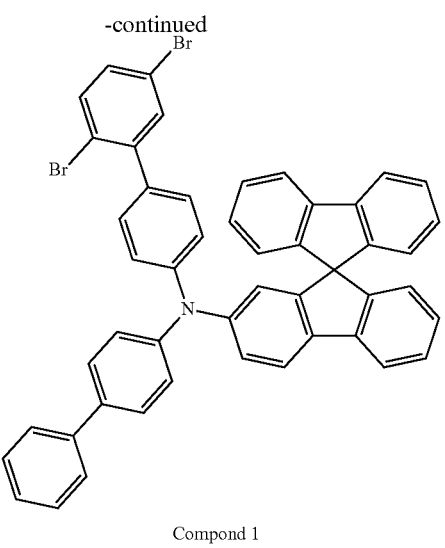

Compound 1

Under an argon atmosphere, Intermediate 1-3 (7.8 g, 11.4 mmol), 1,4-dibromo-2-iodobenzene (7.0 g, 19.3 mmol), carbonate sodium (2.0 g, 19.3 mmol), 160 mL of 1,4-dioxane, and 80 mL of water are added to a reaction vessel and then, stirred for 30 minutes. Subsequently, tetrakis(triphenylphosphine)palladium (0) (Pd[PPh$_3$]4) (0.65 g, 0.57 mmol) is added and the reaction mixture stirred under reflux for 7 hours. After the reaction is completed, the sample (reactants) is transferred to a separatory funnel, and extracted with toluene. An organic layer obtained therefrom is dried with MgSO$_4$, filtered, and concentrated. The concentrated residue is purified by silica gel column chromatography to obtain 3.1 g of a white solid (Compound 1) (Yield: 34%).

Synthesis Example 2

Synthesis of Intermediate 2-1
Intermediate 2-1 is synthesized according to Reaction Scheme 2-1.

Reaction Scheme 2-1

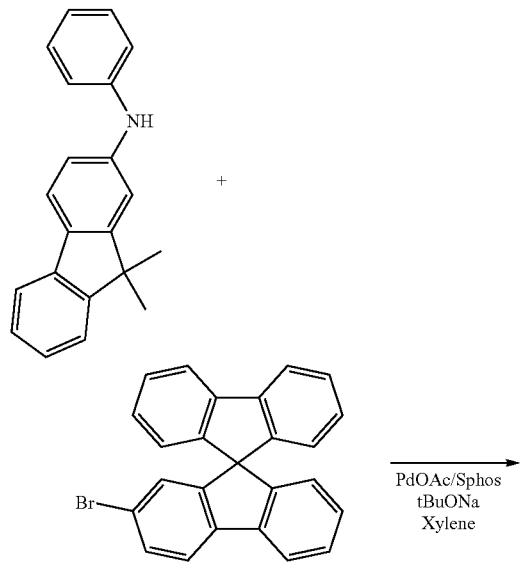

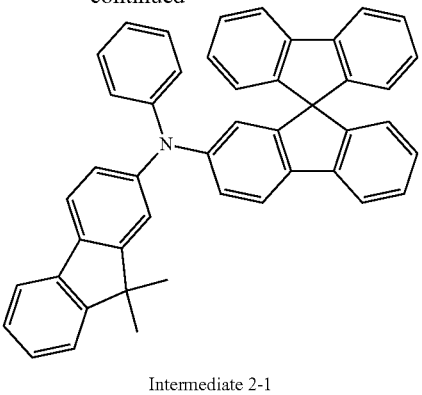

Intermediate 2-1

Under an argon atmosphere, 2-bromo-9,9'-spirobi[9H-fluorene] (10.0 g, 25.3 mmol) (Tokyo Chemical Industry Co., Ltd.), N-phenyl-4-dimethylfluoreneamine (8.7 g, 30.4 mmol), sodium tert-butoxide (tBuONa) (2.42 g, 25.2 mmol), and 150 mL of dehydrated xylene are added to a reactor and stirred for 30 minutes. Subsequently, palladium acetate (PdOAc) (0.085 g, 0.38 mmol) and 2-dicyclohexylphosphino-2,6-dimethoxy biphenyl (SPhos) (0.155 g, 0.76 mmol) are added and stirred under reflux for 5 hours.

After completing the reaction, the mixture is cooled to room temperature, filtered through Celite® and the filtrate is concentrated. The concentrated residue is purified by silica gel column chromatography to obtain Intermediate 2-1 (13.5 g) (Yield: 89%).

Synthesis of Intermediate 2-2
Intermediate 2-2 is synthesized according to Scheme 2-2.

Reaction Scheme 2-2

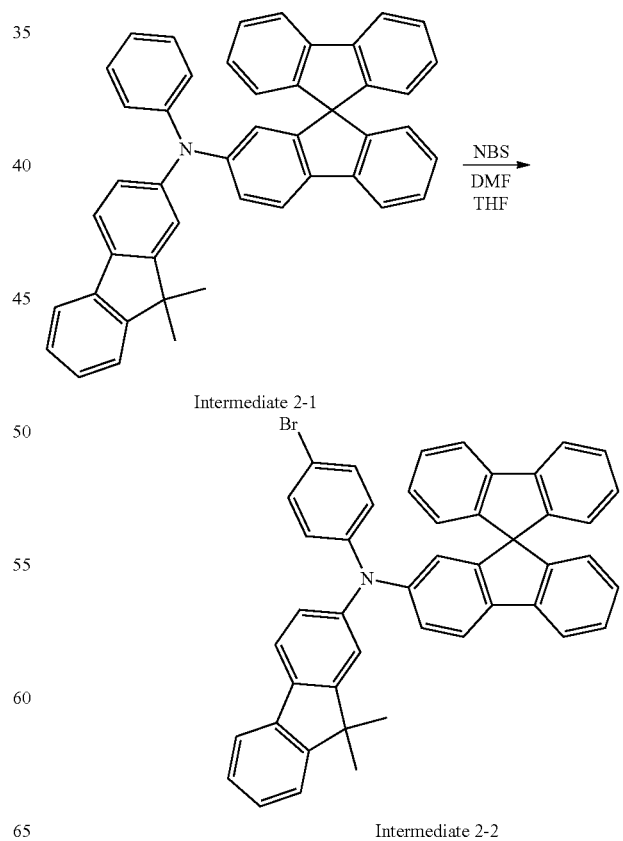

Intermediate 2-2

Under an argon atmosphere, Intermediate 2-1 (12.0 g, 20.0 mmol), N,N-dimethyl formamide (DMF) (200 mL), and tetrahydrofuran (THF) (100 mL) are added to a reactor and stirred at room temperature. N-Bromo succinimide (NBS) (3.6 g, 20.0 mmol) dissolved in DMF (200 mL) is added dropwise, followed by stirring for 14 minutes. Toluene (200 mL) is added, the mixture is washed with water (100 mL), and the separated organic layer is dried with magnesium sulfate. The solvent is removed under reduced pressure, and the resulting product is purified by column chromatography to obtain 8.9 g of a solid (Intermediate 2-2) (Yield: 66%).

Synthesis of Intermediate 2-3

Intermediate 2-3 is synthesized according to Reaction Scheme 2-3.

Synthesis of Compound 2

Compound 2 is synthesized according to Reaction Scheme 2.

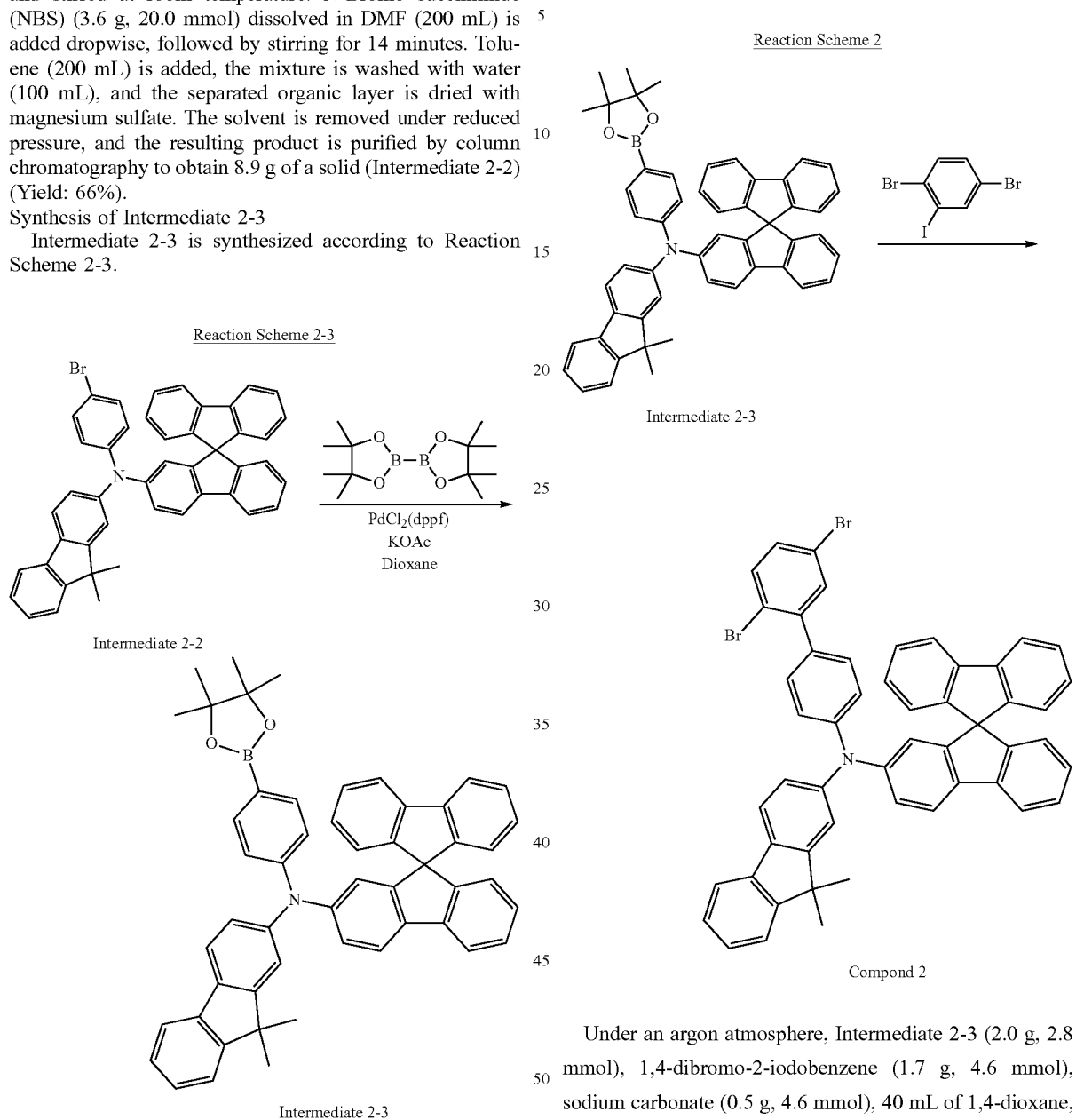

Under an argon atmosphere, Intermediate 2-2 (8.9 g, 13.1 mmol), bispinacolatodiboron (10.0 g, 39.3 mmol), potassium acetate (3.8 g, 39.3 mmol), [bis(diphenyl phosphino)ferrocene]dichloro palladium (PdCl$_2$(dppf)) (0.28 g, 0.39 mmol), and 1,4-dioxane (80 mL) are added to a reaction vessel and mixed. Subsequently, the mixture is stirred under reflux for 5 hours, and after the reaction is completed, the reaction mixture is allowed to cool to room temperature. The reaction mixture is filtered using Celite® and impurities are separated by filtration.

The solvent is removed from the filtrate under reduced pressure, and the resulting product is purified by column chromatography to obtain Intermediate 2-3 (8.0 g) (Yield: 84%).

Under an argon atmosphere, Intermediate 2-3 (2.0 g, 2.8 mmol), 1,4-dibromo-2-iodobenzene (1.7 g, 4.6 mmol), sodium carbonate (0.5 g, 4.6 mmol), 40 mL of 1,4-dioxane, and 20 mL of water are added to a reaction vessel and stirred for 30 minutes. Subsequently, tetrakis(triphenylphosphine)palladium (0) (Pd[PPh$_3$]4) (0.16 g, 0.14 mmol) is added and the reaction mixture is heated and stirred under reflux for 10 hours. After the reaction is completed, the resultant is cooled to room temperature, and the sample is transferred to a separatory funnel and extracted with toluene. The organic layer is dried with MgSO$_4$, filtered, and concentrated. The concentrated residue is purified by silica gel column chromatography to obtain a solid (Compound 2) (1.3 g) (Yield: 63%).

Synthesis Example 3 Synthesis of Intermediate 3-1

Intermediate 3-1 is synthesized according to Reaction Scheme 3-1.

Reaction Scheme 3-1

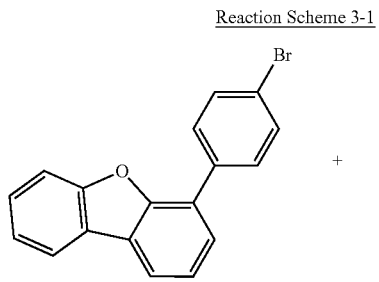

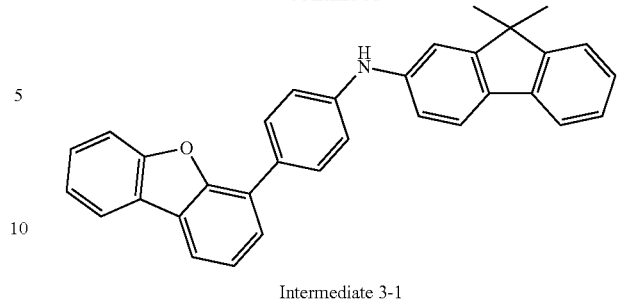

Intermediate 3-1

Under an argon atmosphere, 2-amino-9,9-dimethyl fluorene (3.9 g, 18.6 mmol), 4-(4-bromophenyl)dibenzofuran (Tokyo Chemical Industry Co., Ltd.) (5.0 g, 15.5 mmol), sodium tert-butoxide (tBuONa) (1.49 g, 15.5 mmol), 150 mL of dehydration toluene are added to a reactor and stirred for 30 minutes. Subsequently, tris(dibenzylideneacetone)dipalladium ($Pd_2(dba)_3$) (0.142 g, 0.155 mmol) and 1,1'-bis(diphenyl phosphino)ferrocene (dppf) (0.171 g, 0.309 mmol) are added and the reaction mixture is heated and stirred under reflux for 5 hours.

After completing the reaction, the mixture is cooled to room temperature, filtered through Celite® and the filtrate is concentrated. The concentrated residue is purified by silica gel column chromatography to obtain 6.7 g of a solid (Intermediate 3-1) (Yield: 95%).

Synthesis of Intermediate 3-2

Intermediate 3-2 is synthesized according to Reaction Scheme 3-2.

Reaction Scheme 3-2

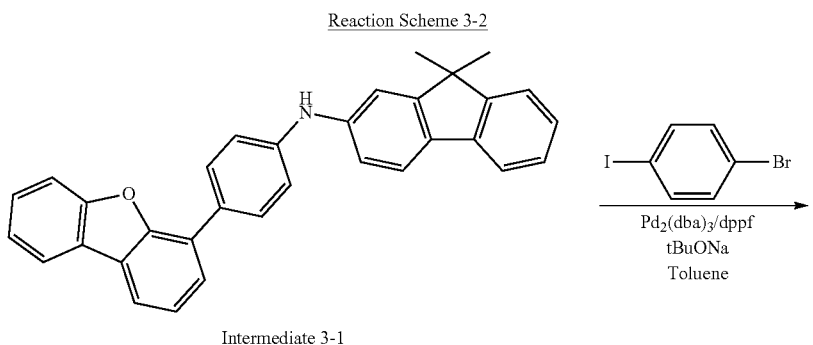

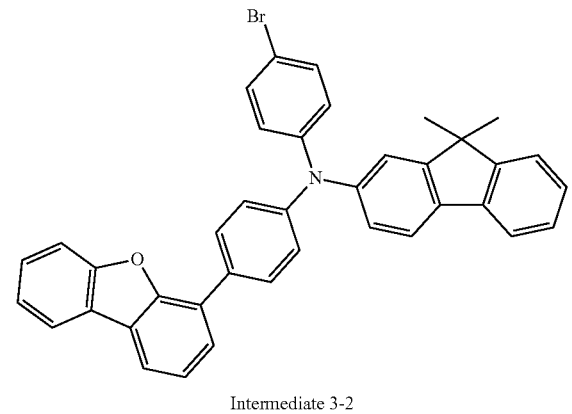

Intermediate 3-2

Under an argon atmosphere, Intermediate 3-1 (5.5 g, 9.73 mmol), bromoiodobenzene (3.0 g, 10.7 mmol), sodium tert-butoxide (tBuONa) (1.03 g, 10.7 mmol), and 100 mL of dehydration toluene are added to a reactor and stirred for 30 minutes. Subsequently, tris(dibenzylideneacetone)dipalladium ($Pd_2(dba)_3$) (0.445 g, 0.486 mmol) and 1,1'-bis(diphenyl phosphino)ferrocene (dppf) (1.08 g, 1.95 mmol) are added, and the reaction mixture is heated and stirred under reflux for 7 hours.

After completing the reaction, the mixture is cooled to room temperature, filtered through Celite® and the filtrate is concentrated. The concentrated residue is purified by silica gel column chromatography to obtain 6.11 g of a solid (Intermediate 3-2) (Yield: 82%).

Synthesis of Intermediate 3-3

Intermediate 3-3 is synthesized according to Reaction Scheme 3-3.

Under an argon atmosphere, Intermediate 3-2 (5.5 g, 9.1 mmol), bispinacolatodiboron (5.8 g, 22.7 mmol), potassium acetate (2.7 g, 27.2 mmol), [bis(diphenyl phosphino)ferrocene]dichloro palladium ($PdCl_2(dppf)$) (0.20 g, 0.27 mmol), and dioxane (70 mL) are added to a reactor and stirred. Subsequently, the mixture is stirred under reflux for 5 hours, and after the reaction is completed, the reaction mixture is allowed to cool to room temperature. The reaction mixture is filtered using Celite® and impurities are separated by filtration. Then, the solvent is removed from the filtrate under reduced pressure, and the resulting product purified by column chromatography to obtain Intermediate 3-3 (5.8 g) (Yield: 99%).

Reaction Scheme 3-3

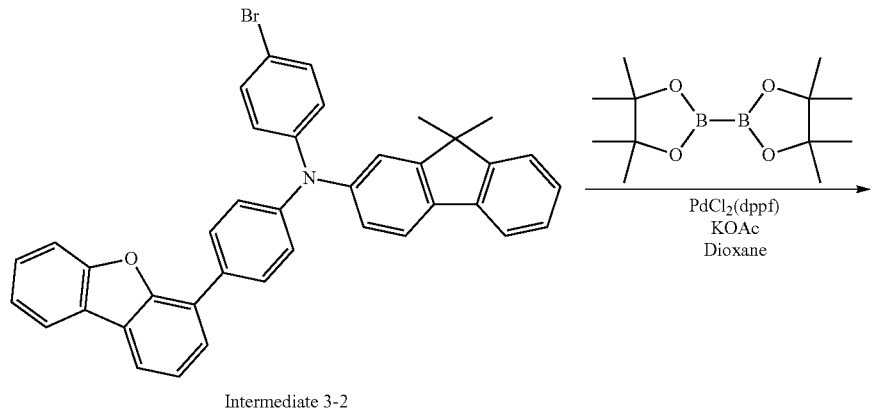

Intermediate 3-2

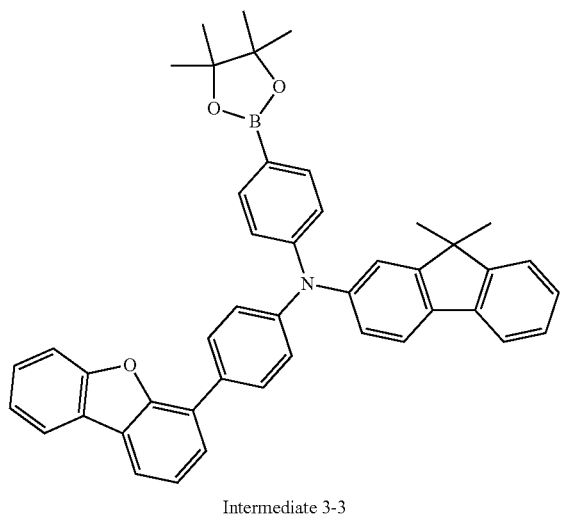

Intermediate 3-3

Synthesis of Compound 3
Compound 3 is synthesized according to Reaction Scheme 3.

Reaction Scheme 3

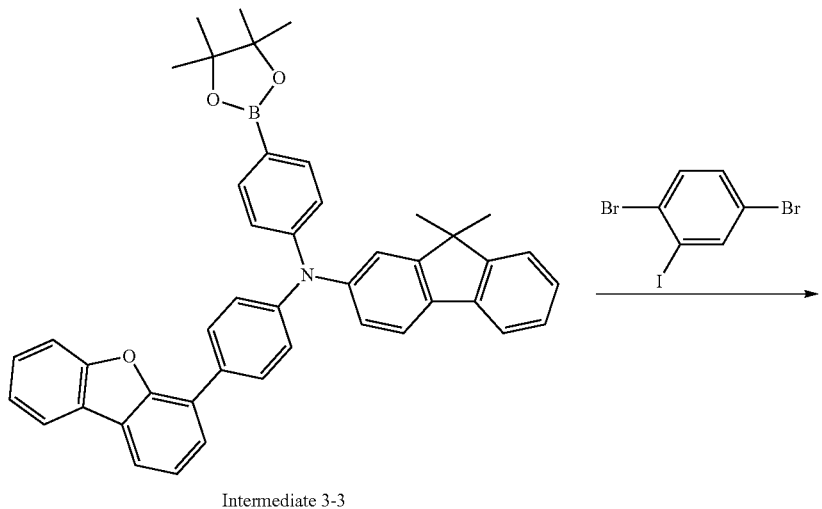

Intermediate 3-3

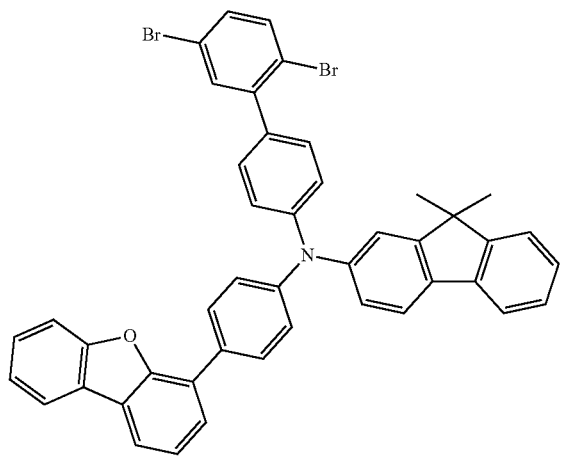

Compond 3

Under an argon atmosphere, Intermediate 3-3 (6.1 g, 9.4 mmol), 1,4-dibromo-2-iodobenzene (5.7 g, 15.9 mmol), sodium carbonate (1.7 g, 15.9 mmol), 80 mL of dioxane, and 40 mL of water are added to a reaction vessel and stirred for 30 minutes. Subsequently tetrakis(triphenylphosphine)palladium (0) (Pd[PPh$_3$]4) (0.54 g, 0.47 mmol) is added and the reaction mixture is heated and stirred under reflux for 8 hours. After the reaction is completed, the resultant is cooled to room temperature, and the sample is transferred to a separatory funnel and extracted with toluene. The organic layer is dried with MgSO$_4$, filtered, and concentrated. The concentrated residue is purified by silica gel column chromatography to obtain 2.1 g of a white solid (Compound 3) (Yield: 30%).

Synthesis Example 4

Synthesis of Intermediate 4-1
Intermediate 4-1 is synthesized according to Reaction Scheme 4-1.

Reaction Scheme 4-1

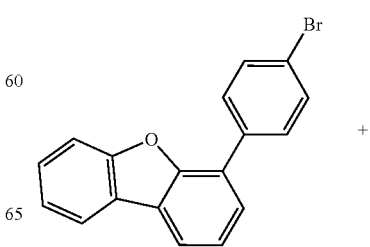

+

-continued

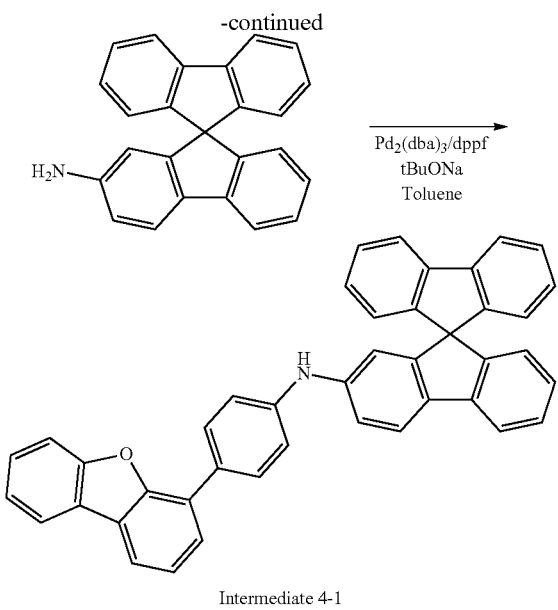

Intermediate 4-1

Under an argon atmosphere, 9,9'-spirobi[9H-fluorene]-2-amine (24.6 g, 74.2 mmol), 4-(4-bromophenyl)dibenzofuran (Tokyo Chemical Industry Co., Ltd.) (20.0 g, 61.9 mmol), sodium tert-butoxide (tBuONa) (5.9 g, 61.9 mmol), and 400 mL of dehydrated toluene are added to a reactor and stirred for 30 minutes. Subsequently, tris(dibenzylideneacetone) dipalladium ($Pd_2(dba)_3$) (0.566 g, 0.619 mmol) and 1,1'-bis (diphenyl phosphino)ferrocene (dppf) (0.69 g, 1.24 mmol) are added and the reaction mixture is heated and stirred under reflux for 4 hours.

After completing the reaction, filtration is performed at 80° C. through Celite® and the filtrate is concentrated. 100 mL of methanol is charged into the concentrated residue for dispersion washing, and 100 mL of 2-propanol was charged for dispersion washing to obtain 33.9 g of a solid (Intermediate 4-1) (Yield: 99%).

Synthesis of Intermediate 4-2

Intermediate 4-2 is synthesized according to Reaction Scheme 4-2.

Reaction Scheme 4-2

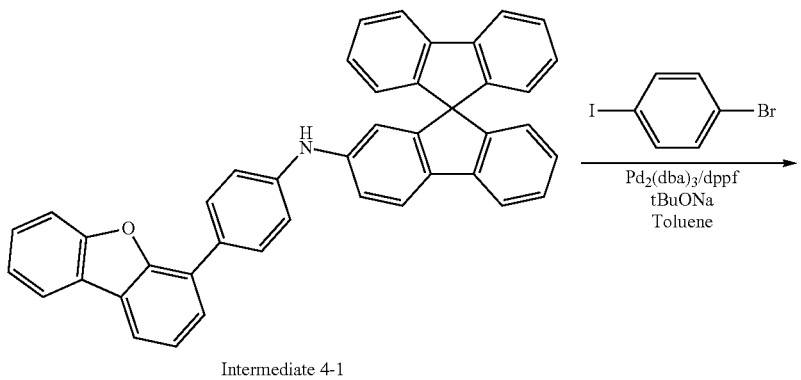

Intermediate 4-1

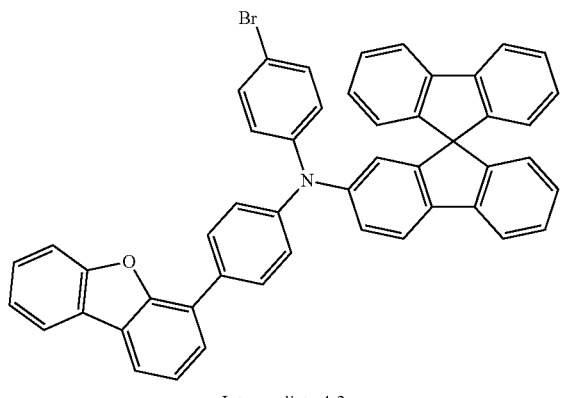

Intermediate 4-2

Under an argon atmosphere, Intermediate 4-1 (10.0 g, 17.4 mmol), bromoiodobenzene (5.4 g, 19.2 mmol), sodium tert-butoxide (tBuONa) (1.8 g, 19.2 mmol), and 200 mL of dehydration toluene are assed to a reactor and stirred for 30 minutes. Subsequently, tris(dibenzylideneacetone)dipalladium (Pd$_2$(dba)$_3$) (0.798 g, 0.872 mmol), 1,1'-bis(diphenyl phosphino)ferrocene (dppf) (1.93 g, 3.48 mmol) are added and the reaction mixture is heated and stirred under reflux for 7 hours.

After completing the reaction, the mixture is cooled to room temperature, filtered through Celite® and the filtrate is concentrated. The concentrated residue is purified by silica gel column chromatography to obtain 6.8 g of a solid (Intermediate 4-2) (Yield: 54%).

Synthesis of Intermediate 4-3

Intermediate 4-3 is synthesized according to Reaction Scheme 4-3.

Under an argon atmosphere, Intermediate 4-2 (10.3 g, 14.1 mmol), bispinacolatodiboron (8.9 g, 35.3 mmol), potassium acetate (4.1 g, 42.3 mmol), [bis(diphenyl phosphino)ferrocene]dichloro palladium (PdCl$_2$(dppf)) (0.31 g, 0.42 mmol), and 120 ml of dioxane are added to a reaction vessel and stirred for 30 minutes. Subsequently, the mixture is stirred under reflux for 5 hours, and after the reaction is completed, the reaction mixture is allowed to cool to room temperature. The reaction mixture is filtered using Celite® and impurities are separated by filtration. Then, the solvent is removed from the filtrate under reduced pressure, and the resulting product is purified by column chromatography to obtain Intermediate 4-3 (7.2 g) (Yield: 66%).

Reaction Scheme 4-3

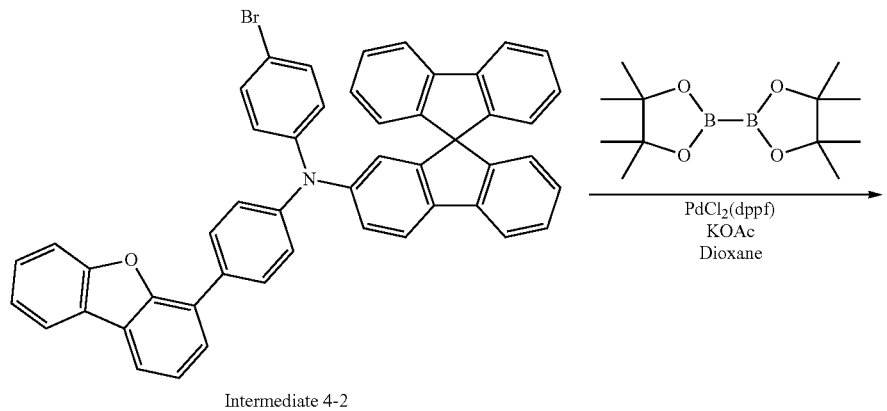

Intermediate 4-2

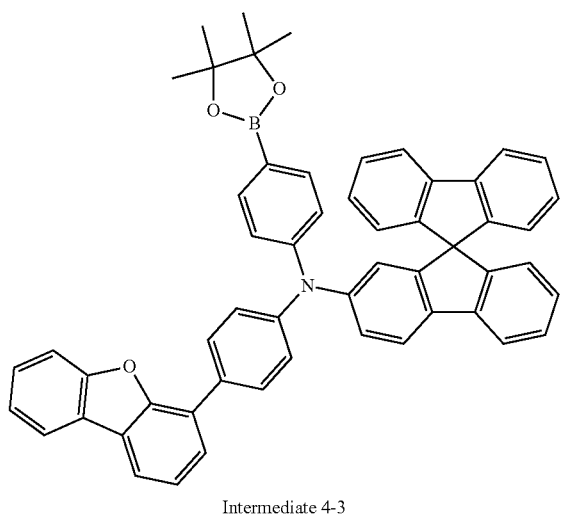

Intermediate 4-3

Synthesis of Compound 4

Compound 4 is synthesized according to Reaction Scheme 4.

Reaction Scheme 4

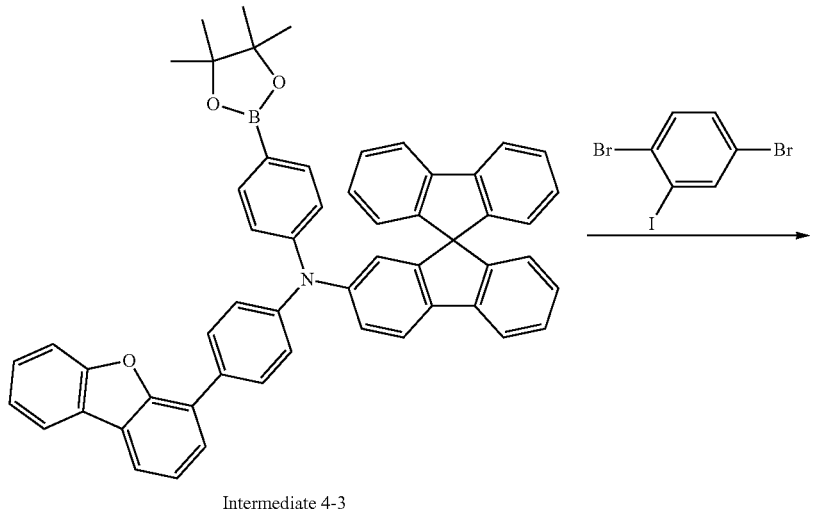

Intermediate 4-3

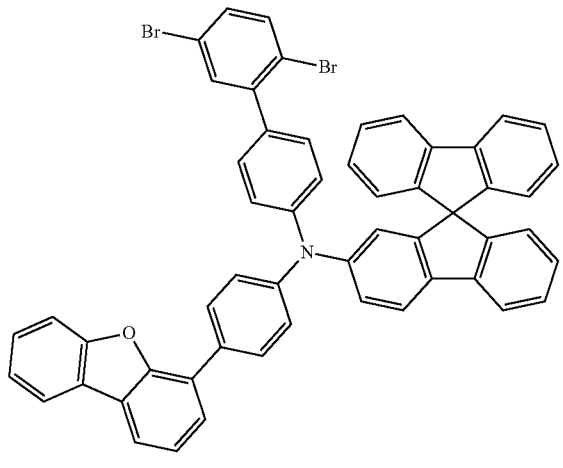

Compound 4

Under an argon atmosphere, Intermediate 4-3 (5.0 g, 6.4 mmol), 1,4-dibromo-2-iodobenzene (3.5 g, 9.7 mmol), sodium carbonate (1.0 g, 9.7 mmol), 60 mL of dioxane, and 30 mL of water are added to a reaction vessel and stirred for 30 minutes. Subsequently tetrakis(triphenylphosphine)palladium (0) (Pd[PPh$_3$]4) (0.37 g, 0.32 mmol) is added and the reaction mixture is heated and stirred under reflux for 10 hours. After the reaction is completed, the resultant is cooled to room temperature, and the sample is transferred to a separatory funnel and extracted with toluene. The organic layer is dried with MgSO$_4$, filtered, and concentrated. The concentrated residue is purified by silica gel column chromatography to obtain 3.9 g of a white solid (Compound 4) (Yield: 68%).

Synthesis Example 5

Synthesis of Intermediate 5-1

Intermediate 5-1 is synthesized according to Reaction Scheme 5-1.

Reaction Scheme 5-1

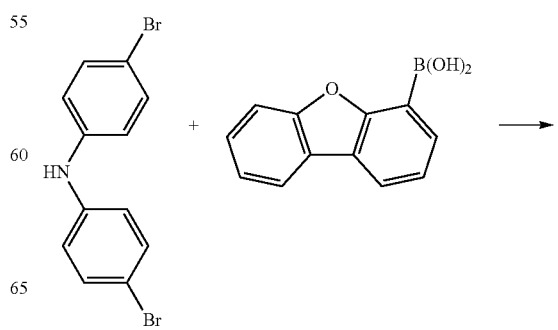

-continued

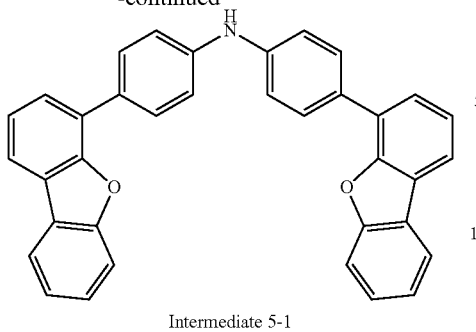

Intermediate 5-1

Under an argon atmosphere, 4-bromodiphenylamine (10.0 g, 30.6 mmol), dibenzofuran-4-boronic acid (14.2 g, 67.2 mmol), sodium carbonate (6.5 g, 61.1 mmol), 100 mL of toluene, and 50 mL of water are assed to a reaction vessel and stirred for 30 minutes Subsequently tetrakis(triphenylphosphine)palladium (0) (Pd[PPh₃]4) (0.70 g, 0.61 mmol) is added and the reaction mixture is heated and stirred under reflux for 3 hours. When a reaction is completed, the reaction mixture is cooled down to room temperature, and a precipitate is filtered off. The filtrate is dispersed and washed with 100 mL of MeOH, obtaining 12.8 g of a solid (Intermediate 5-1) (Yield: 83%).

Synthesis of Intermediate 5-2

Intermediate 5-2 is synthesized according to Reaction Scheme 5-2.

Reaction Scheme 5-2

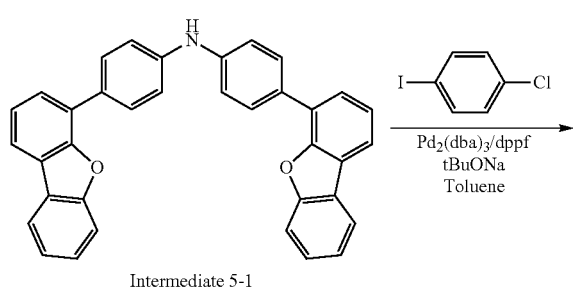

-continued

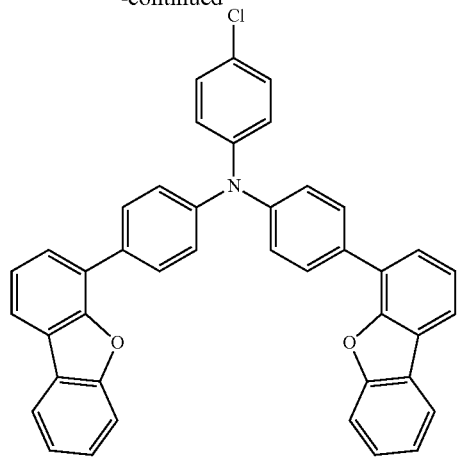

Intermediate 5-2

Under an argon atmosphere, Intermediate 5-1 (16.0 g, 31.9 mmol), iodine chlorobenzene (11.4 g, 47.8 mmol), sodium tert-butoxide (tBuONa) (3.4 g, 35.1 mmol), and 250 mL of dehydration toluene are added to a reactor and stirred for 30 minutes. Subsequently tris(dibenzylideneacetone)dipalladium (Pd₂(dba)₃) (1.46 g, 1.59 mmol) and 1,1'-bis (diphenyl phosphino)ferrocene (dppf) (1.77 g, 3.19 mmol) are added and the reaction mixture is heated and stirred under reflux for 9 hours.

After completing the reaction, the mixture is cooled to room temperature, filtered through Celite® and the filtrate is concentrated. The concentrated residue is purified by silica gel column chromatography to obtain 13.1 g of a solid (Intermediate 5-2) (Yield: 67%).

Synthesis of Intermediate 5-3

Intermediate 5-3 is synthesized according to Reaction Scheme 5-3.

Reaction Scheme 5-3

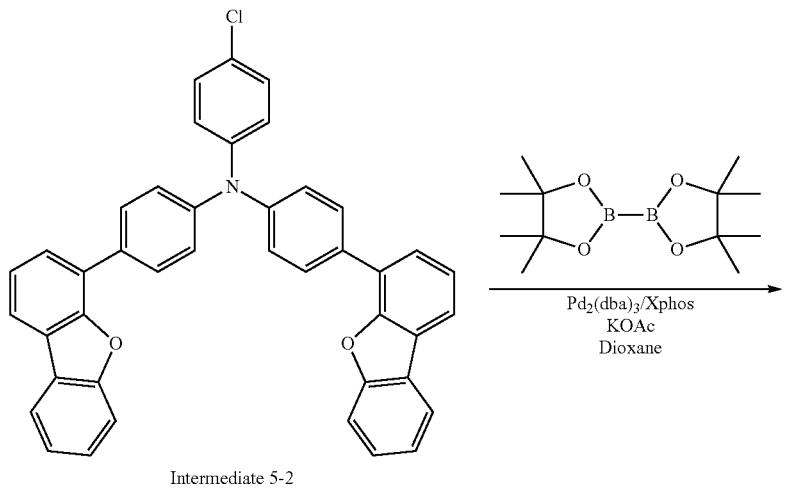

Intermediate 5-2

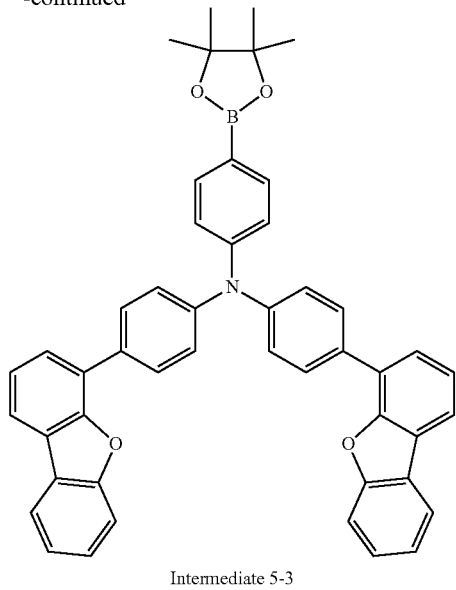

Intermediate 5-3

Under an argon atmosphere, Intermediate 5-2 (10.0 g, 16.3 mmol), bispinacolatodiboron (8.3 g, 32.6 mmol), potassium acetate (4.8 g, 49.0 mmol), and dioxane (100 mL) are added to a reaction vessel and stirred for 30 minutes. Subsequently, tris(dibenzylideneacetone)dipalladium ($Pd_2(dba)_3$) (0.45 g, 0.49 mmol), 2-dicyclohexylphosphino-2',4',6'-triisopropylbiphenyl (Xphos) (0.93 g, 1.96 mmol) are added and the reaction mixture is heated and stirred under reflux for 4 hours.

After the reaction is completed, the reaction mixture is allowed to cool to room temperature. The reaction mixture is filtered using Celite® and impurities are separated by the filtration. After removing the solvent under reduced pressure, the resulting product is purified through column chromatography, obtaining Intermediate 5-3 (10.3 g, Yield: 89%).

Synthesis of Compound 5

Compound 5 is synthesized according to Reaction Scheme 5.

Reaction Scheme 5

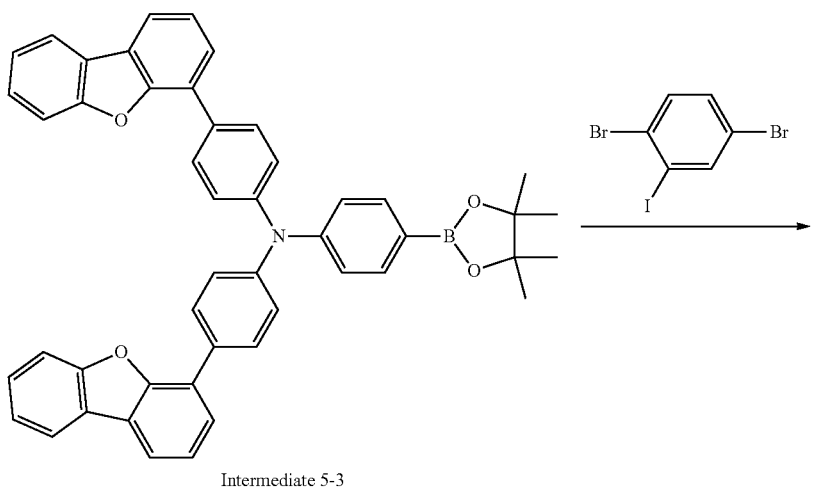

Intermediate 5-3

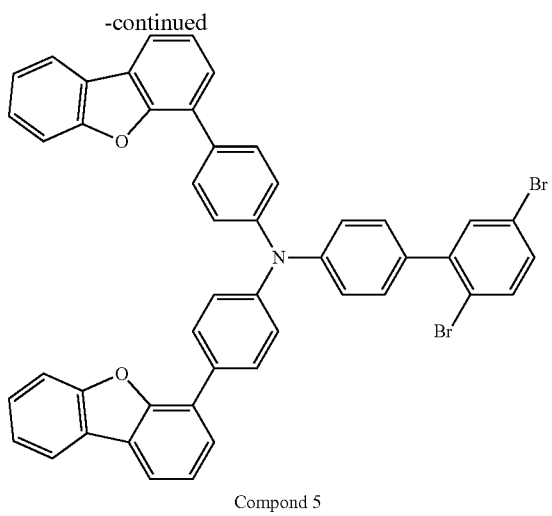

Compound 5

Under an argon atmosphere, Intermediate 5-3 (6.0 g, 8.5 mmol), 1,4-dibromo-2-iodobenzene (4.6 g, 12.8 mmol), sodium carbonate (1.3 g, 12.8 mmol), 60 mL of dioxane, and 30 mL of water are added to a reaction vessel and stirred for 30 minutes. Subsequently tetrakis(triphenylphosphine)palladium (0) (Pd[PPh$_3$]4) (0.49 g, 0.43 mmol) is added and the reaction mixture is heated and stirred under reflux for 11 hours.

After the reaction is completed, the resultant is cooled to room temperature, and the sample is transferred to a separatory funnel and extracted with toluene. The organic layer is dried with MgSO$_4$, filtered, and concentrated. The concentrated residue is purified by silica gel column chromatography to obtain 2.1 g of a white solid (Compound 5) (Yield: 30%).

Synthesis Example 6

Synthesis of Intermediate 6-1

Intermediate 6-1 is synthesized according to Reaction Scheme 6-1.

Reaction Scheme 6-1

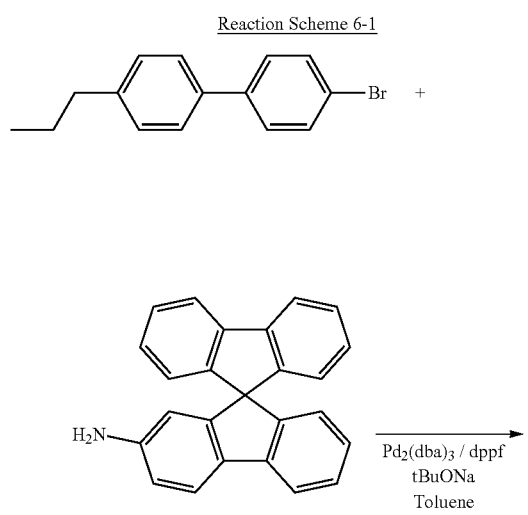

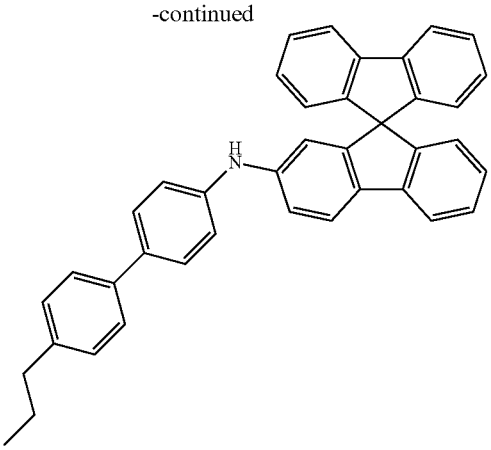

Intermediate 6-1

Under an argon atmosphere, 9,9'-spirobi[9H-fluorene]-2-amine (14.4 g, 43.6 mmol), 4-bromo-4'-propyl biphenyl (10.0 g, 36.3 mmol), sodium tert-butoxide (tBuONa) (3.5 g, 36.3 mmol), and 200 mL of dehydration toluene are added to a reactor and stirred for 30 minutes. Subsequently tris (dibenzylideneacetone)dipalladium (Pd$_2$(dba)$_3$) (0.332 g, 0.363 mmol) and 1,1'-bis(diphenyl phosphino)ferrocene (dppf) (0.40 g, 0.727 mmol) are added and the reaction mixture is heated and stirred under reflux for 5 hours.

After the reaction is completed, the reaction mixture is allowed to cool to room temperature. The reaction mixture is filtered using Celite® and impurities are separated by filtration. The solvent is removed from the filtrate under reduced pressure, and the resulting product is purified by column chromatography to obtain Intermediate 6-1 (16.5 g) (Yield: 86%).

Synthesis of Intermediate 6-2

Intermediate 6-2 is synthesized according to Reaction Scheme 6-2.

Reaction Scheme 6-2

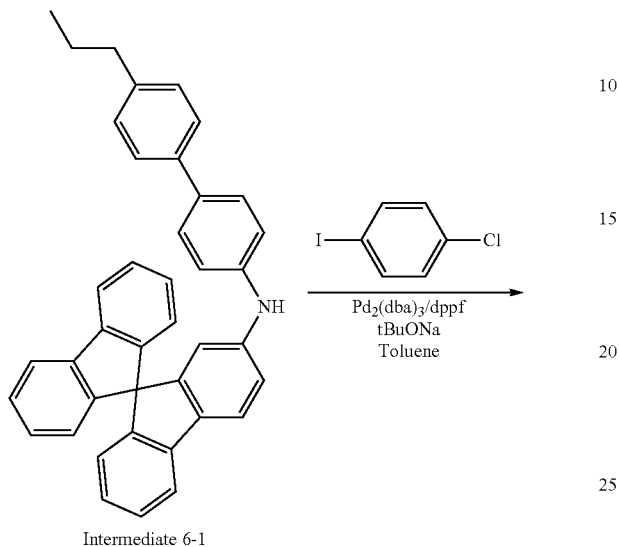

Intermediate 6-1

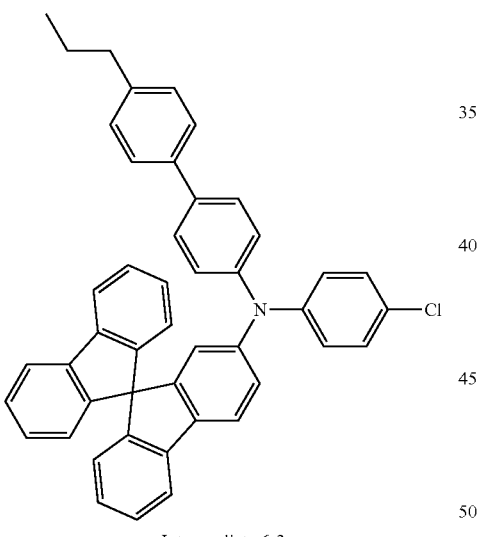

Intermediate 6-2

Under an argon atmosphere, Intermediate 6-1 (12.0 g, 22.8 mmol), iodine chlorobenzene (10.9 g, 45.6 mmol), sodium tert-butoxide (tBuONa) (2.4 g, 25.1 mmol), and 200 mL of dehydration toluene are added to a reactor and stirred for 30 minutes. Subsequently, tris(dibenzylideneacetone) dipalladium ($Pd_2(dba)3$) (1.05 g, 1.14 mmol) and 1,1'-bis(diphenyl phosphino)ferrocene (dppf) (1.27 g, 2.28 mmol) are added and the reaction mixture is heated and stirred under reflux for 9 hours.

After completing the reaction, the mixture is cooled to room temperature, filtered through Celite® and the filtrate is concentrated. The concentrated residue is purified by silica gel column chromatography to obtain 11.3 g of a solid (Intermediate 6-2) (Yield: 78%).

Synthesis of Intermediate 6-3

Intermediate 6-3 is synthesized according to Reaction Scheme 6-3.

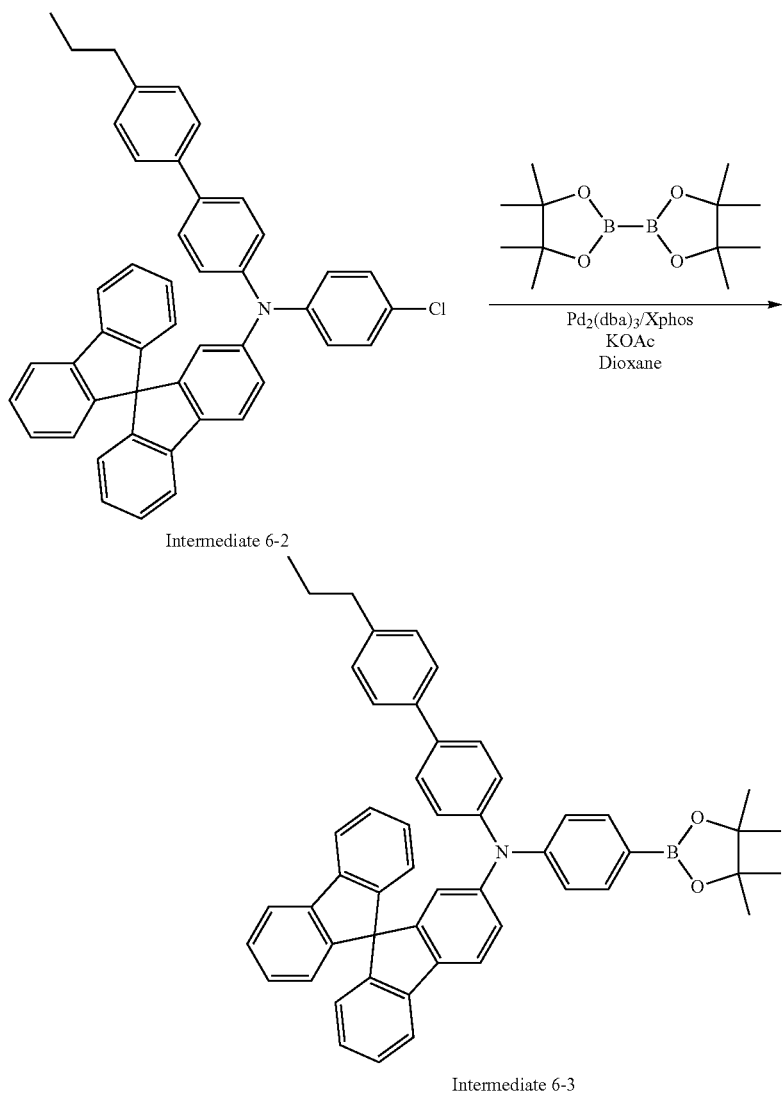

Under an argon atmosphere, Intermediate 6-2 (11.0 g, 17.3 mmol), bispinacolatodiboron (8.8 g, 34.6 mmol), potassium acetate (5.1 g, 51.9 mmol), and dioxane (80 mL) are added to a reaction vessel and stirred for 30 minutes. Subsequently, tris(dibenzylideneacetone)dipalladium (Pd$_2$(dba)$_3$) (0.47 g, 0.52 mmol) and 2-dicyclohexylphosphino-2',4',6'-triisopropylbiphenyl (Xphos) (0.99 g, 2.08 mmol) are added and the reaction mixture is heated and stirred under reflux for 8 hours.

After the reaction is completed, the reaction mixture is allowed to cool to room temperature. The reaction mixture is filtered using Celite® and impurities are separated by filtration. The solvent is removed from the filtrate under reduced pressure, and the resulting product is purified by column chromatography to obtain Intermediate 6-3 (4.6 g) (Yield: 37%).

Synthesis of Compound 6

Compound 6 is synthesized according to Reaction Scheme 6.

Reaction Scheme 6

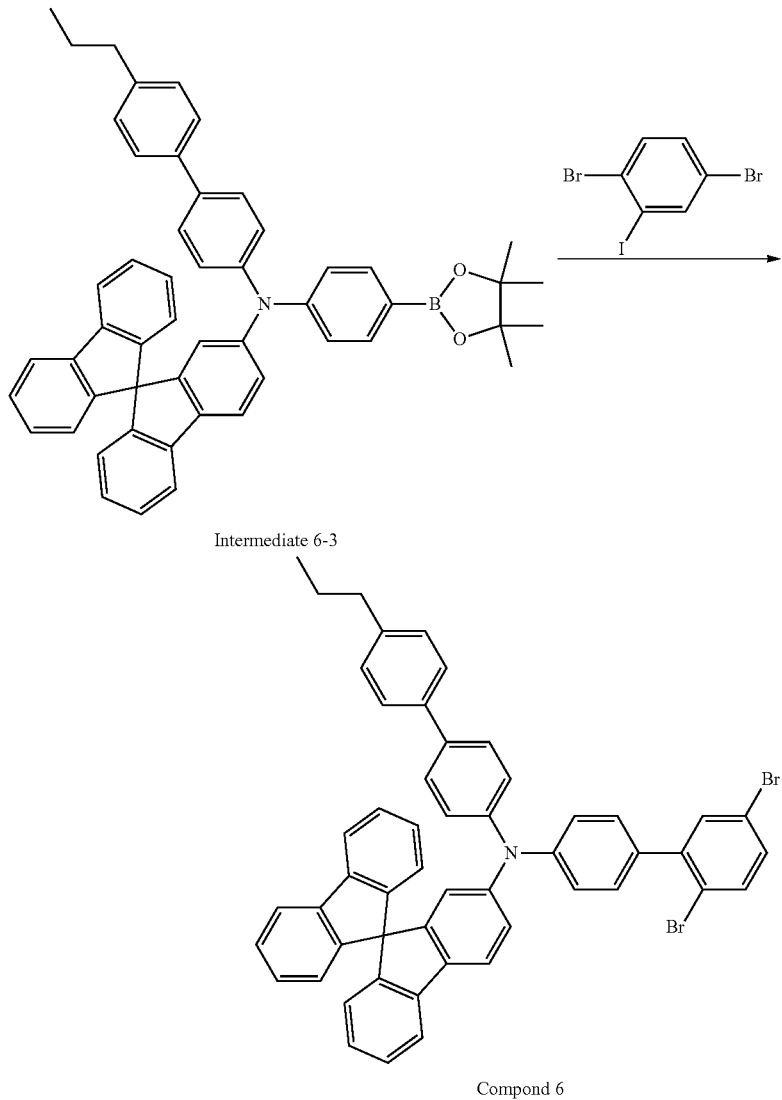

Under an argon atmosphere, Intermediate 6-3 (4.6 g, 6.3 mmol), 1,4-dibromo-2-iodobenzene (3.4 g, 9.5 mmol), sodium carbonate (1.0 g, 9.5 mmol), 60 mL of dioxane, and 30 mL of water are added to a reaction vessel and stirred for 30 minutes. Subsequently, tetrakis(triphenylphosphine)palladium (0) (Pd[PPh$_3$]4) (0.36 g, 0.32 mmol) is added and the reaction mixture is heated and stirred under reflux for 13 hours.

After the reaction is completed, the resultant is cooled to room temperature, and the sample is transferred to a separatory funnel and extracted with toluene. The organic layer is dried with MgSO$_4$, filtered, and concentrated. The concentrated residue is purified by silica gel column chromatography to obtain 4.2 g of a white solid (Compound 6) (Yield: 75%).

Synthesis Example 7

Synthesis of Intermediate 7-1

Intermediate 7-1 is synthesized according to Reaction Scheme 7-1.

Reaction Scheme 7-1

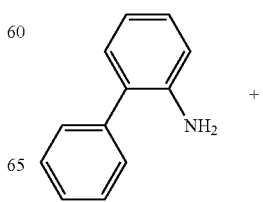

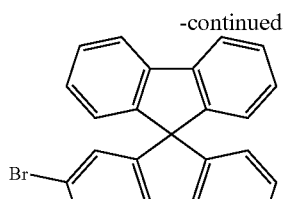

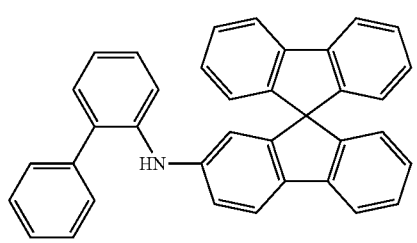

Intermediate 7-1

Under an argon atmosphere, 2-amino biphenyl (7.4 g, 43.6 mmol), 2-bromo-9,9'spirobi[9H-fluorene] (14.3 g, 36.3 mmol), sodium tert-butoxide (tBuONa) (3.5 g, 36.3 mmol), and 150 mL of dehydration toluene are added to a reactor and stirred for 30 minutes. Subsequently, tris(dibenzylideneacetone)dipalladium ($Pd_2(dba)_3$) (0.332 g, 0.363 mmol) and 1,1'-bis(diphenyl phosphino)ferrocene (dppf) (0.40 g, 0.727 mmol) are added and the reaction mixture is heated and stirred under reflux for 5 hours.

After the reaction is completed, the reaction mixture is allowed to cool to room temperature. Then, the reaction mixture is filtered using Celite® and impurities are separated by filtration. The solvent is removed from the filtrate under reduced pressure, and the resulting product is purified by column chromatography to obtain Intermediate 7-1 (15.8 g) (Yield: 90%).

Synthesis of Intermediate 7-2
Intermediate 7-2 is synthesized according to Reaction Scheme 7-2.

Reaction Scheme 7-2

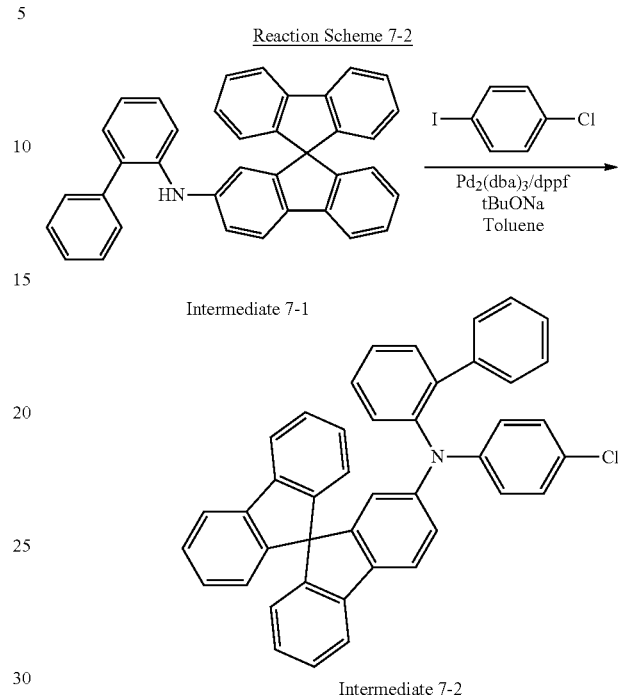

Intermediate 7-2

Under an argon atmosphere, Intermediate 7-1 (11.0 g, 22.8 mmol), iodine chlorobenzene (9.7 g, 40.6 mmol), sodium tert-butoxide (tBuONa) (2.4 g, 25.1 mmol), and 200 mL of dehydration toluene are added to a reactor and stirred for 30 minutes. Subsequently, tris(dibenzylideneacetone) dipalladium ($Pd_2(dba)_3$) (1.05 g, 1.14 mmol) and 1,1'-bis (diphenyl phosphino)ferrocene (dppf) (1.27 g, 2.28 mmol) are added and the reaction mixture is heated and stirred under reflux for 9 hours.

After completing the reaction, the mixture is cooled to room temperature, filtered through Celite® and the filtrate is concentrated. The concentrated residue is purified by silica gel column chromatography to obtain 10.3 g of a solid (Intermediate 7-2) (Yield: 76%).

Synthesis of Intermediate 7-3
Intermediate 7-3 is synthesized according to Reaction Scheme 7-3.

Reaction Scheme 7-3

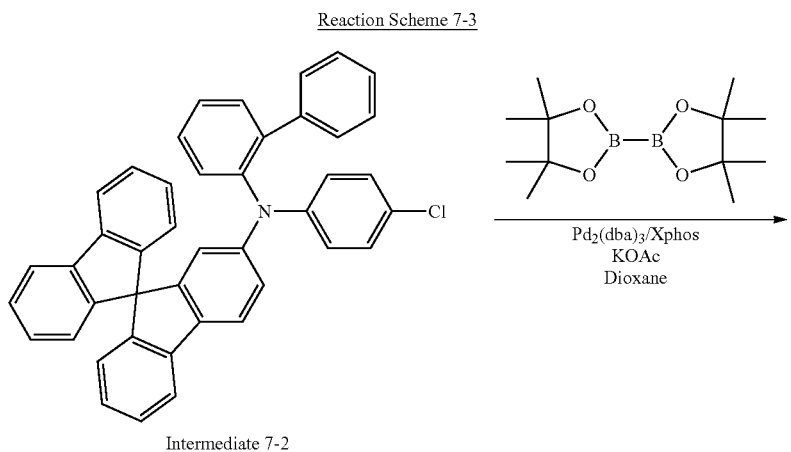

Intermediate 7-2

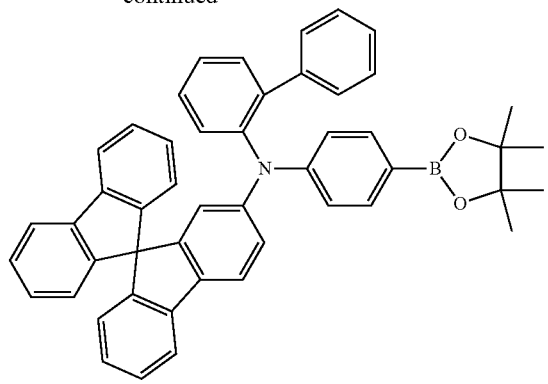

Intermediate 7-3

Under an argon atmosphere, Intermediate 7-2 (10.3 g, 17.3 mmol), bispinacolatodiboron (8.8 g, 34.6 mmol), potassium acetate (5.1 g, 51.9 mmol), and dioxane (80 mL) are added to a reactor and stirred for 30 minutes. Subsequently, tris(dibenzylideneacetone)dipalladium ($Pd_2(dba)_3$) (0.47 g, 0.52 mmol) and 2-dicyclohexylphosphino-2',4',6'-triisopropylbiphenyl (Xphos) (0.99 g, 2.08 mmol) are added and the reaction mixture is heated and stirred under reflux for 8 hours.

After the reaction is completed, the reaction mixture is allowed to cool to room temperature. The reaction mixture is filtered using Celite® and impurities are separated by filtration. The solvent is removed from the filtrate under reduced pressure, and the resulting product is purified by column chromatography to obtain Intermediate 7-3 (9.7 g) (Yield: 82%).

Synthesis of Compound 7

Compound 7 is synthesized according to Reaction Scheme 7.

Reaction Scheme 7

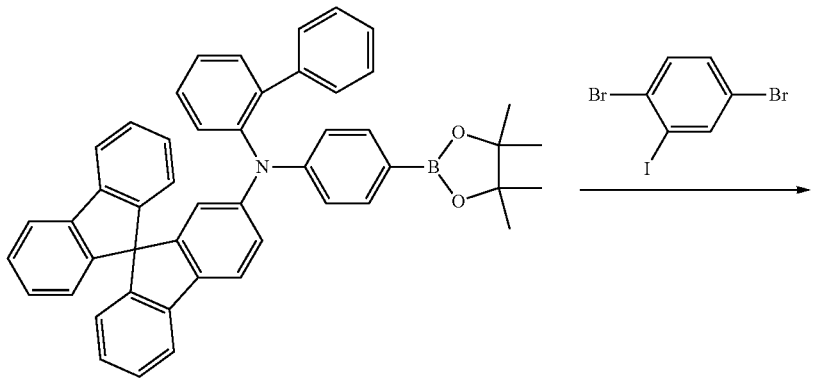

Intermediate 7-3

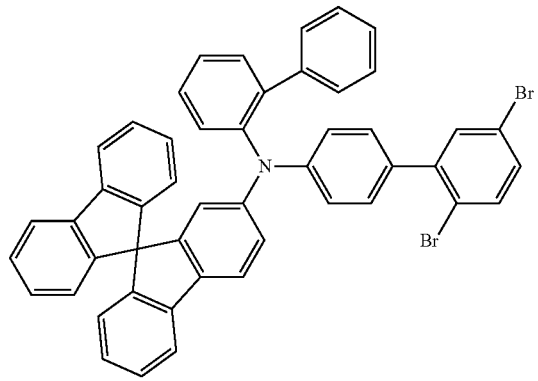

Compound 7

Under an argon atmosphere, Intermediate 7-3 (6.0 g, 8.8 mmol), 1,4-dibromo-2-iodobenzene (4.7 g, 13.1 mmol), sodium carbonate (1.4 g, 13.1 mmol), 70 mL of dioxane, and 35 mL of water are added to a reaction vessel and stirred for 30 minutes. Subsequently, tetrakis(triphenylphosphine)palladium (0) (Pd[PPh$_3$]4) (0.51 g, 0.44 mmol) is added and the reaction mixture is heated and stirred under reflux for 13 hours.

After the reaction is completed, the resultant is cooled to room temperature, and the sample is transferred to a separatory funnel and extracted with toluene. The organic layer is dried with MgSO$_4$, filtered, and concentrated. The concentrated residue is purified by silica gel column chromatography to obtain 4.9 g of a white solid (Compound 7) (Yield: 71%).

Synthesis Example 8

Synthesis of Compound 8

Compound 8 is synthesized according to Reaction Scheme 8.

Reaction Scheme 8

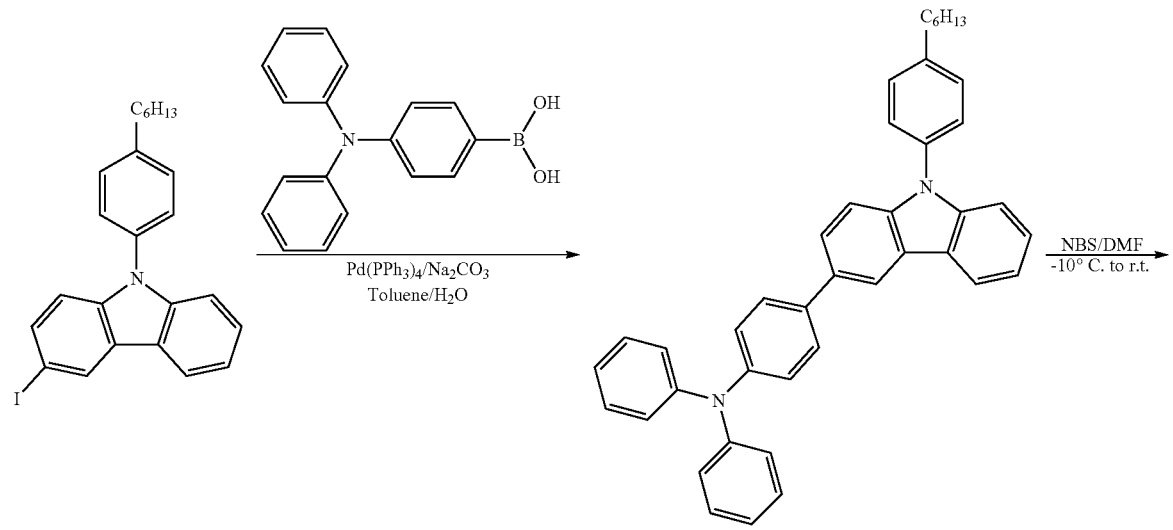

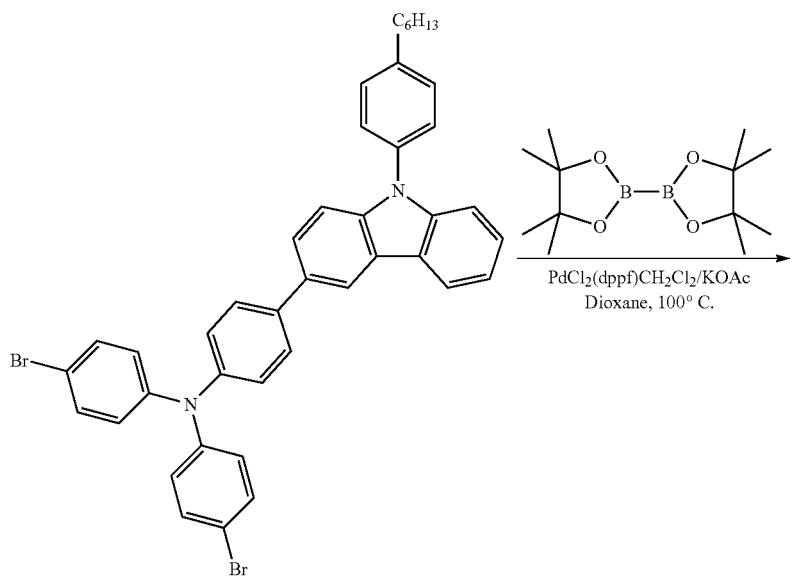

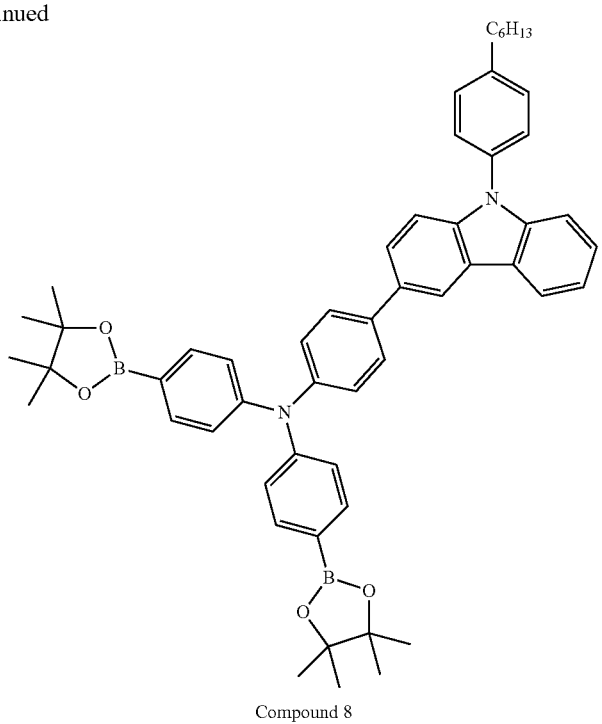

Compound 8

9-(4-hexylphenyl)-3-iodine-9-carbazole (20.0 g), 4-(diphenyl amino)phenyl boronic acid (15.3 g), sodium carbonate (9.51 g), tetrakis(triphenylphosphine)palladium (0) (Pd (PPh$_3$)$_4$) (2.49 g), toluene (221 mL), ethanol (110 mL), and water (110 mL) are added to a 1 L four-necked flask and then, stirred at 120° C. (a bath temperature) for 3 hours.

After cooling down to room temperature, an organic layer obtained by separating an aqueous layer is washed with water (100 L×2) and dried with magnesium sulfate. After removing the solvent under reduced pressure, the residue is purified through column chromatography, obtaining 4-(9-(4-hexylphenyl)-9-carbazol-3-yl)-N,N-diphenyl)aniline (17.7 g).

The obtained 4-(9-(4-hexylphenyl)-9-carbazol-3-yl)-N,N-diphenyl)aniline (17.7 g) and N,N-dimethyl formamide (DMF) (310 mL) are added to a 500 mL four-necked flask and cooled down, and N-Bromo succinimide (NBS) (11.7 g) dissolved in DMF (30 mL) is added in a dropwise fashion under a nitrogen atmosphere and stirred for 6 hours. After filtering off an insoluble material, the residue is washed with 800 mL of methanol and vacuum-dried, obtaining 4-bromo-N-(4-bromophenyl)-N-(4-(9-(4-hexylphenyl)-9-carbazol-3-yl)phenyl)aniline (14.0 g).

The obtained 4-bromo-N-(4-bromophenyl)-N-(4-(9-(4-hexylphenyl)-9-carbazol-3-yl)phenyl)aniline (14.0 g), bispinacolatodiboron (14.8 g), potassium acetate (KOAc) (11.4 g), an addition product of [1,1'-bis(diphenyl phosphino) ferrocene]palladium (II) dichloride dichloromethane (PdCl$_2$ (dppf) CH$_2$Cl$_2$) (0.477 g), and 1,4-dioxane (160 mL) are added to a 500 mL four-necked flask and refluxed under a nitrogen atmosphere at 100° C. for 4 hours. The reaction solution is cooled down to room temperature, and after filtering off a solid by using Celite®, the filtrate is passed through silica gel. After removing the solvent under a reduced pressure, the residue is dissolved in toluene (200 mL), and activated carbon (14.2 g) is added and the mixture is refluxed for 30 minutes. The activated carbon is filtered off and after removing the solvent under reduced pressure, the residue is recrystallized in a mixed solvent of toluene and acetonitrile, obtaining Compound 8 (11.9 g).

Example 1

Synthesis of Polymer Compound A-1

Under an argon atmosphere, Compound 1 (1.317 g) synthesized in Synthesis Example 1, 2,2'-(2,5-dihexyl-1,4-phenylene)bis[4,4,5,5-tetramethyl-1,3,2-dioxaborolane] (0.823 g), palladium acetate (2.2 mg), and tris(2-methoxy phenyl)phosphine (20.3 mg), 30 mL of toluene, and a 20 wt % tetraethylammonium hydroxide aqueous solution (7.61 g) are added to a reaction vessel and stirred for 8 hours. Subsequently, phenyl boronic acid (23.3 mg), bis(triphenylphosphine) palladium(II) dichloride (13.4 mg), and a 20 wt % tetraethylammonium hydroxide aqueous solution (7.61 g) are added and the reaction mixture is heated under reflux for 7 hours. After removing an aqueous layer, sodium N,N-diethyldithiocarbamate trihydrate (3.43 g) and 40 mL of ion exchange water are added and stirred at 85° C. for 2 hours. After separating the organic layer from the aqueous layer, the organic layer is washed with water, 3 wt % of an aqueous acetic acid solution, and water. The organic layer is added dropwise to methanol to precipitate a polymer compound, and the resultant is filtered and dried to obtain a solid. This solid is dissolved in toluene and passed through column chromatography filled with silica gel/alumina, and then the solvent is removed under reduced pressure. The obtained liquid is added dropwise to methanol, and the precipitated solid is filtered and dried to obtain Polymer Compound A-1 (1.65 g). The weight average molecular weight (Mw) and polydispersity (Mw/Mn) of the obtained Polymer Compound A-1 are measured by SEC. As a result, the weight average molecular weight (Mw) and polydispersity (Mw/Mn) of Polymer Compound A-1 are 160,000 and 1.75, respectively.

Polymer Compound A-1 obtained in this way is expected to have the following structural unit based on an injection ratio of the monomers and to be a polymer compound in which the structural unit X and the structural unit Y according to the present invention are alternately polymerized.

Chemical Formula A-1

Polymer Compound A-1

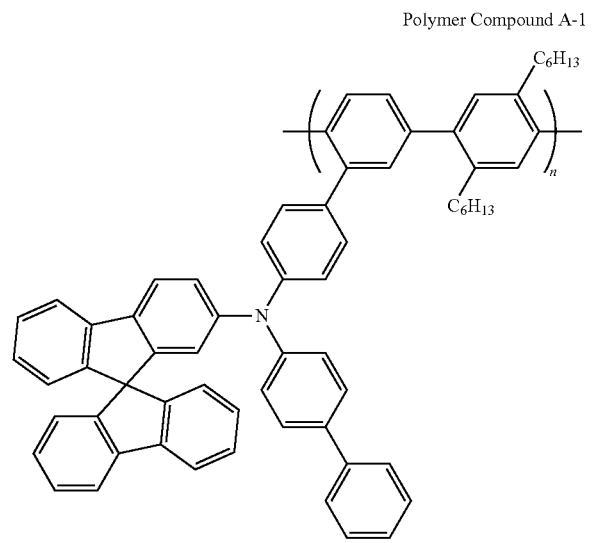

Example 2

Synthesis of Polymer Compound A-2

Under an argon atmosphere, Compound 1 (1.597 g) according to Synthesis Example 1, 2,7-bis(4,4,5,5-tetramethyl-1,3,2-dioxaborolan-2-yl)-9,9-di-n-octyl fluorene (1.286 g), palladium acetate (2.2 mg), and tris(2-methoxy phenyl)phosphine (20.3 mg), 30 mL of toluene, and a 20 wt % tetraethylammonium hydroxide aqueous solution (7.61 g) are added to a reaction vessel and stirred for 8 hours. Subsequently, phenyl boronic acid (23.3 mg), bis(triphenylphosphine)palladium(II)dichloride (13.4 mg), and a 20 wt % tetraethylammonium hydroxide aqueous solution (7.61 g) are added, and the reaction mixture is heated under reflux for 7 hours. After removing an aqueous layer, sodium N,N-diethyldithiocarbamate trihydrate (3.43 g) and ion exchange water (40 mL) are added thereto and stirred at 85° C. for 2 hours. After separating the organic layer from the aqueous layer, the organic layer is washed with water, 3 mass % of an aqueous acetic acid solution, and water. The organic layer is added dropwise to methanol to precipitate a polymer compound, and the resultant is filtered and dried to obtain a solid. This solid is dissolved in toluene and passed through column chromatography filled with silica gel/alumina, and then the solvent is distilled off under reduced pressure. The obtained liquid is added dropwise to methanol, and the precipitated solid is filtered and dried to obtain Polymer Compound A-2 (2.11 g). The weight average molecular weight (Mw) and polydispersity (Mw/Mn) of the obtained Polymer Compound A-2 are measured by SEC. As a result, the weight average molecular weight (Mw) and polydispersity (Mw/Mn) of Polymer Compound A-2 are 200,000 and 2.52, respectively.

Polymer Compound A-2 obtained in this way is presumed to have having the following structural unit based on an injection ratio of the monomers and to be a polymer compound in which the structural unit X and the structural unit Y according to the present invention are alternately polymerized.

[Chemical Formula A-2]

Polymer Compound A-2

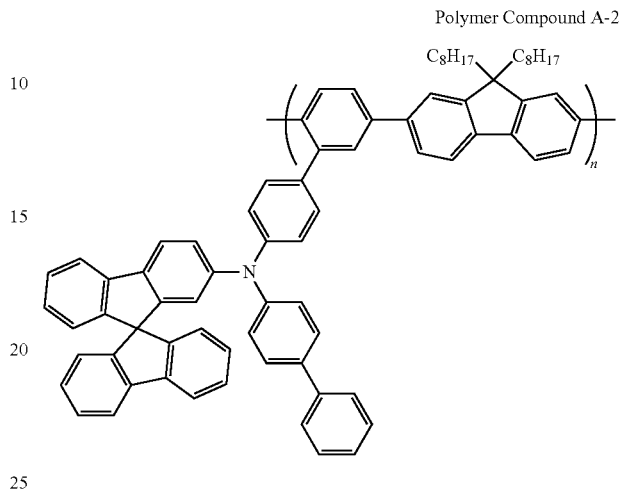

Example 3

Synthesis of Polymer Compound A-3

Under an argon atmosphere, Compound 1 (0.3249 g) according to Synthesis Example 1, 1,3-bis(4,4,5,5-tetramethyl-1,3,2-dioxaborolan-2-yl)-5-dodecyl benzene (0.2600 g), palladium acetate (1.1 mg), and tris(2-methoxy phenyl) phosphine (10.2 mg), 20 mL of toluene, and a 20 wt % tetraethyl ammonium hydroxide aqueous solution (1.90 g) are added to a reaction vessel and then, stirred for 8 hours. Subsequently, phenyl boronic acid (23.3 mg), bis(triphenylphosphine) palladium(II)dichloride (13.4 mg), and a 20 wt % tetraethylammonium hydroxide aqueous solution (3.81 g) are added, and the reaction mixture is heated under reflux for 7 hours. After removing an aqueous layer, sodium N,N-diethyldithiocarbamate trihydrate (3.43 g) and 20 mL of ion exchange water are added and the mixture is stirred at 85° C. for 2 hours. After separating the organic layer from the aqueous layer, the organic layer is washed with water, 3 wt % of an aqueous acetic acid solution, and water. The organic layer is added dropwise to methanol to precipitate a polymer compound, and the resultant is filtered and dried to obtain a solid.

This solid is dissolved in toluene and passed through column chromatography filled with silica gel/alumina, and then the solvent is removed under reduced pressure. The obtained liquid is added dropwise to methanol, and the resulting precipitated solid is filtered and dried to obtain Polymer Compound A-3 (0.30 g). The weight average molecular weight (Mw) and polydispersity (Mw/Mn) of the obtained Polymer Compound A-3 are measured by SEC. As a result, the weight average molecular weight (Mw) and polydispersity (Mw/Mn) of Polymer Compound A-3 are 15,800 and 1.56, respectively.

Polymer Compound A-3 obtained in this way is presumed to have having the following structural unit based on an injection ratio of the monomers and to be a polymer compound in which the structural unit X and the structural unit Y according to the present invention are alternately polymerized.

Chemical Formula A-3

Polymer Compound A-3

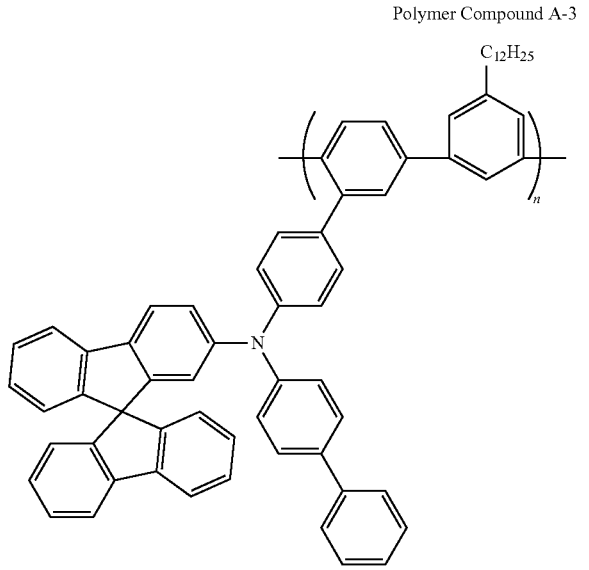

Example 4

Synthesis of Polymer Compound A-4

Under an argon atmosphere, Compound 2 (1.323 g) according to Synthesis Example 2, 2,2'-(2,5-Dihexyl-1,4-phenylene)bis [4,4,5,5-tetramethyl-1,3,2-dioxaborolane] (0.749 g), palladium acetate (2.2 mg), tris(2-methoxy phenyl)phosphine (20.3 mg), 30 mL of toluene, and a 20 wt % tetraethyl ammonium hydroxide aqueous solution (7.61 g) are added to a reaction vessel and stirred for 8 hours. Subsequently, phenyl boronic acid (200 mg), bis(triphenylphosphine) palladium(II)dichloride (13.4 mg), and a 20 wt % tetraethyl ammonium hydroxide aqueous solution (7.61 g) are added, and the reaction mixture is heated under reflux for 7 hours. After removing an aqueous layer, sodium N,N-diethyldithiocarbamate trihydrate (3.43 g) and 40 mL of ion exchange water are added and the mixture stirred at 85° C. for 2 hours. After separating the organic layer from the aqueous layer, the organic layer is washed with water, 3 wt % of an aqueous acetic acid solution, and water. The organic layer is added dropwise to methanol to precipitate a polymer compound, and the resultant is filtered and dried to obtain a solid.

This solid is dissolved in toluene and passed through column chromatography filled with silica gel/alumina, and then the solvent is removed under reduced pressure. The obtained liquid is added dropwise to methanol, and the resulting precipitated solid is filtered and dried to obtain Polymer Compound A-4 (0.91 g). The weight average molecular weight (Mw) and polydispersity (Mw/Mn) of the obtained Polymer Compound A-4 are measured by SEC. As a result, the weight average molecular weight (Mw) and polydispersity (Mw/Mn) of Polymer Compound A-4 are 13,000 and 1.80, respectively.

Polymer Compound A-4 obtained in this way is expected to have having the following structural unit based on an injection ratio of the monomers and to be a polymer compound in which the structural unit X and the structural unit Y according to the present invention are alternately polymerized.

[Chemical Formula A-4]

Polymer Compound A-4

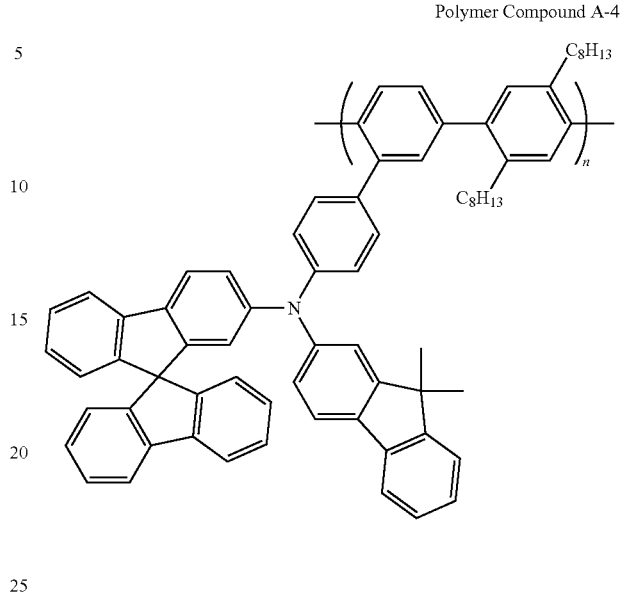

Example 5

Synthesis of Polymer Compound A-5

Under an argon atmosphere, Compound 2 (1.359 g) according to Synthesis Example 2, 1,3-bis(4,4,5,5-tetramethyl-1,3,2-dioxaborolan-2-yl)-5-dodecyl benzene (1.625 g), palladium acetate (3.7 mg), tris(2-methoxy phenyl)phosphine (34.5 mg), toluene (60 mL), and a 20 wt % tetraethylammonium hydroxide aqueous solution (8.40 g) are added to a reaction vessel and stirred for 8 hours. Subsequently, phenyl boronic acid (200 mg), bis(triphenylphosphine)palladium(II)dichloride (68.4 mg), and a 20 wt % tetraethyl ammonium hydroxide aqueous solution (8.40 g) are added and the reaction mixture is heated under reflux for 7 hours. After removing an aqueous layer, sodium N,N-diethyldithiocarbamate trihydrate (3.43 g) and ion exchange water (60 mL) are added thereto and the mixture stirred at 85° C. for 2 hours. After separating an aqueous layer from an organic layer, the organic layer is washed with water, 3 wt % of an aqueous acetic acid solution, and water. The organic layer is added dropwise to methanol to precipitate a polymer compound, and the resultant is filtered and dried to obtain a solid.

This solid is dissolved in toluene and passed through column chromatography filled with silica gel/alumina, and then the solvent is distilled off under reduced pressure. The obtained liquid is added dropwise to methanol, and the precipitated solid is filtered and dried to obtain Polymer Compound A-5 (0.57 g). The weight average molecular weight (Mw) and polydispersity (Mw/Mn) of the obtained Polymer Compound A-5 are measured by SEC. As a result, the weight average molecular weight (Mw) and polydispersity (Mw/Mn) of Polymer Compound A-5 are 9,400 and 1.55, respectively.

Polymer Compound A-5 obtained in this way is presumed to have having the following structural unit based on an injection ratio of the monomers and to be a polymer compound in which the structural unit X and the structural unit Y according to the present invention are alternately polymerized.

[Chemical Formula A-5]

Polymer Compound A-5

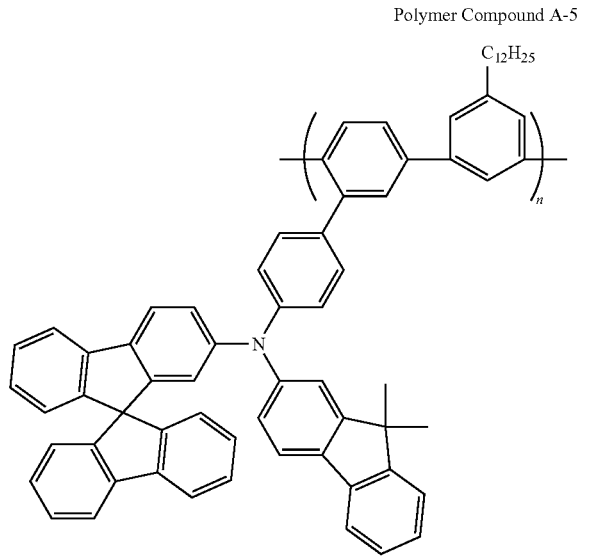

Example 6

Synthesis of Polymer Compound A-6

Under an argon atmosphere, Compound 3 (1.338 g) according to Synthesis Example 3, 2,2'-(2,5-Dihexyl-1,4-phenylene)bis[4,4,5,5-tetramethyl-1,3,2-dioxaborolane] (0.875 g), palladium acetate (2.15 mg), tris(2-methoxy phenyl)phosphine (20.3 mg), toluene (30 mL), and a 20 mass % tetraethyl ammonium hydroxide aqueous solution (7.61 g) are added to a reaction vessel and refluxed for 8 hours. Subsequently, phenyl boronic acid (200 mg), bis(triphenylphosphine) palladium(II) dichloride) (13.4 mg), and a 20 wt % tetraethyl ammonium hydroxide aqueous solution (7.61 g) are added and the reaction mixture is heated under reflux for 7 hours. After separating an aqueous layer from an organic layer, sodium N,N-diethyldithiocarbamate trihydrate (3.43 g) and ion exchange water (40 mL) are added thereto and stirred at 85° C. for 2 hours. After separating the organic layer from the aqueous layer, the organic layer is washed with water, 3 wt % of an aqueous acetic acid solution, and water. The organic layer is added dropwise to methanol to precipitate a polymer compound, and the resultant is filtered and dried to obtain a solid.

This solid is dissolved in toluene and passed through column chromatography filled with silica gel/alumina, and then the solvent is distilled off under reduced pressure. The obtained liquid is added dropwise to methanol, and the precipitated solid is filtered and dried to obtain Polymer Compound A-6 (0.94 g). The weight average molecular weight (Mw) and polydispersity (Mw/Mn) of the obtained Polymer Compound A-6 are measured by SEC. As a result, the weight average molecular weight (Mw) and polydispersity (Mw/Mn) of Polymer Compound A-6 are 133,900 and 2.60, respectively.

Polymer Compound A-6 obtained in this way is presumed to have having the following structural unit based on an injection ratio of the monomers and to be a polymer compound in which the structural unit X and the structural unit Y according to the present invention are alternately polymerized.

Chemical Formula A-6

Polymer Compound A-6

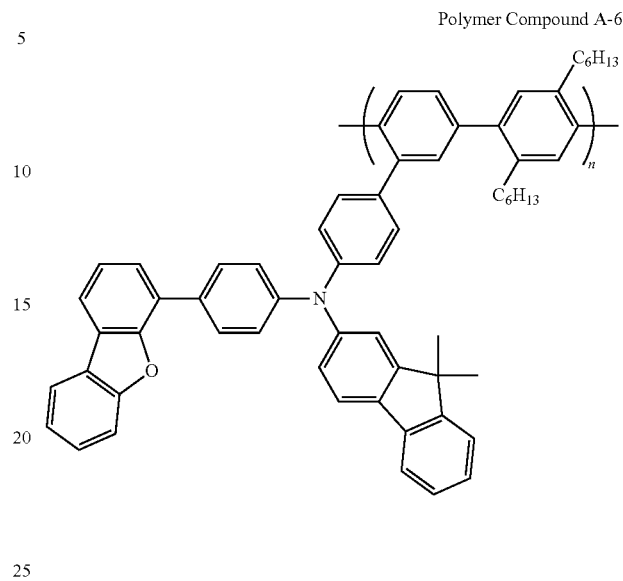

Example 7

Synthesis of Polymer Compound A-7

Under an argon atmosphere, Compound 4 (1.821 g) according to Synthesis Example 4, 1,3-bis(4,4,5,5-tetramethyl-1,3,2-dioxaborolan-2-yl)-5-dodecyl benzene (1.746 g), palladium acetate (9.3 mg), and tris(2-methoxy phenyl) phosphine (87.2 mg), toluene (70 mL), and a 20 wt % tetraethylammonium hydroxide aqueous solution (10.62 g) are added to a reaction vessel and refluxed for 8 hours. Subsequently, phenyl boronic acid (500 mg), bis(triphenylphosphine)palladium(II) dichloride (86.8 mg), and a 20 wt % tetraethylammonium hydroxide aqueous solution (10.62 g) are added and the reaction mixture is heated under reflux for 7 hours. After separating an aqueous layer from an organic layer, sodium N,N-diethyldithiocarbamate trihydrate (3.43 g) and ion exchange water (80 mL) are added and the mixture stirred at 85° C. for 2 hours. After separating the organic layer from the aqueous layer, the organic layer is washed with water, 3 wt % of an aqueous acetic acid solution, and water. The organic layer is added dropwise to methanol to precipitate a polymer compound, and the resultant is filtered and dried to obtain a solid.

This solid is dissolved in toluene and passed through column chromatography filled with silica gel/alumina, and then the solvent is removed under reduced pressure. The obtained liquid is added dropwise to methanol, and the precipitated solid is filtered and dried to obtain Polymer Compound A-7 (0.89 g). The weight average molecular weight (Mw) and polydispersity (Mw/Mn) of the obtained Polymer Compound A-7 are measured by SEC. As a result, the weight average molecular weight (Mw) and polydispersity (Mw/Mn) of Polymer Compound A-7 are 5,970 and 1.30, respectively.

Polymer Compound A-7 obtained in this way is expected to have the following structural unit based on an injection ratio of the monomers and to be a polymer compound in which the structural unit X and the structural unit Y according to the present invention are alternately polymerized.

Chemical Formula A-7

Polymer Compound A-7

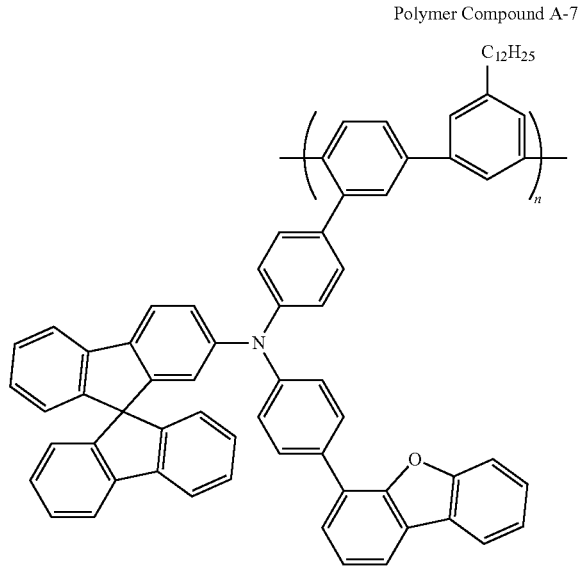

Example 8

Chemical Formula A-8

Polymer Compound A-8

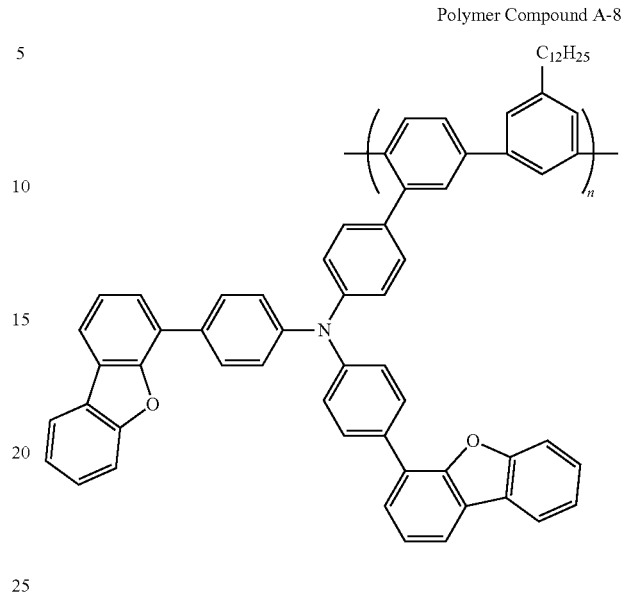

Example 9

Synthesis of Polymer Compound A-8

Under an argon atmosphere, Compound 5 (1.807 g) according to Synthesis Example 5, 1,3-bis(4,4,5,5-tetramethyl-1,3,2-dioxaborolan-2-yl)-5-dodecyl benzene (1.665 g), palladium acetate (10.0 mg), and 2-dicyclohexylphosphino-2',6'-dimethoxy biphenyl (SPhos) (54.8 mg), toluene (70 mL), and a 20 mass % tetraethylammonium hydroxide aqueous solution (11.48 g) are assed to a reaction vessel and refluxed for 8 hours. Subsequently, phenyl boronic acid (270 mg), bis(triphenylphosphine) palladium(II) dichloride (94 mg), and a 20 wt % tetraethyl ammonium hydroxide aqueous solution (11.48 g) are added and the reaction mixture is heated under reflux for 7 hours. After separating an aqueous layer from an organic layer, sodium N,N-diethyldithiocarbamate trihydrate (3.43 g) and ion exchange water (70 mL) are added and the mixture stirred at 85° C. for 2 hours. After separating the organic layer from the aqueous layer, the organic layer is washed with water, 3 wt % of an aqueous acetic acid solution, and water. The organic layer is added dropwise to methanol to precipitate a polymer compound, and the resultant is filtered and dried to obtain a solid.

This solid is dissolved in toluene and passed through column chromatography filled with silica gel/alumina, and then the solvent is distilled off under reduced pressure. The obtained liquid is added dropwise to methanol, and the precipitated solid is filtered and dried to obtain Polymer Compound A-8 (1.28 g). The weight average molecular weight (Mw) and polydispersity (Mw/Mn) of the obtained Polymer Compound A-8 are measured by SEC. As a result, the weight average molecular weight (Mw) and polydispersity (Mw/Mn) of Polymer Compound A-8 are 6,520 and 1.60, respectively.

Polymer Compound A-8 obtained in this way is expected to have the following structural unit based on an injection ratio of the monomers and to be a polymer compound in which the structural unit X and the structural unit Y according to the present invention are alternately polymerized.

Synthesis of Polymer Compound A-9

Under an argon atmosphere, Compound 7 (1.803 g) according to Synthesis Example 7, 1,3-bis(4,4,5,5-tetramethyl-1,3,2-dioxaborolan-2-yl)-5-dodecyl benzene (1.699 g), palladium acetate (10.2 mg), tris(2-methoxyphenyl) phosphine (48.0 mg), toluene (70 mL), and a 20 wt % tetraethyl ammonium hydroxide aqueous solution (11.71 g) are added to a reaction vessel and then, refluxed for 8 hours. Subsequently, phenyl boronic acid (275 mg), bis(triphenylphosphine) palladium(II)dichloride (96 mg), and a 20 wt % tetraethyl ammonium hydroxide aqueous solution (11.71 g) are added and the reaction mixture is heated under reflux for 7 hours. After separating an aqueous layer from an organic layer, sodium N,N-diethyldithiocarbamate trihydrate (3.43 g) and ion exchange water (70 mL) are added and stirred at 85° C. for 2 hours. After separating the organic layer from the aqueous layer, the organic layer is washed with water, 3 wt % of an aqueous acetic acid solution, and water. The organic layer is added dropwise to methanol to precipitate a polymer compound, and the resultant is filtered and dried to obtain a solid.

This solid is dissolved in toluene and passed through column chromatography filled with silica gel/alumina, and then the solvent is removed under reduced pressure. The obtained liquid is added dropwise to methanol, and the precipitated solid is filtered and dried to obtain Polymer Compound A-9 (1.25 g). The weight average molecular weight (Mw) and polydispersity (Mw/Mn) of the obtained Polymer Compound A-9 are measured by SEC. As a result, the weight average molecular weight (Mw) and polydispersity (Mw/Mn) of Polymer Compound A-2 are 8,300 and 1.43, respectively.

Polymer Compound A-9 obtained in this way is expected to have the following structural unit based on an injection ratio of the monomers and to be a polymer compound in which the structural unit X and the structural unit Y according to the present invention are alternately polymerized.

Chemical Formula A-9

Polymer Compound A-9

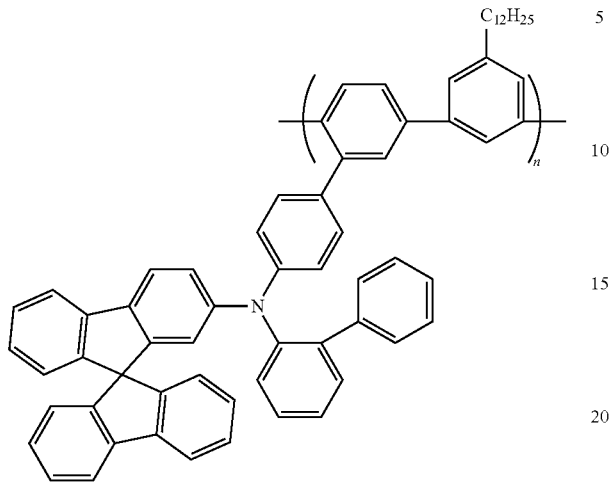

Example 10

Synthesis of Polymer Compound A-10

Under an argon atmosphere, Compound 6 (1.812 g) according to Synthesis Example 6, 1,3-bis(4,4,5,5-tetramethyl-1,3,2-dioxaborolan-2-yl)-5-dodecyl benzene (1.297 g), palladium acetate (9.7 mg), tris(2-methoxy phenyl)phosphine (45.8 mg), toluene (62 mL), and a 20 wt % tetraethyl ammonium hydroxide aqueous solution (11.18 g) are added to a reaction vessel and refluxed for 8 hours. Subsequently, phenyl boronic acid (262 mg), bis(triphenylphosphine)palladium(II) dichloride (91 mg), and a 20 wt % tetraethyl ammonium hydroxide aqueous solution (11.18 g) are added and the reaction mixture is heated under reflux for 7 hours. After separating an aqueous layer from an organic layer, sodium N,N-diethyldithiocarbamate trihydrate (3.43 g) and ion exchange water (62 mL) are added and stirred at 85° C. for 2 hours. After separating the organic layer from the aqueous layer, the organic layer is washed with water, 3 wt % aqueous acetic acid solution, and water. The organic layer is added dropwise to methanol to precipitate a polymer compound, and the resultant is filtered and dried to obtain a solid.

This solid is dissolved in toluene and passed through column chromatography filled with silica gel/alumina, and then the solvent is removed under reduced pressure. The obtained liquid is added dropwise to methanol, and the precipitated solid is filtered and dried to obtain Polymer Compound A-10 (1.31 g). The weight average molecular weight (Mw) and polydispersity (Mw/Mn) of the obtained Polymer Compound A-10 are measured by SEC. As a result, the weight average molecular weight (Mw) and polydispersity (Mw/Mn) of Polymer Compound A-10 are 7,900 and 1.38, respectively.

Polymer Compound A-10 obtained in this way is expected to have the following structural unit based on an injection ratio of the monomers and to be a polymer compound in which the structural unit X and the structural unit Y according to the present invention are alternately polymerized.

Chemical Formula A-10

Polymer Compound A-10

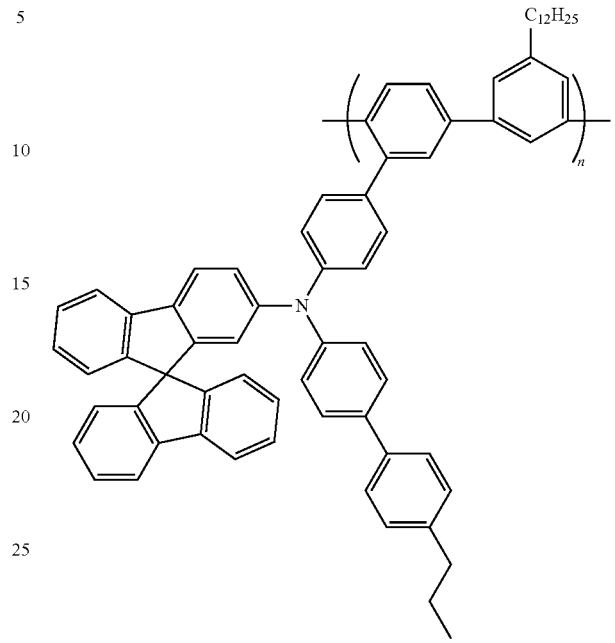

Example 11

Synthesis of Polymer Compound B-1

Under an argon atmosphere, Compound 8 (1.72 g) according to Synthesis Example 8, 2,7-dibromo-9,9-dioctyl fluorene (1.15 g), palladium acetate (9.4 mg), tris(2-methoxy phenyl)phosphine (44.2 mg), toluene (57 mL), and a 20 mass % tetraethyl ammonium hydroxide aqueous solution (10.7 g) are added to a reaction vessel and stirred at 85° C. for 6 hours. Subsequently, phenyl boronic acid (121 mg), tetrakis(triphenyl phosphino)palladium (146 mg), and a 20 wt % tetraethyl ammonium hydroxide aqueous solution (10.7 g) are added and the reaction mixture is stirred for 3 hours. Then, sodium N,N-diethyldithiocarbamate trihydrate (14.1 g) dissolved in ion exchange water (50 mL) is added thereto and then, stirred at 85° C. for 2 hours. After separating the organic layer from the aqueous layer, the organic layer is washed with water, 3 wt % of an aqueous acetic acid solution, and water. The organic layer is subjected to column chromatography filled with silica gel/alumina, and the solvent is distilled off under reduced pressure. The obtained liquid is added dropwise to methanol, and the precipitated solid is dissolved in toluene. Then, this solution is added dropwise to methanol to obtain precipitate, and the precipitated solid is filtered and dried to obtain Polymer Compound B-1 (1.14 g). The weight average molecular weight (Mw) and polydispersity (Mw/Mn) of the obtained Polymer Compound B-1 are measured by SEC. As a result, the weight average molecular weight (Mw) and polydispersity (Mw/Mn) of Polymer Compound B-1 are 139,000 and 3.39, respectively.

Polymer Compound B-1 obtained in this way is expected to be a polymer compound having the following structural unit based on an injection ratio of the monomers.

Chemical Formula B-1 — Polymer Compound B-1

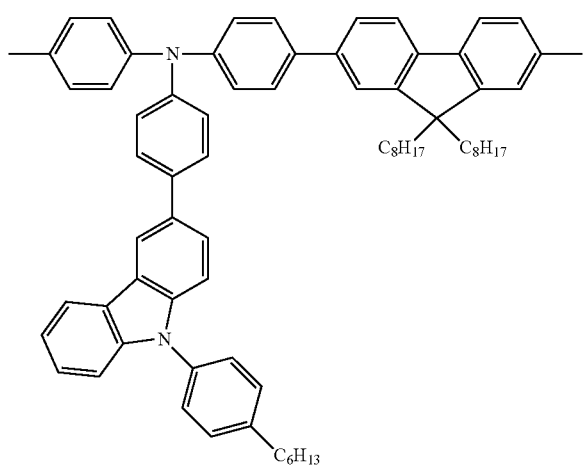

Polymer Compounds A-1 to A-10 according to Examples 1 to 10 and Polymer Compound B-1 according to Example 11 are measured with respect to HOMO levels (eV) in the following method. The results are shown in Table 1.

(Measurement of HOMO Level)

Each polymer compound is dissolved in xylene at a concentration of 1 wt %, for preparing a coating liquid. The coating liquid is spin-coated at 2000 rpm on a UV-cleaned and ITO-attached glass substrate and dried on a hot plate at 150° C. for 30 minutes, preparing samples. The samples are measured with respect to HOMO levels by using a photoelectron spectrometer (AC-3, Riken Keiki Co., Ltd.) in the air. Herein, the measurement results are used to calculate a rising tangent point of intersection, which is regarded as the HOMO levels (eV).

TABLE 1

| | Polymer compound | Structural unit | Mw (Mw/Mn) | HOMO (eV) |
|---|---|---|---|---|
| Example 1 | A-1 | | 160,000 (1.75) | −5.67 |
| Example 2 | A-2 | | 200,000 (2.52) | −5.78 |

TABLE 1-continued
| Polymer compound | Structural unit | Mw (Mw/Mn) | HOMO (eV) |
|---|---|---|---|
| Example 3 A-3 | 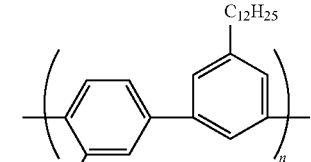 | 15,800 (1.56) | −5.68 |
| Example 4 A-4 | 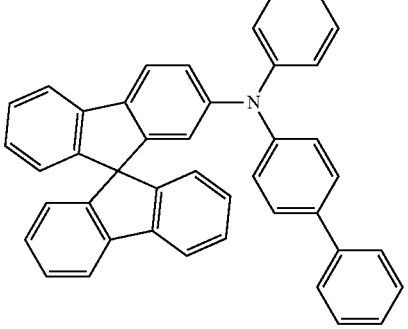 | 13,000 (1.80) | −5.67 |
| Example 5 A-5 | 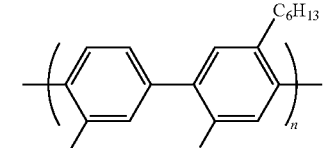 | 9,400 (1.55) | −5.60 |

TABLE 1-continued
| Polymer compound | | Structural unit | Mw (Mw/Mn) | HOMO (eV) |
|---|---|---|---|---|
| Example 6 | A-6 | 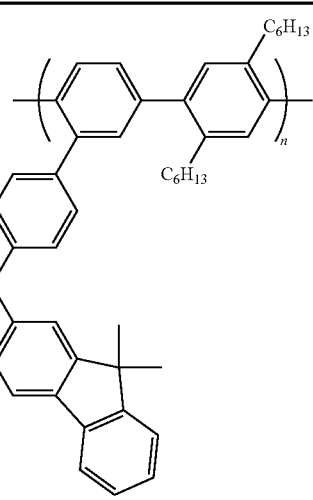 | 133,900 (2.60) | −5.66 |
| Example 7 | A-7 | 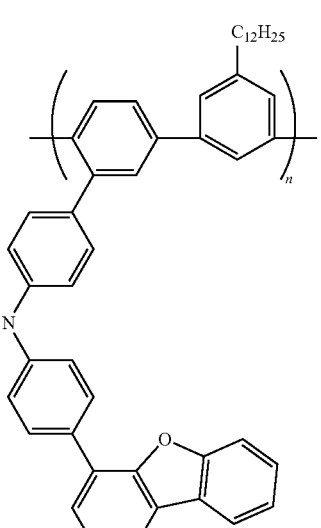 | 5,970 (1.30) | −5.62 |
| Example 8 | A-8 | 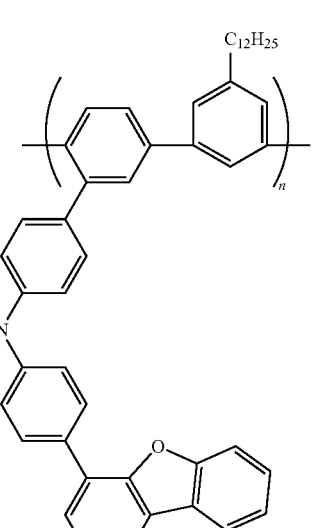 | 6,520 (1.60) | −5.66 |

TABLE 1-continued
| Polymer compound | | Structural unit | Mw (Mw/Mn) | HOMO (eV) |
|---|---|---|---|---|
| Example 9 | A-9 | 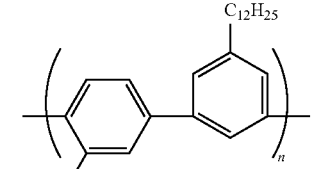 | 8,300 (1.43) | −5.71 |
| Example 10 | A-10 | 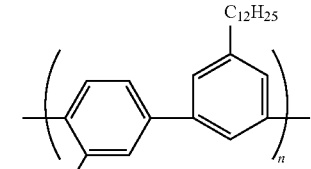 | 7,900 (1.38) | −5.66 |

TABLE 1-continued

| Polymer compound | | Structural unit | Mw (Mw/Mn) | HOMO (eV) |
|---|---|---|---|---|
| Example 11 | B-1 | (structure) | 139,000 (3.39) | −5.45 |

Example 12

Production of Electroluminescence Device 1

As for a first electrode (an anode), a glass substrate adhered with indium tin oxide (ITO) which is patterned to have a film thickness of 150 nm is used. This ITO-adhered glass substrate is sequentially washed with a neutral detergent, deionized water, water, and isopropyl alcohol and then, treated with UV-ozone. Subsequently, on this ITO-adhered glass substrate, poly(3,4-ethylenedioxythiophene)/poly(4-styrenesulfonate) (PEDOT/PSS) (Sigma-Aldrich Co., Ltd.) is spin-coated and dried to have a dry film thickness of 30 nm. As a result, a hole injection layer having a thickness (dry film thickness) of 30 nm is formed on the ITO-adhered glass substrate.

Subsequently, Polymer Compound A-1 synthesized in Example 1 (a hole transport material) is dissolved in toluene (a solvent) at a concentration of 1 wt %, preparing a coating liquid (1) for forming a hole transport layer (HTL).

On the hole injection layer (HIL), the coating liquid (1) for a hole transport layer (HTL) is spin-coated and heated at 230° C. for 1 hour to form a hole transport layer (HTL) having a thickness (dry film thickness) of 30 nm thereon.

Subsequently, quantum dot dispersion is prepared by dispersing a blue quantum dot of ZnTeSe/ZnSe/ZnS (core/shell/shell; an average diameter of about 10 nm) having a structure shown in FIG. 2 in cyclohexane at 1.0 wt %. The hole transport layer (HTL) (particularly, Polymer Compound A-1) is not dissolved in cyclohexane. This quantum dot dispersion is spin-coated to have a dry film thickness of 30 nm on the hole transport layer (HTL) and dried. As a result, a quantum dot light emitting layer with a thickness (dry film thickness) of 30 nm is formed on the hole transport layer (HTL). When the quantum dot dispersion is irradiated by ultraviolet (UV) light, the dispersion emits light with a wavelength of 462 nm and a half width of 30 nm.

This quantum dot light emitting layer is completely dried. On this quantum dot light emitting layer, lithium quinolate (Liq) and 1,3,5-tris(N-phenylbenzimidazol-2-yl)benzene (TPBI) (Sigma-Aldrich Co., Ltd.) as an electron transport material are codeposited by using a vacuum deposition apparatus. As a result, an electron transport layer having a thickness of 36 nm is formed on the quantum dot light emitting layer.

On this electron transport layer, (8-quinolato)lithium (lithium quinolate, Liq) is deposited by using the vacuum deposition apparatus. As a result, 0.5 nm-thick electron injection layer is formed on the electron transport layer.

On the electron injection layer (EIL), aluminum (hereinafter, Al) is deposited by using a vacuum deposition apparatus, forming a second electrode (a cathode) with a thickness of 100 nm. Accordingly, an electroluminescence device 1 (a quantum dot electroluminescence device 1) is obtained.

Example 13

Production of Electroluminescence Device 2

An electroluminescence device 2 (a quantum dot electroluminescence device 2) is manufactured according to the same method as Example 12 except that Polymer Compound A-2 of Example 2 is used instead of Polymer Compound A-1.

Example 14

Production of Electroluminescence Device 3

An electroluminescence device 3 (a quantum dot electroluminescence device 3) is manufactured according to the same method as Example 12 except that Polymer Compound A-3 of Example 3 is used instead of Polymer Compound A-1.

Example 15

Production of Electroluminescence Device 4

An electroluminescence device 4 (a quantum dot electroluminescence device 4) is manufactured according to the same method as Example 12 except that Polymer Compound A-4 of Example 4 is used instead of Polymer Compound A-1.

Example 16

Production of Electroluminescence Device 5

An electroluminescence device 5 (a quantum dot electroluminescence device 5) is manufactured according to the same method as Example 12 except that Polymer Compound A-5 of Example 5 is used instead of Polymer Compound A-1.

Example 17

Production of Electroluminescence Device 6

An electroluminescence device 6 (a quantum dot electroluminescence device 6) is manufactured according to the same method as Example 12 except that Polymer Compound A-6 of Example 5 is used instead of Polymer Compound A-1.

Example 18

Production of Electroluminescence Device 7

An electroluminescence device 7 (a quantum dot electroluminescence device 7) is manufactured according to the same method as Example 12 except that Polymer Compound A-7 of Example 7 is used instead of Polymer Compound A-1

Example 19

Production of Electroluminescence Device 8

An electroluminescence device 8 (a quantum dot electroluminescence device 8) is manufactured according to the same method as Example 12 except that Polymer Compound A-8 of Example 8 is used instead of Polymer Compound A-1.

Example 20

Production of Electroluminescence Device 9

An electroluminescence device 9 (a quantum dot electroluminescence device 9) is manufactured according to the same method as Example 12 except that Polymer Compound A-9 of Example 9 is used instead of Polymer Compound A-1.

Comparative Example 1

Production of Comparative Electroluminescence Device 1

A comparative electroluminescence device 1 (a comparative quantum dot electroluminescence device 1) is manufactured according to the same method as Example 12 except that poly[(9,9-dioctyl fluorenyl-2,7-diyl)-co-(4,4'-(N-(4-sec-butyl phenyl)diphenyl amine)] (TFB) having the following structural unit (Luminescence Technology Corp.) is used instead of Polymer Compound A-1

TFB is measured with respect to a weight average molecular weight (Mw) and polydispersity (Mw/Mn) by using SEC. As a result, TFB has a weight average molecular weight (Mw) and polydispersity (Mw/Mn) of respectively, 359,000 and 3.4.

Chemical Formula 106

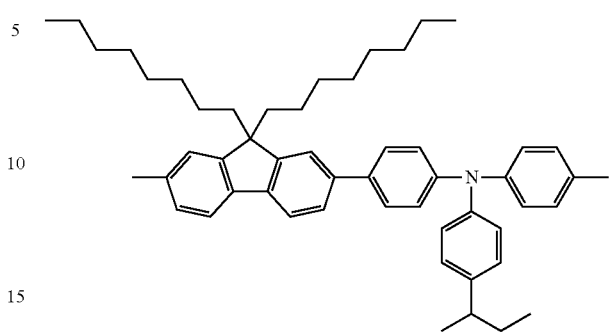

TFB

Evaluation 1 of Electroluminescence Device

The electroluminescence devices 1 to 8 according to Examples 12 to 19 and the comparative electroluminescence device 1 according to Comparative Example 1 are evaluated with respect to luminous efficiency in the following method. The results are shown in Table 2.

Luminous Efficiency

When a voltage is applied to each electroluminescence device, and a current starts to flow at a constant voltage, the electroluminescence device emits light. As the voltage of each device is gradually increased by using a DC constant voltage power supply (a source meter, Keyence Corp.), a current at that time is measured, and in addition, luminance thereof during the light emission is measured by using a luminance-measuring device (SR-3, Topcom Technology Co., Ltd.). Herein, when the luminance starts to decline, the measurement is ended. The luminance ($cd/m^2$) is divided by current density ($A/m^2$), which is obtained as a current per unit area from an area of each device, obtaining current efficiency (cd/A).

In addition, a spectral emission luminance spectrum measured by the luminance-measuring device, assuming that Lambertian radiation is performed, is used to calculate external quantum efficiency (EQE) (%) at Cd/A max, evaluating luminous efficiency.

TABLE 2

| | Polymer Compound | EQE [%] |
|---|---|---|
| Example 12 | A-1 | 15.5 |
| Example 13 | A-2 | 11.4 |
| Example 14 | A-3 | 14.4 |
| Example 15 | A-4 | 12.3 |
| Example 16 | A-5 | 11.9 |
| Example 17 | A-6 | 11.2 |
| Example 18 | A-7 | 13.4 |
| Example 19 | A-8 | 15.4 |
| Comparative Example 1 | TFB | 8.7 |

Referring to the results of Table 2, the electroluminescence devices 1 to 8 according to the examples exhibit significantly high luminous efficiency (EQE), compared with the comparative electroluminescence device 1. As noted, a blue quantum dot electroluminescence devices is evaluated in the above, however the same result may be achieved in a red quantum dot electroluminescence device and the like.

Example 21 Production of Electroluminescence Device 10

As for a first electrode (anode), an ITO-attached glass substrate, in which indium tin oxide (ITO) is patterned to have a film thickness of 150 nm, is used. This ITO-attached glass substrate is washed with a neutral detergent, deionized water, water, and isopropyl alcohol in order and then, treated with UV-ozone. Subsequently, on this ITO-attached glass substrate, poly(3,4-ethylenedioxythiophene)/poly(4-styrenesulfonate) (PEDOT/PSS) (Sigma-Aldrich Co., Ltd.) is spin-coated to have a dry film thickness of 30 nm and dried. As a result, a hole injection layer (HIL) with the thickness (dry film thickness) of 30 nm is formed on the ITO-attached glass substrate.

Subsequently, Polymer Compound A-3 according to Example 3 and Polymer Compound B-1 according to Example 11 (hole transport material) are dissolved in toluene (a solvent) respectively at a concentration of 0.5 wt %, preparing a coating liquid (5) for a hole transport layer (HTL). On the hole injection layer (HIL), this coating liquid (5) for a hole transport layer (HTL) is spin-coated to have a thickness (dry film thickness) of 30 nm and heat-treated at 230° C. for 1 hour to form a hole transport layer (HTL) with the thickness (dry film thickness) of 30 nm on the hole injection layer (HIL).

Figure 2:
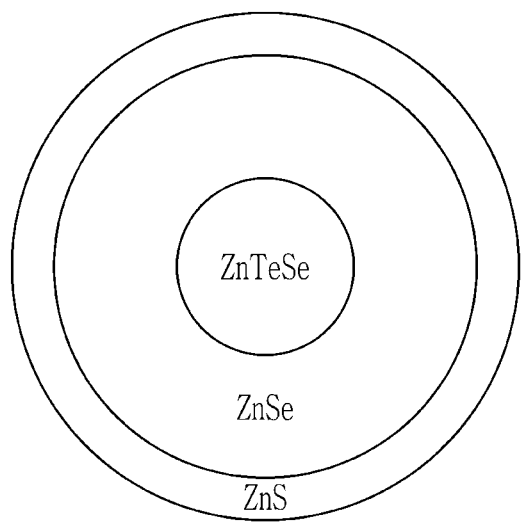
FIG. 2 is a cross-sectional view showing the structure of a quantum dot.

Quantum dot dispersion is prepared by dispersing a blue quantum dot of ZnTeSe/ZnSe/ZnS (core/shell/shell; average diameter=about 10 nm) with a structure shown in FIG. 2 in cyclohexane at 1.0 wt %.

This quantum dot dispersion is spin-coated to have a dry film thickness of 30 nm on the hole transport layer (HTL) and dried. As a result, a quantum dot light emitting layer with the thickness (dry film thickness) of 30 nm is formed on the hole transport layer (HTL). The light emitted by irradiating the quantum dot dispersion with ultraviolet (UV) has a wavelength of 462 nm and a half width of 30 nm. This quantum dot light emitting layer is completely dried. On this quantum dot light emitting layer, lithium quinolate (Liq) and 1,3,5-tris(N-phenyl benzimidazol-2-yl)benzene (TPBI) (Sigma-Aldrich Co., Ltd.) as an electron transport material are codeposited by using a vacuum deposition apparatus. As a result, an electron transport layer (ETL) with a thickness of 36 nm is formed on the quantum dot light emitting layer. On this electron transport layer (ETL), (8-quinolinato) lithium (lithium quinolate, Liq) is deposited by using the vacuum deposition apparatus. As a result, an electron injection layer (EIL) with a thickness of 0.5 nm is formed on the electron transport layer (ETL). On the electron injection layer (EIL), aluminum (hereinafter, Al) is deposited in the vacuum deposition apparatus to form a second electrode (cathode) with a thickness of 100 nm. Accordingly, an electroluminescence device 5 (quantum dot electroluminescence device 5) is obtained. The electroluminescence device 10 according to Example 21 is evaluated with respect to luminous efficiency according to the method described in the Evaluation 1 of Electroluminescence Device] (luminous efficiency). The result is shown in Table 3.

Evaluation 2 of Electroluminescence Device

The electroluminescence device 10 according to Example 21 and the comparative electroluminescence device 1 according to Comparative Example 1 are evaluated with respect to luminescence life-spans in the following method. The results are shown in Table 3.

Luminescence Life-Span

Each quantum dot electroluminescence device is made to emit light by applying a predetermined voltage thereto with a DC constant voltage power supply (a source meter, Keyence Corp.).

The quantum dot electroluminescence device is measured with respect to light emission by using a luminance-measuring device (SR-3, Topcom Technology Co., Ltd.), while a current is gradually increased, and when the luminance reaches 280 nit (cd/m$^2$), the device is allowed to stand, while the current is made constant.

The time when the luminance measured with a luminance-measuring device gradually decreases and reaches 50% of the initial luminance is "LT50 (hr)".

TABLE 3

| | Polymer compound | EQE [%] | LT50 (hr) |
|---|---|---|---|
| Example 21 | A-3 + B-1 (Mixing weight ratio = 1:1) | 12.9 | 111 |
| Comparative Example 1 | TFB | 8.7 | 80 |

Referring to the results of Table 3, the electroluminescence device 10 of Example 21 using a combination of Polymer Compound A-3 and Polymer Compound B-1 having a specific HOMO level exhibits significantly high luminous efficiency (EQE) and durability (significantly long luminescence life-span), compared with the comparative electroluminescence device 1 of Comparative Example 1. A similar result as the above may be achieved in a red or green quantum dot electroluminescence device and the like.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

100: electroluminescence device (EL device),
110: substrate,
120: first electrode,
130: hole injection layer (HIL),
140: hole transport layer HTL,
150: light emitting layer,
160: electron transport layer (ETL),
170: electron injection layer (EIL),
180: second electrode.

What is claimed is:

1. A copolymer having a structural unit represented by Chemical Formula 1:

[Chemical Formula 1]

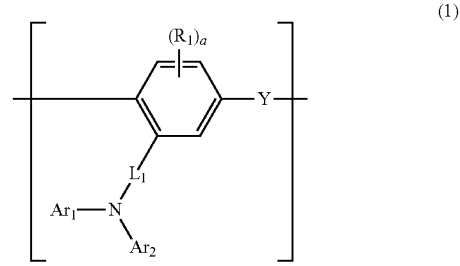

wherein, in Chemical Formula 1,

Ar$_1$ and Ar$_2$ are each independently a substituted or unsubstituted aromatic hydrocarbon group having 6 to 30 carbon atoms, or a substituted or unsubstituted aromatic heterocyclic group having 3 to 30 ring-member atoms, L$_1$ is a substituted or unsubstituted divalent aromatic hydrocarbon group having 6 to 30 carbon atoms, each R$_1$ is independently a hydrogen, a substituted or unsubstituted alkyl group having 1 to 20 carbon atoms, a substituted or unsubstituted alkoxy group having 1 to 20 carbon atoms, a substituted or unsubstituted aromatic hydrocarbon group having 6 to 30 carbon atoms, or a substituted or unsubstituted aromatic heterocyclic group having 3 to 30 ring-member atoms, wherein two R$_1$'s are optionally linked to provide a ring structure, a is an integer of 0, 1, 2, or 3, and Y is a substituted or unsubstituted aromatic hydrocarbon group having 6 to 60 carbon atoms or a substituted or unsubstituted aromatic heterocyclic group having 3 to 60 ring-member atoms.

2. The copolymer of claim 1, wherein at least one of Ar$_1$ or Ar$_2$ is a group represented by Chemical Formula 1-2:

Chemical Formula 1-2

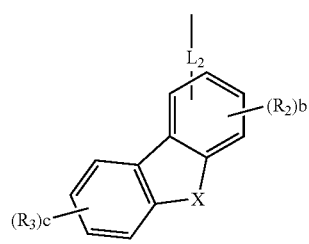

(1-2)

wherein, in Chemical Formula 1-2,

L$_2$ is a single bond, a substituted or unsubstituted aromatic hydrocarbon group having 6 to 30 carbon atoms, or a substituted or unsubstituted aromatic heterocyclic group having 3 to 30 ring-member atoms, each R$_2$ and each R$_3$ are independently a hydrogen, a substituted or unsubstituted alkyl group having 1 to 20 carbon atoms, a substituted or unsubstituted alkoxy group having 1 to 20 carbon atoms, a substituted or unsubstituted aromatic hydrocarbon group having 6 to 30 carbon atoms, or a substituted or unsubstituted aromatic heterocyclic group having 3 to 30 ring-member atoms, wherein optionally, two adjacent R$_2$, or two adjacent R$_3$, join to form a ring structure, X is =CR$_4$R$_5$—, —O—, or —S—, wherein R$_4$ and R$_5$ are independently a substituted or unsubstituted aryl group having 6 to 30 carbon atoms or a substituted or unsubstituted alkyl group having 1 to 20 carbon atoms, or R$_4$ and R$_5$ join to form a ring structure, b is an integer of 0, 1, 2, or 3, and c is an integer of 0, 1, 2, 3, or 4.

3. The copolymer of claim 2, wherein the group represented by Chemical Formula 1-2 is a group of Chemical Formulas 3 to 18:

Chemical Formulas 3 to 18

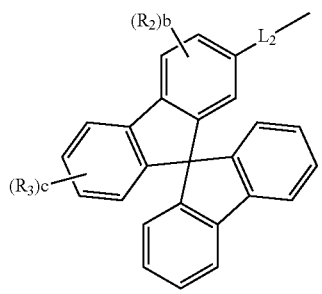

3

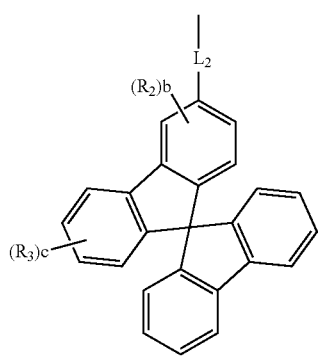

4

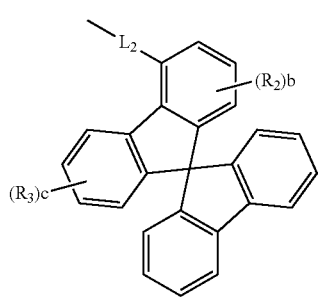

5

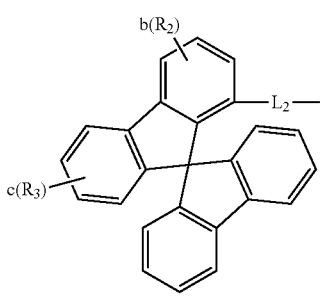

6

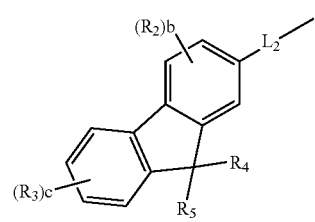

7

-continued

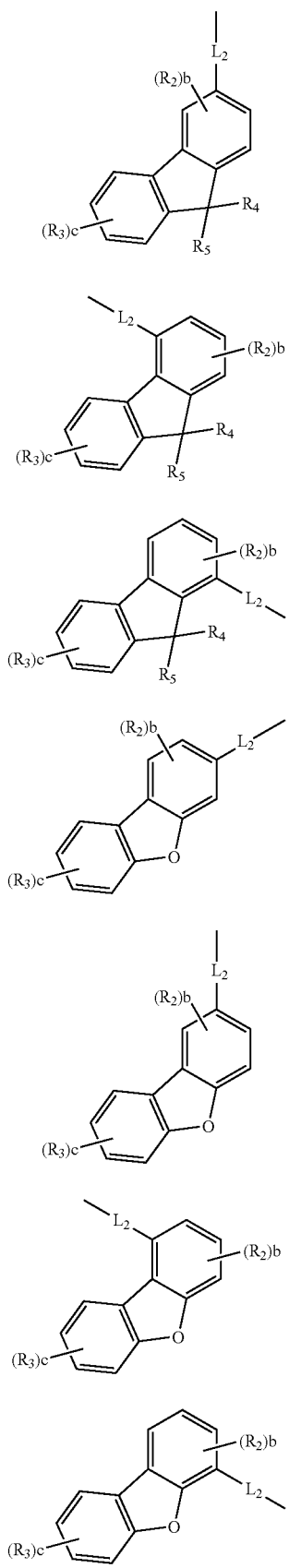

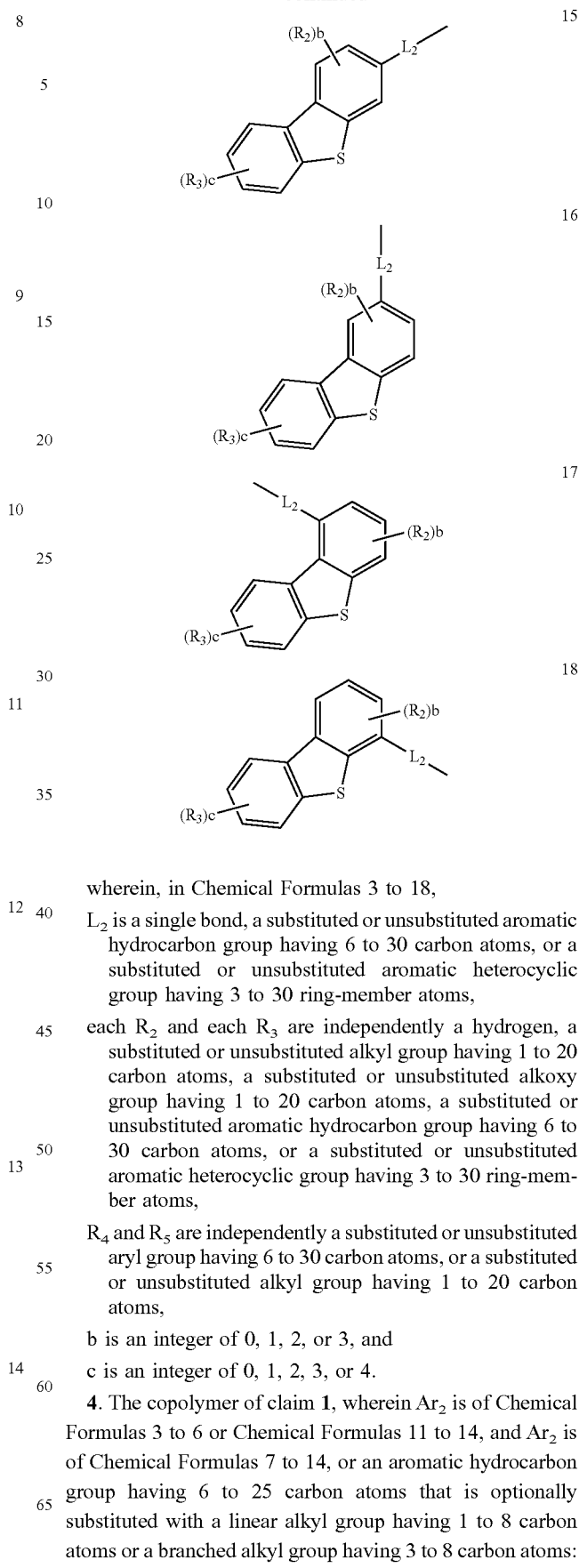

wherein, in Chemical Formulas 3 to 18, $L_2$ is a single bond, a substituted or unsubstituted aromatic hydrocarbon group having 6 to 30 carbon atoms, or a substituted or unsubstituted aromatic heterocyclic group having 3 to 30 ring-member atoms, each $R_2$ and each $R_3$ are independently a hydrogen, a substituted or unsubstituted alkyl group having 1 to 20 carbon atoms, a substituted or unsubstituted alkoxy group having 1 to 20 carbon atoms, a substituted or unsubstituted aromatic hydrocarbon group having 6 to 30 carbon atoms, or a substituted or unsubstituted aromatic heterocyclic group having 3 to 30 ring-member atoms, $R_4$ and $R_5$ are independently a substituted or unsubstituted aryl group having 6 to 30 carbon atoms, or a substituted or unsubstituted alkyl group having 1 to 20 carbon atoms, b is an integer of 0, 1, 2, or 3, and c is an integer of 0, 1, 2, 3, or 4.

4. The copolymer of claim 1, wherein $Ar_2$ is of Chemical Formulas 3 to 6 or Chemical Formulas 11 to 14, and $Ar_2$ is of Chemical Formulas 7 to 14, or an aromatic hydrocarbon group having 6 to 25 carbon atoms that is optionally substituted with a linear alkyl group having 1 to 8 carbon atoms or a branched alkyl group having 3 to 8 carbon atoms:

(3)
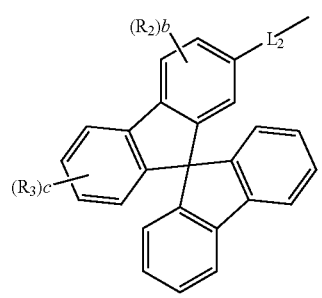
(4)
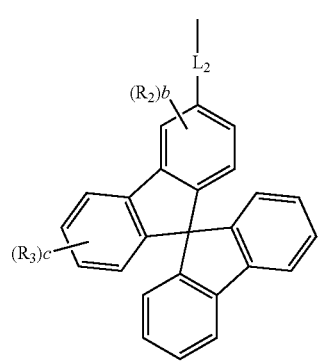
(5)
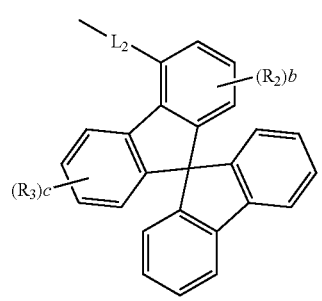
(6)
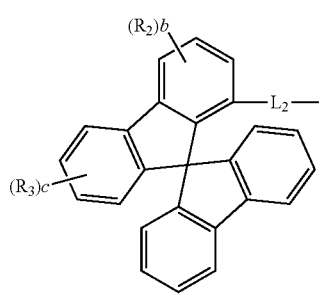
(7)
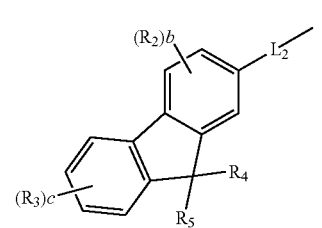
-continued
(8)
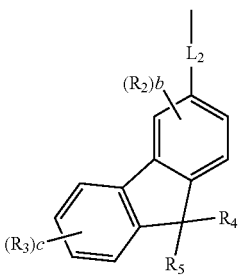
(9)
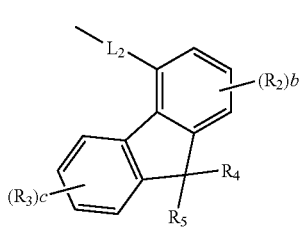
(10)
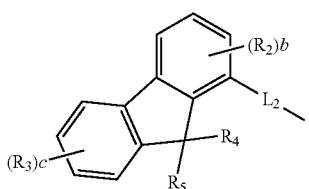
(11)
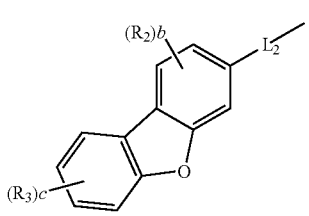
(12)
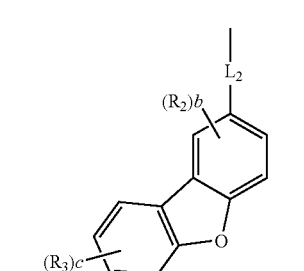
(13)
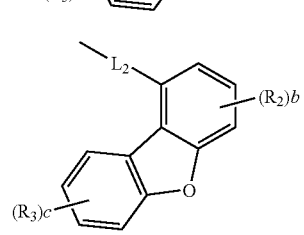

-continued

(14)
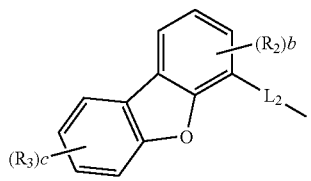

wherein, in Chemical Formulas 3 to 14, $L_2$ is a single bond or a phenylene group, each $R_2$ and each $R_3$ are independently a hydrogen, or an alkyl group having 1 to 10 carbon atoms, b is an integer of 0, 1, 2, or 3, and c is an integer of 0, 1, 2, 3, or 4.

5. The copolymer of claim 1, wherein Y is one of Chemical Formulas 19 to 34:

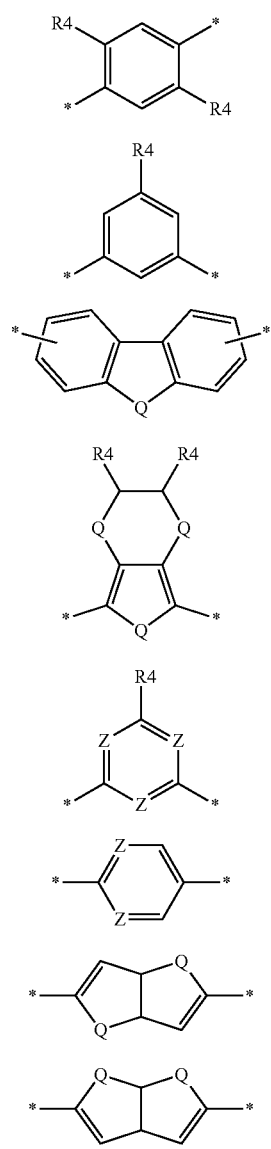

-continued

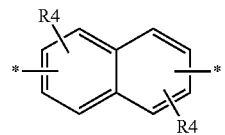
(27)

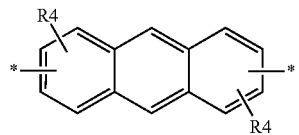
(28)

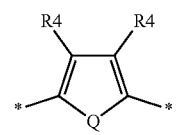
(29)

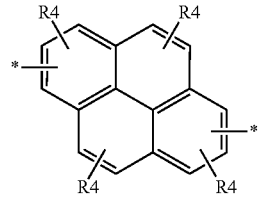
(30)

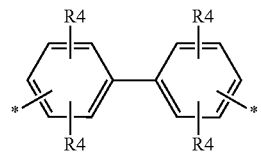
(31)

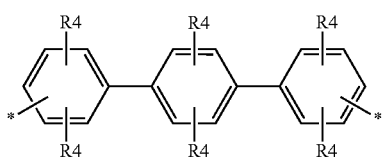
(32)

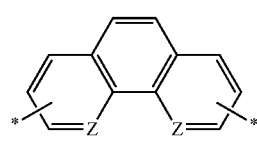
(33)

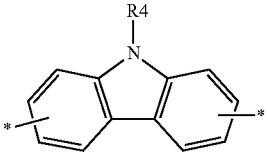
(34)

wherein, in Chemical Formulas 19 to 34, each $R_4$ is independently a hydrogen, substituted or unsubstituted aromatic hydrocarbon group having 6 to 60 carbon atoms, a substituted or unsubstituted aromatic heterocyclic group having 3 to 60 ring-member atoms, or an alkyl group having 1 to 60 carbon atoms, Q is each independently O, S, Se, $CR_{17}R_{18}$, or $SiR_{17}R_{18}$, wherein $R_{17}$ and $R_{18}$ are independently a hydrogen, a deuterium, a substituted or unsubstituted alkyl group, a substituted or unsubstituted aryl group, or a substituted or unsubstituted heteroaryl group, Z is each independently $CR_{19}$, N, or $SiR_{19}$, wherein $R_{19}$ is a hydrogen, a deuterium, substituted or unsubstituted alkyl group, a substituted or unsubstituted aryl group, or a substituted or unsubstituted heteroaryl group, and

* indicates a linking position.

6. A polymer composition comprising the copolymer of claim 1 and a polymeric material having a HOMO level of greater than about −5.6 eV and less than or equal to about −5.3 eV.

7. The polymer composition of claim 6, wherein the polymeric material is represented by Chemical Formula 35:

Chemical Formula 35

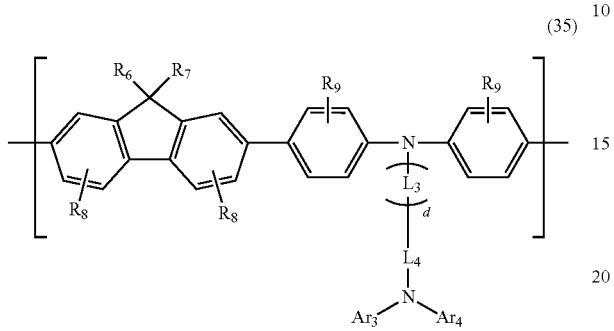

(35)

wherein, in Chemical Formula 35,
$R_6$ to $R_9$ are independently a hydrogen, or a hydrocarbon group having 1 to 16 carbon atoms, $L_3$ is a substituted or unsubstituted aromatic hydrocarbon group having 6 to 25 carbon atoms, or a substituted or unsubstituted aromatic heterocyclic group having 3 to 24 ring-member atoms,
d is 0, 1, or 2, and if d is 0, $L_3$ is a single bond, and if d is 2, each $L_3$ is the same or different,
$L_4$ is a substituted or unsubstituted aromatic hydrocarbon group having 6 to 25 carbon atoms, or a substituted or unsubstituted aromatic heterocyclic group having 3 to 24 ring-member atoms, wherein $L_4$ optionally forms a ring with $Ar_3$,
$Ar_3$ is a substituted or unsubstituted aromatic hydrocarbon group having 6 to 25 carbon atoms, or a substituted or unsubstituted aromatic heterocyclic group having 3 to 24 ring-member atoms, wherein $Ar_3$ optionally forms a ring with $Ar_4$ or $L_4$, and
$Ar_4$ is an aromatic hydrocarbon group having 6 to 25 carbon atoms which is substituted with a linear hydrocarbon group having 1 to 12 carbon atoms, a branched hydrocarbon group having 3 to 12 carbon atoms, or an aromatic heterocyclic group having 3 to 24 ring-member atoms which is substituted with a linear hydrocarbon group having 1 to 12 carbon atoms, or a branched hydrocarbon group having 3 to 12 carbon atoms, wherein $Ar_4$ optionally forms a ring with $Ar_3$.

8. An electroluminescence device material, comprising the copolymer of claim 1.

9. An electroluminescence device material, comprising the polymer composition of claim 6.

10. An electroluminescence device, comprising
a first electrode and a second electrode, and
one or more organic layers disposed between the first electrode and the second electrode,
wherein at least one layer of the one or more organic layers includes the copolymer of claim 1.

11. The electroluminescence device of claim 10, wherein the at least one organic layer including the copolymer is a hole transport layer or a hole injection layer.

12. The electroluminescence device of claim 10, wherein the one or more organic layers is a light emitting layer comprising a semiconductor nanoparticle or an organometal complex.

13. An electroluminescence device comprising
a first electrode and a second electrode, and
one or more organic layers disposed between the first electrode and the second electrode,
wherein at least one layer of the one or more organic layers includes the polymer composition of claim 6.

14. The electroluminescence device of claim 13, wherein the at least one organic layer including the polymer composition is a hole transport layer or a hole injection layer.

15. The electroluminescence device of claim 13, wherein the one or more organic layers is a light emitting layer comprising a semiconductor nanoparticle or an organometal complex.

16. The copolymer of claim 1, further comprising a structural unit represented by Chemical Formula 1-1

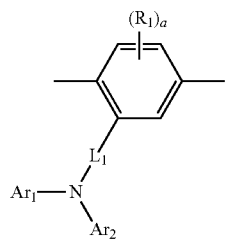

wherein in Chemical Formula 1-1, $L_1$, $Ar_1$, $Ar_2$, $R_1$, and a are as defined, and are independently the same or different than $L_1$, $Ar_1$, $Ar_2$, $R_1$, and a, of Chemical Formula 1.

17. The copolymer of claim 16, wherein at least one of $Ar_1$ or $Ar_2$ of Chemical Formula 1-1 is a group represented by Chemical Formula 1-2:

Chemical Formula 1-2

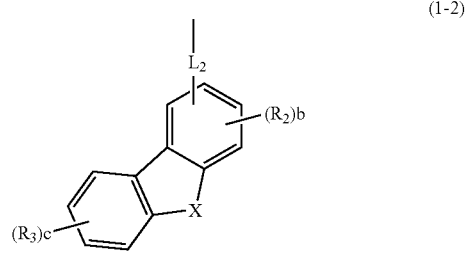

(1-2)

wherein, in Chemical Formula 1-2,
$L_2$ is a single bond, a substituted or unsubstituted aromatic hydrocarbon group having 6 to 30 carbon atoms, or a substituted or unsubstituted aromatic heterocyclic group having 3 to 30 ring-member atoms,
each $R_2$ and each $R_3$ are independently a hydrogen, a substituted or unsubstituted alkyl group having 1 to 20 carbon atoms, a substituted or unsubstituted alkoxy group having 1 to 20 carbon atoms, a substituted or unsubstituted aromatic hydrocarbon group having 6 to 30 carbon atoms, or a substituted or unsubstituted aromatic heterocyclic group having 3 to 30 ring-member atoms, X is =CR$_4$R$_5$—, —O—, or —S—, wherein R$_4$ and R$_5$ are independently a substituted or unsubstituted aryl group having 6 to 30 carbon atoms or a substituted or unsubstituted alkyl group having 1 to 20 carbon atoms, or R$_4$ and R$_5$ join to form a ring structure
b is an integer of 0, 1, 2, or 3, and
c is an integer of 0, 1, 2, 3, or 4.

* * * * *